United States Patent
Kaneko et al.

(10) Patent No.: US 9,323,145 B2
(45) Date of Patent: Apr. 26, 2016

(54) COLORED RADIATION-SENSITIVE COMPOSITION, COLORED CURED FILM, COLOR FILTER, PATTERN FORMING METHOD, COLOR FILTER PRODUCTION METHOD, SOLID-STATE IMAGE SENSOR, AND IMAGE DISPLAY DEVICE

(71) Applicant: FUJIFILM CORPORATION, Minato-ku, Tokyo (JP)

(72) Inventors: Yushi Kaneko, Haibara-gun (JP); Hiroaki Idei, Haibara-gun (JP); Seiichi Hitomi, Haibara-gun (JP); Kazuya Oota, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/454,832

(22) Filed: Aug. 8, 2014

(65) Prior Publication Data
US 2014/0349101 A1 Nov. 27, 2014

Related U.S. Application Data

(63) Continuation of application No. PCT/JP2013/055363, filed on Feb. 28, 2013.

(30) Foreign Application Priority Data

Mar. 21, 2012 (JP) ................................. 2012-064577

(51) Int. Cl.
| | | |
|---|---|---|
| G03F 7/004 | (2006.01) | |
| G02B 5/20 | (2006.01) | |
| G03F 7/00 | (2006.01) | |
| G03F 7/031 | (2006.01) | |
| G03F 7/027 | (2006.01) | |
| G03F 7/105 | (2006.01) | |
| G02B 1/04 | (2006.01) | |
| G03F 7/038 | (2006.01) | |
| G02B 5/22 | (2006.01) | |

(52) U.S. Cl.
CPC ............... *G03F 7/0007* (2013.01); *G02B 1/04* (2013.01); *G03F 7/027* (2013.01); *G03F 7/031* (2013.01); *G03F 7/038* (2013.01); *G03F 7/0388* (2013.01); *G03F 7/105* (2013.01); *G02B 5/223* (2013.01)

(58) Field of Classification Search
CPC ....... G03F 7/0007; G03F 7/027; G03F 7/031; G02B 5/223; G02B 1/04

USPC ......................................... 430/7, 270.1, 281.1
See application file for complete search history.

(56) References Cited

U.S. PATENT DOCUMENTS

| | | |
|---|---|---|
| 6,509,125 B1 | 1/2003 | Ito et al. |
| 2006/0210892 A1 | 9/2006 | Sasamoto |
| 2007/0112134 A1 | 5/2007 | Seto |
| 2007/0117031 A1 | 5/2007 | Mizukawa et al. |
| 2011/0217636 A1* | 9/2011 | Kanna et al. ...................... 430/7 |

FOREIGN PATENT DOCUMENTS

| | | | |
|---|---|---|---|
| JP | 2000-162429 A | 6/2000 | |
| JP | 3309514 B2 | 7/2002 | |
| JP | 2005-316012 A | 11/2005 | |
| JP | 3736221 B2 | 1/2006 | |
| JP | 2006-258916 A | 9/2006 | |
| JP | 2007-138051 A | 6/2007 | |
| JP | 2007-139906 A | 6/2007 | |
| JP | 2008-298967 A | * 12/2008 | |
| JP | 2009-251482 A | * 10/2009 | |
| JP | 2009-288705 A | 12/2009 | |
| KR | 10-2011-0098638 A | 9/2011 | |
| WO | WO 2011/122707 A1 | * 10/2011 | |

OTHER PUBLICATIONS

Computer-generated translation of JP 2008-298967 (Dec. 2008).*
Computer-generated translation of JP 2009-251482 (Oct. 2009).*
International Search Report for PCT/JP2013/055363 dated Apr. 9, 2013, 5 pages in Japanese and English.
Written Opinion for PCT/JP2013/055363 dated Apr. 9, 2013, 4 pages.
International Preliminary Report on Patentability and Written Opinion, mailed Sep. 23, 2014, issued in corresponding International Application No. PCT/JP2013/055363, 5 pages in English.
Communication, dated Mar. 31, 2015, issued in corresponding EP Application No. 13763780.7, 5 pages in English.
Office Action dated Oct. 7, 2015 from the Taiwan Intellectual Property Office issued in corresponding TW Application No. 102109558.
Office Action dated Dec. 8, 2015 from the Korean Intellectual Property Office in counterpart Korean Application No. 10-2014-7022087.

* cited by examiner

*Primary Examiner* — John A McPherson
(74) *Attorney, Agent, or Firm* — Sughrue Mion, PLLC

(57) ABSTRACT

A colored radiation-sensitive composition contains (A) a dye multimer, (B) a pigment, (C) a polymerizable compound, (D) a photopolymerization initiator, and (E) a dispersion resin obtained by reacting a polymer, which has a hydroxyl group on one terminal, with an acid anhydride.

27 Claims, No Drawings

COLORED RADIATION-SENSITIVE COMPOSITION, COLORED CURED FILM, COLOR FILTER, PATTERN FORMING METHOD, COLOR FILTER PRODUCTION METHOD, SOLID-STATE IMAGE SENSOR, AND IMAGE DISPLAY DEVICE

CROSS-REFERENCE TO RELATED APPLICATIONS

This application is a Continuation of PCT International Application No. PCT/JP2013/55363, filed on Mar. 10, 2014, which claims priority under 35 U.S.C. §119(a) to Japanese Patent Application No. 2012-064577, filed on Mar. 21, 2012. Each of the above application(s) is hereby expressly incorporated by reference, in its entirety, into the present application.

BACKGROUND OF THE INVENTION

1. Field of the Invention

The present invention relates to a colored radiation-sensitive composition, a colored cured film, a color filter, a pattern forming method, a color filter production method, a solid-state image sensor, and a image display device which are suitable for producing a color filter used in a liquid crystal display device, a solid-state image sensor, and the like.

2. Description of the Related Art

As one of the methods of producing a color filter used for a liquid crystal display device or a solid-state image sensor, there is a pigment dispersion method. As the pigment dispersion method, there is a method of producing a color filter by photolithography by using a colored photosensitive composition that is obtained by dispersing pigments in various photosensitive compositions. That is, a curable composition is coated onto a substrate by using a spin coater, a roll coater, or the like, the substrate is dried to form a coating film, and the coating film is developed by pattern exposure, thereby obtaining colored pixels. This operation is repeated for the number of the desired colors to prepare a color filter.

Using pigments, the aforementioned method is stable with respect to light or heat, and positional accuracy is sufficiently secured since patterning is performed by photolithography. Accordingly, the method has been widely used as a method suitable for producing a color filter for color display or the like.

Meanwhile, in recent years, there has been a demand for color filters for a solid-state image sensor such as CCD to have high definition. As the definition of color filter is heightened, the size of a pattern tends to be miniaturized, but it is considered that the pigment dispersion method that has been widely used in the related art has a difficulty in further improving resolution while also miniaturizing the pattern size. One of the reasons is that coarse particles generated due to the aggregation of pigment particles cause color unevenness in a fine pattern. Consequently, in recent years, the pigment dispersion method having been widely used so far has not necessarily been used for purposes requiring a fine pattern, such as in a solid-state image sensor.

In the related art, a color filter has been prepared using a pigment as a colorant. However, today, use of a dye instead of a pigment is under examination. When a dye is used, the following points particularly become problems. (1) A dye is generally inferior to a pigment in terms of light fastness and heat resistance. Particularly, there is a problem in that optical characteristics are changed due to a high-temperature treatment performed at the time when a film is formed of indium tin oxide (ITO) which is widely used as an electrode of liquid crystal display or the like.

(2) Since a dye tends to suppress a radical polymerization reaction, in a system using radical polymerization as curing means, there is a difficulty in designing a colored photosensitive composition.

Particularly, when photolithography is used for preparing a color filter, the following points become problems.

(3) Generally, a dye exhibits low solubility in an aqueous alkaline solution or an organic solvent (hereinafter, simply referred to as a "solvent"), and accordingly, it is difficult to obtain a colored photosensitive composition having a desired spectrum.

(4) A dye interacts with other components in a colored photosensitive composition in many cases, and it is difficult to regulate the solubility (developability) of an exposed and unexposed portions.

(5) When a molar absorption coefficient (E) of a dye is low, the dye has to be added in a large amount. As a result, amounts of other components in a colored photosensitive composition, such as a polymerizable compound (monomer), a binder, and a photopolymerization initiator, have to be relatively reduced, and curability of the composition as well as heat resistance, developability, and the like of the cured composition deteriorate.

Due to these problems, it has been difficult so far to form a colored pattern that is constituted with a fine and thin film for a high-definition color filter and has excellent toughness by using a dye. Moreover, in a case of a color filter for a solid-state image sensor, a colored layer is required to be formed of a thin film of 1 μm or less. Accordingly, in order to obtain desired absorption, a relatively large amount of dye needs to be added to a curable composition, and consequently, the aforementioned problems arise.

Furthermore, it is known that when a colored photosensitive composition containing a dye is formed into a film and then subjected to a heating treatment, a phenomenon of color migration easily occurs between different colors of colored patterns adjacent to each other or between layers disposed and stacked on each other. In addition to color migration, there is also problems in that a pattern is easily peeled off in an area with a low exposure dose due to decrease in sensitivity; since the amount of photosensitive components contributing to photolithography characteristics is relatively reduced, an intended shape or color density is not obtained due to heat sagging (phenomenon in which a film is melted due to heating) or elution caused at the time of development; and the like.

As methods for resolving such problems, various methods, such as selecting the type of initiator and increasing the amount of initiator added, have been suggested in the related art (for example, see JP2005-316012A). Moreover, a color filter production method, in which a colored pattern is formed and then irradiated with light while a substrate is being heated so as to increase a polymerization rate of the system by performing polymerization at an increased exposure temperature, has been suggested (for example, see JP3309514B). In addition, a color filter production method, in which light irradiation is performed between a development treatment and a heating treatment so as to prevent deformation of a color filter, has been suggested (for example, see JP2006-258916A). Furthermore, a method of resolving the aforementioned problems by polymerizing a dye has been suggested (for example, see JP2007-139906A, JP2007-138051A, JP3736221B, and JP2000-162429A)

SUMMARY OF THE INVENTION

However, it is difficult to mention that the technique of the related art can form a pattern which is sufficiently fine, hence the technique needs to be further improved.

The present invention has been made in consideration of the above circumstances, and the objects thereof are as follows.

That is, a first object of the present invention is to provide a colored radiation-sensitive composition which makes it possible to form a colored pattern having an excellent pattern shape even in forming a fine pattern and can reduce the surface roughness of the pattern and the amount of residues in a developed portion.

Moreover, a second object of the present invention is to provide a colored cured film exhibiting excellent color characteristics and a color filter having the colored cured film.

Furthermore, a third object of the present invention is to provide a pattern forming method and a color filter production method that can make a colored pattern exhibiting excellent color characteristics.

In addition, a fourth object of the present invention is to provide a solid-state image sensor and an image display device (a liquid crystal display device, an organic EL display device, or the like) that have a color filter exhibiting excellent color characteristics.

As a result of thorough examination, the present inventors found that a colored radiation-sensitive composition which contains specific coloring components, curable components, and a specific dispersion resin can improve the pattern shape which becomes problematic in forming a fine pattern and to reduce the surface roughness of the pattern and the amount of residues in a developed portion. Based on the findings, the inventors have completed the present invention.

Specific means for achieving the above objects is as follows.

<1> A colored radiation-sensitive composition contains (A) a dye multimer, (B) a pigment, (C) a polymerizable compound, (D) a photopolymerization initiator, and (E) a dispersion resin obtained by reacting a polymer, which has a hydroxyl group on one terminal, with an acid anhydride.

<2> The colored radiation-sensitive composition according to <1>, in which the (A) dye multimer has a partial structure derived from a dye selected from a dipyrromethene dye, an azo dye, an anthraquinone dye, a triphenylmethane dye, a xanthene dye, a cyanine dye, a squarylium dye, a quinophthalone dye, a phthalocyanine dye, and a subphthalocyanine dye.

<3> The colored radiation-sensitive composition according to <1> or <2>, in which the (A) dye multimer has a partial structure derived from a dye selected from a dipyrromethene dye, a triphenylmethane dye, and a xanthene dye.

<4> The colored radiation-sensitive composition according to any one of <1> to <3>, in which the (A) dye multimer further contains an alkali-soluble group.

<5> The colored radiation-sensitive composition according to any one of <1> to <4>, in which an acid value of the (A) dye multimer is 0.3 mmol/g to 2.0 mmol/g.

<6> The colored radiation-sensitive composition according to any one of <1> to <5>, in which a weight average molecular weight of the (A) dye multimer is 2,000 to 20,000.

<7> The colored radiation-sensitive composition according to any one of <1> to <6>, in which the (A) dye multimer is a radical polymer containing a dye monomer having an ethylenically unsaturated bond.

<8> The colored radiation-sensitive composition according to any one of <1> to <7>, in which the (A) dye multimer has a polymerizable group.

<9> The colored radiation-sensitive composition according to any one of <1> to <8>, in which a content of the polymerizable group with respect to 1 g of the (A) dye multimer is 0.1 mmol to 2.0 mmol.

<10> The colored radiation-sensitive composition according to any one of <1> to <9>, in which the (B) pigment is at least one kind of pigment selected from an anthraquinone pigment, a diketopyrrolopyrrole pigment, a phthalocyanine pigment, a quinophthalone pigment, an isoindoline pigment, an azomethine pigment, and a dioxazine pigment.

<11> The colored radiation-sensitive composition according to any one of <1> to <10>, in which the (D) photopolymerization initiator is an oxime compound.

<12> The colored radiation-sensitive composition according to any one of <1> to <11> that is used for forming a colored layer of a color filter.

<13> A colored cured film obtained by curing the colored radiation-sensitive composition according to any one of <1> to <12>.

<14> A color filter having the colored cured film according to <13>.

<15> The color filter according to <14>, in which a film thickness of the colored cured film is 0.7 μm or less.

<16> A pattern forming method including forming a colored radiation-sensitive composition layer by applying the colored radiation-sensitive composition according to any one of <1> to <12> onto a support; exposing the colored radiation-sensitive composition layer in the form of a pattern; and forming a colored pattern in the form of a pattern by developing and removing an unexposed portion.

<17> A color filter production method including forming a colored radiation-sensitive composition layer by applying the colored radiation-sensitive composition according to any one of <1> to <12> onto a support; exposing the colored radiation-sensitive composition layer in the form of a pattern; and forming a colored pattern by developing and removing an unexposed portion.

<18> A solid-state image sensor having the color filter according to <14> or <15> or a color filter obtained by the color filter production method according to <17>.

<19> An image display device having the color filter according to <14> or <15> or a color filter obtained by the color filter production method according to <17>.

According to the present invention, it is possible to provide a colored radiation-sensitive composition which makes it possible to form a colored pattern having an excellent pattern shape even in forming a fine pattern and can reduce surface roughness of the pattern and the amount of residues in a developed portion.

Moreover, according to the present invention, it is possible to provide a colored cured film exhibiting excellent color characteristics and a color filter having the colored cured film.

Furthermore, according to the present invention, it is possible to provide a pattern forming method and a color filter production method that can form a colored pattern exhibiting excellent color characteristics.

In addition, according to the present invention, it is possible to provide a solid-state image sensor and an image display device (a liquid crystal display device, an organic EL display device, or the like) that have a color filter exhibiting excellent color characteristics.

DESCRIPTION OF THE PREFERRED EMBODIMENTS

Hereinafter, the colored radiation-sensitive composition, colored cured film, pattern forming method, color filter production method, solid-state image sensor, and image display device of the present invention will be described in detail.

The constituents of the present invention will be described as follows based on typical embodiments of the present invention, but the present invention is not limited to the embodiments.

In the present specification, if there is a description that does not indicate whether a group (atomic group) is substituted or unsubstituted, it means that the group includes a group not having a substituent and a group having a substituent. For example, an "alkyl group" includes not only an alkyl group not having a substituent (unsubstitued alkyl group) but also an alkyl group having a substituent (substituted alkyl group).

Furthermore, in the present specification, "actinic rays" or "radiation" means, for example, a bright line spectrum of a mercury lamp, far-ultraviolet represented by an excimer laser, extreme ultraviolet (EUV radiation), X-rays, electron beams, and the like. Moreover, in the present invention, "light" means actinic rays or radiation. In the present specification, unless otherwise specified, "light exposure" includes not only exposure to light of a mercury lamp, far-ultraviolet represented by an excimer laser, X-rays, EUV radiation, and the like but also drawing utilizing particle beams such as electron beams and ion beams.

In the present specification, a range of numerical values that is described using "xx to yy" means a range that has a numerical value "xx" as a lower limit and a numerical value "yy" as a upper limit.

In the present specification, the total solid contents refers to a total mass of components remaining when a solvent is excluded from the entire composition of a colored radiation-sensitive composition.

Moreover, in the present specification, "(meth)acrylate" represents either or both of "acrylate" and "methacrylate"; "(meth)acryl" represents either or both of "acryl" and "methacryl"; and "(meth)acryloyl" represents either or both of "acryloyl" and "methacryloyl".

In the present specification, a "monomer" refers to a compound which is distinguished from an "oligomer" or a "polymer" and has a weight average molecular weight of 2,000 or less. Moreover, in the present specification, a "polymerizable compound" refers to a compound having a polymerizable functional group and may be a monomer or a polymer. The polymerizable functional group refers to a group involved in a polymerization reaction.

In the present specification, a term "step" includes not only an independent step, but also steps that are not clearly distinguished from other steps if an intended action of the steps is obtained.

[Colored Radiation-Sensitive Composition]

The colored radiation-sensitive composition of the present invention contains (A) a dye multimer, (B) a pigment, (C) a polymerizable compound, (D) a photopolymerization initiator, and (E) a dispersion resin obtained by reacting a polymer, which has a hydroxyl group on one terminal, with an acid anhydride (hereinafter, the resin is appropriately referred to as a "specific dispersion resin").

It is preferable for the colored radiation-sensitive composition of the present invention to further contains (F) an alkali-soluble resin. If necessary, the composition may contain other components such as a crosslinking agent.

The colored radiation-sensitive composition of the present invention that is constituted as above makes it possible to form an excellent pattern shape even in a fine pattern and can reduce the amount of residues in an exposed portion. The mechanism of action of the composition has not been clarified, but the following is assumed to be as the mechanism.

That is, the (E) specific dispersion resin in the present invention is a product of a reaction between a polymer, which has a hydroxyl group on one terminal, and an acid anhydride, and the carboxyl group, which functions as a portion adsorbed onto a pigment, is always disposed near a steric repulsion portion (polymer). Therefore, close interaction is not easily caused between the adsorption portion and a pigment or a dye multimer. Consequentially, presumably, in an unexposed portion, a developer may easily permeate the periphery of a pigment onto which the specific dispersion resin has been adsorbed, developability in an unexposed portion may be improved in forming a colored pattern, and the amount of residues may be effectively reduced. In contrast, presumably, in an exposed portion, formation of pigment aggregates may be inhibited due to excellent pigment dispersibility of the specific dispersion resin, and hardness of the film may be improved due to the presence of a dye multimer. Consequentially, the pattern shape of the formed colored pattern may become excellent, and surface roughness of the pattern may also be reduced.

Hereinafter, the components contained in the colored radiation-sensitive composition of the present invention will be described in detail.

[(A) Dye Multimer]

The colored radiation-sensitive composition of the present invention contains at least one kind of dye multimer (hereinafter, simply referred to as a "dye multimer (A)" in some cases).

More specifically, the dye multimer (A) is a multimer having a partial structure, which has a dye sleketon of which a maximum absorption wavelength is present in a range of 400 nm to 780 nm, in the molecular structure thereof. The dye multimer (A) includes the structure of a dimer, a trimer, a polymer, and the like. In the colored radiation-sensitive composition of the present invention, the dye multimer (A) functions as, for example, a colorant.

Hereinafter, dye-derived partial structures in the dye multimer (A), preferable structures of the dye multimer (A), functional groups (substituent group A which will be described later) that may be contained in the dye multimer (A), and preferable physical properties of the dye multimer (A) will be described in detail.

The "dye-derived partial structure" refers to a structure which is formed when hydrogen atoms are removed from a specific dye (hereinafter, also referred to as a "dye compound") that can form a dye structure which will be described later, and can be linked to a dye multimer linkage portion (a polymer chain, a core of dendrimer, and the like).

(Dye-Derived Partial Structure)

The dye-derived partial structure (hereinafter, also referred to as a "dye structure") in the dye multimer (A) is not particularly limited, and various structures having known dye structures can be used. Examples of the known dye structures include dye structures and the like derived from a dye selected from an azo dye, an azomethine dye, (an indoaniline dye, an indophenol dye, or the like), a dipyrromethene dye, a quinone dye (a benzoquinone dye, a naphthoquinone dye, an anthraquinone dye, an anthrapyridone dye, or the like), a carbonium dye (a diphenylmethane dye, a triphenylmethane dye, a xanthene dye, an acridine dye, or the like), a quinonimine dye (an oxazine dye, a thiazine dye, or the like), an azine dye, a polymethine dye (an oxonol dye, a merocyanine dye, an arylidene dye, a styryl dye, a cyanine dye, a squarylium dye, a croconium dye, or the like), a quinophthalone dye, a phthalocyanine dye, a subphthalocyanine dye, a perinone dye, an indigo dye, a thioindigo dye, a quinoline dye, a nitro dye, a nitroso dye, and a metal complex dye of these.

Among these dye structures, from the viewpoint of color characteristics, dye structures derived from a dye selected from a dipyrromethene dye, an azo dye, an anthraquinone dye, a triphenylmethane dye, a xanthene dye, a cyanine dye, a squarylium dye, a quinophthalone dye, a phthalocyanine dye, and a subphthalocyanine dye are preferable, and dye structures derived from a dye selected from a dipyrromethene dye, a triphenylmethane dye, and a xanthene dye are most preferable.

Specific dye compounds that can form a dye structure are described in "New edition, Dye Handbook" (edited by The Society of Synthetic Organic Chemistry, Japan; MARUZEN, Co., Ltd., 1970), "Color index" (The Society of Dyers and Colourists), "Dye Handbook" (Gen Ookawa et al; Kodansha Ltd., 1986), and the like.

In the dye multimer (A) according to the present invention, a hydrogen atom in the dye structure may be substituted with a substituent selected from the following substituent group A.

<Substituent Group A>

Examples of the substituent that the dye multimer may have include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoyl amino group, an alkyl or arylsulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like. These will be described in detail below.

Examples of the substituent include a halogen atom (for example, a fluorine atom, a chlorine atom, a bromine atom, or an iodine atom); a linear or branched alkyl group (linear or branched substituted or unsubstituted alkyl group preferably having 1 to 30 carbon atoms, for example, methyl, ethyl, n-propyl, isopropyl, t-butyl, n-octyl, 2-chloroethyl, 2-cyanoethyl, or 2-ethylhexyl); a cycloalkyl group (preferably a substituted or unsubstituted cycloalkyl group having 3 to 30 carbon atoms, for example, cyclohexyl or cyclopentyl, or a polycyclic alkyl group, for example, a group having a polycyclic structure such as a bicycloalkyl group (preferably a substituted or unsubstituted bicycloalkyl group having 5 to 30 carbon atoms, for example, bicyclo[1,2,2]heptan-2-yl or bicyclo[2,2,2]octan-3-yl or a tricycloalkyl group. Among these, a monocyclic cycloalkyl group and a bicycloalkyl group are preferable, and a monocyclic cycloalkyl group is particularly preferable);

a linear or branched alkenyl group (a linear or branched substituted or unsubstituted alkenyl group, which is preferably an alkenyl group having 2 to 30 carbon atoms, for example, vinyl, allyl, prenyl, geranyl, or oleyl); a cycloalkenyl group (preferably a substituted or unsubstituted cycloalkenyl group having 3 to 30 carbon atoms, for example, 2-cyclopenten-1-yl or 2-cyclohexen-1-yl, a polycyclic alkenyl group (for example, a bicycloalkenyl group which is preferably a substituted or unsubstituted bicycloalkenyl group having 5 to 30 carbon atoms, for example, bicyclo[2,2,1]hepto-2-en-1-yl or bicyclo[2,2,2]octo-2-en-4-yl), or a tricycloalkenyl group. Among these, a monocyclic cycloalkenyl group is particularly preferable.); an alkynyl group (preferably a substituted or unsubstituted alkynyl group having 2 to 30 carbon atoms, for example, an ethynyl, propargyl, or trimethylsilyl ethynyl group);

an aryl group (preferably a substituted or unsubstituted aryl group having 6 to 30 carbon atoms, for example, phenyl, p-tolyl, naphthyl, m-chlorophenyl, or o-hexadecanoyl aminophenyl); a heterocyclic group (preferably a substituted or unsubstituted, saturated or unsaturated, aromatic or non-aromatic, and monocyclic or ring-condensed 5- to 7-membered heterocyclic group, more preferably a heterocyclic group of which ring-constituting atoms are selected from carbon atoms, nitrogen atoms, and sulfur atoms, and which has at least any one of hetero atoms including a nitrogen atom, an oxygen atom, and a sulfur atom, and even more preferably a 5- or 6-membered aromatic heterocyclic group having 3 to 30 carbon atoms, for example, 2-furyl, 2-thienyl, 2-pyridyl, 4-pyridyl, 2-pyrimidinyl, or 2-benzothiazolyl); a cyano group; a hydroxyl group; a nitro group; a carboxyl group;

an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy); an aryloxy group (preferably a substituted or unsubstituted aryloxy group having 6 to 30 carbon atoms, for example, phenoxy, 2-methylphenoxy, 2,4-di-t-amylphenoxy, 4-t-butylphenoxy, 3-nitrophenoxy, or 2-tetradecanoylaminophenoxy); a silyloxy group (preferably a silyloxy group having 3 to 20 carbon atoms, for example, trimethylsilyloxy or t-butyldimethylsilyloxy); a heterocyclic oxy group (preferably a substituted or unsubstituted heterocyclic oxy group having 2 to 30 carbon atoms; a heterocycle portion of the heterocyclic oxy group is preferably the heterocycle portion explained for the heterocyclic group described above; the heterocyclic oxy group is, for example, 1-phenyltetrazol-5-oxy or 2-tetrahydropyranyloxy);

an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy); a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy); an alkoxycarbonyloxy group (preferably a substituted or unsubstituted alkoxy carbonyloxy group having 2 to 30 carbon atoms, for example, methoxycarbonyloxy, ethoxycarbonyloxy, t-butoxycarbonyloxy, or n-octylcarbonyloxy); an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxy carbonyloxy);

an amino group (preferably an amino group, a substituted or unsubstituted alkylamino group having 1 to 30 carbon atoms, a substituted or unsubstituted arylamino group having 6 to 30 carbon atoms, or a heterocyclic amino group having 0 to 30 carbon atoms, for example, amino, methylamino, dimethylamino, anilino, N-methyl-anilino, diphenylamino, or N-1,3,5-triazin-2-ylamino); an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenyl carbonylamino); an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, or morpholinocarbonylamino); an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino);

an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino); a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino); an alkyl or aryl sulfonylamino group (preferably a substituted or unsubstituted alkyl sulfonylamino group having 1 to 30 carbon atoms, or a substituted or unsubstituted aryl sulfonylamino group having 6 to 30 carbon atoms, for example, methyl sulfonylamino, butyl sulfonylamino, phenyl sulfonylamino, 2,3,5-trichlorophenylsulfonylamino, or p-methylphenylsulfonylamino), a mercapto group;

an alkylthio group (preferably a substituted or unsubstituted alkylthio group having 1 to 30 carbon atoms, for example, methylthio, ethylthio, or n-hexadecylthio); an arylthio group (preferably a substituted or unsubstituted arylthio group having 6 to 30 carbon atoms, for example, phenylthio, p-chlorophenylthio, or m-methoxyphenylthio); a heterocyclic thio group (preferably a substituted or unsubstituted heterocyclic thio group having 2 to 30 carbon atoms, in which a heterocycle portion is preferably the heterocycle portion explained for the heterocyclic group described above, for example, 2-benzothiazolylthio or 1-phenyltetrazol-5-ylthio); a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl); a sulfo group;

an alkyl or aryl sulfinyl group (preferably a substituted or unsubstituted alkyl sulfinyl group having 1 to 30 carbon atoms or a substituted or unsubstituted aryl sulfinyl group having 6 to 30 carbon atoms, for example, methyl sulfinyl, ethyl sulfinyl, phenyl sulfinyl, or p-methylphenyl sulfinyl); an alkyl or aryl sulfony group (preferably a substituted or unsubstituted alkyl solfonyl group having 1 to 30 carbon atoms or a substituted or unsubstituted aryl sulfonyl group having 6 to 30 carbon atoms, for example, methyl sulfonyl, ethyl sulfonyl, phenyl sulfonyl, or p-methylphenyl sulfonyl); an acyl group (preferably a formyl group, a substituted or unsubstituted alkyl carbonyl group having 2 to 30 carbon atoms, or a substituted or unsubstituted aryl carbonyl group having 7 to 30 carbon atoms, for example, acetyl, pivaloyl, 2-chloroacetyl, stearoyl, benzoyl, or p-n-octyloxyphenylcarbonyl); an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl);

an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl); a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl); an aryl or heterocyclic azo group (preferably a substituted or unsubstituted arylazo group having 6 to 30 carbon atoms, or a substituted or unsubstituted heterocyclic azo group having 3 to 30 carbon atoms (in which a heterocycle portion is preferably the heterocycle portion explained for the heterocyclic group described above), for example, phenylazo, p-chlorophenylazo, or 5-ethylthio-1,3,4-thiadiazol-2-ylazo); an imide group (preferably a substituted or unsubstituted imide group having 2 to 30 carbon atoms, for example, N-succinimide or N-phthalimide); a phosphino group (preferably a substituted or unsubstituted phosphino group having 2 to 30 carbon atoms, for example, dimethylphosphino, diphenylphosphino, or methyl phenoxyphosphino); a phosphinyl group (preferably a substituted or unsubstituted phosphinyl group having 2 to 30 carbon atoms, for example, phosphinyl, dioctyloxyphosphinyl, or diethoxyphosphinyl);

a phosphinyloxy group (preferably a substituted or unsubstituted phosphinyloxy group having 2 to 30 carbon atoms, for example, diphenoxyphosphinyloxy or dioctyloxyphosphinyloxy); a phosphinylamino group (preferably a substituted or unsubstituted phosphinylamino group having 2 to 30 carbon atoms, for example, dimethoxyphosphinylamino or dimethylaminophosphinylamino); and a silyl group (preferably a substituted or unsubstituted silyl group having 3 to 30 carbon atoms, for example, trimethyl silyl, t-butyl dimethyl silyl, or phenyl dimethyl silyl).

Among the above functional groups, in the functional groups having hydrogen atoms, the portion of hydrogen atoms in the functional groups may be substituted with any one of the above groups. Examples of the functional groups that can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include methyl sulfonylaminocarbonyl, p-methylphenylsulfonylaminocarbonyl, acetylaminosulfonyl, and benzoylaminosulfonyl groups.

Particularly preferable dyes (dye compounds) that can form the dye-derived partial structure in the dye multimer (A) will be described in detail.

(Dipyrromethene Dye)

One of the embodiments of the dye multimer (A) according to the present invention is a dye multimer which has a partial structure derived from the dipyrromethene dye shown below as a partial structure of the dye moiety.

In the present invention, as the dipyrromethene dye, a dipyrromethene compound and a dipyrromethene metal complex compound obtained from a dipyrromethene compound with a metal or a metal compound are preferable.

Moreover, in the present invention, a compound having a dipyrromethene structure is referred to as a dipyrromethene compound, and a complex in which a metal or a metal compound is coordinated to the compound having a dipyrromethene structure is referred to as a dipyrromethene metal complex compound.

As the dipyrromethene metal complex compound, a dipyrromethene metal complex compound obtained from a dipyrromethene compound represented by the following Formula (M) with a metal or a metal compound and a tautomer thereof are preferable. Among these, a dipyrromethene metal complex compound represented by the following Formula (7) and a dipyrromethene metal complex compound represented by the following Formula (8) are exemplified as preferable embodiments, and the dipyrromethene metal complex compound represented by the following Formula (8) is most preferable.

<<Dipyrromethene Metal Complex Compound Obtained from Dipyrromethene Compound Represented by Formula (M) with Metal or a Metal Compound, and Tautomer Thereof>>

One of the preferable embodiments of the dye structure in the dye multimer (A) is a dye structure that contains, as a dye moiety, a complex (hereinafter, appropriately referred to as a "specific complex") in which a compound (dipyrromethene compound) represented by the following Formula (M) or a tautomer thereof is coordinated to a metal or a metal compound.

[Chem. 1]

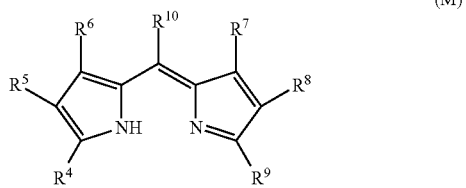

(M)

In Formula (M), each of $R^4$ to $R^{10}$ independently represents a hydrogen atom or a monovalent substituent. Here, $R^4$ and $R^9$ do not form a ring by being bonded to each other.

When the compound represented by Formula (M) is introduced into the structural unit represented by Formula (A) to Formula (C), which will be described later, or into the multimer represented by Formula (D), the introduction site is not particularly limited. However, in view of synthesis suitability, the compound is preferably introduced at one of the sites including $R^4$ to $R^9$, more preferably introduced at one of the sites including $R^4$, $R^6$, $R^7$, and $R^9$, and even more preferably introduced at one of the sites including $R^4$ and $R^9$.

When $R^4$ to $R^9$ in Formula (M) represent a monovalent substituent, examples of the monovalent substituent include the substituents exemplified in the above section of Substituent Group A.

When the monovalent substituent represented by $R^4$ to $R^9$ in Formula (M) is a group that can be further substituted, the group may further have the substituents described for $R^4$ to $R^9$, and when the group has two or more substituents, these substituents may be the same as or different from each other.

In Formula (M), $R^4$ and $R^5$, $R^5$ and $R^6$, $R^7$ and $R^8$, and $R^8$ and $R^9$ may independently form a 5-, 6-, or 7-membered saturated or unsaturated ring by being bonded to each other respectively. Here, $R^4$ and $R^9$ do not form a ring by being bonded to each other. When the formed 5-, 6-, or 7-membered ring is a group that can be further substituted, the ring may be substituted with the substituents described for $R^4$ to $R^9$, and when the ring is substituted with two or more substituents, these substituents may be the same as or different from each other.

In Formula (M), when $R^4$ and $R^5$, $R^5$ and $R^6$, $R^7$ and $R^8$, and $R^8$ and $R^9$ independently form a 5-, 6-, or 7-membered saturated or unsaturated ring not having a substituent by being bonded to each other respectively, examples of the 5-, 6-, or 7-membered saturated or unsaturated ring not having a substituent include a pyrrole ring, a furan ring, a thiophene ring, a pyrazole ring, an imidazole ring, a triazole ring, an oxazole ring, a thiazole ring, pyrrolidine ring, a piperidine ring, a cyclopentene ring, a cyclohexene ring, a benzene ring, a pyridine ring, a pyrazine ring, and a pyridazine ring, and among these, a benzene ring or a pyridine ring is preferable.

$R^{10}$ in Formula (M) preferably represents a hydrogen atom, a halogen atom, an alkyl group, an aryl group, or a heterocyclic group. The halogen atom, alkyl group, aryl group, and heterocyclic group respectively have the same definition as that of the halogen atom, alkyl group, aryl group, and heterocyclic group described in the above section of Substituent Group A, and a preferable range thereof is also the same.

When $R^{10}$ represents an alkyl group, an aryl group, or a heterocyclic group, if the alkyl group, aryl group, and heterocyclic group are groups that can be further substituted, they may be substituted with the substituents described in the above section of Substituent Group A. If the groups are substituted with two or more substituents, the substituents may be the same as or different from each other.

~Metal or Metal Compound~

In the present invention, the specific complex is a complex in which the dipyrromethene compound represented by the Formula (M) or a tautomer thereof is coordinated to a metal or a metal compound.

The metal or metal compound may be any types of metal or metal compound as long as they can form a complex, and include a divalent metal atom, a divalent metal oxide, a divalent metal hydroxide, and a divalent metal chloride. Examples of the metal or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of the stability, spectral characteristics, heat resistance, light fastness, and production suitability of the complex, Fe, Zn, Mg, Si, Pt, Pd, Mo, Mn, Cu, Ni, Co, TiO, or VO is preferable, Zn, Mg, Si, Pt, Pd, Cu, Ni, Co, or VO is more preferable, and Zn is most preferable.

Next, a more preferable range of the specific complex of the compound represented by Formula (M) in the present invention will be described.

A preferable range of the specific complex in the present invention is a range in which in Formula (M) each of R4 and R9 is independently a hydrogen atom, an alkyl group, an alkenyl group, an aryl group, a heterocyclic group, a silyl group, a hydroxyl group, a cyano group, an alkoxy group, an aryloxy group, a hetereocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; each of $R^5$ and $R^8$ is independently a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; each of $R^6$ and $R^7$ is independently a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{10}$ is a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or V=O.

A more preferable range of the specific complex in the present invention is a range in which in Formula (M), each of $R^4$ and $R^9$ is independently a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, a ureido group, an imide group, an alkoxycarbonylamino group, an aryloxycarbonylamino group, a sulfonamide group, an azo group, an alkylsulfonyl group, an arylsulfonyl group, or a phosphinoylamino group; each of $R^5$ and $R^8$ is independently an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an aryl sulfonyl group, or a sulfamoyl group; each of $R^6$ and $R^7$ is independently a hydrogen atom, an alkyl group, an alkenyl group, an aryl group, a heterocyclic group, a cyano group, an acyl group, an alkoxycarbonyl group, a carbamoyl group, a carbonamide group, a ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group; $R^{10}$ is a hydrogen atom, a halogen atom, an alkyl group, an aryl group, or a heterocyclic group; and the metal or metal compound is Zn, Mg, Si, Pt, Pd, Cu, Ni, Co, or V=O.

A particularly preferable range of the specific complex in the present invention is a range in which in Formula (M), each of $R^4$ and $R^9$ is independently a hydrogen atom, an alkyl group, an aryl group, a heterocyclic group, an amino group, a heterocyclic amino group, a carbonamino group, a ureido group, an imide group, an alkoxycarbonylamino group, a sulfonamide group, an azo group, an alkylsulfonyl group, an arylsulfonyl group, or a phosphinoylamino group; each of $R^5$ and $R^8$ is independently an alkyl group, an aryl group, a heterocyclic group, a cyano group, an acyl group, an alkoxycarbonyl group, a carbamoyl group, an alkylsulfonyl group, or an arylsulfonyl group; each of $R^6$ and $R^7$ is independently a hydrogen atom, an alkyl group, an aryl group, or a heterocyclic group; $R^{10}$ is a hydrogen atom, an alkyl group, an aryl group, or a heterocyclic group; and the metal or metal compound is Zn, Cu, Co, or V=O.

Moreover, the dipyrromethene metal complex compound represented by Formula (7) or Formula (8), which will be described later in detail, is also a particularly preferable embodiment of the dipyrromethene dye.

<<Dipyrromethene Metal Complex Compound Represented by Formula (7)>>

One of the preferable embodiments of the dye structure in the dye multimer (A) is a dye structure derived from the dipyrromethene metal complex compound represented by the following Formula (7).

[Chem. 2]

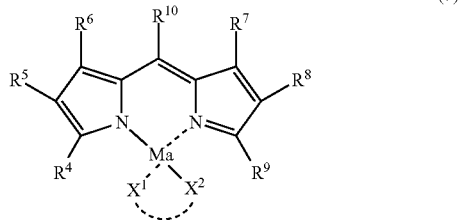

In Formula (7), each of $R^4$ to $R^9$ independently represents a hydrogen atom or a monovalent substituent, and $R^{10}$ represents a hydrogen atom, a halogen atom, an alkyl group, an aryl group, or a heterocyclic group. Ma represents a metal atom or a metal compound. $X^1$ represents a group that can be bonded to Ma, $X^2$ represents a group that neutralizes the charge of Ma, and $X^1$ and $X^2$ may form a 5-, 6-, or 7-membered ring together with Ma by being bonded to each other. Here, $R^4$ and $R^9$ do not form a ring by being bonded to each other.

Moreover, the dipyrromethene metal complex compound represented by Formula (7) includes a tautomer.

When the dipyrromethene metal complex compound represented by Formula (7) is introduced into the structural unit represented by Formula (A) to Formula (C), which will be described later, or into the multimer represented by Formula (D), the introduction site is not particularly limited. However, in view of synthesis suitability, the compound is preferably introduced at one of the sites including $R^4$ to $R^9$, more preferably introduced at one of the sites including $R^4$, $R^6$, $R^7$, and $R^9$, and even more preferably introduced at one of the sites including $R^4$ and $R^9$.

When the dye multimer (A) has an alkali-soluble group, as a method of introducing the alkali-soluble group, a method of bonding the alkali-soluble group to one, two, or more substituents among $R^4$ to $R^{10}$, $X^1$, and $X^2$ in the Formula (7) can be used. Among these substituents, one of the $R^4$ to $R^9$ and $X^1$ is preferable, one of the $R^4$, $R^6$, $R^7$, and $R^9$ is more preferable, and one of the $R^4$ and $R^9$ is even more preferable.

The dipyrromethene metal complex compound represented by Formula (7) may have a functional group other than the alkali-soluble group, as long as the effects of the present invention are not diminished.

$R^4$ to $R^9$ in Formula (7) have the same definition as $R^4$ to $R^9$ in the Formula (M), and preferable embodiments thereof are also the same.

In Formula (7), Ma represents a metal atom or a metal compound. The metal atom or metal compound may be any type as long as it is a metal atom or a metal compound that can form a complex, and includes a divalent metal atom, a divalent metal oxide, a divalent metal hydroxide, or a divalent metal chloride.

Examples of the metal atom or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of stability, spectral characteristics, heat resistance, light fastness, and production suitability of the complex, as the metal atom or metal compound, Fe, Zn, Mg, Si, Pt, Pd, Mo, Mn, Cu, Ni, Co, TiO, and V=O are preferable, Zn, Mg, Si, Pt, Pd, Cu, Ni, Co, and V=O are more preferable, Zn, Co, V=O, and Cu are particularly preferable, and Zn is most preferable.

In Formula (7), $R^{10}$ represents a hydrogen atom, a halogen atom, an alkyl group, an aryl group, or a heterocyclic group, and is preferably a hydrogen atom.

In Formula (7), $X^1$ may be any group as long as the group can be bonded to Ma, and specific examples thereof include water, alcohols (for example, methanol, ethanol, and propanol), and compounds disclosed in "Metal Chelates" ([1] Takeichi Sakaguchi and Kagehira Ueno (1995, Nankodo Co., Ltd.), [2] (1996), [3] (1997), and the like). Among these, in view of production thereof, water, a carboxylic acid compound, and alcohols are preferable, and water and a carboxylic acid compound are more preferable.

In Formula (7), examples of the "group that neutralizes the charge of Ma" represented by $X^2$ include a halogen atom, a hydroxyl group, a carboxylic acid group, a phosphoric acid group, a sulfonic acid group, and the like. Among these, in view of production thereof, a halogen atom, a hydroxyl group, a carboxylic acid group, and a sulfonic acid group are preferable, and a hydroxyl group and a carboxylic acid group are more preferable.

In Formula (7), $X^1$ and $X^2$ may form a 5-, 6-, or 7-membered ring together with Ma by being bonded to each other. The formed 5-, 6-, or 7-membered ring may be a saturated or unsaturated ring. In addition, the 5-, 6-, or 7-membered ring may be constituted only with carbon atoms or may form a heterocycle having at least one atom selected from a nitrogen atom, an oxygen atom, or/and a sulfur atom.

In a preferable embodiment of the compound represented by Formula (7), each of $R^4$ to $R^9$ independently represents the group described as the preferable embodiment of $R^4$ to $R^9$; $R^{10}$ represents the group described as the preferable embodiment of $R^{10}$, Ma is Zn, Cu, Co, or V=O; $X^1$ is water or a carboxylic acid compound; $X^2$ is a hydroxyl group or a carboxylic acid group; and $X^1$ and $X^2$ may form a 5- or 6-membered ring by being bonded to each other.

<<Dipyrromethene Metal Complex Compound Represented by Formula (8)>>

One of the preferable embodiments of the dye structure in the dye multimer (A) is a dye structure derived from a dipyrromethene metal complex compound represented by the following Formula (8).

[Chem. 3]

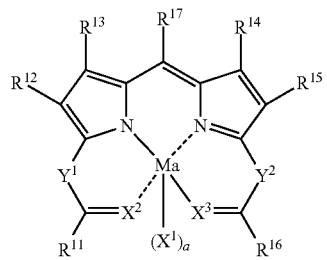

(8)

In Formula (8), each of $R^{11}$ and $R^{16}$ independently represents an alkyl group, an alkenyl group, an aryl group, a heterocyclic group, an alkoxy group, an aryloxy group, an alkylamino group, an arylamino group, or a heterocyclic amino group. Each of $R^{12}$ to $R^{15}$ independently represents a hydrogen atom, or a substituent. $R^{17}$ represents a hydrogen atom, a halogen atom, an alkyl group, an aryl group, or a heterocyclic group. Ma represents a metal atom or a metal compound. Each of $X^2$ and $X^3$ independently represents NR(R represents a hydrogen atom, an alkyl group, an alkenyl group, an aryl group, a heterocyclic group, an acyl group, an alkylsulfonyl group, or an arylsulfonyl group), a nitrogen atom, an oxygen atom or a sulfur atom. Each of $Y^1$ and $Y^2$ independently represents $NR^c$ ($R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom. $R^{11}$ and $Y^1$ may form a 5-, 6-, or 7-membered ring by being bonded to each other, and $R^{16}$ and $Y^2$ may form a 5-, 6-, or 7-membered ring by being bonded to each other. $X^1$ represents a group that can be bonded to Ma, and a represents 0, 1, or 2.

Moreover, the dipyrromethene metal complex compound represented by Formula (8) includes a tautomer.

The site at which the dipyrromethene metal complex compound represented by Formula (8) is introduced into the structural unit represented by Formula (A) to Formula (C), which will be described later, or into the multimer represented by Formula (D) is not particularly limited, as long as the effects of the present invention are not diminished. However, the site is preferably at least one of the $R^{11}$ to $R^{17}$, $X^1$, $Y^1$, and $Y^2$. Among these, in view of synthesis suitability, it is preferable for the compound to be introduced at one of the $R^{11}$ to $R^{16}$ and $X^1$. In a more preferable embodiment, the compound is inserted at one of the $R^{11}$, $R^{13}$, $R^{14}$, and $R^{16}$. In an even more preferable embodiment, the compound is inserted at one of the $R^{11}$ and $R^{16}$.

When the dye multimer (A) uses the alkali-soluble group, if a dye monomer or a structural unit having the alkali-soluble group is used, as a method for introducing the alkali-soluble group, it is possible to use a method of introducing the alkali-soluble group into one, two, or more substituents among $R^{11}$ to $R^{17}$, $X^1$, $Y^1$, and $Y^2$ in the Formula (8). Among these substituents, one of the $R^{11}$ to $R^{16}$ and $X^1$ is preferable, one of the $R^{11}$, $R^{13}$, $R^{14}$, and $R^{16}$ is more preferable, and one of the $R^{11}$ and $R^{16}$ is even more preferable.

The dipyrromethene metal complex compound represented by Formula (8) may have a functional group other than the alkali-soluble group, as long as the effects of the present invention are not dimished.

In Formula (8), $R^{12}$ to $R^{15}$ have the same definition as $R^5$ to $R^8$ in the Formula (M), and preferable embodiments thereof are also the same. $R^{17}$ has the same definition as $R^{10}$ in the Formula (M), and preferable embodiments thereof are also the same. Ma has the same definition as Ma in the Formula (7), and preferable embodiments thereof are also the same.

More specifically, among $R^{12}$ to $R^{15}$ in the Formula (8), as $R^{12}$ and $R^{15}$, an alkoxycarbonyl group, an aryloxycarbonyl group, a carbamoyl group, an alkylsulfonyl group, an arylsulfonyl group, a nitrile group, an imide group, or a carbamoylsulfonyl group is preferable, an alkoxycarbonyl group, an aryloxycarbonyl group, a carbamoyl group, an alkylsulfonyl group, a nitrile group, an imide group, or a carbamoylsulfonyl group is more preferable, an alkoxycarbonyl group, an aryloxycarbonyl group, a carbamoyl group, a nitrile group, an imide group, or a carbamoylsulfonyl group is even more preferable, and an alkoxycarbonyl group, an aryloxycarbonyl group, or a carbamoyl group is particularly preferable.

As $R^{13}$ and $R^{14}$, a substituted or unsubstituted alkyl group, a substituted or unsubstituted aryl group, and a substituted or unsubstituted heterocyclic group are preferable, and a substituted or unsubstituted alkyl group and a substituted or unsubstituted aryl group are more preferable. Specific examples of the more preferable alkyl group, aryl group, and heterocyclic group include the same specific examples as exemplified for $R^6$ and $R^7$ of Formula (M).

In Formula (8), $R^{11}$ and $R^{16}$ represents an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, or a benzotriazol-1-yl group), an alkoxy group (an alkoxy group preferably having 1 to 36 carbon atoms and more preferably having 1 to 18 carbon atoms, for example, a methoxy group, an ethoxy group, a propyloxy group, a butoxy group, a hexyloxy group, a 2-ethylhexyloxy group, a dodecyloxy group, or a cyclohexyloxy group), an aryloxy group (an aryloxy group preferably having 6 to 24 carbon atoms and more preferably having 1 to 18 carbon atoms, for example, a phenoxy group or a naphthyloxy group), an alkylamino group (an alkylamino group preferably having 1 to 36 carbon atoms and more preferably having 1 to 18 carbon atoms, for example, a methylamino group, an ethylamino group, a propylamino group, a butylamino group, a hexylamino group, a 2-ethylhexylamino group, an isopropylamino group, a t-butylamino group, a t-octylamino group, a cyclohexylamino group, a N,N-diethylamino group, a N,N-dipropylamino group, a N,N-dibutylamino group, or N-methyl-N-ethylamino group), an arylamino group (an arylamino group preferably having 6 to 36 carbon atoms and more preferably having 6 to 18 carbon atoms, for example, a phenylamino group, a naphthylamino group, a N,N-diphenylamino group, or a N-ethyl-N-phenylamino group), or a heterocyclic amino group (a heterocyclic amino group preferably having 1 to 24 carbon atoms and more preferably having 1 to 12 carbon atoms, for example, a 2-aminopyrrole group, 3-aminopyrazole, a 2-aminopyridine group, or a 3-aminopyridine group).

Among the above groups, as $R^{11}$ and $R^{16}$, an alkyl group, an alkenyl group, an aryl group, a heterocyclic group, an alkylamino group, an arylamino group, and a heterocyclic amino group are preferable, an alkyl group, an alkenyl group, an aryl group, and a heterocyclic group are more preferable, an alkyl group, an alkenyl group, and an aryl group are even more preferable, and an alkyl group is particularly preferable.

In Formula (8), when the alkyl group, alkenyl group, aryl group, heterocyclic group, alkoxy group, aryloxy group, alkylamino group, arylamino group, or heterocyclic amino group represented by $R^{11}$ and $R^{16}$ is a group that can be further substituted, the group may be substituted with the substituents described in the above section of Substituent Group A. When the group is substituted with two or more substituents, these substituents may be the same as or different from each other.

In Formula (8), each of $X^2$ and $X^3$ independently represents NR, a nitrogen atom, an oxygen atom, or a sulfur atom. Here, R represents a hydrogen atom, an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group), an acyl group (an acyl group preferably having 1 to 24 carbon atoms and more preferably having 2 to 18 carbon atoms, for example, an acetyl group, a pivaloyl group, a 2-ethylhexyl group, a benzoyl group, or a cyclohexanoyl group), an alkylsulfonyl group (an alkylsulfonyl group preferably having 1 to 24 carbon atoms and more preferably having 1 to 18 carbon atoms, for example, a methylsulfonyl group, an ethylsulfonyl group, an isopropylsulfonyl group, or a cyclohexylsulfonyl group), or an arylsulfonyl group (an arylsulfonyl group preferably having 6 to 24 carbon atoms and more preferably having 6 to 18 carbon atoms, for example, a phenylsulfonyl group or a naphthylsulfonyl group).

In Formula (8), each of $Y^1$ and $Y^2$ independently represents $NR^c$, a nitrogen atom, or a carbon atom. $R^c$ has the same definition as R of $X^2$ and $X^3$, and the preferable embodiments thereof are also the same.

In Formula (8), $R^{11}$ and $Y^1$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a pyridazine ring, a quinoline ring, or a quinazoline ring), or a 7-membered ring (for example, a cycloheptane ring or a hexamethylene imine ring) together with a carbon atom by being bonded to each other.

In the Formula (8), $R^{16}$ and $Y^2$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a pyridazine ring, a quinoline ring, or a quinazoline ring), or a 7-membered ring (for example, a cycloheptane ring or a hexamethylene imine ring) together with a carbon atom by being bonded to each other.

In Formula (8), when the 5-, 6-, and 7-membered rings that $R^{11}$ and $Y^1$ as well as $R^{16}$ and $Y^2$ form by being bonded to each other are substitutable rings, the rings may be substituted with the substituents described in the above section of Substituent Group A. When the rings are substituted with two or more substituents, these substituents may be the same as or different from each other.

In Formula (8), it is preferable for each of $R^{11}$ and $R^{16}$ to be independently a monovalent substituent of which an –Es value as a steric parameter is 1.5 or greater. The –Es value is more preferably 2.0 or greater, even more preferably 3.5 or greater, and particularly preferably 5.0 or greater.

The –Es value as a steric parameter is a parameter that represents steric bulkiness of a substituent. As the value, the –Es' value disclosed in the document (J. A. Macphee, et al, Tetrahedron, Vol. 34, pp 3553-3562, and Chemistry Special Edition 107, Structure-activity Correlation and Drug Design, edited by Toshio Fujita, published Feb. 20, 1986 (Kagaku-Doujin Publishing Company, Inc.)) is used.

In Formula (8), $X^1$ represents a group that can be bonded to Ma. Specific examples thereof include the same group as represented by $X^1$ in the Formula (7), and the preferable embodiments are also the same. a represents 0, 1, or 2.

In a preferable embodiment of the compound represented by Formula (8), each of $R^{12}$ to $R^{15}$ independently represents the group described as the preferable embodiment of $R^5$ to $R^8$ in the Formula (M); $R^{17}$ represents the group described as the preferable embodiment of $R^{10}$ in the Formula (M); Ma represents Zn, Cu, Co, or V=O; $X^2$ represents NR(R represents a hydrogen atom or an alkyl group), a nitrogen atom, or an oxygen atom; $X^3$ represents NR(Rc represents a hydrogen atom or an alkyl group) or an oxygen atom; $Y^1$ represents $NR^c$ ($R^c$ represents a hydrogen atom or an alkyl group), a nitrogen atom, or a carbon atom; $Y^2$ represents a nitrogen atom or a carbon atom; each of $R^{11}$ and $R^{16}$ is independently an alkyl group, an aryl group, a heterocyclic group, an alkoxy group, or an alkylamino group; $X^1$ represents a group bonded via an oxygen atom; and a represents 0 or 1. $R^{11}$ and $Y^1$ may form a 5- or 6-membered ring by being bonded to each other; or $R^{16}$ and $Y^2$ may form a 5- or 6-membered ring by being bonded to each other.

In a more preferable embodiment of the compound represented by Formula (8), each of $R^{12}$ to $R^{15}$ independently represents the group described as the preferable embodiment of $R^5$ to $R^8$ in the compound represented by Formula (M); $R^{17}$ represents the preferable embodiment described as the preferable embodiment of $R^{10}$ in the Formula (M); Ma is Zn; $X^2$ and $X^3$ are oxygen atoms; $Y^1$ is NH; $Y^2$ is a nitrogen atom; each of $R^{11}$ and $R^{16}$ is independently an alkyl group, an aryl group, a heterocyclic group, an alkoxy group, or an alkylamino group; $X^1$ is a group bonded via an oxygen atom; and a is 0 or 1. $R^{11}$ and $Y^1$ may form a 5- or 6-membered ring by being bonded to each other; or $R^{16}$ and $Y^2$ may form a 5- or 6-membered ring by being bonded to each other.

In view of a coloring ability, the molar absorption coefficient of the dipyrromethene metal complex compound represented by the Formula (7) and Formula (8) is preferably as high as possible. Moreover, in view of improving color purity, the maximum absorption wavelength λmax is preferably 520 nm to 580 nm and more preferably 530 nm to 570 nm. If the value is within this range, it is possible to prepare a color filter having excellent color reproducibility by using the colored radiation-sensitive composition of the present invention.

Furthermore, an absorbance at the maximum absorption wavelength (λmax) of the dye multimer (A) having a dye structure derived from a dipyrromethene dye is preferably 1,000 times or higher, more preferably 10,000 times or higher, and even more preferably 100,000 times or higher than the absorbance at 450 nm. If the ratio is in this range, particularly when a blue color filter is prepared using the colored radiation-sensitive composition of the present invention, a color filter having a higher transmissivity can be formed. In addition, the maximum absorption wavelength and molar absorption coefficient are measured by a spectrophotometer Cary 5 (manufactured by Varian).

From the viewpoint of solubility, it is preferable for the melting point of the dipyrromethene metal complex compound represented by Formula (7) and Formula (8) not to be too high.

The dipyrromethene metal complex compound represented by the Formula (7) and Formula (8) can be synthesized by the method described in U.S. Pat. No. 4,774,339A, U.S. Pat. No. 5,433,896A, JP2001-240761A, JP2002-155052A, JP3614586B, Aust. J. Chem, 1965, 11, 1835-1845, J. H. Boger et al., Heteroatom Chemistry, Vol. 1, No. 5, 389 (1990), and the like. Specifically, the method described in paragraphs 0131 to 0157 of JP2008-292970A can be used.

Specific examples of the dipyrromethene dye will be shown below, but the present invention is not limited thereto.

[Chem. 4]

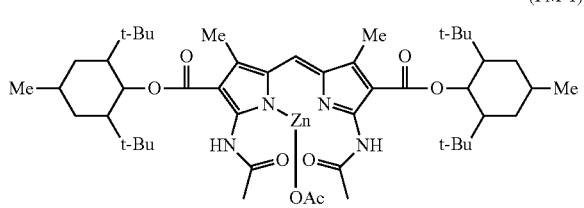

(PM-1)

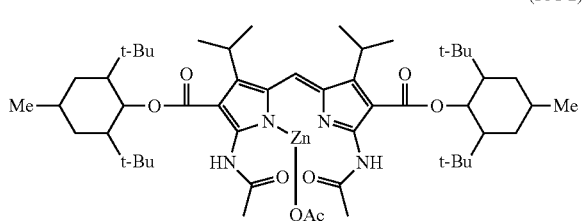

(PM-2)

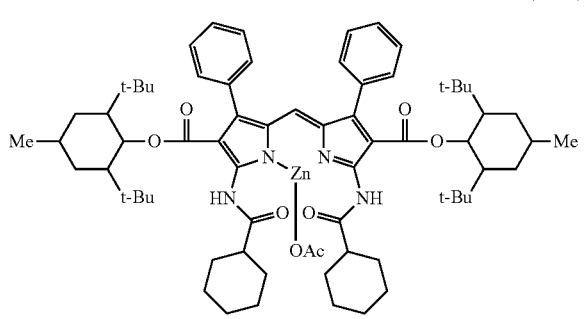

(PM-3)

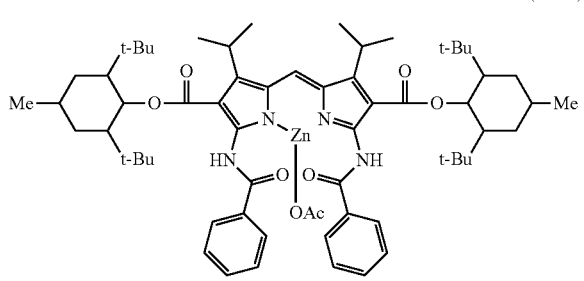

(PM-4)

(PM-5)
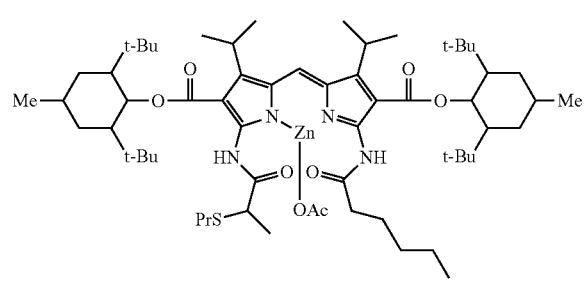
(PM-6)
(PM-7)
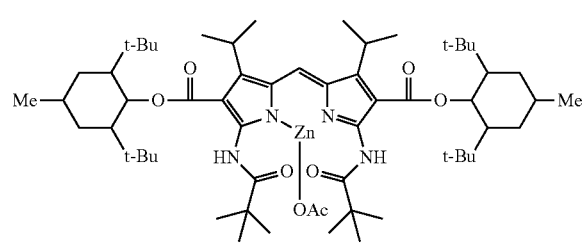
(PM-8)
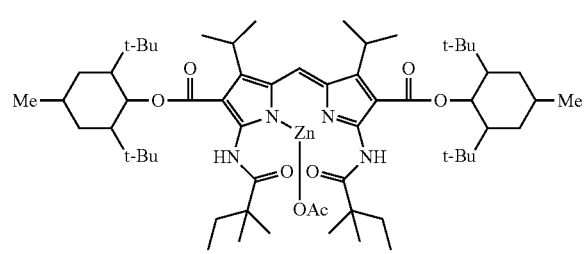
(PM-9)
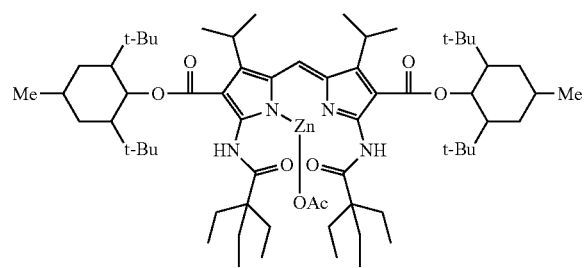
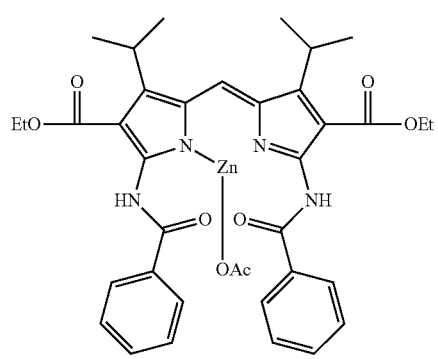
(PM-10)
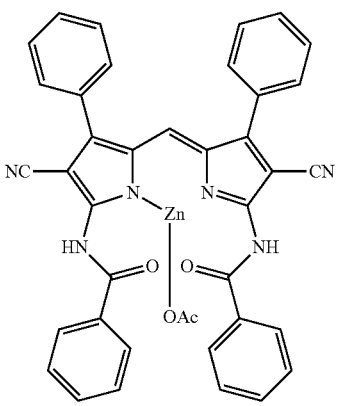
[Chem. 5]
(PM-11)
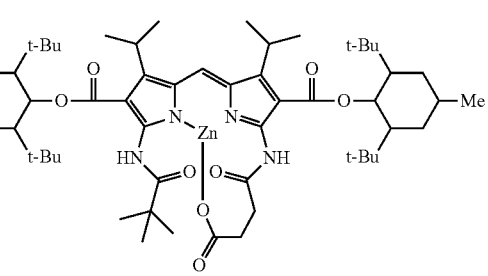
(PM-12)
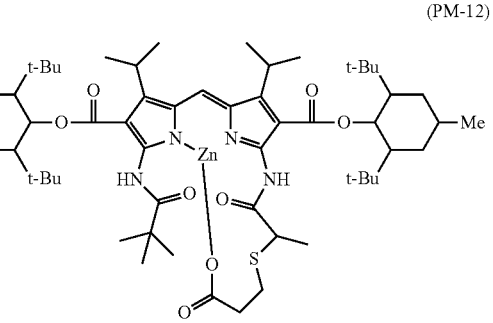
(PM-13)
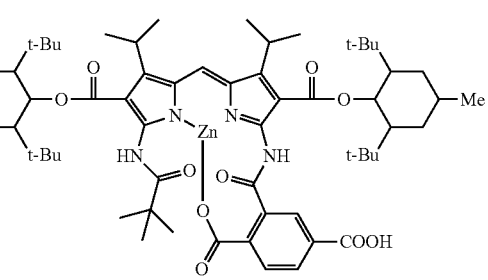
(PM-14)
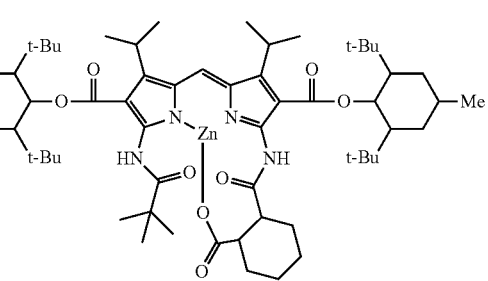

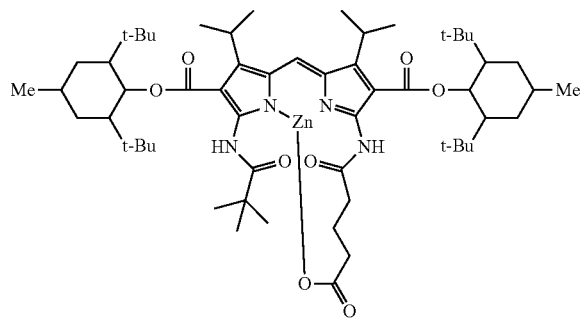
(PM-15)

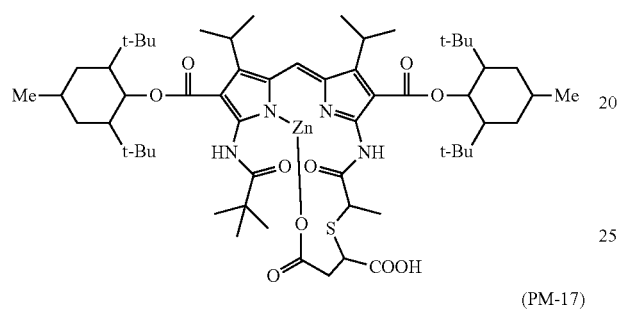
(PM-16)

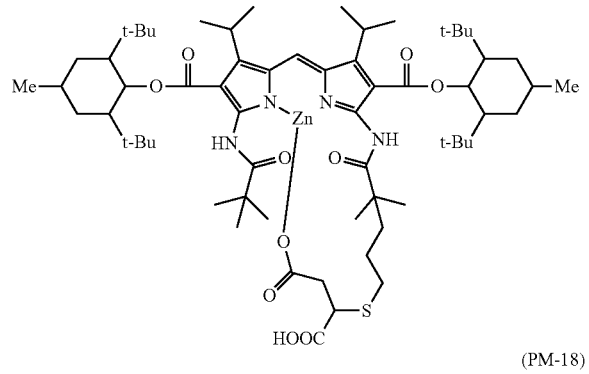
(PM-17)

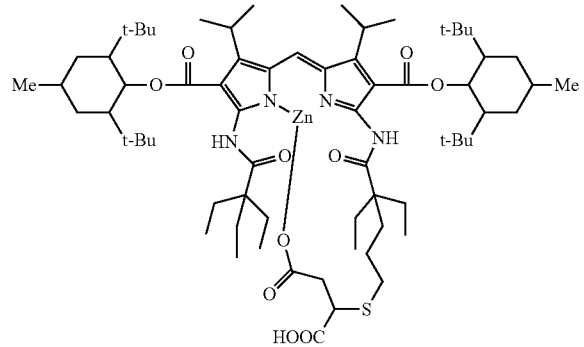
(PM-18)

Among the above specific examples, from the viewpoint of color characteristics and heat resistance, (PM-8) and (PM-18) are particularly preferable.

(Azo Dye)

One of the preferable embodiments of the dye multimer (A) according to the present invention is a dye multimer that has an azo dye (azo compound)-derived partial structure as a partial structure of the dye moiety. In the present invention, the azo compound collectively refers to a compound having a dye moiety containing an N=N group in a molecule thereof.

The azo dye can be used by being appropriately selected from known azo dyes (for example, substituted azobenzene (specific examples thereof include (AZ-4) to (AZ-6) and the like which will be described later)).

As the azo dye, azo dyes known as a magenta dye and a yellow dye can be used, and among these, azo dyes represented by the following Formula (d), Formula (e), Formula (g), Formula (I-1), Formula (I-2), and Formula (V) are particularly preferable.

<<Magenta Dye>>

Preferable examples of the azo dye include an azo dye represented by the following Formula (d) that is a magenta dye.

[Chem. 6]

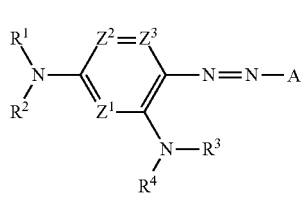

Formula (d)

In Formula (d), each of $R^1$ to $R^4$ independently represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; A represents an aryl group or an aromatic heterocyclic group; each of $Z^1$ to $Z^3$ independently represents —C($R^5$)= or —N=; and $R^5$ represents a hydrogen atom or a substituent.

Each of the substituents in Formula (d) will be described in detail.

In Formula (d), each of $R^1$ to $R^4$ independently represents a hydrogen atom, an alkyl group (a linear, branched, or cyclic alkyl group preferably having 1 to 36 carbon atoms and more preferably having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an alkenyl group (an alkenyl group preferably having 2 to 24 carbon atoms more preferably having 2 to 12 carbon atoms, for example, vinyl, allyl, or 3-buten-1-yl), an aryl group (an aryl group preferably having 6 to 36 carbon atoms and more preferably having 6 to 18 carbon atoms, for example, phenyl or naphthyl), a heterocyclic group (a heterocyclic group preferably having 1 to 24 carbon atoms more preferably having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), an acyl group (an acyl group preferably having 1 to 24 carbon atoms and more preferably having 2 to 18 carbon atoms, for example, acetyl, pivaloyl, 2-ethylhexyl, benzoyl, or cyclohexanoyl), an alkoxycarbonyl group (an alkoxycarbonyl group preferably having 1 to 10 carbon atoms and more preferably having 1 to 6 carbon atoms, for example, methoxycarbonyl or ethoxycarbonyl), an aryloxycarbonyl group (an aryloxycarbonyl group preferably having 6 to 15 carbon atoms and more preferably having 6 to 10 carbon atoms, for example, phenoxycarbonyl), a carbamoyl group (a carbamoyl group preferably having 1 to 8 carbon atoms and more preferably having 2 to 6 carbon atoms, for example, dimethylcarbamoyl), an alkylsulfonyl group (an alkylsulfonyl group preferably having 1 to 24 carbon atoms and more preferably having 1 to 18 carbon atoms, for example, methylsulfonyl, ethylsulfonyl, isopropylsulfonyl, or cyclohexylsulfonyl), or an arylsulfonyl group (an arylsulfonyl group preferably having 6 to 24 carbon atoms and more preferably having 6 to 18 carbon atoms, for example, phenylsulfonyl or naphthylsulfonyl).

Preferably, each of $R^1$ and $R^3$ independently is an alkyl group, an alkenyl group, an aryl group, or a heterocyclic group. Preferably, each of $R^2$ and $R^4$ independently is a hydrogen atom or an alkyl group.

When $R^1$ to $R^4$ are substitutable groups, for example, these groups may be substituted with the substituents described in the above section of Substituent Group A. When these groups have two or more substituents, these substituents may be the same as or different from each other.

$R^1$ and $R^2$, $R^1$ and $R^5$ (in a case where $Z^1$ or $Z^2$ represents —C($R^5$)=), $R^3$ and $R^4$, and $R^3$ and $R^5$ (in a case where $Z^1$ represents —C($R^5$)=) may form a 5- or 6-membered ring by being bonded to each other.

Each of $Z^1$ to $Z^3$ independently represents —C($R^5$)= or —N=, and $R^5$ represents a hydrogen atom or a substituent. Examples of the substituent represented by $R^5$ include the substituents exemplified in the above section of substituents. When the substituent represented by $R^5$ is a group that can be further substituted, the group may be substituted with, for example, the substituents described in the above section of Substituent Group A. When the group is substituted with two or more substituents, these substituents may be the same as or different from each other.

Regarding $Z^1$ to $Z^3$, $Z^1$ is —N=, $Z^2$ is preferably —C($R^5$)= or —N=, and $Z^3$ is preferably —C($R^5$)=. $Z^1$ is more preferably —N=, and $Z^2$ and $Z^3$ are more preferably —C($R^5$)=.

A represents an aryl group or an aromatic heterocyclic group. The aryl group and aromatic heterocyclic group represented by A may further have, for example, the substituents described in the above section of substituents. When the groups are substituted with two or more substituents, these substituents may be the same as or different from each other.

A is preferably an aromatic heterocyclic group. More preferably, examples of A include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring, and the like.

In Formula (d), the site where the polymerizable group involved in multimerization (formation of the dye multimer (A)) is introduced is not particularly limited. However, in view of synthesis suitability, the polymerizable group is preferably introduced at one, two, or more sites among $R^1$, $R^2$, and A, and more preferably introduced at $R^1$ and/or A.

The azo dye represented by Formula (d) is more preferably an azo dye represented by the following Formula (d').

[Chem. 7]

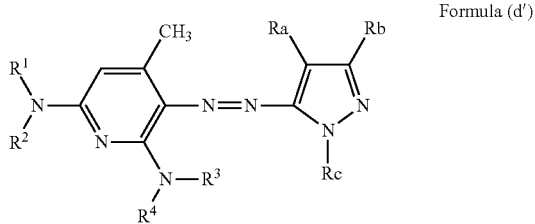

Formula (d')

In Formula (d'), $R^1$ to $R^4$ have the same definition as $R^1$ to $R^4$ in the Formula (d), and the preferable range thereof is also the same. Ra represents an electron-attracting group having a Hammett substituent constant σp of 0.2 or greater, and Rb represents a hydrogen atom or a monovalent substituent. Rc represents an alkyl group, an alkenyl group, an aryl group, a heterocyclic group, an acyl group, an alkoxycarbonyl group, a carbamoyl group, an alkylsulfonyl group, or an arylsulfonyl group.

Examples of the substituent represented by Rb include the substituents exemplified in the above section of Substituent Group A.

Preferable examples of the azo dye also include an azo dye represented by the following Formula (e) that is a magenta dye.

[Chem. 8]

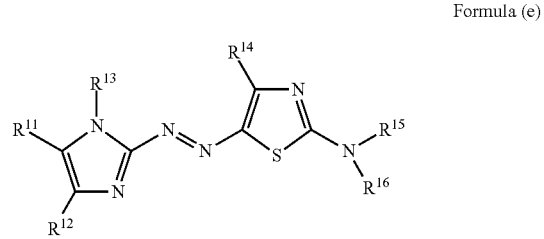

Formula (e)

In Formula (e), each of $R^{11}$ to $R^{16}$ independently represents a hydrogen atom or a monovalent substituent. $R^{11}$ and $R^{12}$, and $R^{15}$ and $R^{16}$ may independently form a ring by being bonded to each other respectively.

Each of the substituents in Formula (e) will be described in detail.

Each of $R^{11}$ to $R^{16}$ independently represents a hydrogen atom or a monovalent substituent. Examples of the monovalent substituent include a halogen atom, an alkyl group having 1 to 30 carbon atoms (herein, refers to a saturated aliphatic group including a cycloalkyl group and a bicycloalkyl group), an alkenyl group having 2 to 30 carbon atoms (herein, refers to an unsaturated aliphatic group having a double bond, including a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group having 2 to 30 carbon atoms, an aryloxycarbonyloxy group having 7 to 30 carbon atoms, an amino group having 0 to 30 carbon atoms (including an alkylamino group, an anilino group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkyl or aryl sulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl or aryl sulfinyl group having 1 to 30 carbon atoms, an alkyl or aryl sulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl or heterocyclic azo group having 3 to 30 carbon atoms, and an imide group. Each of these groups may further have a substituent.

Each of $R^{11}$ and $R^{12}$ preferably independently represents a hydrogen atom, a heterocyclic group, or a cyano group, and more preferably represents a cyano group.

Each of $R^{13}$ and $R^{14}$ preferably independently represents a hydrogen atom, a substituted or unsubstituted alkyl group, or a substituted or unsubstituted aryl group, and more preferably represents a substituted or unsubstituted alkyl group.

Each of $R^{15}$ and $R^{16}$ preferably independently represents a hydrogen atom, a substituted or unsubstituted alkyl group, or a substituted or unsubstituted aryl group, and more preferably represents a substituted or unsubstituted alkyl group.

In Formula (e), the site at which the polymerizable group involved in multimerization (formation of the dye multimer (A)) is introduced is not particularly limited. However, in view of synthesis suitability, the polymerizable group is preferably introduced at one, two, or more sites among $R^{13}$, $R^{15}$, and $R^{16}$, more preferably introduced at $R^{13}$ and/or $R^{15}$, and even more preferably introduced at $R^{13}$.

Among the above azo dyes, the azo dye represented by Formula (e) is more preferable as a magenta dye.

—Yellow Dye—

Preferable examples of the azo dyes include the azo dyes (including a tautomer thereof) as yellow dyes represented by the following Formula (I-1), Formula (I-2), and Formula (V).

[Chem. 9]

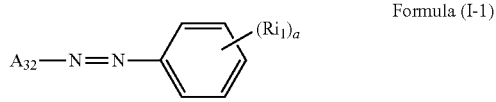

Formula (I-1)

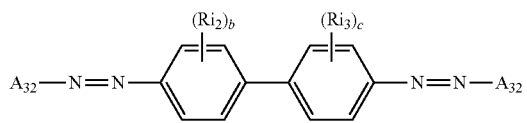

Formula (I-2)

In Formula (I-1) and Formula (I-2), each of $Ri_1$, $Ri_2$, and $Ri_3$ independently represents a monovalent substituent, and a represents an integer from 0 to 5. When a is 2 or greater, two adjacent $Ri_1$s may be linked to each other to form a condensed ring. Each of b and c independently represents an integer from 0 to 4. When b and c are 1 or greater, two adjacent $Ri_1$s may be linked to each other to form a ring. $A_{32}$ represents the following Formula (IA), Formula (IB), or Formula (IC).

[Chem. 10]

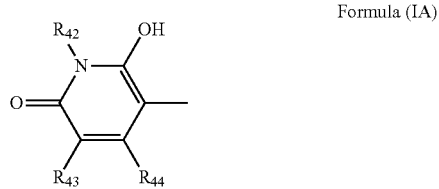

Formula (IA)

In Formula (IA), $R_{42}$ represents a hydrogen atom, an alkyl group, or an aryl group; $R_{43}$ represents a monovalent substituent; and $R_{44}$ represents a hydrogen atom, an alkyl group, or an aryl group.

[Chem. 11]

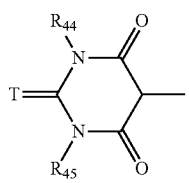

Formula (IB)

In Formula (IB), each of $R_{44}$ and $R_{45}$ independently represents a hydrogen atom, an alkyl group, or an aryl group; and T represents an oxygen atom or a sulfur atom.

[Chem. 12]

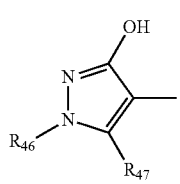

Formula (IC)

In Formula (IC), $R_{46}$ represents a hydrogen atom, an alkyl group, or an aryl group; and $R_{47}$ represents a monovalent substituent.

Examples of the monovalent substituent represented by $Ri_1$, $Ri_2$, and $Ri_3$ in Formula (I-1) and Formula (I-2) include the substituents exemplified in the above section of Substituent Group A. More specific examples of the monovalent substituent include an alkyl group (a linear, branched, or cyclic alkyl group preferably having 1 to 10 carbon atoms and more preferably having 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an aryl group (an aryl group preferably having 6 to 36 carbon atoms and more preferably having 6 to 18 carbon atoms, for example, a phenyl, naphthyl, or a sulfonamide group), an alkenyl group (a linear, branched, or cyclic alkenyl group preferably having 1 to 10 carbon atoms more preferably having 1 to 5 carbon atoms, for example, vinyl, allyl, prenyl, geranyl, or oleyl), a sulfo group, and a sulfamoyl group (preferably an alkylsulfamoyl group having 1 to 10 carbon atoms). Among these, an alkyl group having 1 to 5 carbon atoms and an alkylsulfamoyl group having 1 to 10 carbon atoms are particularly preferable. a is preferably 1 to 3, and b and c are preferably 1 to 3.

In Formula (IA), $R_{42}$ represents a hydrogen atom, an alkyl group, or an aryl group and is preferably an alkyl group having 1 to 5 carbon atoms and a phenyl group. Examples of the monovalent substituent represented by $R_{43}$ include the substituents exemplified in the above section of Substituent Group A, and among these, a cyano group and a carbamoyl group are particularly preferable. $R_{44}$ represents a hydrogen atom, an alkyl group, or an aryl group and is particularly preferably an alkyl group having 1 to 5 carbon atoms and a phenyl group.

In Formula (IB), T represents an oxygen atom or a sulfur atom and is preferably an oxygen atom. Each of $R_{44}$ and $R_{45}$ independently represents a hydrogen atom, an alkyl group, or an aryl group, and is particularly preferably an alkyl group having 1 to 5 carbon atoms and a phenyl group.

In Formula (IC), $R_{46}$ represents a hydrogen atom, an alkyl group, or an aryl group, and is particularly preferably an alkyl group having 1 to 5 carbon atoms and a phenyl group. Examples of the monovalent substituent represented by $R_{47}$ include the substituents exemplified in the above section of Substituent Group A. Among these, a hydrogen atom, an alkyl group and an aryl group are preferable, and an alkyl group having 1 to 5 carbon atoms and a phenyl group are particularly preferable.

[Chem. 13]

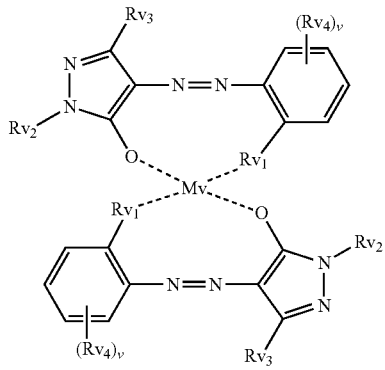

Formula (V)

In Formula (V), My represents Cr or Co, and $Rv_1$ represents an oxygen atom or —COO—. Each of $Rv_2$ and $Rv_3$ independently represents a hydrogen atom, an alkyl group, or an aryl group. v represents an integer from 0 to 4, and $Rv_4$ represents a monovalent substituent. When v is 2 or greater, adjacent $Rv_4$s may be linked to each other to form a ring.

$Rv_2$ and $Rv_3$ are particularly preferably an alkyl group having 1 to 5 carbon atoms or a phenyl group. Examples of the monovalent substituent represented by $Rv_4$ include the substituents exemplified in the above section of Substituent Group A. Among these, an alkyl group, an aryl group, a nitro group, a sulfamoyl group, and a sulfo group are particularly preferable, and an alkyl group having 1 to 5 carbon atoms, a phenyl group, and a nitro group are most preferable.

Among the above azo dyes, the azo dyes represented by Formula (I-1), Formula (I-2), and Formula (V) are preferable as yellow dyes.

Specific examples of the azo dyes will be shown below, but the present invention is not limited thereto.

[Chem. 14]

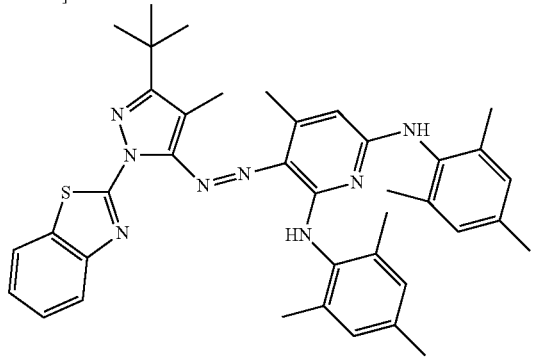

(AZ-1)

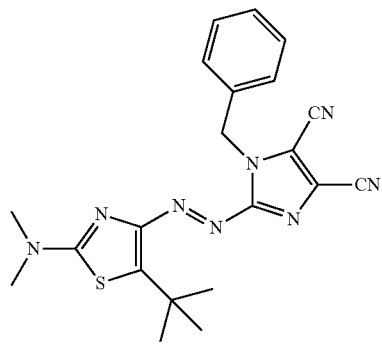

(AZ-2)

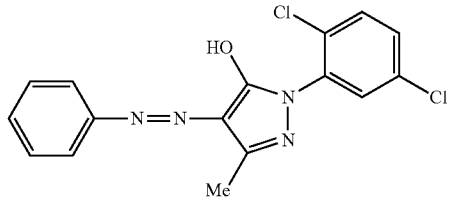

(AZ-3)

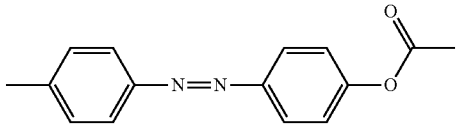

(AZ-4)

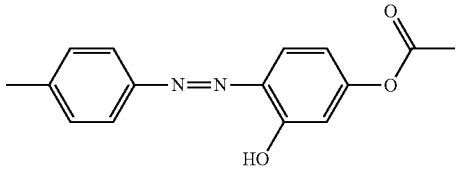

(AZ-5)

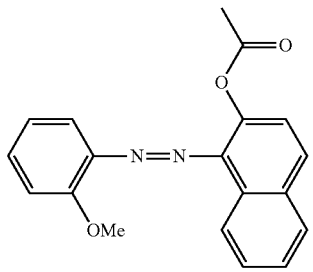

(AZ-6)

[Chem. 15]

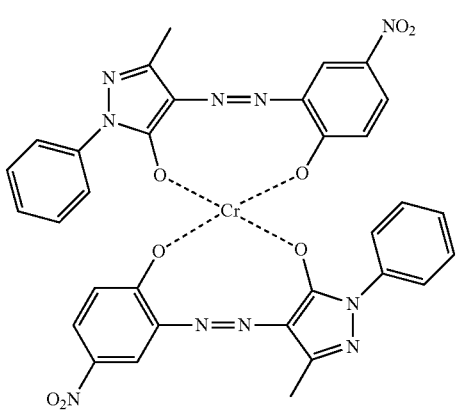

(AZ-7)

(AZ-8)
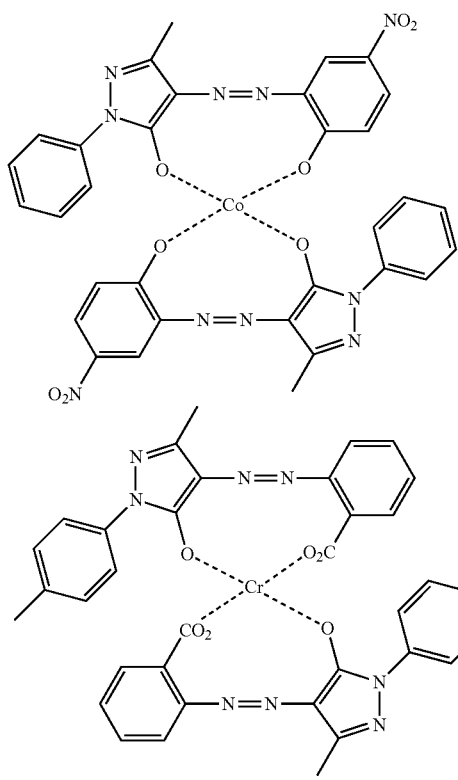
(AZ-9)
(AZ-10)
[Chem. 16]
(2-1)
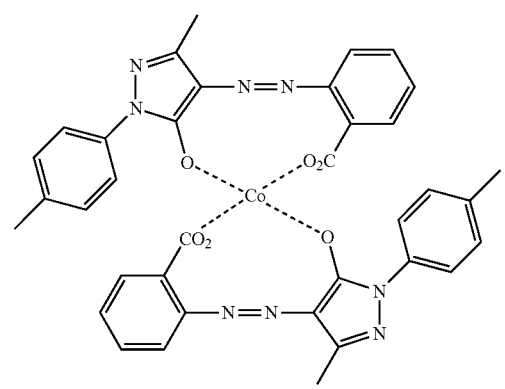
(2-2)
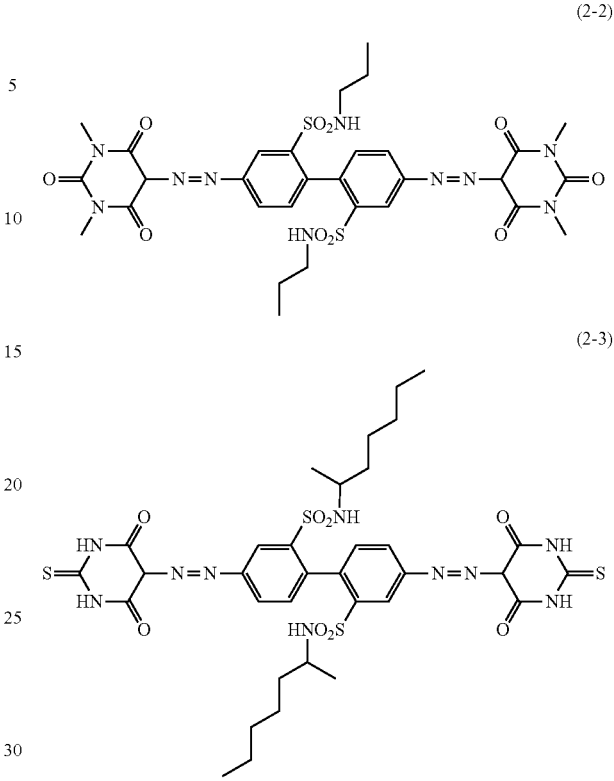
(2-3)
(2-4)
[Chem. 17]
(3-1)
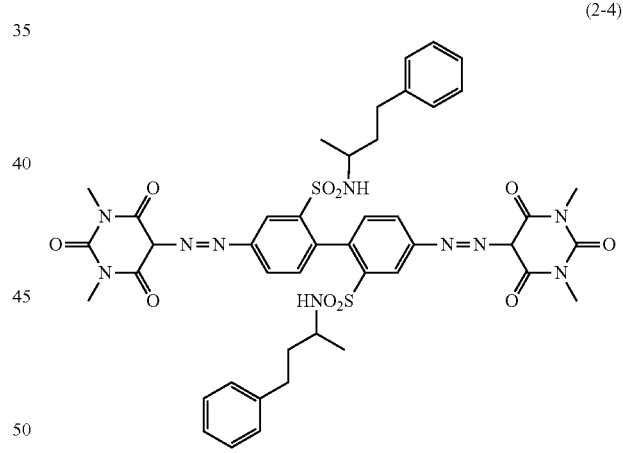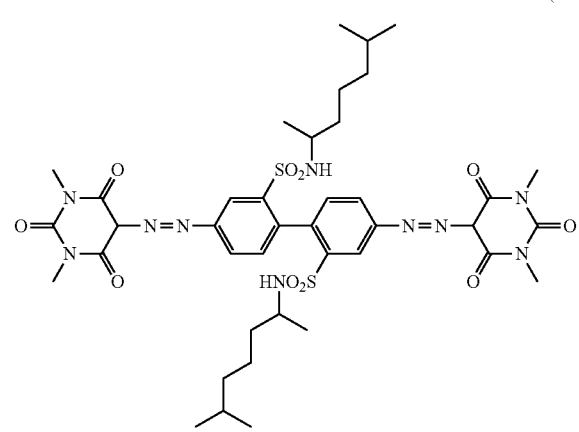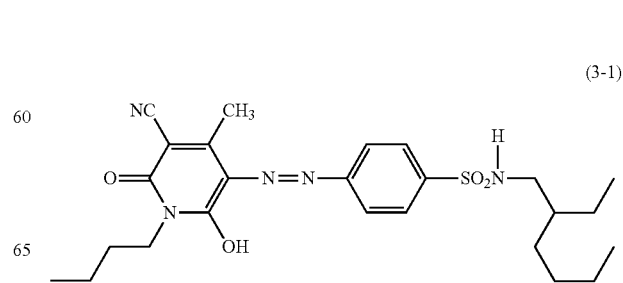

-continued (3-2)
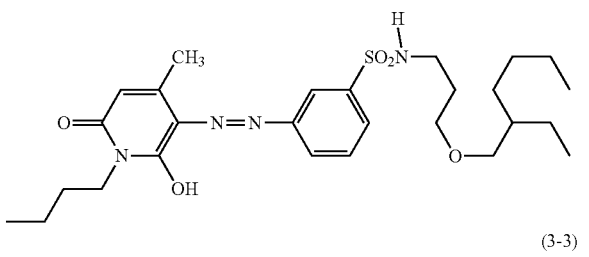

(3-3)
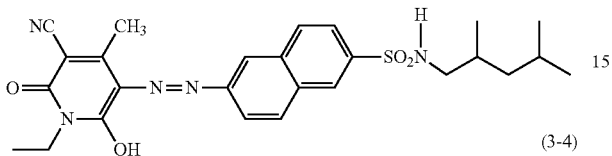

(3-4)
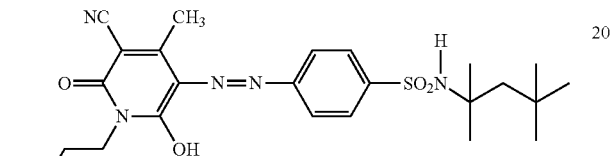

(3-5)
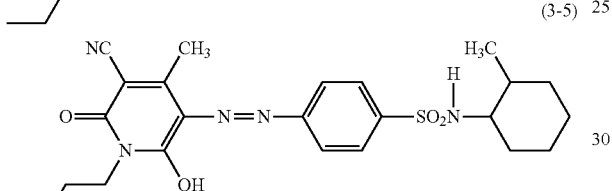

[Chem. 18]

(3-12)
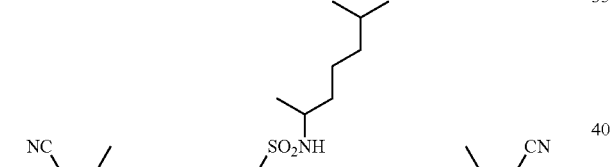

(3-13)
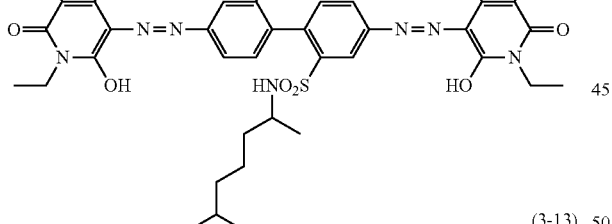

-continued (3-14)
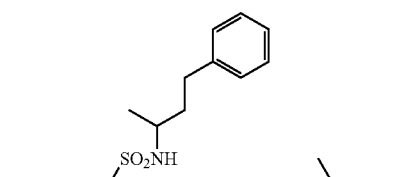

(3-15)
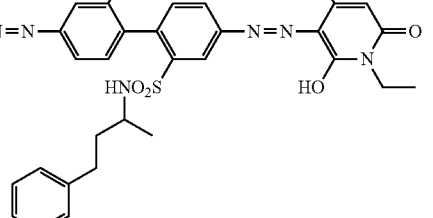

Among the above specific examples, in view of color characteristics and heat resistance, (AZ-7) and (AZ-8), (2-1), (2-2), (2-4), (3-1) to (3-5), and (3-12) to (3-15) are particularly preferable.

(Anthraquinone Dye)

One of the preferable embodiments of the dye multimer (A) according to the present invention is a dye multimer having a partial structure derived from an anthraquinone dye (anthraquinone compound). Such a dye multimer (A) includes a dye multimer that has, as a partial structure of a dye moiety, a partial structure derived from a compound (anthraquinone compound) represented by the following Formulae (AQ-1) to (AQ-3). The anthraquinone compounds in the present invention collectively refer to compounds having a dye moiety containing an anthraquinone skeleton in a molecule thereof.

[Chem. 19]

Formula (AQ-1)
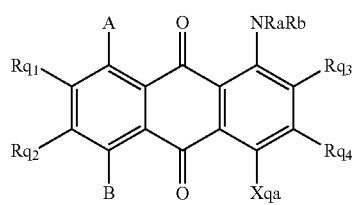

-continued

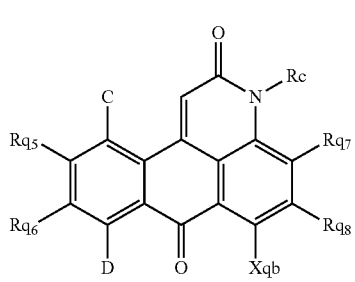
Formula (AQ-2)

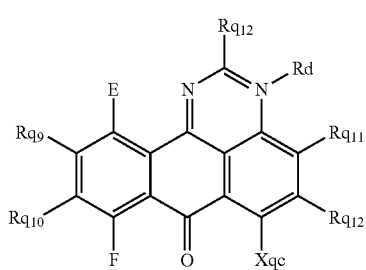
Formula (AQ-3)

In Formula (AQ-1), each of A and B independently represents an amino group, a hydroxyl group, an alkoxy group, or a hydrogen atom. Xqa represents $ORqa_1$ or $NRqa_2Rqa_3$. Each of $Rqa_1$ to $Rqa_3$ independently represents a hydrogen atom, an alkyl group, or an aryl group, and $Rq_1$ to $Rq_4$ represent substituents. The substituents that $Rq_1$ to $Rq_4$ may have are the same substituents as exemplified in the above section of Substituent Group A. Each of Ra and Rb independently represents a hydrogen atom, an alkyl group, or an aryl group.

In Formula (AQ-2), C and D have the same definition as A and B in Formula (AQ-1). Xqb represents $ORqb_1$ or $NRqb_2Rqb_3$. Each of $Rqb_1$ to $Rqb_3$ independently represents a hydrogen atom, an alkyl group, or an aryl group, and $Rq_5$ to $Rq_8$ represents substituents. $Rq_5$ to $Rq_8$ have the same definition as $Rq_1$ to $Rq_4$ in Formula (AQ-1). Rc has the same definition as Ra or Rb in Formula (AQ-1).

In Formula (AQ-3), E and F have the same definition as A and B in Formula (AQ-1). Xqc represents $ORqc_1$ or $NRqc_2Rqc_3$. Each of $Rqc_1$ to $Rqc_3$ independently represents a hydrogen atom, an alkyl group, or an aryl group. $Rq_9$ to $Rq_{12}$ have the same definition as $Rq_1$ to $Rq_4$ in Formula (AQ-1). Rd has the same definition as Ra or Rb in Formula (AQ-1).

In Formula (AQ-1), A and B are preferably a hydrogen atom. Xqa is preferably $ORqa_1$ ($Rqa_1$ represents a hydrogen atom, an alkyl group having 1 to 5 carbon atoms, or a phenyl group) or $NRqa_2Rqa_3$ ($Rqa_2$ represents a hydrogen atom, and $Rqa_3$ represents an alkyl group having 1 to 5 carbon atoms or a phenyl group). $R_{q1}$ to $R_{q4}$ are preferably a hydrogen atom, a halogen atom, or an alkoxy group. Ra is preferably a hydrogen atom, and Rb is preferably a hydrogen atom, an alkyl group having 1 to 5 carbon atoms, or a phenyl group.

In Formula (AQ-2), C and D are preferably a hydrogen atom. Xqb is preferably $ORqb_1$ ($Rqb_1$ represents a hydrogen atom, an alkyl group having 1 to 5 carbon atoms, or a phenyl group) or $NRqb_2Rqb_3$ ($Rqb_2$ represents a hydrogen atom, and $Rqb_3$ represents an alkyl group having 1 to 5 carbon atoms or a phenyl group). $Rq_5$ to $Rq_8$ are preferably a hydrogen atom, a halogen atom, or an alkoxy group. Rc is preferably a hydrogen atom, an alkyl group having 1 to 5 carbon atoms, or a phenyl group.

In Formula (AQ-3), E and F are preferably a hydrogen atom. Xqc is preferably $ORqc_1$ ($Rqc_1$ represents a hydrogen atom, an alkyl group having 1 to 5 carbon atoms, or a phenyl group) or $NRqc_2Rqc_3$ ($Rqc_2$ represents a hydrogen atom, and $Rqc_3$ represents an alkyl group having 1 to 5 carbon atoms or a phenyl group). $Rq_9$ to $Rq_{12}$ are preferably a hydrogen atom, a halogen atom, or an alkoxy group. Rd is preferably a hydrogen atom, an alkyl group having 1 to 5 carbon atoms, or a phenyl group.

Specific examples of the anthraquinone dyes will be shown below, but the present invention is not limited thereto.

[Chem. 20]

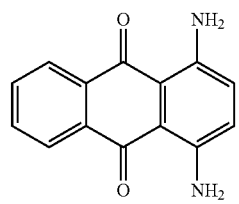
(aq-1)

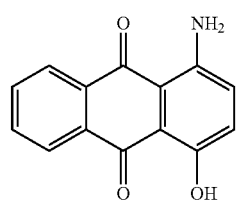
(aq-2)

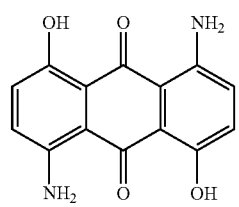
(aq-3)

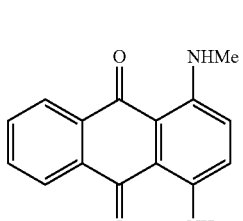
(aq-4)

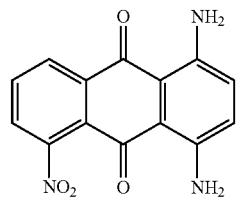
(aq-5)

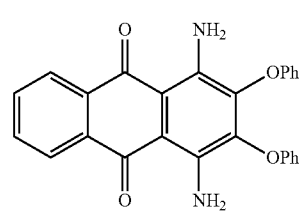
(aq-6)

(aq-7)
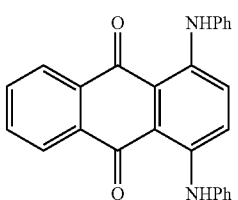

(aq-8)
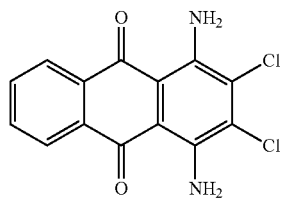

(aq-9)
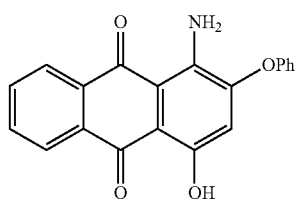

(aq-10)
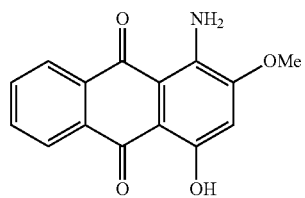

(aq-11)
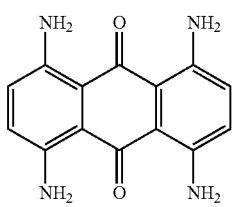

(aq-12)
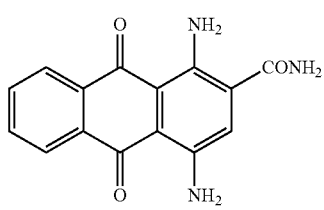

(aq-13)
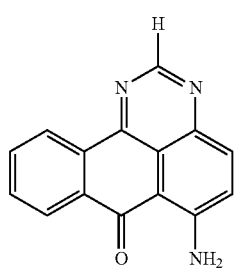

(aq-14)
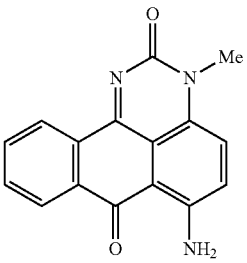

Among the above specific examples, in view of color characteristics and heat resistance, (aq-1) to (aq-4), (aq-13), and (aq-14) are particularly preferable.

(Triphenylmethane Dye)

One of the embodiments of the dye multimer according to the present invention is a dye multimer having a partial structure derived from a triphenylmethane dye (triphenylmethane compound). The dye multimer (A) includes a dye multimer that has, as a partial structure of a dye moiety, a partial structure derived from a compound (triphenylmethane compound) represented by the following Formula (TP). The triphenylmethane compounds in the present invention collectively refer to compounds having a dye moiety containing a triphenylmethane skeleton in a molecule thereof.

[Chem. 21]

Formula (TP)

$Rtp_2Rtp_1N^{\oplus}$ ... $NRtp_3Rtp_4$ $(Rtp_6)_a$ $(Rtp_8)_c$ $X^{\ominus}$ $(Rtp_7)_b$ $Rtp_5$ In Formula (TP), each of $Rtp_1$ to $Rtp_4$ independently represents a hydrogen atom, an alkyl group, or an aryl group. $Rtp_5$ represents a hydrogen atom, an alkyl group, an aryl group, or $NRtp_9Rtp_{10}$ ($Rtp_9$ and $Rtp_{10}$ represent a hydrogen atom, an alkyl group, or an aryl group). $Rtp_6$, $Rtp_7$, and $Rtp_8$ represent substituents. a, b, and c represent an integer from 0 to 4. When a, b, and c are 2 or greater, $Rtp_6$, $Rtp_7$, and $Rtp_8$ may be linked to each other respectively to form a ring. $X^-$ represents an anion.

$Rtp_1$ to $Rtp_6$ are preferably a hydrogen atom, a linear or branched alkyl group having 1 to 5 carbon atoms, and a phenyl group. $Rtp_5$ is preferably a hydrogen atom or $NRtp_9Rtp_{10}$, and most preferably $NRtp_9Rtp_{10}$. $Rtp_9$ and $Rtp_{10}$ are preferably a hydrogen atom, a linear or branched alkyl group having 1 to 5 carbon atoms, or a phenyl group. As the substituents represented by $Rtp_6$, $Rtp_7$, and $Rtp_8$, the substituents exemplified in the above section of Substituent Group A can be used. Particularly, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms, an alkenyl group having 1 to 5 carbon atoms, a phenyl group, or a carboxyl group is more preferable. Particularly, $Rtp_6$ and $Rtp_8$ are preferably an alkyl group having 1 to 5 carbon atoms, and $Rtp_7$ is preferably an alkenyl group (particularly preferably a phenyl group formed when two adjacent alkenyl groups are linked to each other), a phenyl group, or a carboxyl group.

Each of a, b, and c independently represents an integer from 0 to 4. Particularly, a and b are preferably 0 to 1, and c is preferably 0 to 2.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. $X^-$ may be linked to the dye skeleton or may be linked to a portion (polymer chain or the like) of the dye multimer.

$X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the compounds represented by Formula (TP) will be shown below, but the present invention is not limited thereto.

[Chem. 22]

(tp-1)
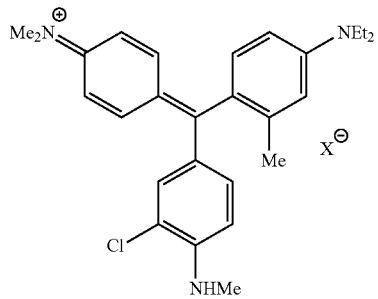

(tp-2)
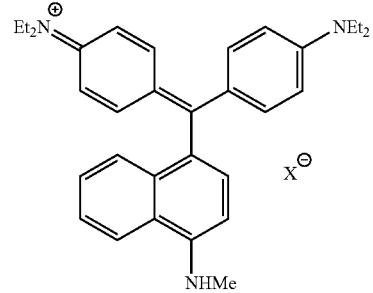

(tp-3)
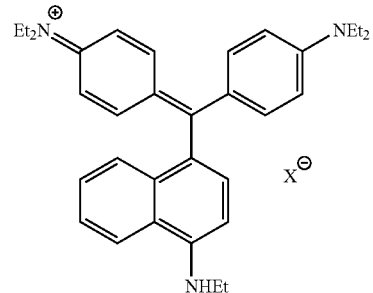

(tp-4)
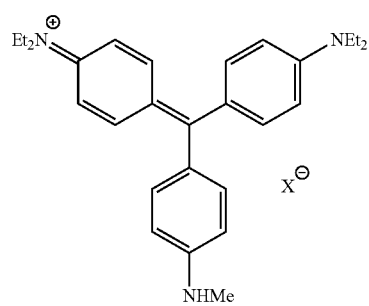

(tp-5)
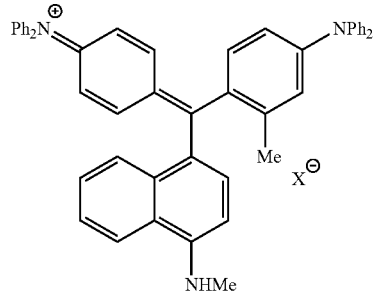

(tp-6)
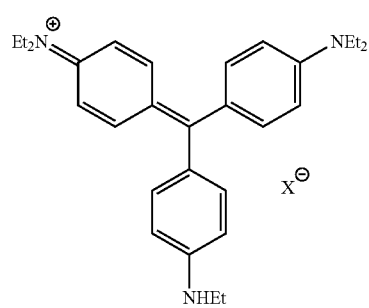

(tp-7)
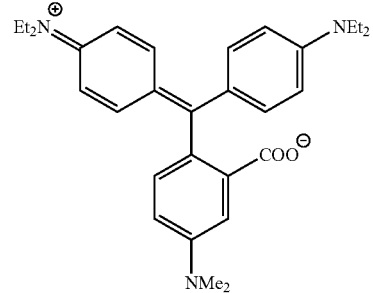

(tp-8)
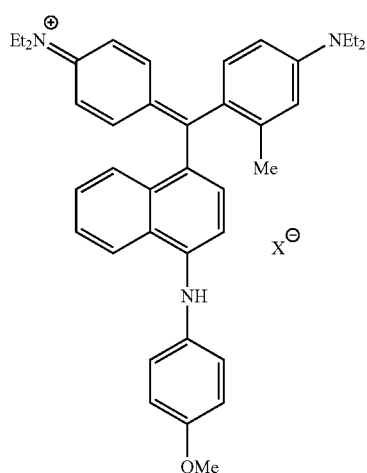
(tp-9)
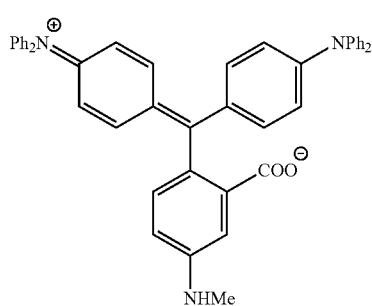
[Chem. 23]
(tp-10)
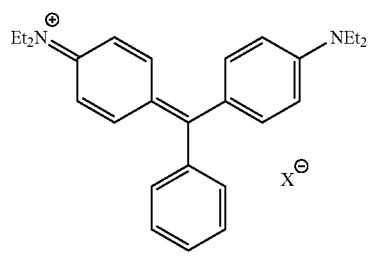
(tp-11)
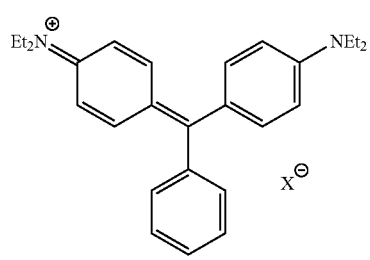
(tp-12)
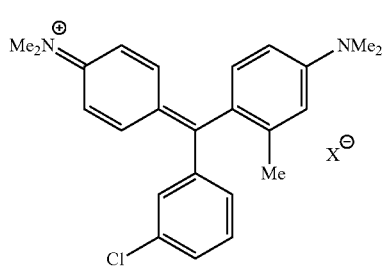
(tp-13)
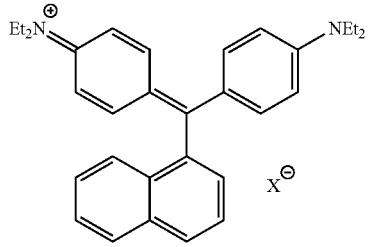
(tp-14)
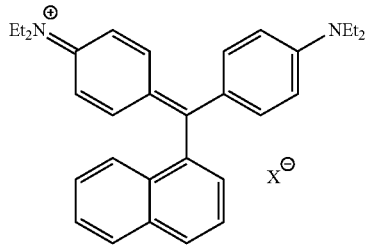
(tp-15)
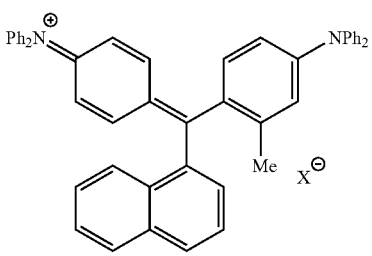
(tp-16)
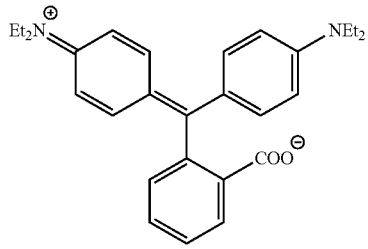
(tp-17)
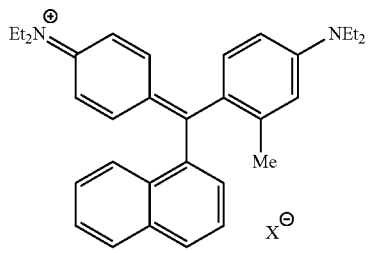
(tp-18)
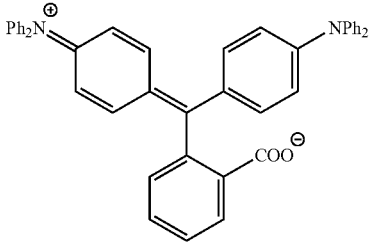
Among the above specific examples, in view of color characteristics and heat resistance, (tp-4), (tp-5), (tp-6), and (tp-8) are particularly preferable.

(Xanthene Dye)

A preferable embodiment of the dye multimer in the present invention is a dye multimer having a partial structure derived from a xanthene dye (xanthene compound). Such a dye multimer (A) include a dye multimer that has, as a partial structure of a dye moiety, a partial structure derived from a xanthene compound represented by the following Formula (J).

[Chem. 24]

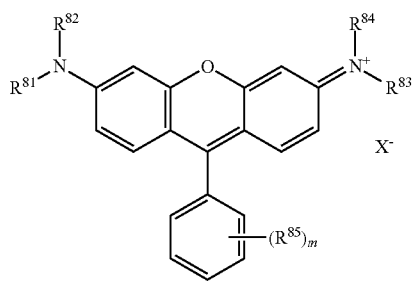

Formula (J)

In Formula (J), each of $R^{81}$, $R^{82}$, $R^{83}$, and $R^{84}$ independently represents a hydrogen atom or a monovalent substituent. Each $R^{85}$ independently represents a monovalent substituent, and m represents an integer from 0 to 5. $X^-$ represents an anion.

The substituents that $R^{81}$ to $R^{84}$ and $R^{85}$ in General Formula (J) may have have the same definition as the substituents exemplified in the above section of Substituent Group A.

In Formula (J), $R^{81}$ and $R^{82}$, $R^{83}$ and $R^{84}$, and $R^{85}$s in a case where m is 2 or greater may independently form a 5-, 6-, or 7-membered saturated ring or a 5-, 6-, or 7-membered unsaturated ring respectively by being bonded to each other. When the formed 5-, 6-, or 7-membered ring is a group that can be further substituted, the ring may be substituted with the substituents described for $R^{81}$ to $R^{85}$. When the ring is substituted with two or more substituents, these substituents may be the same as or different from each other.

In Formula (J), when $R^{81}$ and $R^{82}$, $R^{83}$ and $R^{84}$, and $R^{85}$s in a case where m is 2 or greater independently form 5-, 6-, and 7-membered saturated rings not having a substituent or form 5-, 6-, and 7-membered unsaturated rings respectively by being bonded to each other, examples of the 5-, 6-, and 7-membered saturated rings not having a substituent or the 5-, 6-, and 7-membered unsaturated rings include a pyrrole ring, a pyran ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and among these, a benzene ring and a pyridine ring are preferable.

$R^{82}$ and $R^{83}$ are particularly preferably a hydrogen atom, $R^{81}$ and $R^{84}$ are particularly preferably a substituted or unsubstituted phenyl group. $R^{85}$ is preferably a halogen atom, a linear or branched alkyl group having 1 to 5 carbon atoms, a sulfo group, a sulfonamide group, or a carboxyl group. The substituent that the phenyl group represented by $R^{81}$ and $R^{84}$ has is most preferably a hydrogen atom, a halogen atom, a linear or branched alkyl group having 1 to 5 carbon atoms, a sulfo group, a sulfonamide group, or a carboxyl group.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion, a benzoate anion, organic sulfonate anions such as a benzene sulfonate anion, a toluene sulfonate anion, and a trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. $X^-$ may be linked to the dye skeleton, or may be linked to a portion (polymer chain or the like) of the dye multimer.

$X^-$ is preferably a fluorine anion, a chlorine anion, a bromine anion, an iodine anion, a perchlorate anion, or a carboxylic acid anion, and most preferably a perchlorate anion or a carboxylic acid anion.

The compound having the xanthene skeleton represented by Formula (J) can be synthesized by methods described in documents. Specifically, the methods described in Tetrahedron Letters, 2003, Vol. 44, No. 23, pp 4355-4360, Tetrahedron, 2005, Vol. 61, No. 12, pp 3097-3106, and the like can be used.

Specific examples of the xanthene compounds will be shown below, but the present invention is not limited thereto.

[Chem. 25]

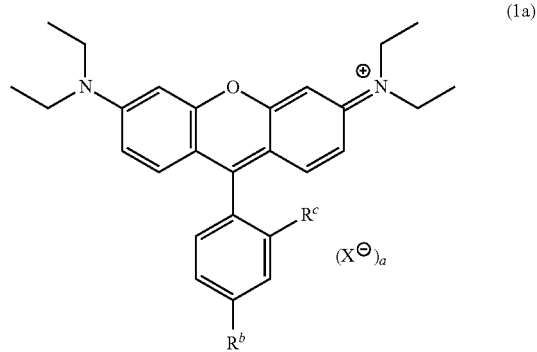

(1a)

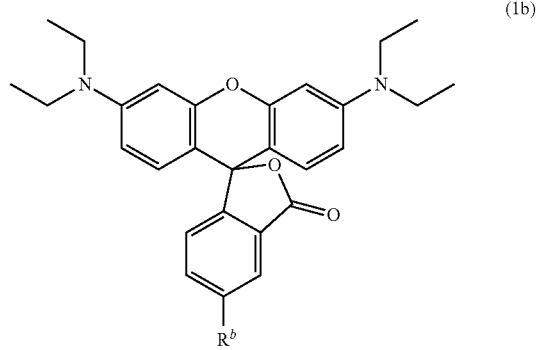

(1b)

-continued

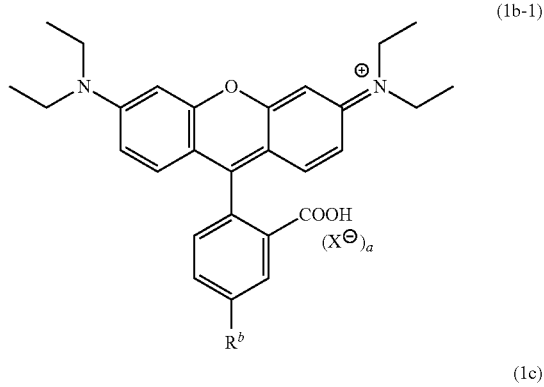
(1b-1)

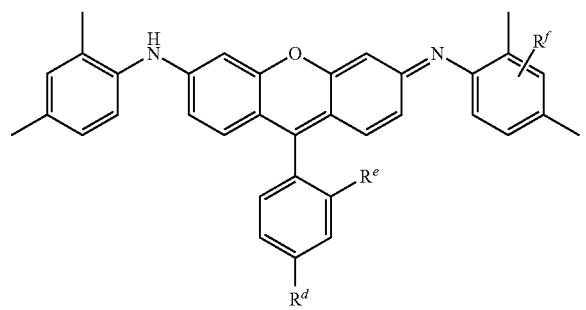
(1c)

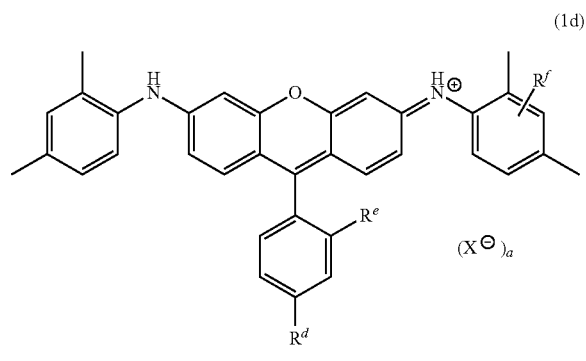
(1d)

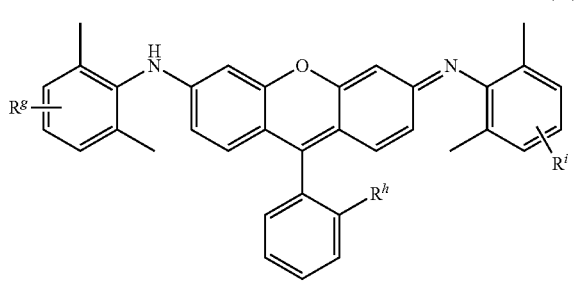
(1e)

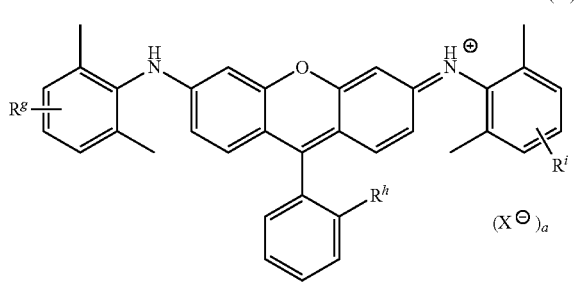
(1f)

In Formulae (1a) to (1f), each of $R^b$ and $R^c$ independently represents a hydrogen atom, —SO$_3$—, —CO$_2$H, or —SO$_2$NHR$^a$. Each of $R^d$, $R^e$, and $R^f$ independently represents —SO$_3$—, —SO$_3$Na, or —SO$_2$NHR$^a$.

Each of $R^g$, $R^h$, and $R^i$ independently represents a hydrogen atom, —SO$_3$—, —SO$_3$H, or —SO$_2$NHR$^a$.

$R^a$ represents an alkyl group having 1 to 10 carbon atoms and preferably represents a 2-ethylhexyl group. X and a have the same definition as described above.

The compound represented by Formula (1b) is a tautomer of the compound represented by Formula (1b-1).

Among the above compounds, in view of color characteristics and heat resistance, Formulae (1e) and (1f) are particularly preferable.

(Cyanine Dye)

One of the embodiments of the dye multimer according to the present invention is a dye multimer having a partial structure derived from a cyanine dye (cyanine compound). Such a dye multimer (A) includes a dye multimer that has, as a partial structure of a dye moiety, a partial structure derived from a compound (cyanine compound) represented by the following Formula (PM). The cyanine compounds in the present invention collectively refer to compounds having a dye moiety containing a cyanine skeleton in a molecule thereof.

[Chem. 26]

Formula (PM)

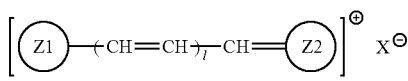

In Formula (PM), each of a ring Z1 and ring Z2 independently represents a heterocycle that may have a substituent. l represents an integer from 0 to 3, and X$^-$ represents an anion.

Each of the ring Z1 and the ring Z2 independently includes, for example, oxazole, benzoxazole, oxazoline, thiazole, thizoline, benzothiazole, indolenine, benzoindolenine, 1,3-thiadiazine, and the like.

The substituents that the ring Z1 and the ring Z2 may have are the same substituents exemplified in the above section of Substituent Group A. Examples of X$^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. X may be linked to the dye skeleton, or may be linked to a portion (polymer chain or the like) of the dye multimer.

The compound represented by Formula (PM) is preferably a compound represented by the following Formula (PM-2).

[Chem. 27]

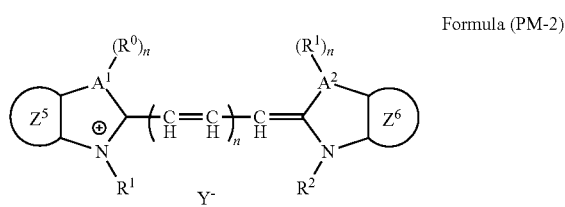

Formula (PM-2)

In Formula (PM-2), each of a ring $Z^5$ and a ring $Z^6$ independently represents a benzene ring that may have a substituent or a naphthalene ring that may have a substituent.

$Y^-$ represents $Cl^-$, $Br^-$, $I^-$, $ClO_4^-$, $OH^-$, a monovalent organic carboxylic acid anion, a monovalent organic sulfonate anion, a monovalent boron anion, or a monovalent organic metal complex anion. $Y^-$ may be linked to the dye skeleton, or may be linked to a portion (polymer chain or the like) of the dye multimer.

n represents an integer from 0 to 3.

Each of $A^1$ and $A^2$ independently represents an oxygen atom, a sulfur atom, a selenium atom, a carbon atom, or a nitrogen atom.

Each of $R^1$ and $R^2$ independently represents a monovalent aliphatic hydrocarbon group having 1 to 20 carbon atoms that may have a substituent.

Each of $R^3$ and $R^4$ independently represents a hydrogen atom, a monovalent aliphatic hydrocarbon group having 1 to 6 carbon atoms, or represents a divalent aliphatic hydrocarbon group having 2 to 6 carbon atoms that is formed when one $R^3$ and one $R^4$ are linked to each other.

Each of a and b independently represents an integer from 0 to 2.

In Formula (PM-2), $Y^-$ is preferably a fluorine anion, a chlorine anion, a bromine anion, an iodine anion, a perchlorate anion, or a carboxylic acid anion, and most preferably a chlorine anion, a perchlorate anion, or a carboxylic acid anion. n is preferably 1. Each of $A^1$ and $A^2$ preferably independently represents an oxygen atom, a sulfur atom, or a carbon atom, and most preferably, both the $A^1$ and $A^2$ represent a carbon atom.

Specific examples of the cyanine compounds will be shown below, but the present invention is not limited thereto.

[Chem. 28]

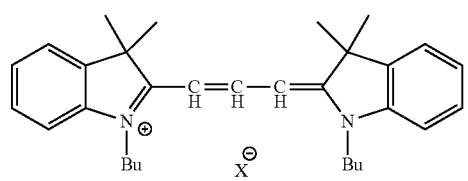
(pm-1)

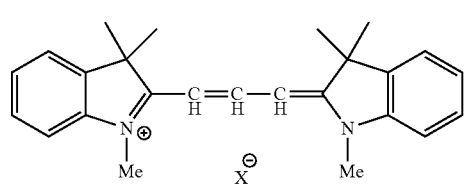
(pm-2)

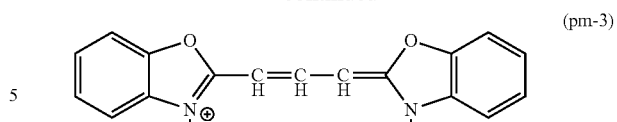
(pm-3)

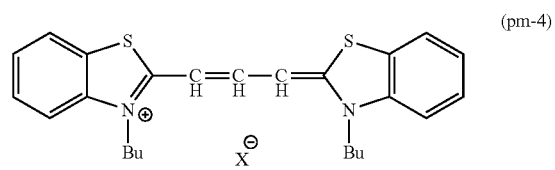
(pm-4)

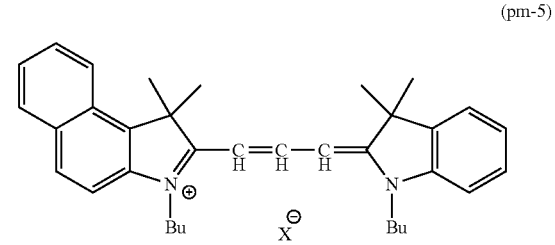
(pm-5)

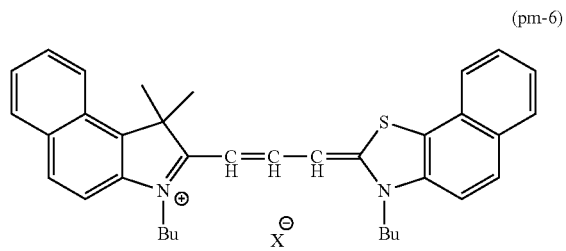
(pm-6)

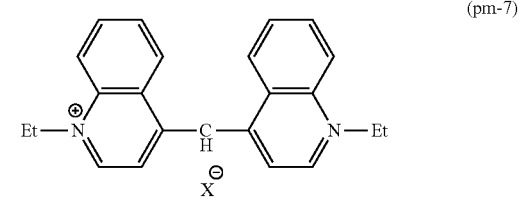
(pm-7)

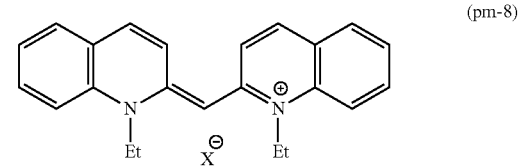
(pm-8)

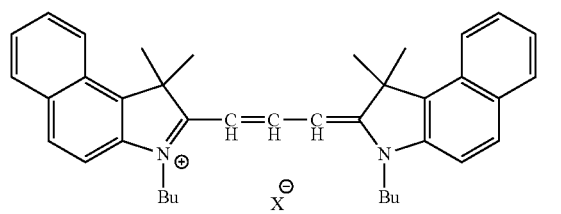
(pm-9)

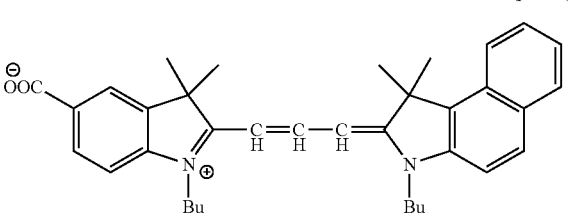
(pm-10)

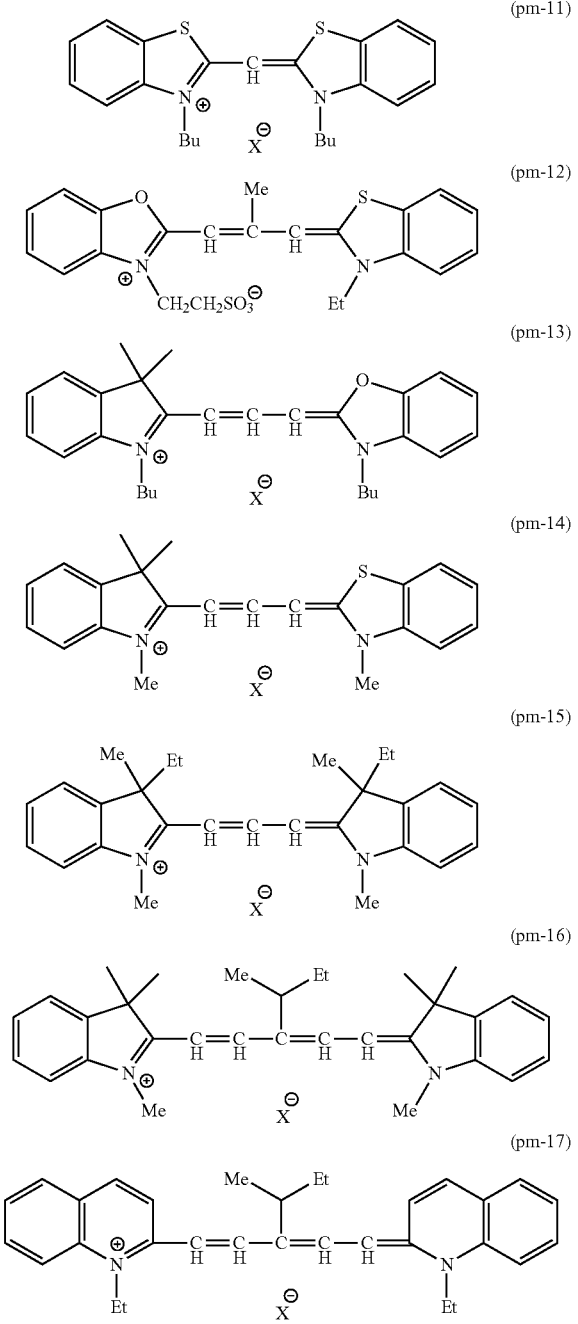

Among the specific examples, structures represented by (pm-1) to (pm-6), (pm-9), and (pm-10) are preferable, and among these, from the viewpoint of color characteristics and heat resistance, dye structures represented by (pm-1), (pm-2), and (pm-10) are particularly preferable.

(Squarylium Dye)

One of the embodiments of the dye multimer according to the present invention is a dye multimer having a partial structure derived from a squarylium dye (squarylium compound). Such a dye multimer (A) includes a resin having a dye multimer that has, as a partial structure of a dye moiety, a partial structure derived from a compound (squarylium compound) represented by the following Formula (K). The squarylium compounds in the present invention collectively refer to compounds having a dye moiety containing a squarylium skeleton in a molecule thereof.

[Chem. 29]

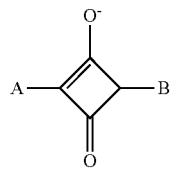

Formula (K)

In Formula (K), each of A and B independently represents an aryl group or a heterocyclic group. The aryl group is an aryl group preferably having 6 to 48 carbon atoms and more preferably having 6 to 24 carbon atoms, and examples thereof include phenyl, naphthyl, and the like. The heterocyclic group is preferably a 5-membered or 6-membered heterocyclic group, and examples thereof include pyrrolyl, imidazolyl, pyrazolyl, thienyl, pyridyl, pyrimidyl, pyridazyl, triazol-1-yl, thienyl, furyl, thiadiazolyl, and the like.

The compound represented by Formula (K) is particularly preferably a compound represented by the following Formula (K-1), Formula (K-2), Formula (K-3), or Formula (K-4).

[Chem. 30]

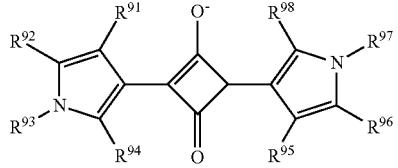

Formula (K-1)

In Formula (K-1), each of $R^{91}$, $R^{92}$, $R^{94}$, $R^{95}$, $R^{96}$, and $R^{98}$ independently represents a hydrogen atom, a halogen atom, a linear or branched alkyl group, a cycloalkyl group, a linear or branched alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, a furylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, or a silyl group.

Each of $R^{93}$ and $R^{97}$ independently represents a hydrogen atom, a linear or branched alkyl group, a cycloalkyl group, a cycloalkenyl group, an alkynyl group, an aryl group, or a heterocyclic group.

$R^{91}$ and $R^{92}$, and $R^{95}$ and $R^{96}$ may respectively form a ring by being linked to each other.

The substituents that $R^{91}$, $R^{92}$, $R^{94}$, $R^{95}$, $R^{96}$, and $R^{98}$ in Formula (K-1) may have have the same definition as the substituents exemplified in the above section of Substituent Group A.

It is preferable for each of $R^{91}$ to $R^{98}$ to be independently a hydrogen atom, an alkyl group, a hydroxyl group, an amino group, an aryl group, or a heterocyclic group. More preferably, $R^{93}$, $R^{94}$, $R^{97}$, and $R^{98}$ are an alkyl group, and $R^{91}$ and $R^{92}$ and $R^{95}$ and $R^{96}$ form an aryl ring by being linked to each other. Most preferably, $R^{93}$, $R^{94}$, $R^{97}$, and $R^{98}$ are an alkyl group having 1 to 20 carbon atoms, and $R^{91}$ and $R^{92}$ and $R^{95}$ and $R^{96}$ form a benzene ring by being linked to each other.

[Chem. 31]

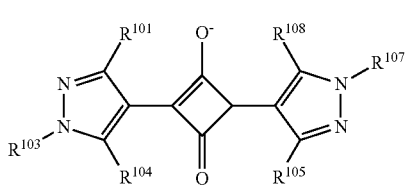

Formula (K-2)

In Formula (K-2), $R^{101}$, $R^{103}$, $R^{104}$, $R^{105}$, $R^{107}$, and $R^{108}$ have the same definition as $R^{91}$, $R^{93}$, $R^{94}$, $R^{95}$, $R^{97}$, and $R^{98}$ in the Formula (K-1) respectively. $R^{103}$ and $R^{107}$ have the same definition as $R^{93}$ and $R^{97}$ in the Formula (K-1).

In Formula (K-2), $R^{101}$, $R^{103}$, $R^{104}$, $R^{105}$, $R^{107}$, and $R^{108}$ are preferably a hydrogen atom, an alkyl group, a hydroxy group, an amino group, an aryl group, or a heterocyclic group. More preferably, $R^{101}$, $R^{103}$, $R^{105}$, and $R^{107}$ are an alkyl group or an aryl group, and $R^{104}$ and $R^{108}$ are a hydroxy group or an amino group. Even more preferably, $R^{101}$, $R^{103}$, $R^{105}$ and $R^{107}$ are an alkyl group having 1 to 20 carbon atoms, and $R^{104}$ and $R^{108}$ are a hydroxy group. $R^{103}$ and $R^{107}$ are preferably a hydrogen atom, a linear or branched alkyl group, and an aryl group, and more preferably an alkyl group having 1 to 5 carbon atoms and a phenyl group.

[Chem. 32]

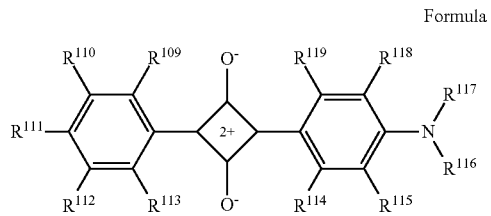

Formula (K-3)

In Formula (K-3), $R^{109}$, $R^{110}$, $R^{111}$, $R^{112}$, $R^{113}$, $R^{114}$, $R^{115}$, $R^{118}$, and $R^{119}$ have the same definition as $R^{91}$, $R^{93}$, $R^{94}$, $R^{95}$, $R^{97}$, and $R^{98}$ in the Formula (K-1). $R^{116}$ and $R^{117}$ have the same definition as $R^{93}$ and $R^{97}$ in the Formula (K-1).

In Formula (K-3), $R^{109}$, $R^{110}$, $R^{111}$, $R^{112}$, $R^{113}$, $R^{114}$, $R^{115}$, $R^{118}$, and $R^{119}$ are preferably a hydrogen atom, a halogen atom, a linear or branched alkyl group, a hydroxy group, or an alkoxy group. Particularly, $R^{109}$, $R^{113}$, $R^{115}$, $R^{118}$, and $R^{119}$ are most preferably a hydrogen atom, $R^{110}$, $R^{111}$, and $R^{112}$ are most preferably a hydrogen atom or an alkoxy group, and $R^{114}$ is most preferably a hydrogen atom, a halogen atom, a hydroxy group, an alkyl group having 1 to 5 carbon atoms, or an alkoxy group having 1 to 5 carbon atoms.

[Chem. 33]

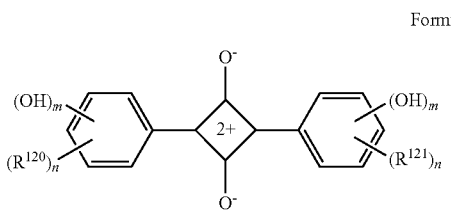

Formula (K4)

In Formula (K-4), $R^{120}$ represents a halogen atom, an alkyl group, an alkoxy group, or an alkenyl group. m represents an integer from 1 to 4, n represents an integer from 0 to 4.

$R^{120}$ is particularly preferably an alkyl group having 1 to 5 carbon atoms or an alkoxy group having 1 to 5 carbon atoms. m is preferably 1 to 3 and most preferably 3. n is preferably 0 to 3 and more preferably 0 or 1.

In the present invention, as the dye compound that can form a dye structure, from the viewpoint of color hue, the squarylium compound represented by the Formula (K-1) is preferable.

The squarylium compounds represented by the Formulae (K-1) to (K-4) can be synthesized using the method described in J. Chem. Soc., Perkin Trans. 1, 2000, p. 599.

Specific examples of the squarylium compounds represented by Formulae (K-1) to (K-4) will be shown below, but the present invention is not limited thereto.

[Chem. 34]

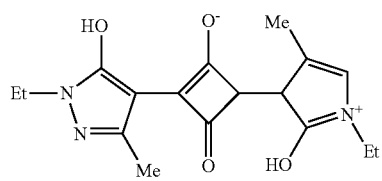

(sq-1)

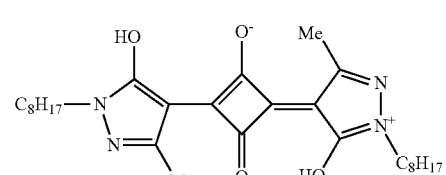

(sq-2)

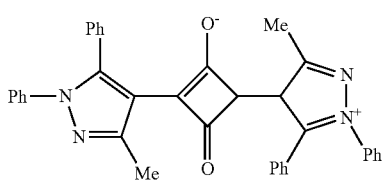

(sq-3)

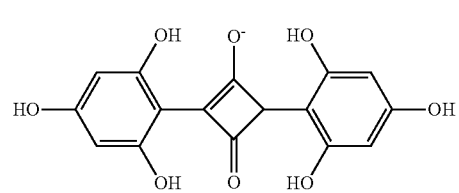

(sq-4)

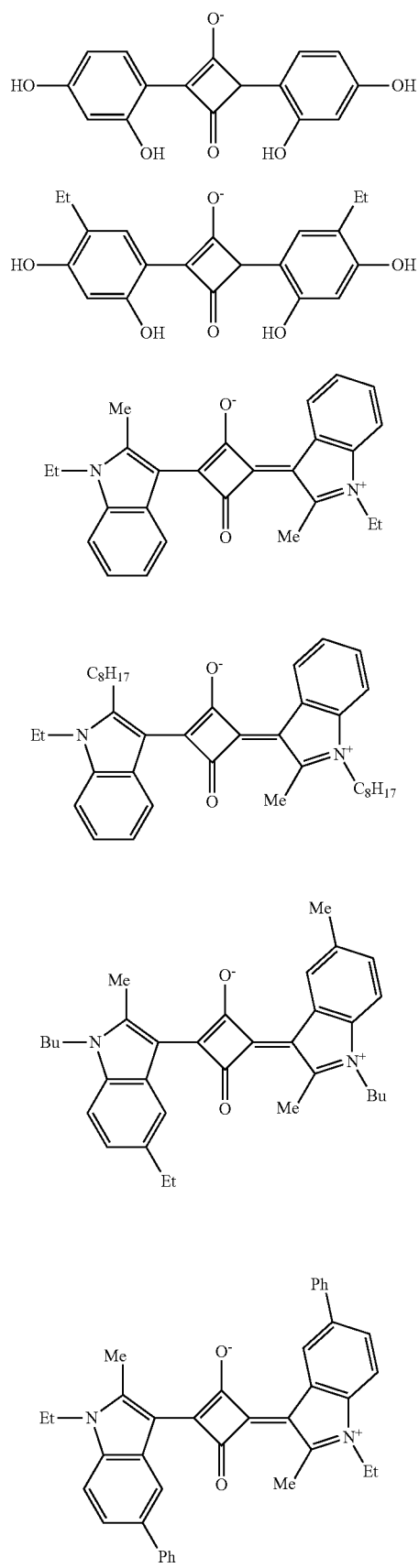
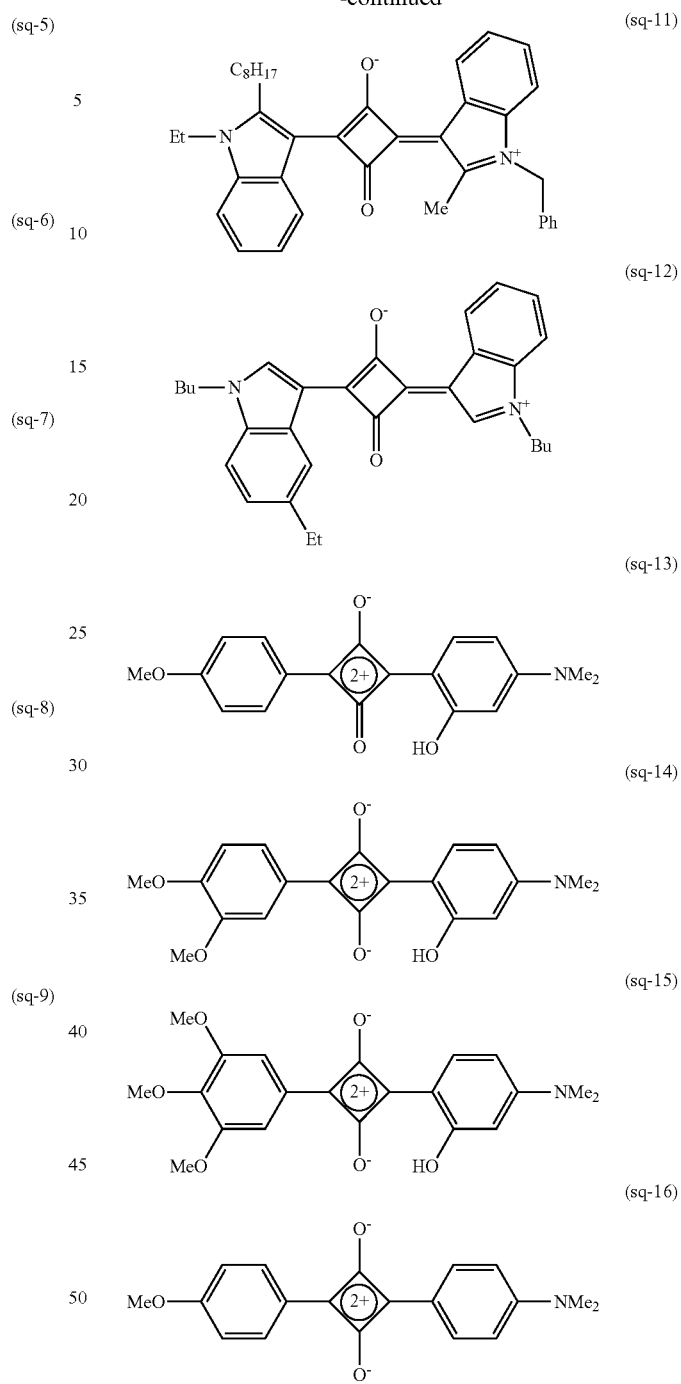

Among the above specific examples, from the viewpoint of color characteristics and heat resistance, (sq-1), (sq-2), (sq-3), (sq-7), (sq-8), (sq-9), (sq-10), (sq-11), and (sq-12) are preferable.

(Quinophthalone Dye)

One of the embodiments of the dye multimer according to the present invention is a dye multimer having a partial structure derived from a quinophthalone dye (quinophthalone compound). Such a dye multimer (A) includes a dye multimer that has, as a partial structure of a dye moiety, a partial structure derived from a compound (quinophthalone compound) represented by the following Formula (QP). The quinophthalone compound in the present invention collectively refers to compounds having a dye moiety containing a quinophthalone skeleton in a molecule thereof.

[Chem. 35]

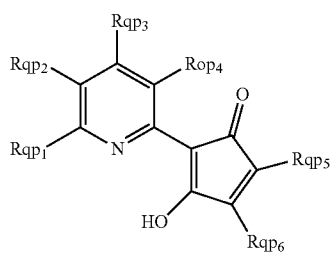

Formula (QP)

In Formula (QP), each of $Rqp_1$ to $Rqp_6$ independently represents a hydrogen atom or a substituent. When at least two out of $Rqp_1$ to $Rqp_6$ are adjacent to each other, these may form a ring by being bonded to each other, and the ring may further have a substituent.

The substituents represented by $Rqp_1$ to $Rqp_6$ represent the substituents exemplified in the above section of Substituent Group A. As the substituents represented by $Rqp_1$ to $Rqp_6$, a halogen atom, an alkyl group, an alkenyl group, and an aryl group are preferable. It is particularly preferable for $Rqp_1$ and $Rqp_2$ and $Rqp_5$ and $Rqp_6$ to form a substituted or unsubstituted phenyl ring by being linked to each other. $Rqp_3$ and $Rqp_4$ are preferably a hydrogen atom, a chlorine atom, or a bromine atom.

Examples of the substituents that the phenyl ring formed by $Rqp_1$ and $Rqp_2$ and $Rqp_5$ and $Rqp_6$ linked to each other may have include the substituents exemplified in the above section of the substituent, and among the substituents, a halogen atom, a carbamoyl group, an amino group, an alkoxy group, an aryloxy group, an alkylthio group, an arylthio group, and an alkoxycarbonyl group are preferable.

Specific examples of the compound represented by Formula (QP) will be shown below, but the present invention is not limited thereto.

[Chem 36.]

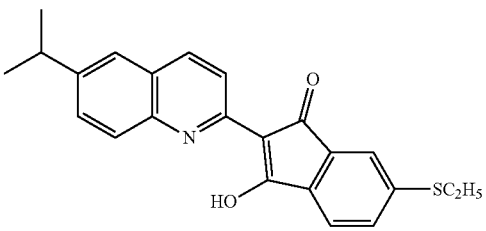

(QP-1)

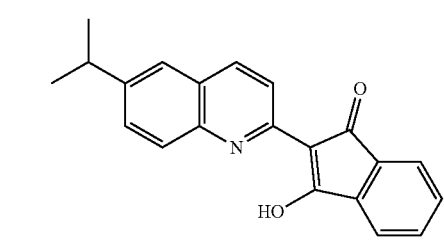

(QP-2)

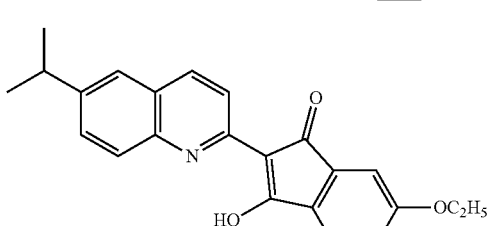

(QP-3)

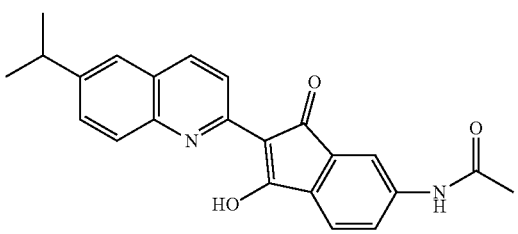

(QP-4)

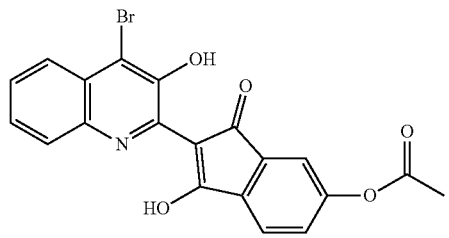

(QP-5)

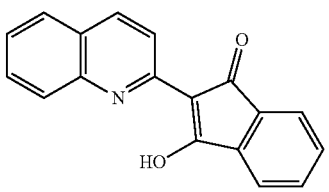

(QP-6)

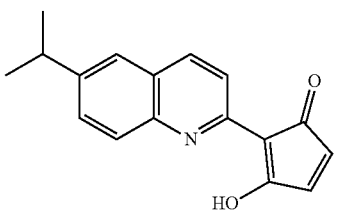

(QP-7)

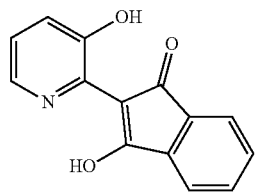

(QP-8)

(QP-9)

Among the above specific examples, from the viewpoint of color characteristics and heat resistance, (QP-1) to (QP-5) are preferable.

(Phthalocyanine Dye)

One of the embodiments of the dye multimer according to the present invention is a dye multimer having a partial structure derived from a phthalocyanine dye (phthalocyanine compound). Such a dye multimer (A) includes a dye multimer that has, as a partial structure of a dye moiety, a partial structure derived from a compound (phthalocyanine compound) represented by the following Formula (F). The phthalocyanine compound in the present invention collectively refers to compounds having a dye moiety containing a phthalocyanine skeleton in a molecule thereof.

[Chem. 37]

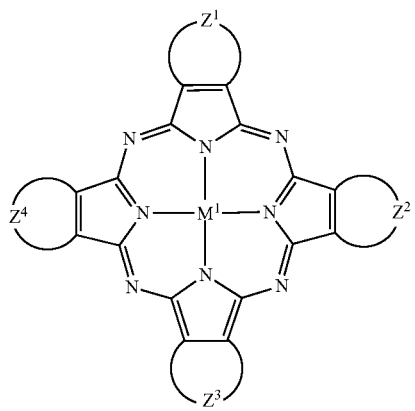

Formula (F)

In Formula (F), $M^1$ represents metals, and each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom.

Formula (F) will be described in detail.

In Formula (F), the metals represented by $M^1$ include, for example, metal atoms such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$. Among these, Cu and Zn are particularly preferable.

In Formula (F), each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom. The 6-membered ring may be a saturated or unsaturated ring and may be unsubstituted or have a substituent. Examples of the substituent include the substituents exemplified in the above section of Substituent Group A. Moreover, when the 6-membered ring has two or more substituents, these substituents may be the same as or different from each other. Further, the 6-membered ring may be condensed with another 5- or 6-membered ring.

The 6-membered ring includes a benzene ring, a cyclohexane ring, and the like.

Among residues of the phthalocyanine dye represented by Formula (F), a residue derived from a phthalocyanine dye represented by the following Formula (F-1) is particularly preferable.

[Chem. 38]

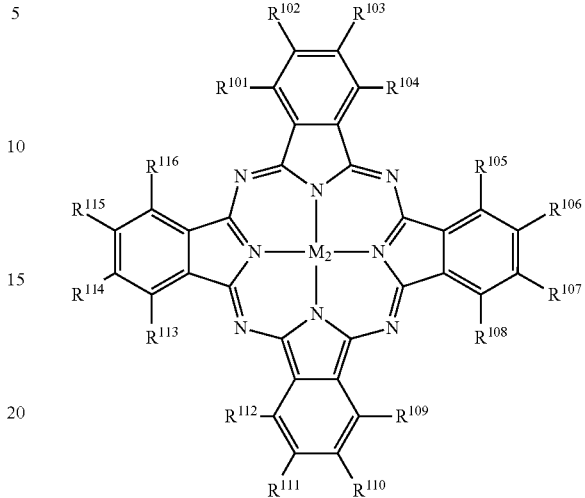

Formula (F-1)

In Formula (F-1), $M^2$ has the same definition as $M^1$ in the Formula (F), and the preferable embodiments thereof are also the same.

In the Formula (F-1), each of $R^{101}$ to $R^{116}$ independently represents a hydrogen atom or a substituent. When the substituents represented by $R^{101}$ to $R^{116}$ are groups that can be further substituted, the groups may be substituted with the substituents described in the above section of Substituent Group A, and when the groups are substituted with two or more substituents, these substituents may be the same as or different from each other.

The substituents represented by $R^{101}$ to $R^{116}$ are preferably a hydrogen atom, $SO_2NR^{117}R^{118}$ ($R^{117}$ and $R^{118}$ are a hydrogen atom or a linear or branched alkyl group having 3 to 20 carbon atoms that may have a substituent), or $SR^{119}$ ($R^{119}$ is a linear or branched alkyl group having 3 to 20 carbon atoms that may have a substituent), among the above substituents.

Specific examples of compounds represented by Formula (F) will be shown below, but the present invention is not limited thereto.

[Chem. 39]

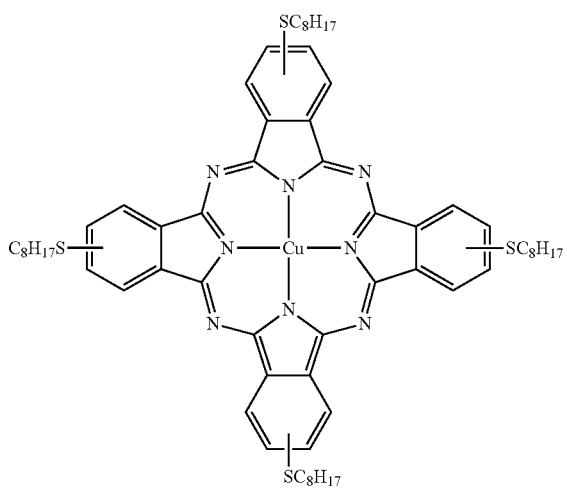

(Ph-1)

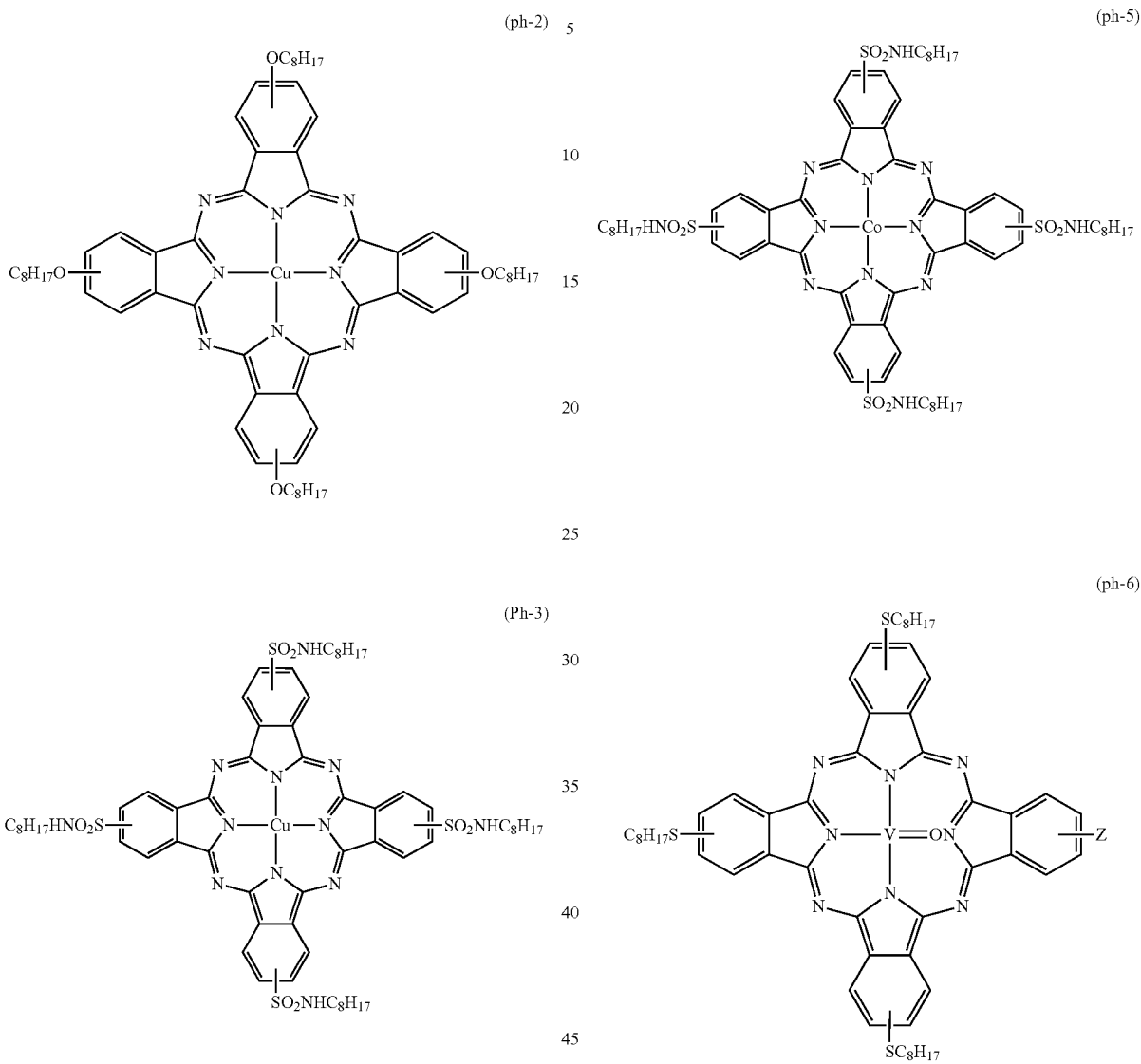

Among the above specific examples, from the viewpoint of color characteristics and heat resistance, (Ph-1) to (Ph-3) are particularly preferable.

(Subphthalocyanine Compound)

One of the embodiments of the dye multimer according to the present invention is a dye multimer having a partial structure derived from a subphthalocyanine dye (subphthalocyanine compound). Such a dye multimer (A) includes a dye multimer that has, as a partial structure of a dye moiety, a partial structure derived from a compound (subphthalocyanine compound) represented by the following Formula (SP). The subphthalocyanine compounds in the present invention collectively refer to compounds having a dye moiety including a subphthalocyanine skeleton in a molecule thereof.

[Chem. 40]

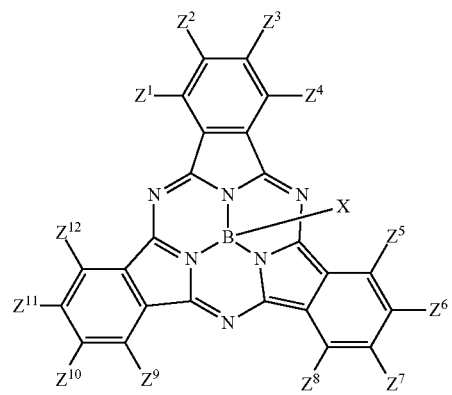

Formula (SP)

In Formula (SP), each of $Z^1$ to $Z^{12}$ independently represents a hydrogen atom, an alkyl group, an aryl group, a hydroxy group, a mercapto group, an amino group, an alkoxy group, an aryloxy group, or a thioether group. X represents an anion.

Formula (SP) will be described in detail.

The alkyl group that $Z^1$ to $Z^{12}$ in Formula (SP) may have represents a linear or branched substituted or unsubstituted alkyl group. Particularly, $Z^1$ to $Z^{12}$ preferably have 1 to 20 carbon atoms, and more preferably have 1 to 10 carbon atoms. Examples of the substituents that $Z^1$ to $Z^{12}$ may have include the substituents exemplified in the above section of Substituent Group A, and among the substituents, a fluorine atom, a hydroxy group, and a mercapto group are particularly preferable.

X in Formula (SP) represents an anion. Specific examples of X include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. X may preferably be linked to a dye skeleton, or may be linked to a portion (polymer chain or the like) of the dye multimer.

X is preferably a fluorine anion, a chlorine anion, a bromine anion, an iodine anion, a perchlorate anion, a carboxylic acid anion, or a phosphate anion, and most preferably a perchlorate anion or a carboxylic acid anion.

Specific examples of subphthalocyanine compounds will be shown below, but the present invention is not limited thereto.

[Chem. 41]

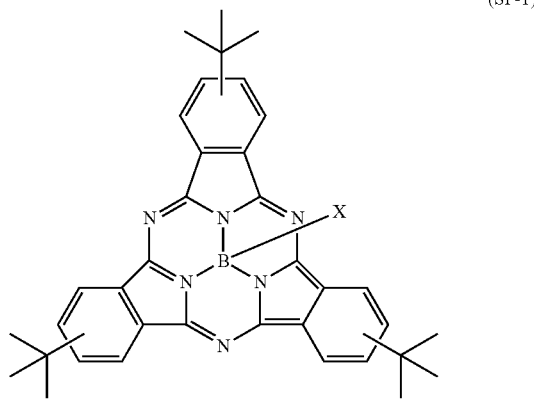

(SP-1)

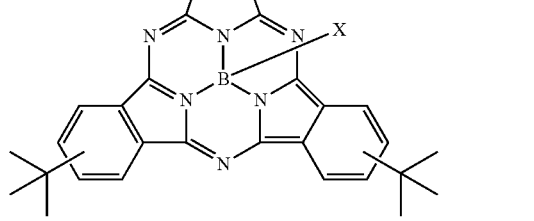

(SP-2)

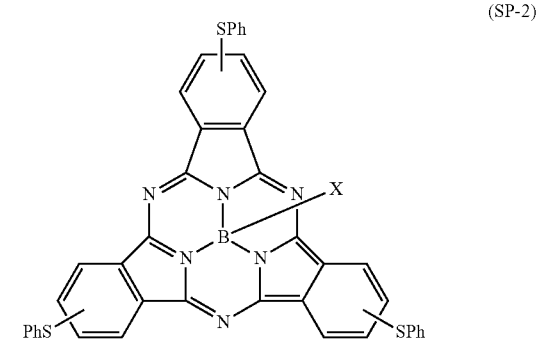

(SP-3)

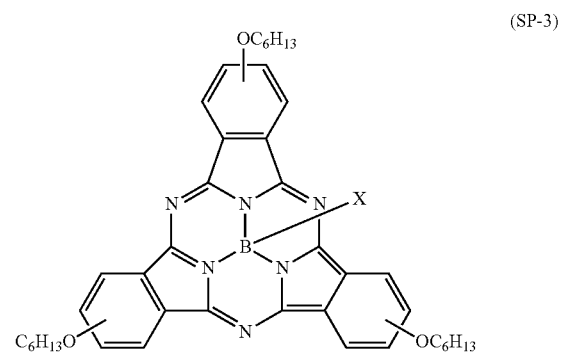

(SP-4)

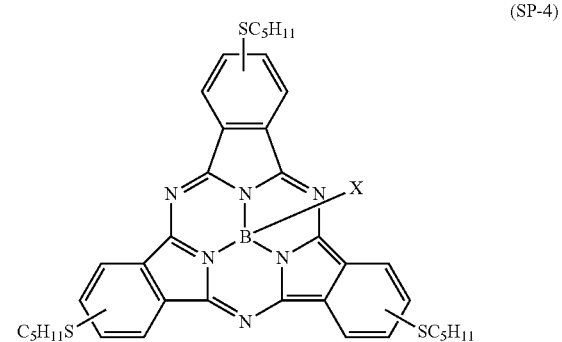

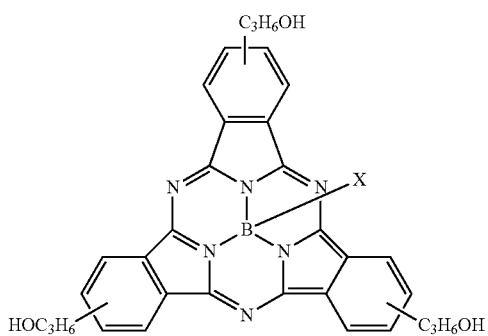
(SP-5)

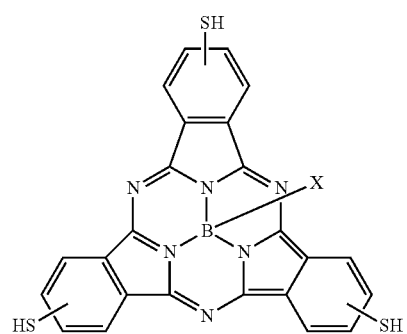
(SP-6)

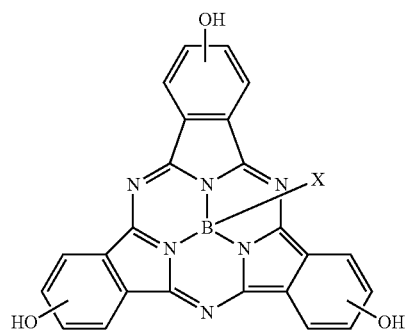
(SP-7)

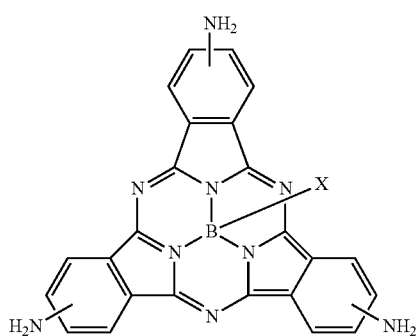
(SP-8)

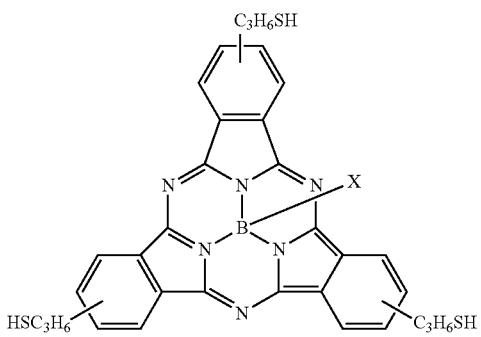
(SP-9)

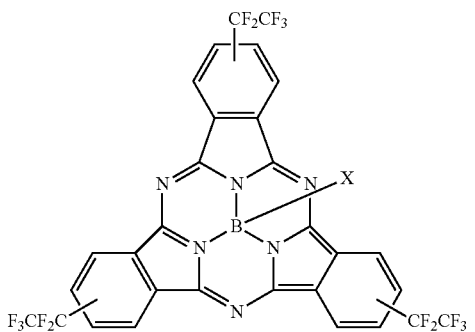
(SP-10)

Among the above specific examples, from the viewpoint of color characteristics and heat resistance, (SP-2), (SP-3), (SP-4), (SP-5), (SP-6), and (SP-7) are particularly preferable.

(Structure of Dye multimer Used for Colored Radiation-Sensitive Composition of the Present Invention)

It is preferable for the dye multimer (A) used for the colored radiation-sensitive composition of the present invention to be a dye multimer, which contains at least one of the structural units represented by the following Formula (A), Formula (B), and Formula (C), or to be a dye multimer represented by Formula (D). These structural units will be sequentially described.

<Structural Unit Represented by Formula (A)>

[Chem. 42]

Formula (A)

In Formula (A), $X_1$ represents a linking group formed by polymerization, and $L_1$ represents a single bond or a divalent linking group. DyeI represents a dye structure.

Hereinafter, Formula (A) will be described in detail.

In Formula (A), $X_1$ represents a linking group formed by polymerization. That is, $X_1$ represents a portion that forms a repeating unit corresponding to a main chain formed by a polymerization reaction. Moreover, the moiety represented by two *s is a repeating unit. $X_1$ is not particularly limited as long as it is a linking group formed of a known polymerizable monomer. Particularly, $X_1$ is preferably linking chains represented by the following (XX-1) to (XX-24), and most preferably (meth)acrylic linking chains represented by (XX-1) and (XX-2), styrene-based linking chains represented by (XX-10) to (XX-17), and a vinyl-based linking chain represented by (XX-24). In (XX-1) to (XX-24), * represents a moiety through which the linking chains are linked to $L_1$. Me represents a methyl group. R in (XX-18) and (XX-19) represents a hydrogen atom, an alkyl group having 1 to 5 carbon atoms, or a phenyl group.
[Chem. 43]
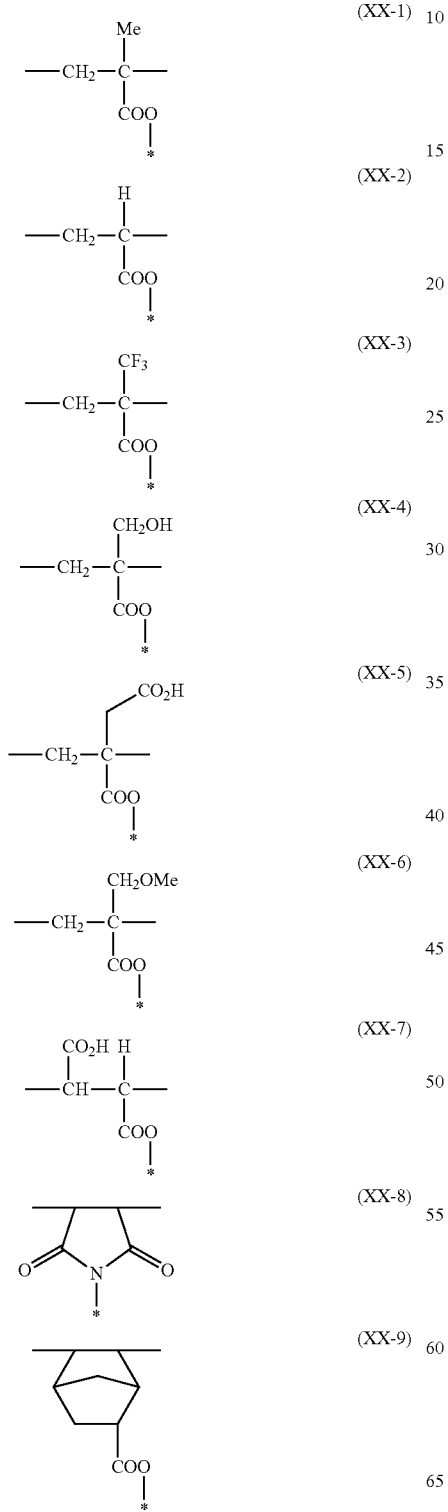
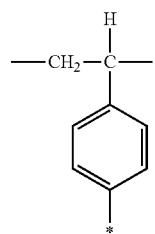
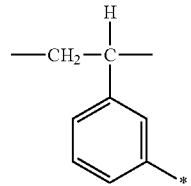
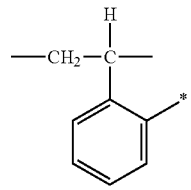
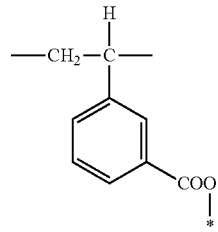
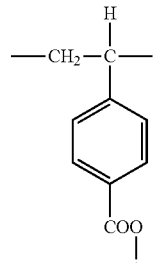
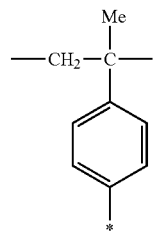

(XX-16) 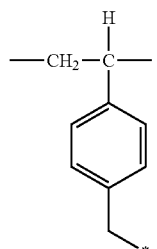

(XX-17) 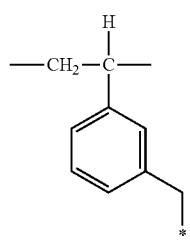

(XX-18) 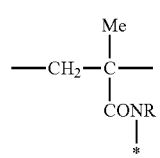

(XX-19) 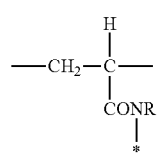

(XX-20) 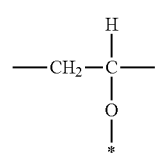

(XX-21) 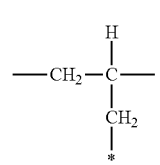

(XX-22) 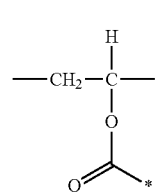

(XX-23) 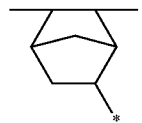

(XX-24) 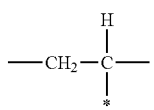

In Formula (A), $L_1$ represents a single bond or a divalent linking group. When $L_1$ represents a divalent linking group, the divalent linking group represents a substituted or unsubstituted alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthalene group), a substituted or unsubstituted heterocyclic linking group, —CH=CH—, —O—, —S—, —C(=O)—, —CO$_2$—, —NR—, —CONR—, —O$_2$C—, —SO—, —SO$_2$—, and a linking group formed of two or more of these linked to each other. Herein, each R independently represents a hydrogen atom, an alkyl group, an aryl group, or a heterocyclic group.

In Formula (A), DyeI represents a dye structure derived from the dye compound described above.

The dye multimer having the structure unit represented by Formula (A) can be synthesized by (1) a method of synthesizing the multimer by means of addition polymerization using a monomer having a dye residue, or (2) a method of synthesizing the multimer by causing a reaction between a polymer, which has a highly reactive functional group such as an isocyanate group, an acid anhydride group, or an epoxy group, and a dye which has a functional group (a hydroxyl group, a primary or secondary amino group, a carboxyl group, or the like) that can react with the highly reactive group.

For the addition polymerization, known addition polymerization (radical polymerization, anionic polymerization, or cationic polymerization) is applicable. Among these, it is particularly preferable for the dye multimer to be synthesized by radical polymerization, since the reaction condition can be set to be mild conditions, and the dye structure is not degraded. For the radical polymerization, known reaction conditions can be applied.

Among these, from the viewpoint of heat resistance, the dye multimer having the structural unit represented by Formula (A) in the present invention is preferably a radical polymer that is obtained by radical polymerization using a dye monomer having an ethylenically unsaturated bond.

Specific examples of structural units represented by Formula (A) will be shown below, but the present invention is not limited thereto.

[Chem. 44]
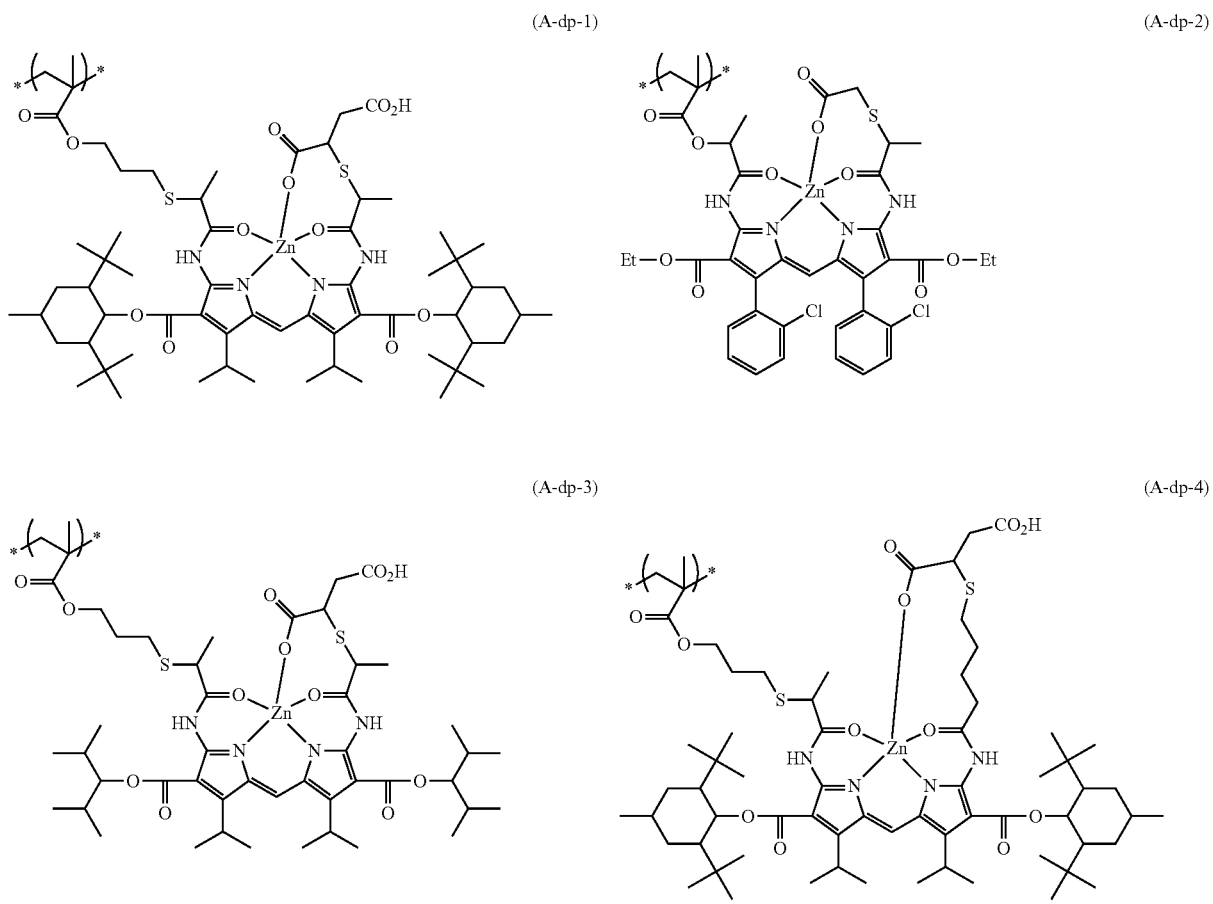
[Chem. 45]
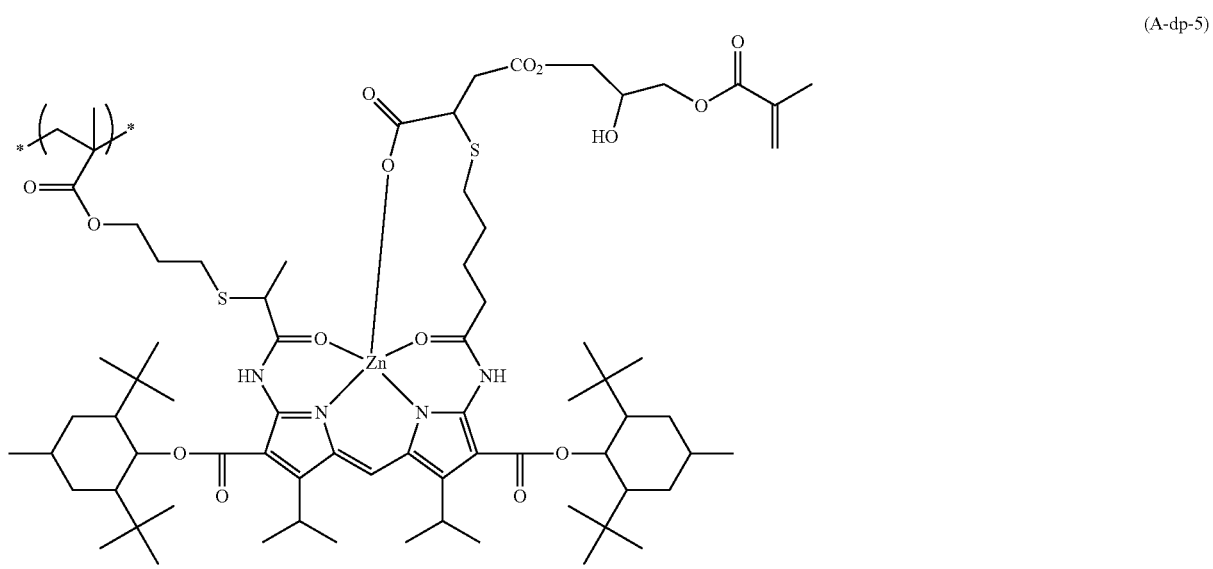

-continued
(A-dp-6)
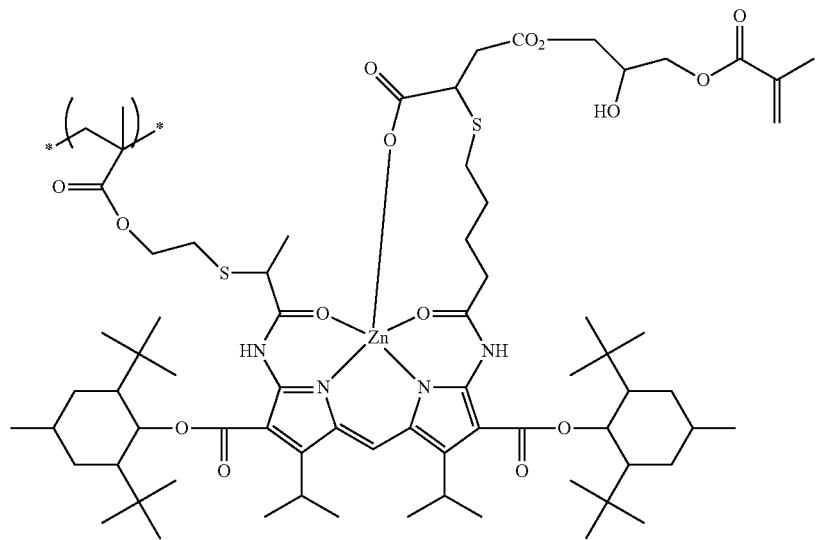
(A-dp-7)
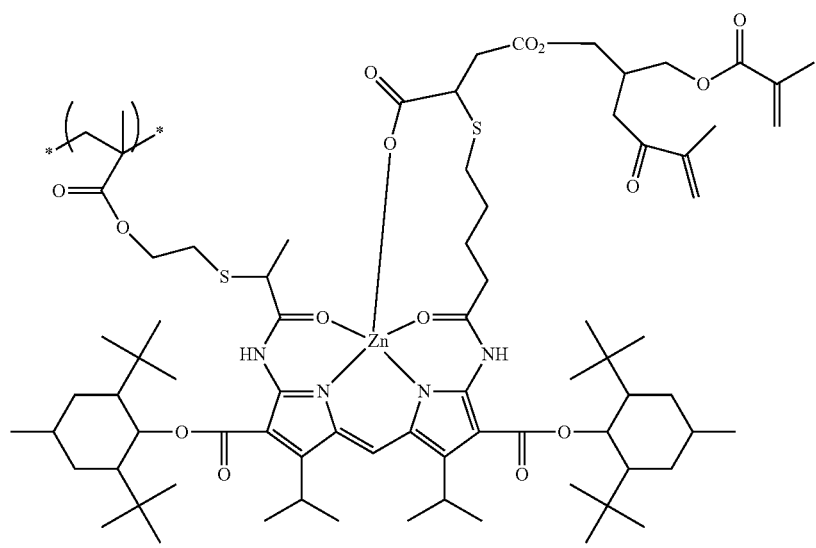
(A-dp-8)
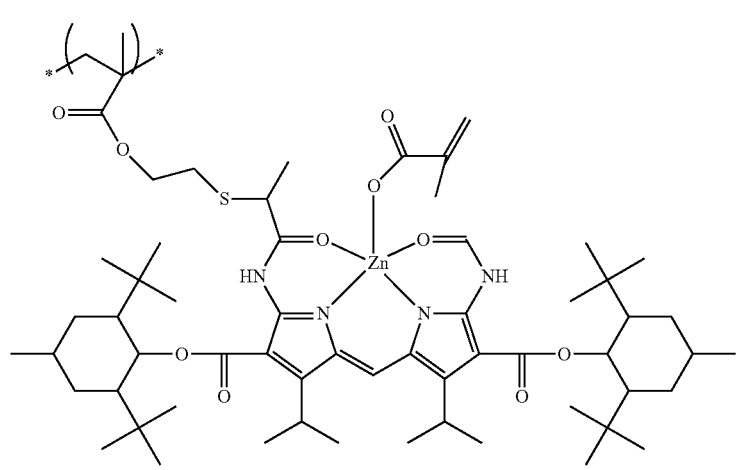

-continued
(A-dp-9)
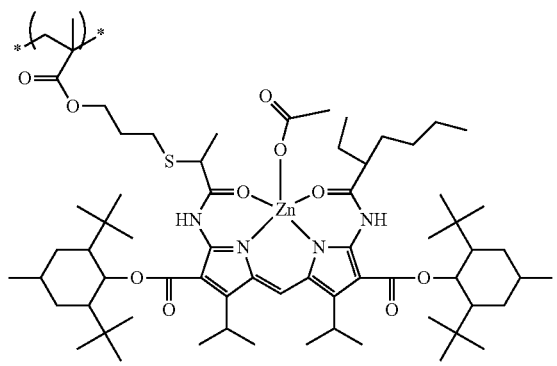
(A-dp-10)
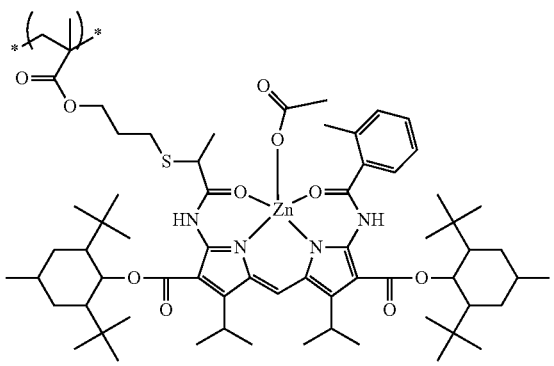
(A-dp-11)
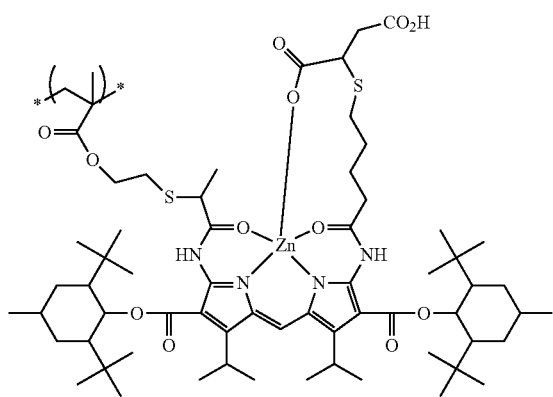
(A-dp-12)
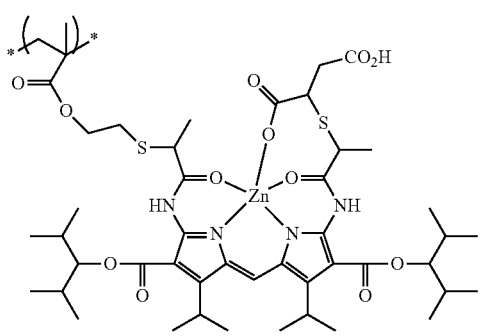
(A-dp-13)
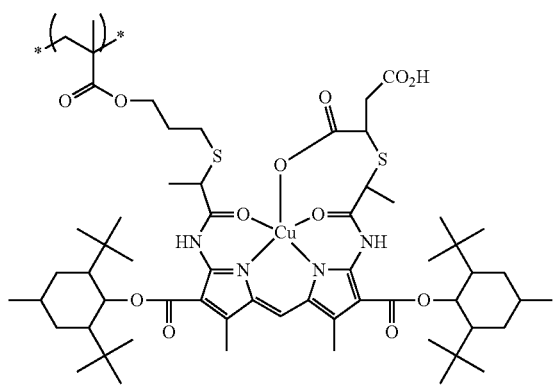
(A-dp-14)
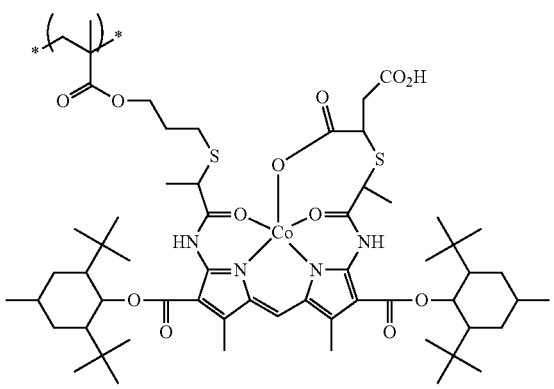

-continued
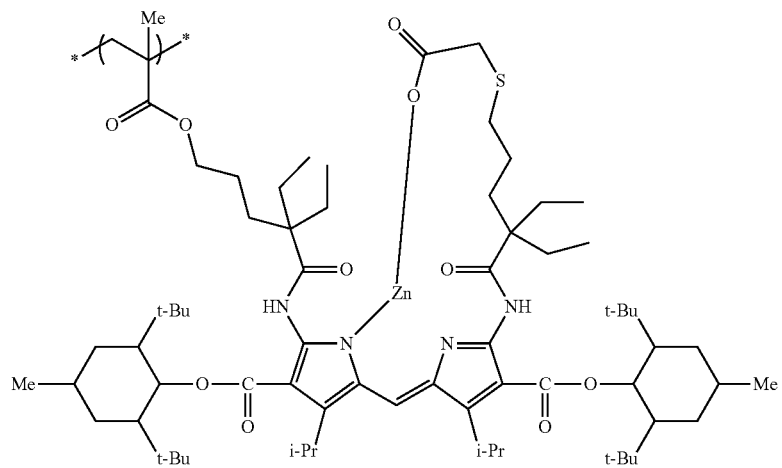
(A-dp-15)
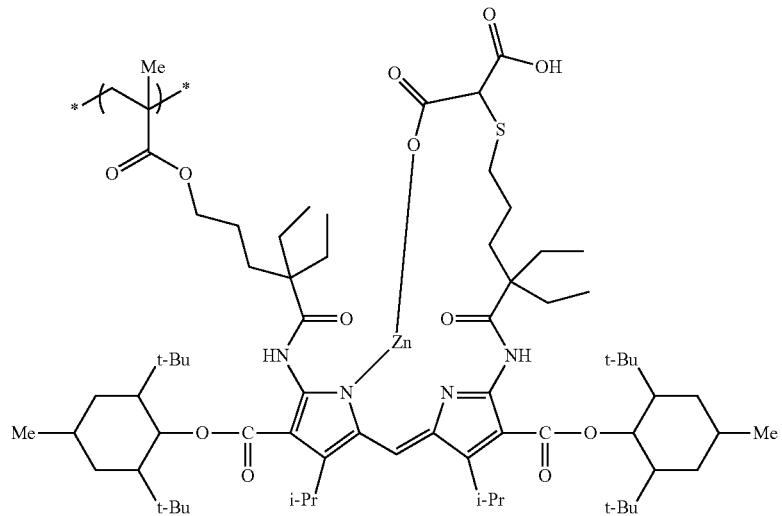
(A-dp-16)
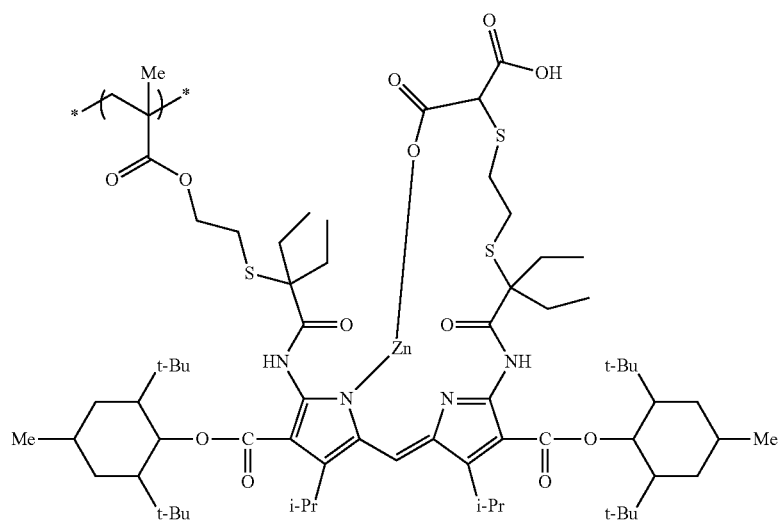
(A-dp-17)

-continued
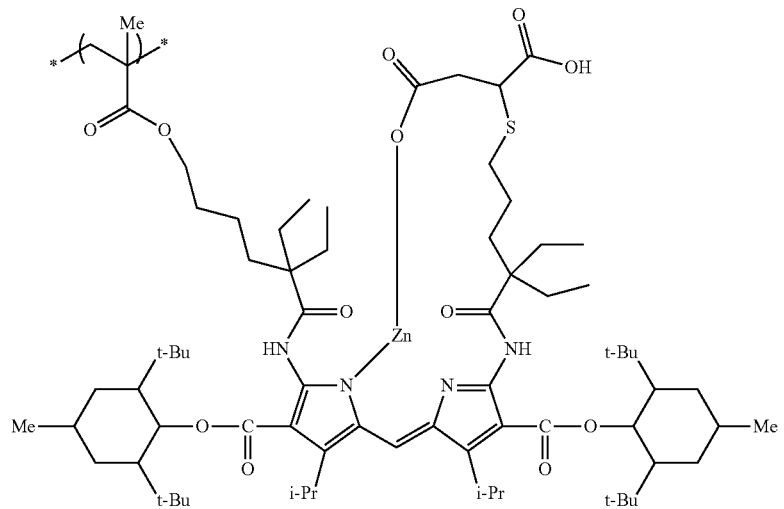
(A-dp-18)
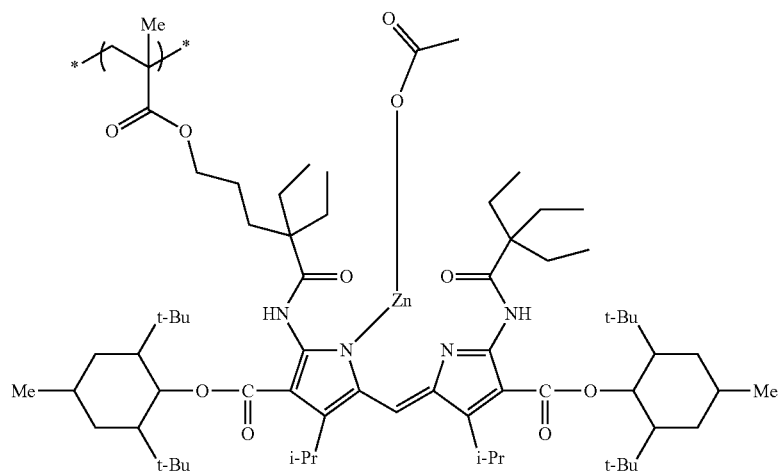
(A-dp-19)
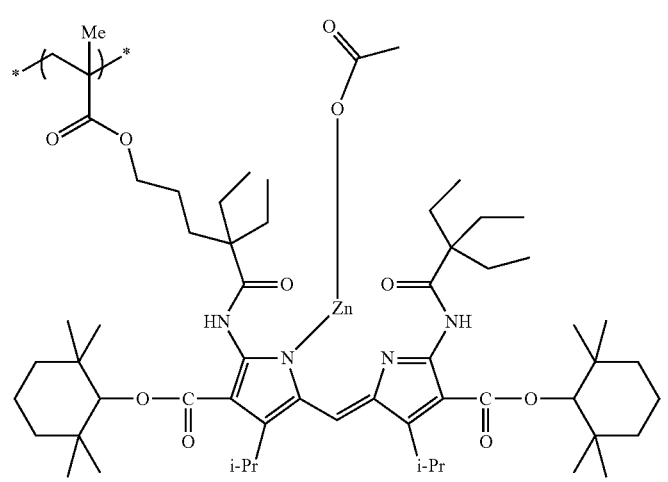
(A-dp-20)

-continued
[Chem. 48]
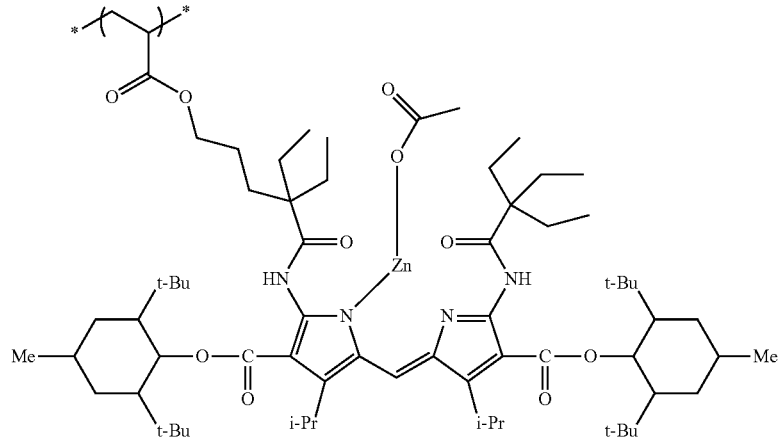
(A-dp-21)
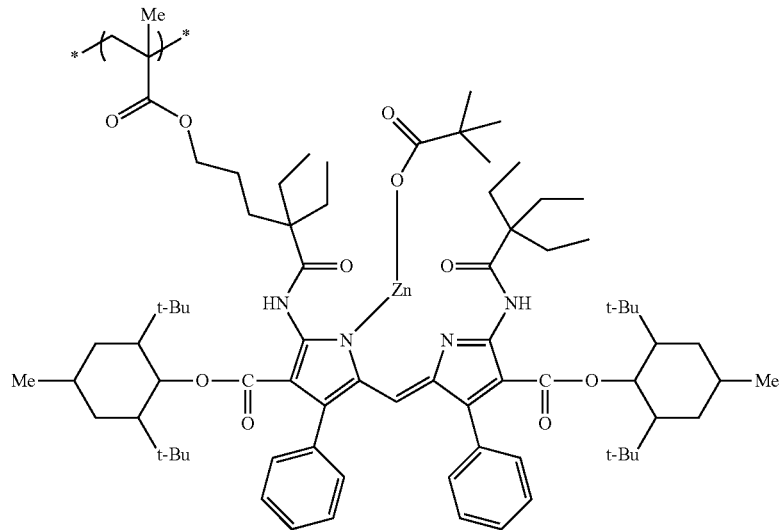
(A-dp-22)
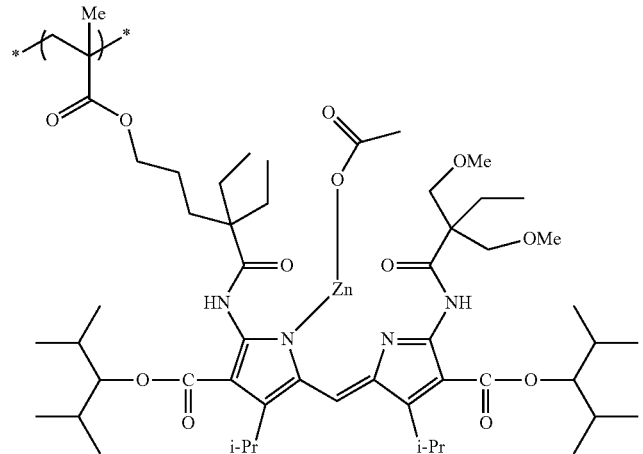
(A-dp-23)

-continued
(A-dp-24)
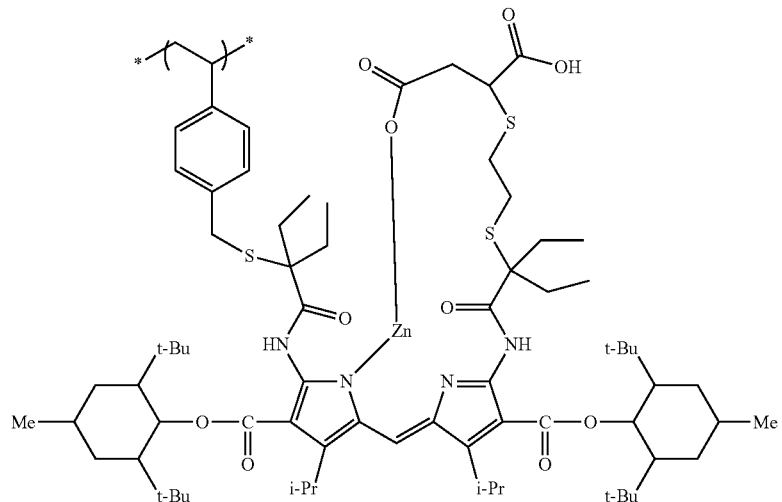
(A-dp-25)
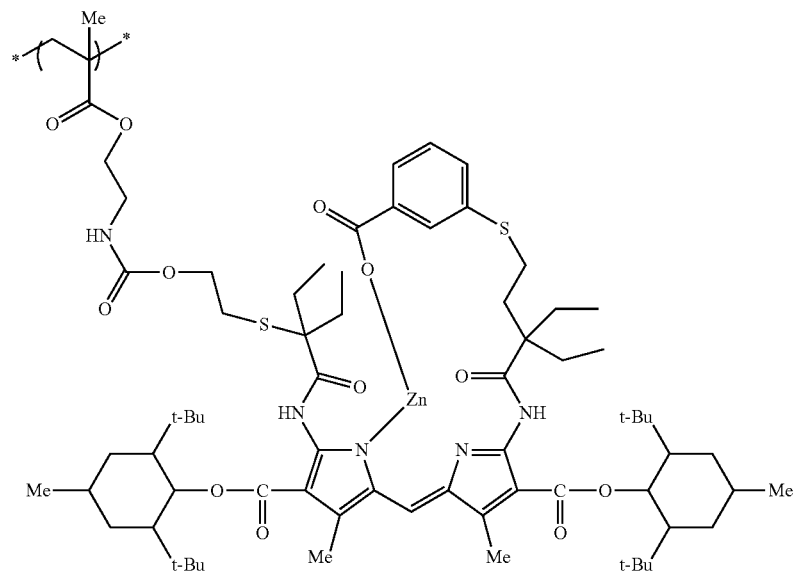
(A-dp-26)
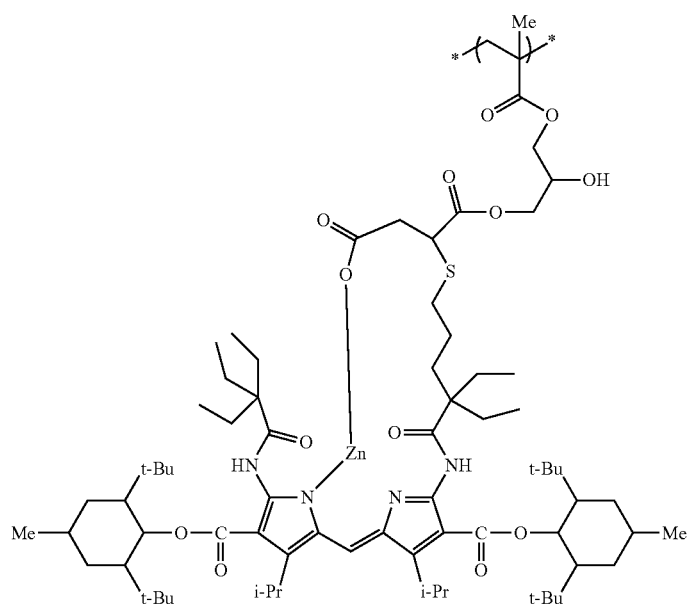

-continued
[Chem. 49]
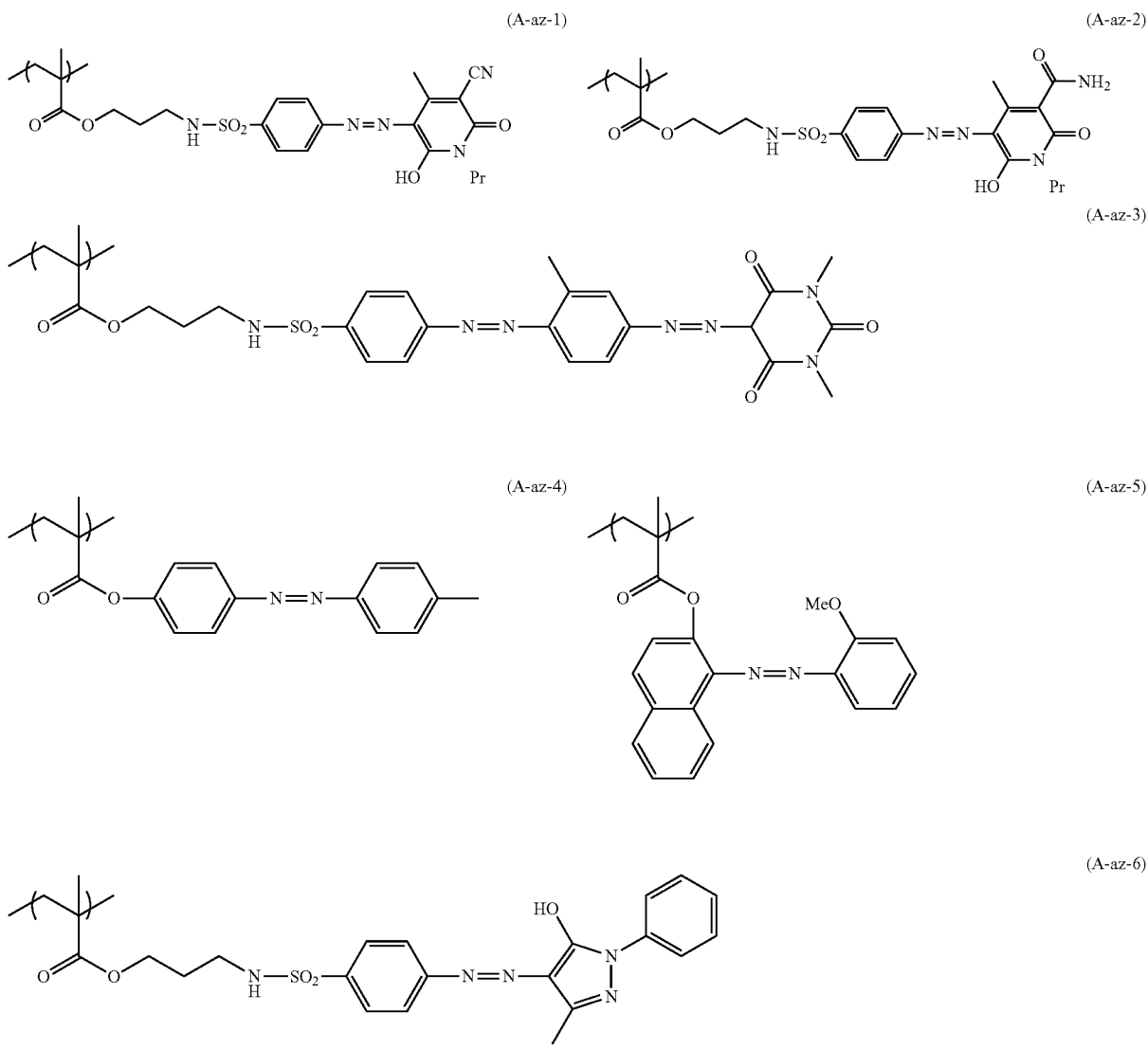
[Chem. 50]
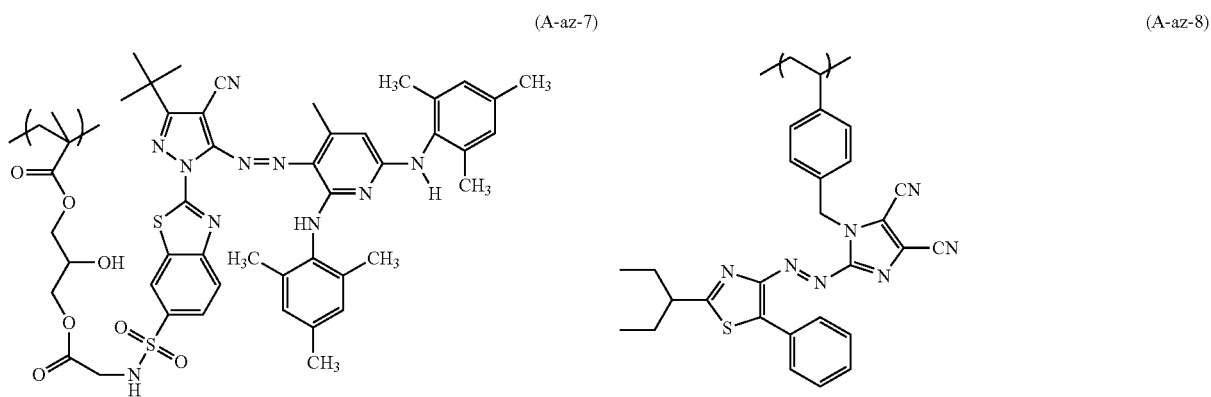

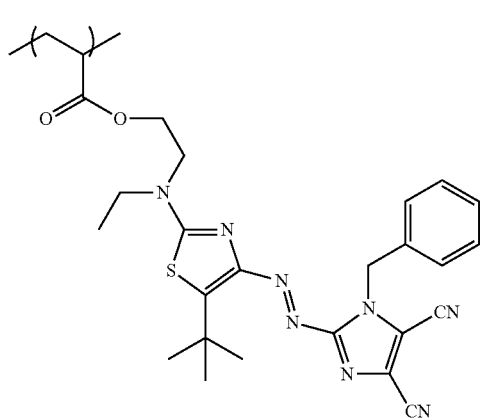 (A-az-9)
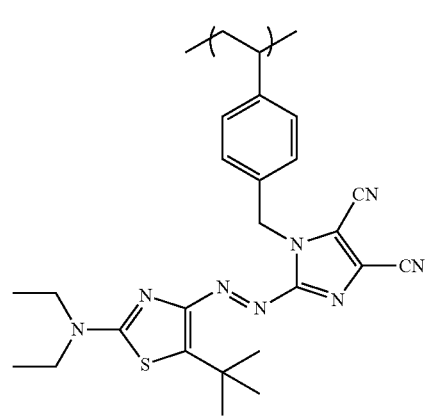 (A-az-10)
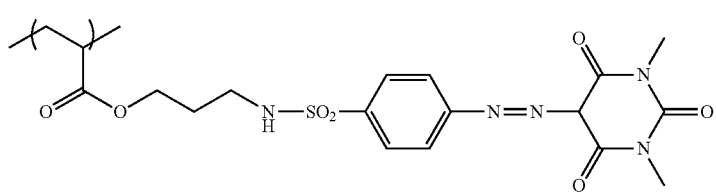 (A-az-11)
[Chem. 51]
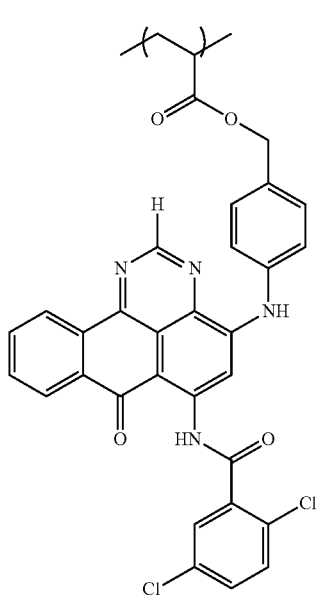 (A-aq-1)
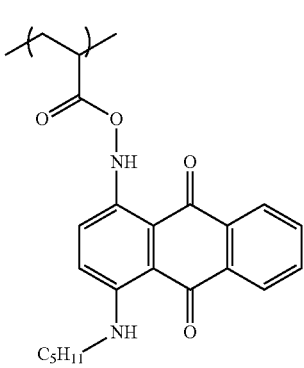 (A-aq-2)

-continued
(A-aq-3)
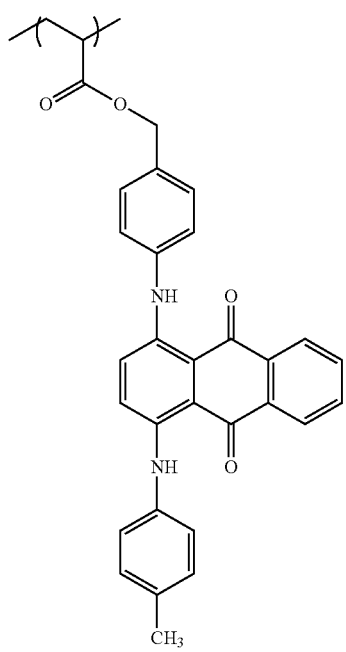
(A-aq-4)
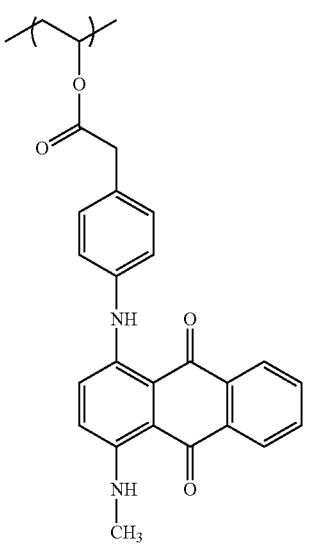
(A-aq-5)
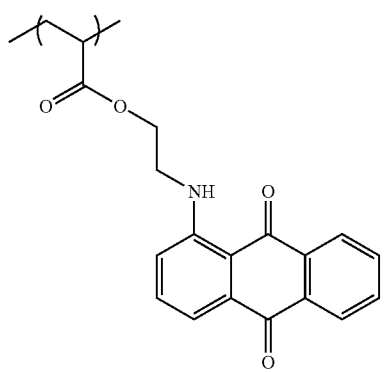
(A-aq-6)
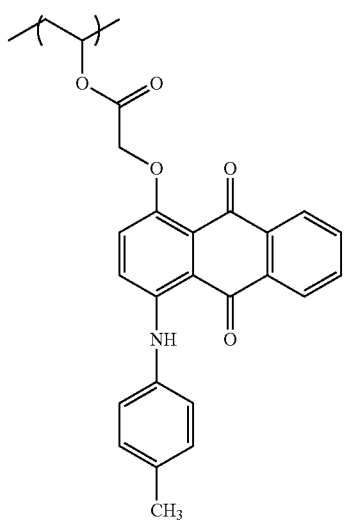
(A-aq-7)
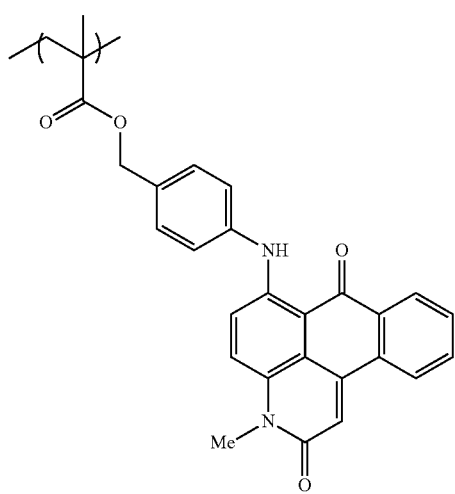
(A-aq-8)
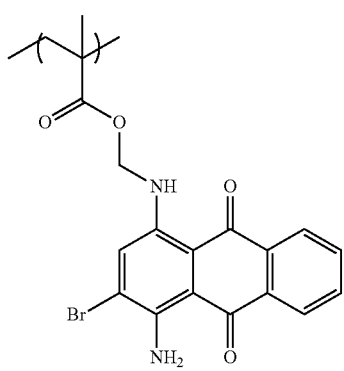

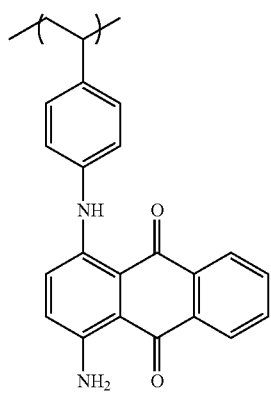 (A-aq-9)
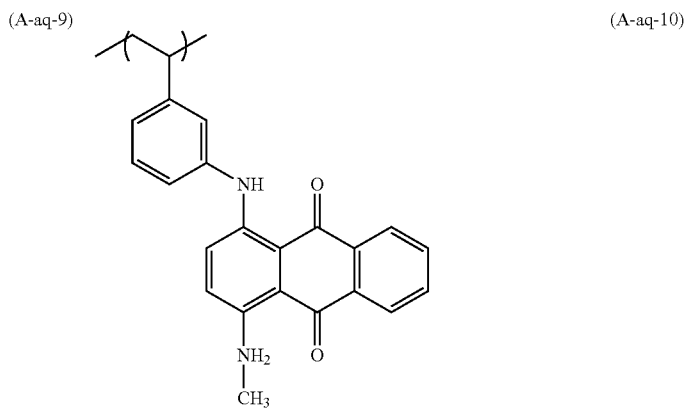 (A-aq-10)
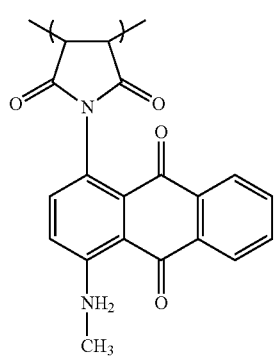 (A-aq-11)
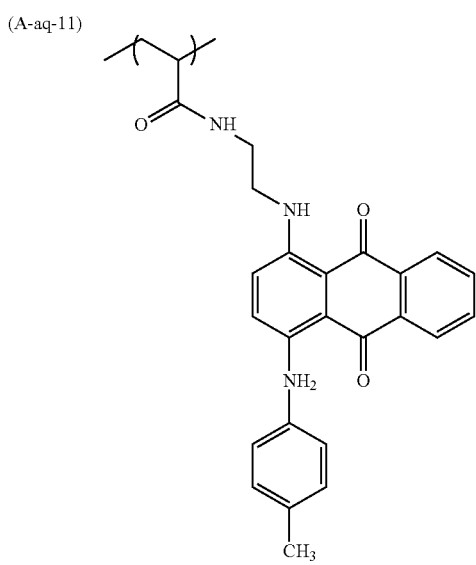 (A-aq-12)
[Chem. 52]
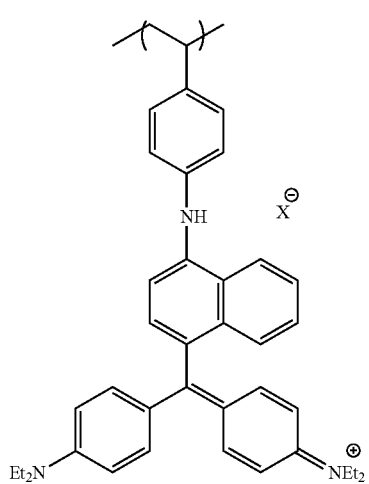 (A-tp-1)
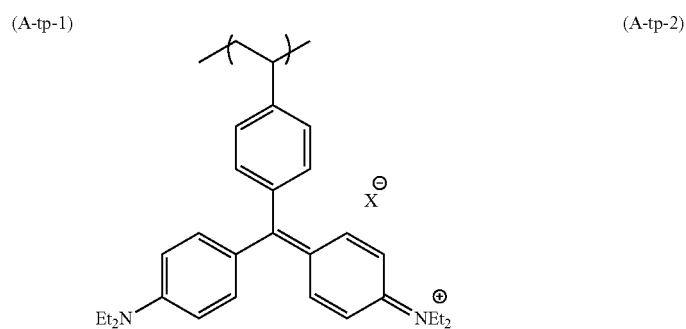 (A-tp-2)

[Chem. 53]
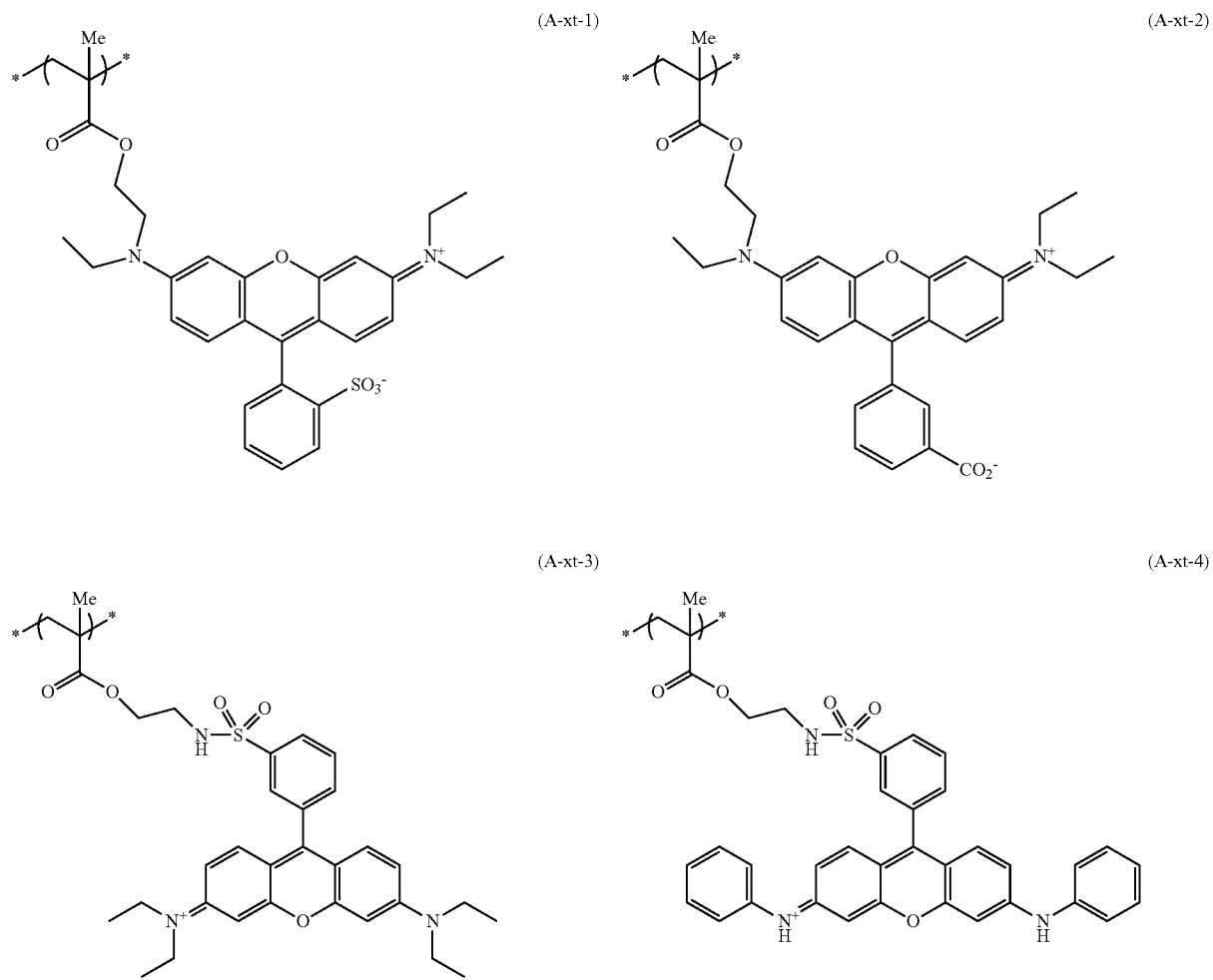

-continued
(A-xt-5)
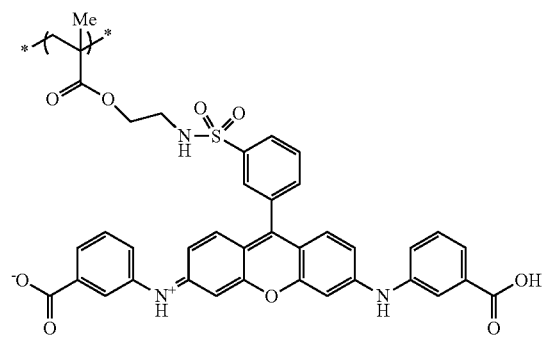
(A-xt-6)
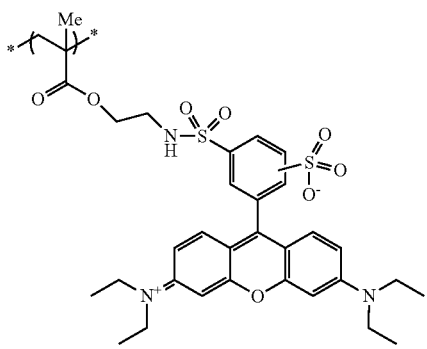
[Chem. 54]
(A-pm-1)
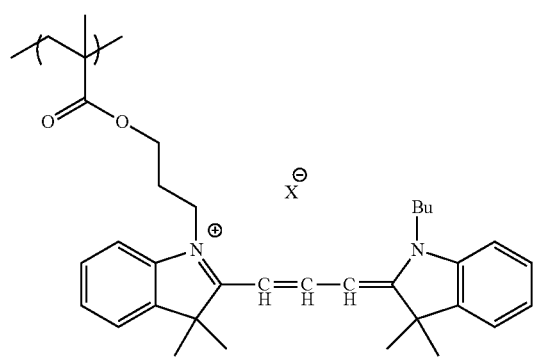
(A-pm-2)
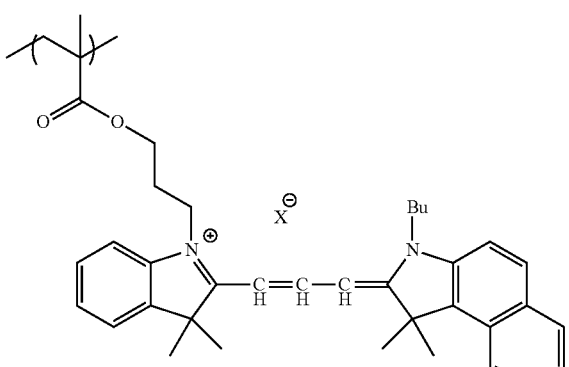
(A-pm-3)
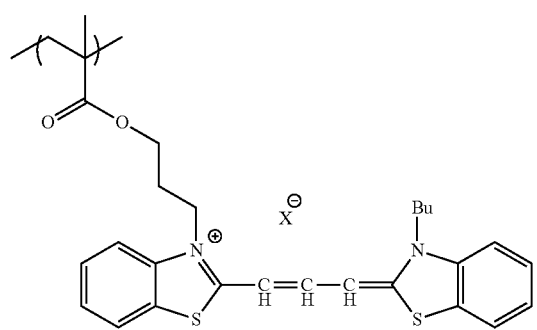
(A-pm-4)
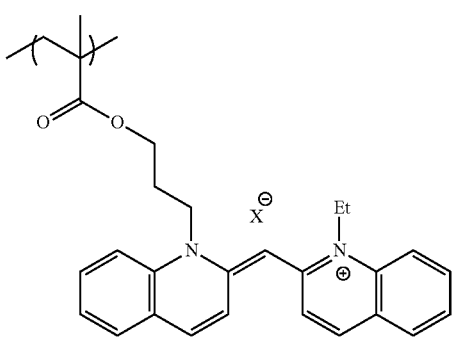
(A-pm-5)
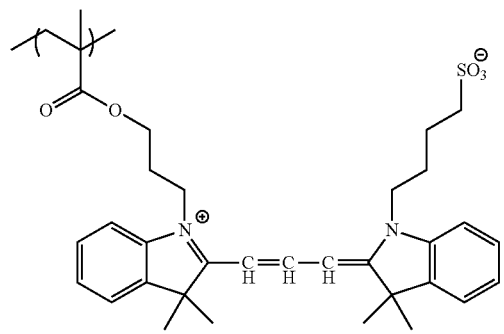
(A-pm-6)
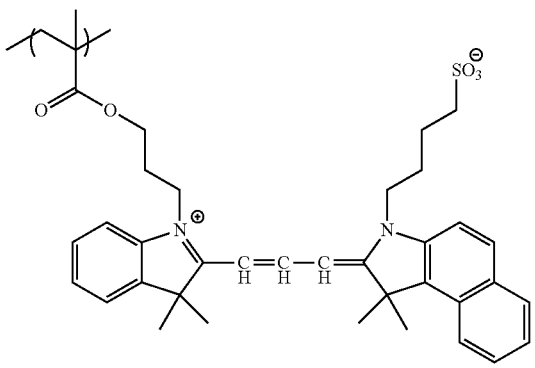

-continued
[Chem. 55]
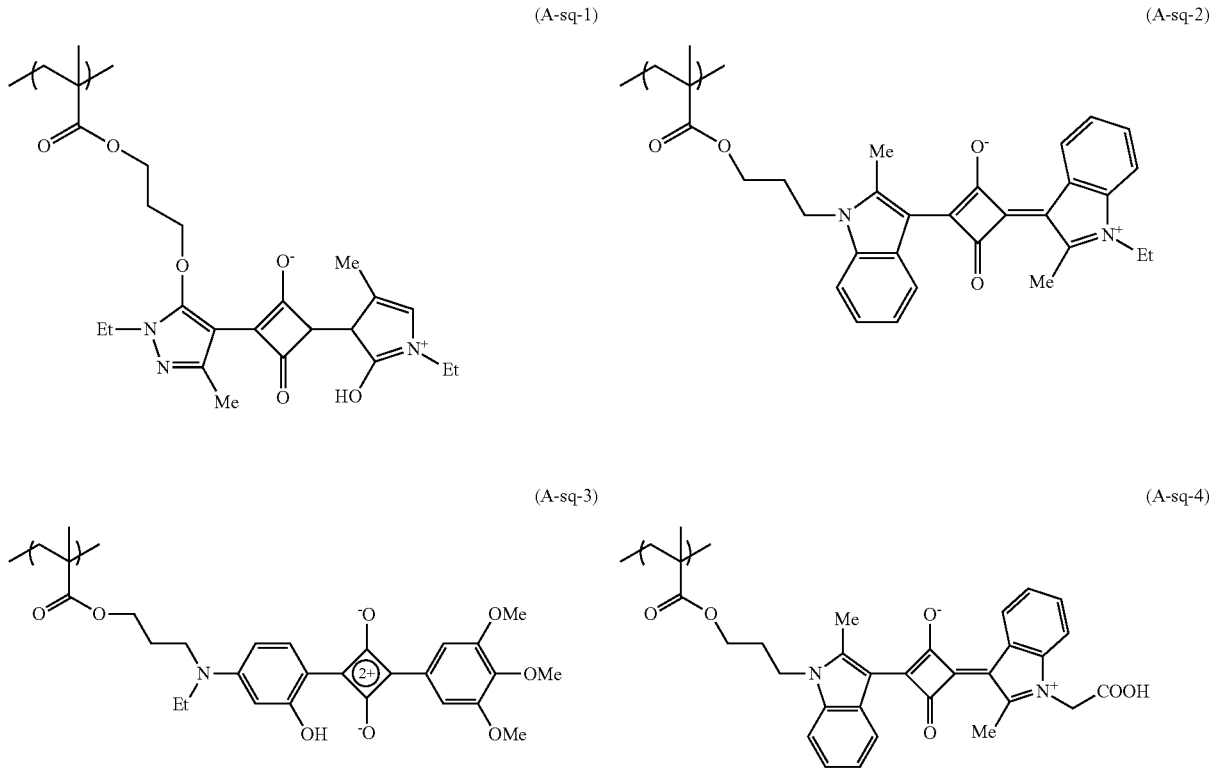
(A-sq-1) (A-sq-2) (A-sq-3) (A-sq-4) (A-sq-4)
[Chem. 56]
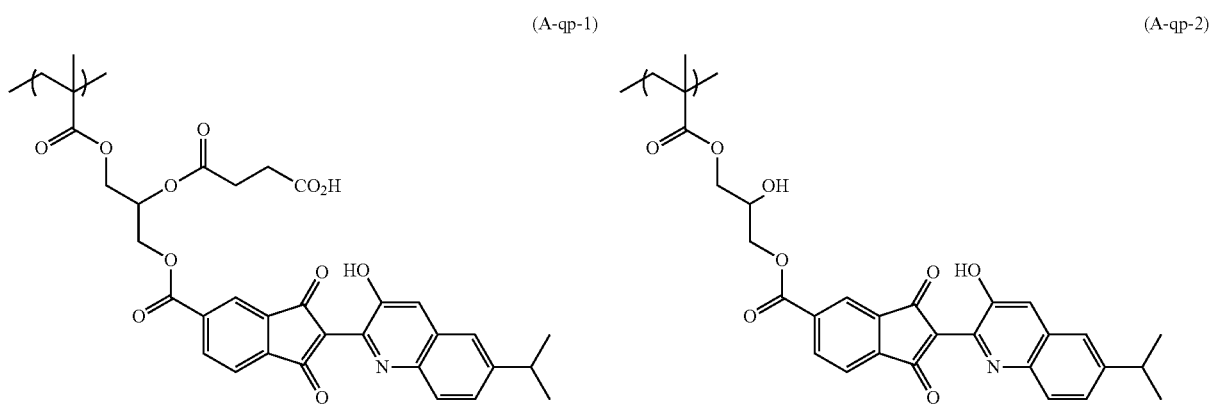
(A-qp-1) (A-qp-2)

-continued
[Chem. 57]
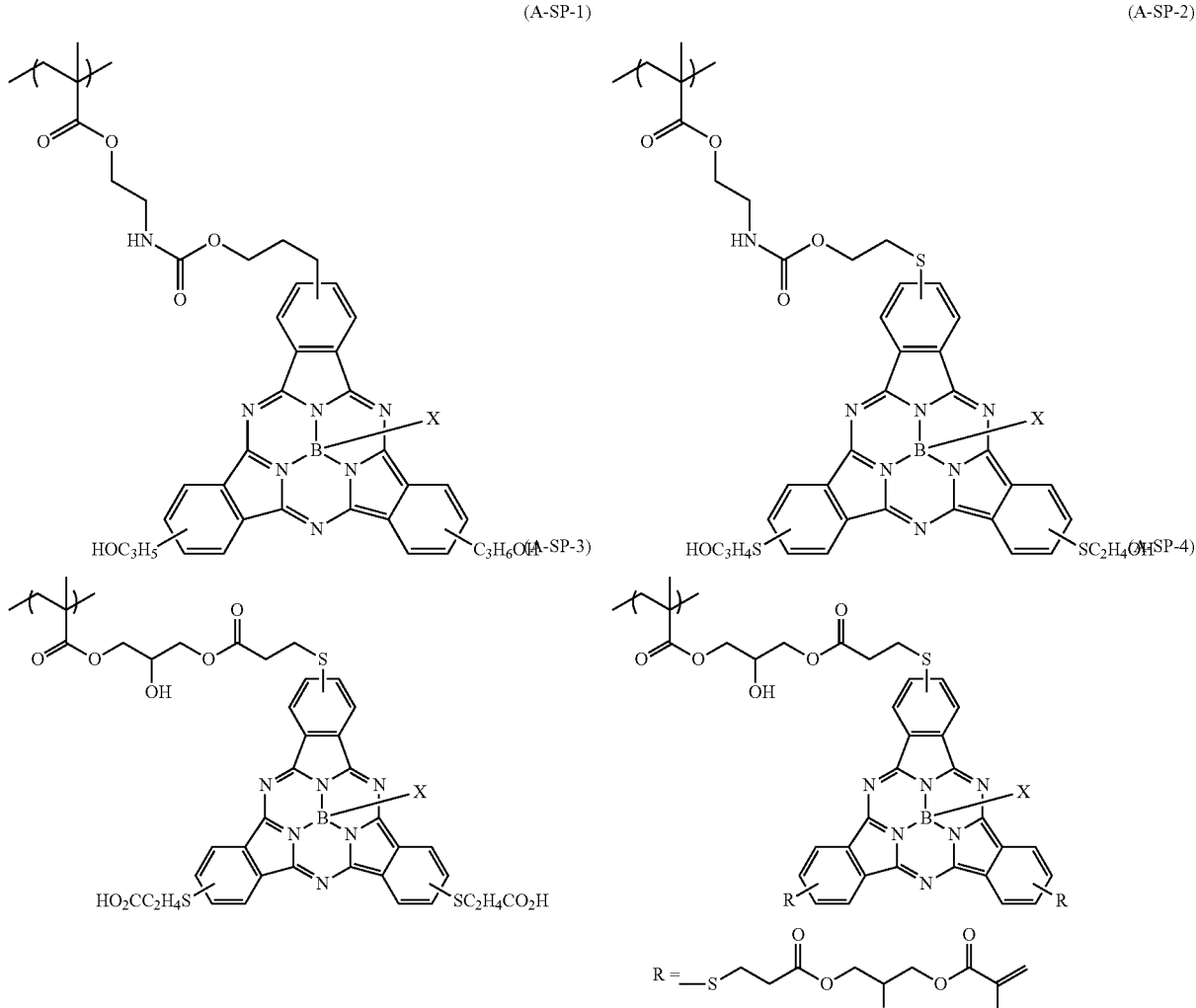
[Chem. 58]
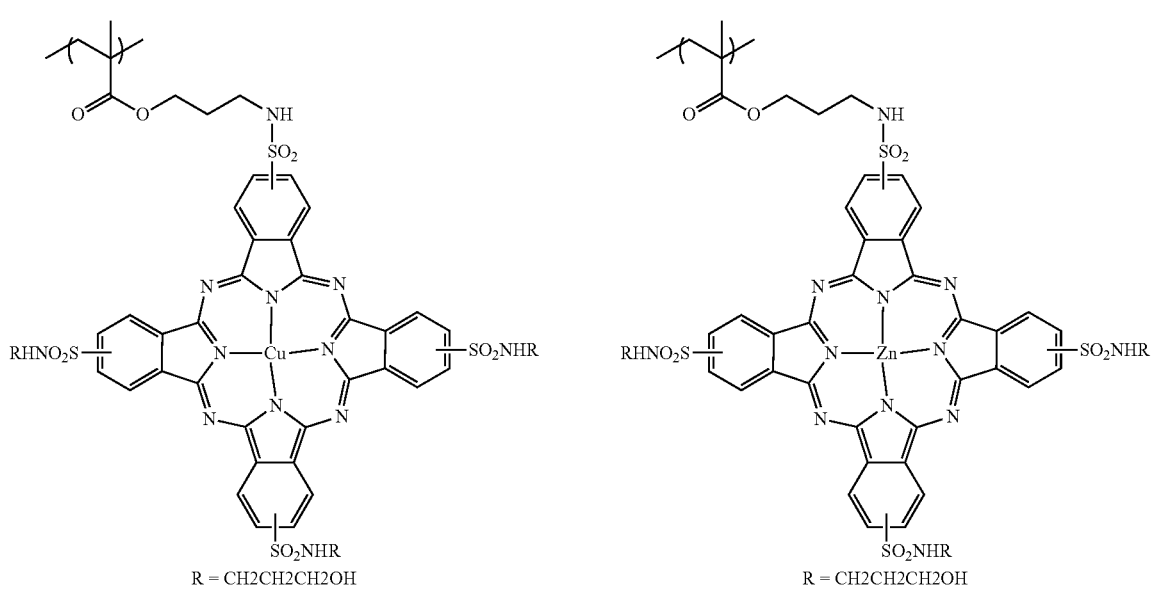

(A-ph-3)
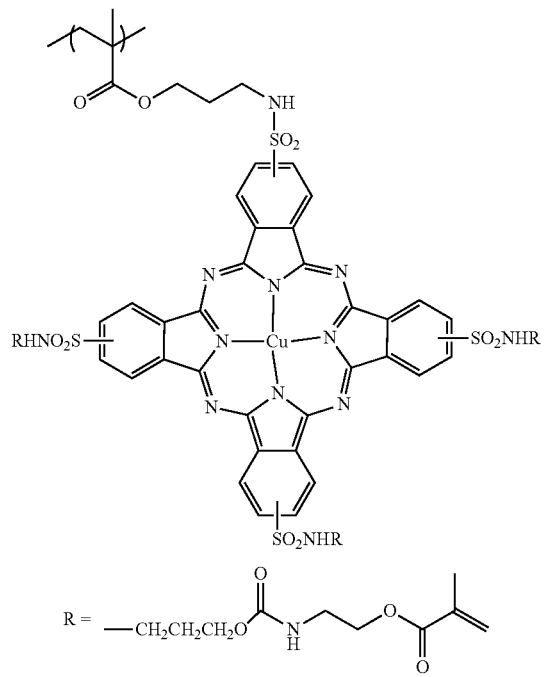
(A-ph-4)
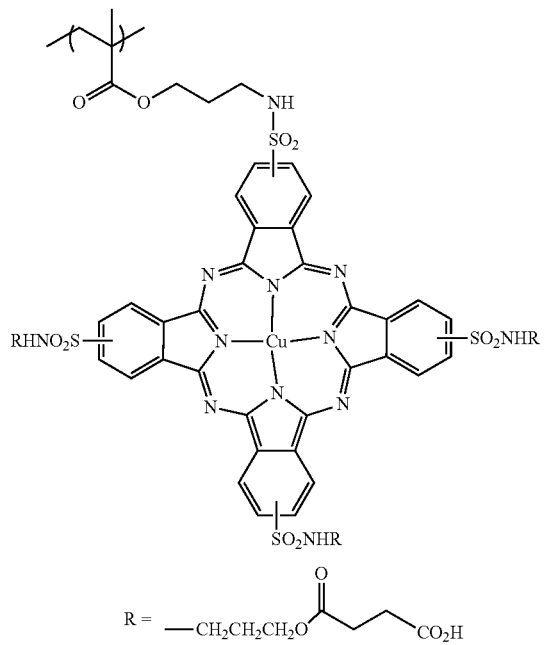
[Chem. 59]
(A-st-1)
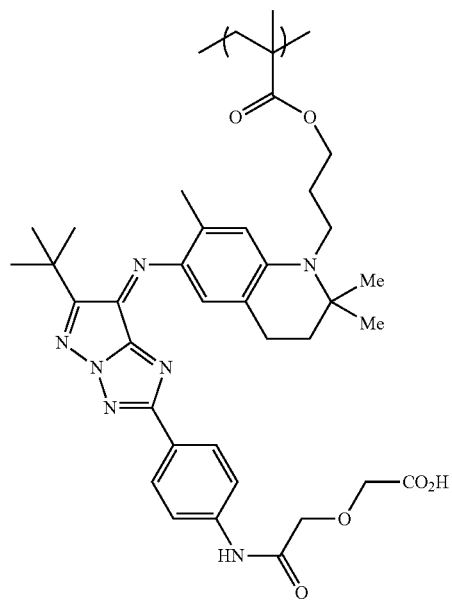
(A-st-2)
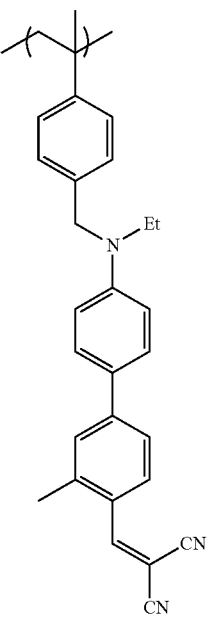

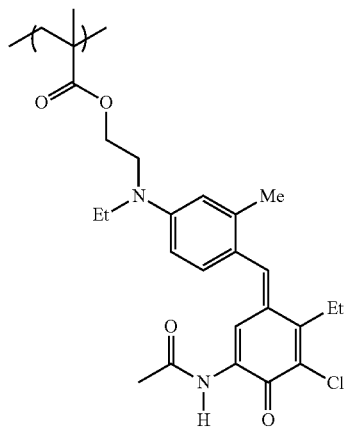

(A-st-3)

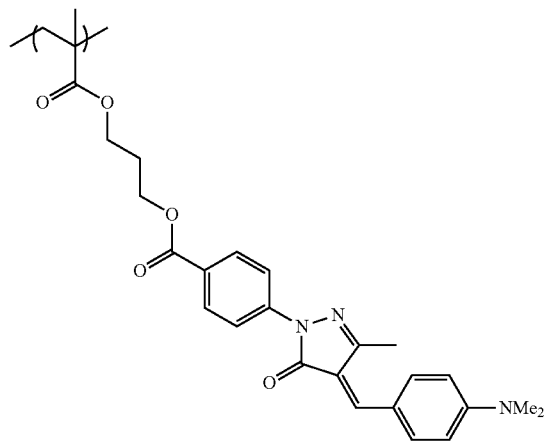

(A-st-4)

<Structural Unit Represented by Formula (B)>

Next, a structural unit represented by Formula (B) will be described in detail.

[Chem. 60]

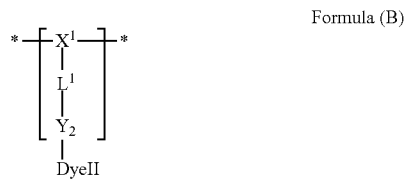

Formula (B)

In Formula (B), $X_2$ has the same definition as $X_2$ in the Formula (A). $L_2$ has the same definition as $L_1$ in the Formula (A). $Y_2$ represents a group that can form an ionic bond or a coordinate bond with DyeII. DyeII represents a dye structure. Hereinafter, Formula (B) will be described in detail.

In Formula (B), $X_2$ has the same definition as that of $X_2$ in the Formula (A), and the preferable range thereof is also the same. $L_2$ has the same definition as $L_1$ in the Formula (A), and the preferable range thereof is also the same. $Y_2$ is preferably a group that can form an ionic bond or a coordinate bond with DyeII, and may be either an anionic group or a cationic bond. Examples of the anionic group include COO⁻, PO₃H⁻, —SO₃⁻, —SO₃NH⁻, —SO₃N⁻CO—, and the like, and among these, COO⁻, PO₃H⁻, and SO₃⁻ are preferable.

Examples of the cationic group include substituted or unsubstituted onium cations (for example, ammonium, pyridinium, imidazolium, phosphonium, and the like), and among these, an ammonium cation is particularly preferable.

$Y_2$ can be bonded to an anion portion (COO⁻, SO₃⁻, O⁻, or the like) or a cation portion (the onium cation described above, a metal cation, or the like) that DyeII has.

The dye multimer having the structural unit represented by Formula (B) in the present invention can be synthesized in the same manner as the dye multimer having the structural unit represented by the Formula (A).

Among these, from the viewpoint of heat resistance, it is preferable for the dye multimer having the structural unit represented by Formula (B) to be a radical polymer that is obtained by radical polymerization by using a dye monomer having an ethylenically unsaturated bond.

Specific examples of structural units represented by Formula (B) will be shown below, but the present invention is not limited thereto.

[Chem.61]

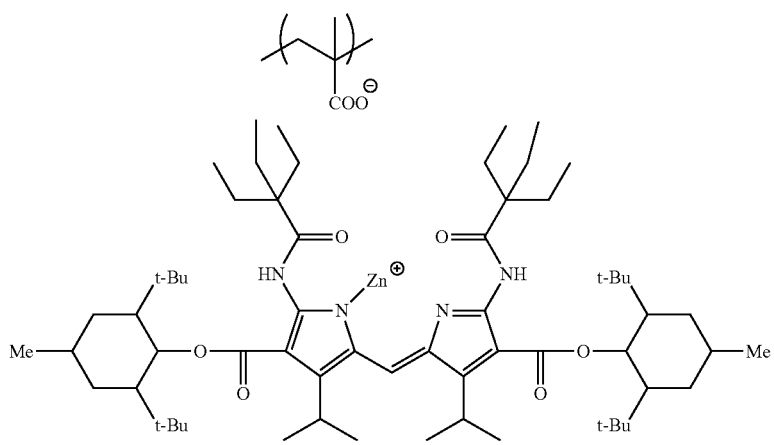

(B-dp-1)

-continued
(B-dp-2)
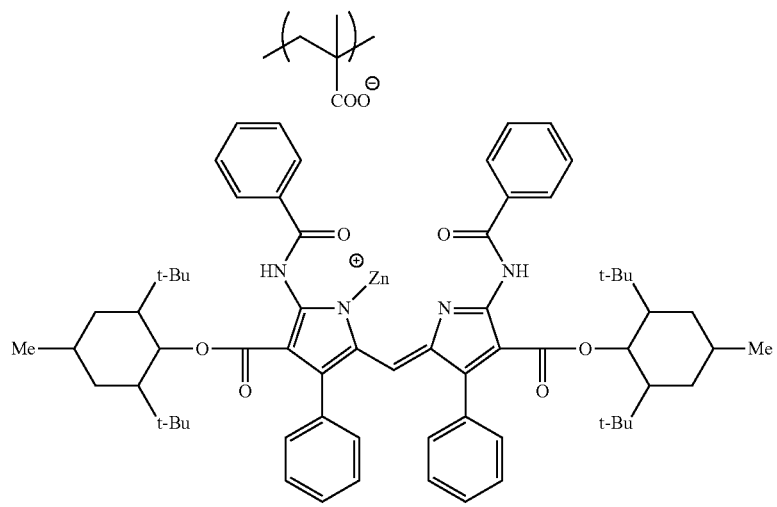
(B-tp-1)
(B-tp-2)
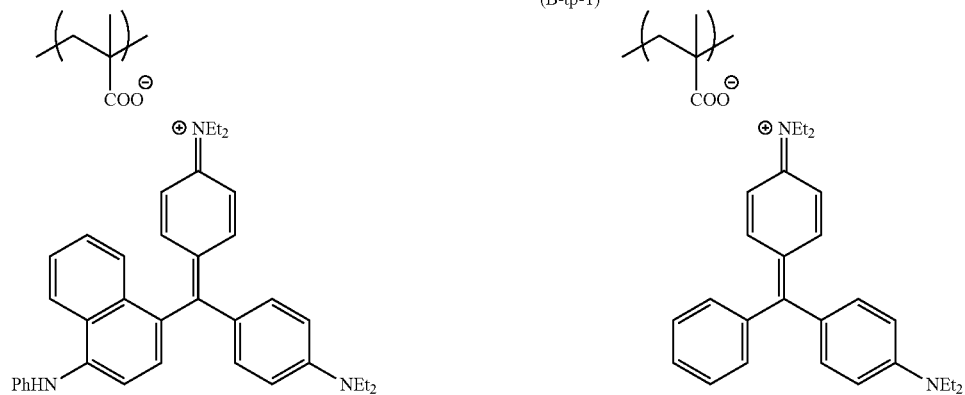
(B-pm-1)
(B-sp-1)
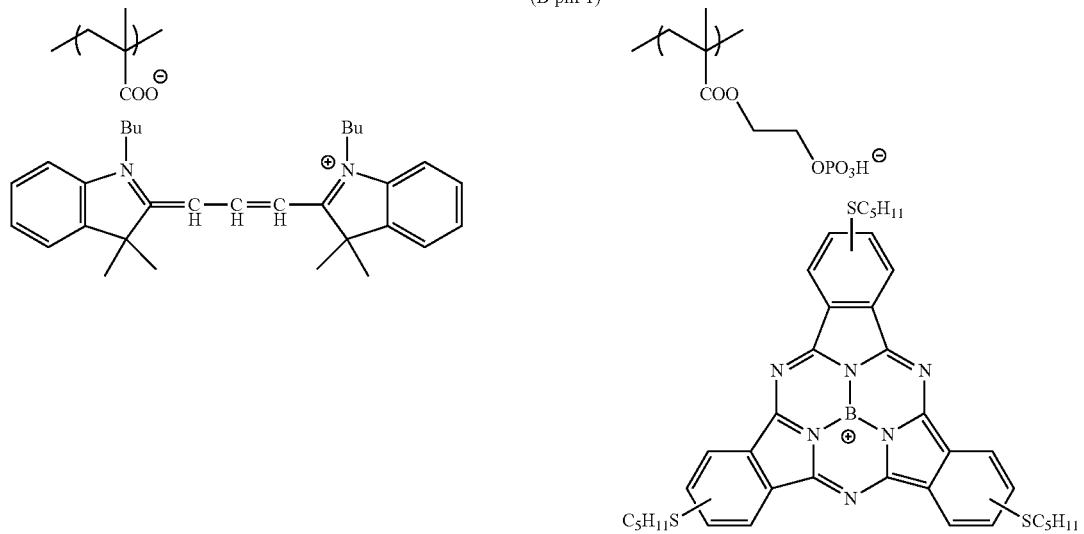

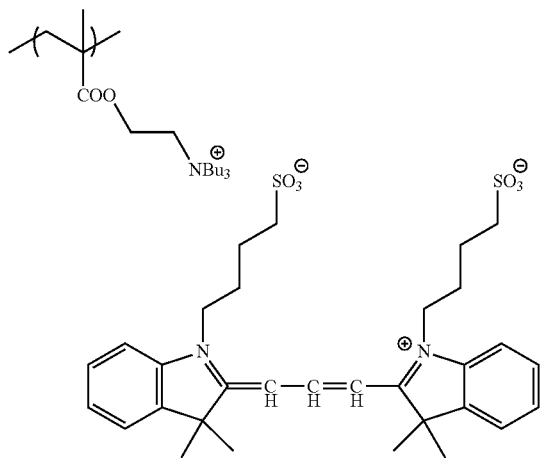
(B-pm-2)

<Structural Unit Represented by Formula (C)>

[Chem. 62]

$$*\!-\!\{\mathrm{DyeIII}\!-\!(L_3)_m\}\!-\!*$$ Formula (C)

In Formula (C), $L_3$ represents a single bond or a divalent linking group. DyeIII represents a partial structure of a dye, and m represents 0 or 1. Hereinafter, Formula (C) will be described in detail.

In the Formula (C), preferable examples of the divalent linking group represented by $L_3$ include a substituted or unsubstituted linear, branched, or cyclic alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthylene group), a substituted or unsubstituted heterocyclic linking group, —CH=CH—, —O—, —S—, —NR— (each R independently represents a hydrogen atom, an alkyl group, an aryl group, or a heterocyclic group), —C(=O)—, —SO—, —SO$_2$—, and a linking group that is formed of two or more of these groups linked to each other. m represents 0 or 1, and is preferably 1.

Specific examples that are preferably used as the divalent linking group represented by $L_3$ in Formula (C) will be shown below, but $L_3$ of the present invention is not limited thereto.

[Chem. 63]

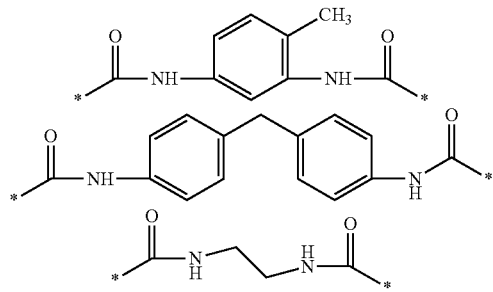

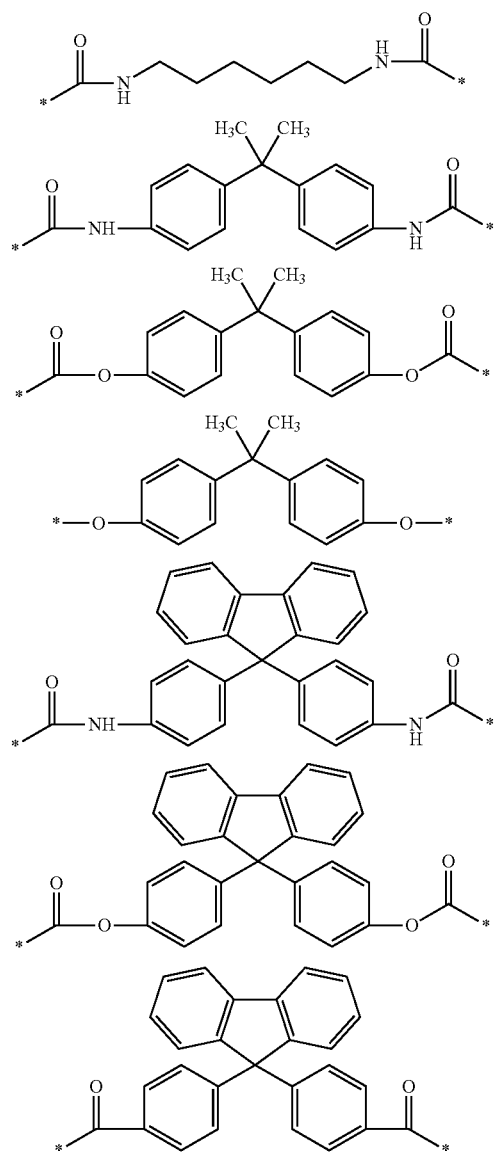

107

-continued

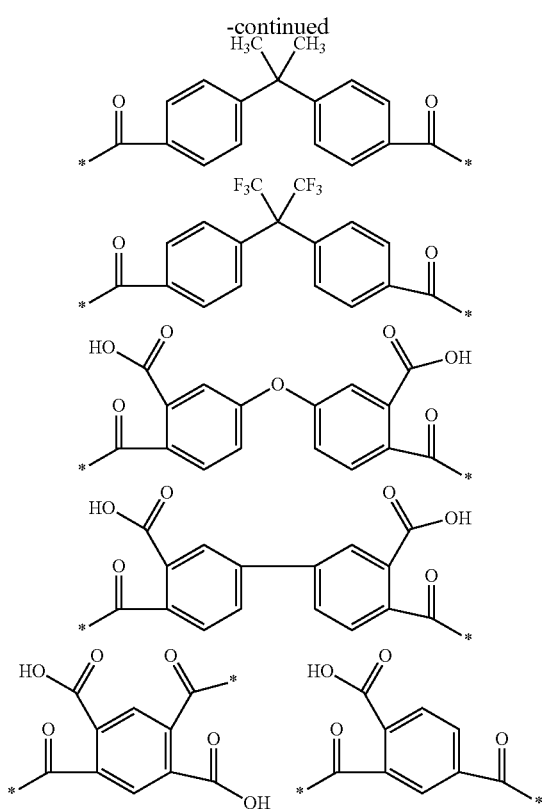

108

-continued

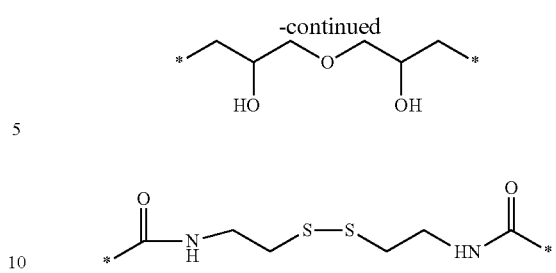

The dye multimer having the structural unit represented by Formula (C) is synthesized by sequential polymerization. Examples of the sequential polymerization include polyaddition (for example, a reaction between an diisocyanate compound and diol, a reaction between a diepoxy compound and a dicarboxylic acid, a reaction between a tetracarboxylic dianhydride and diol, or the like) and polycondensation (for example, a reaction between a dicarboxylic acid and diol, a reaction between a dicarboxylic acid and diamine, or the like). Among these, it is particularly preferable to use the polyaddition reaction to synthesize the dye multimer, since the reaction conditions can be set to be mild, and a dye structure is not degraded by the reaction. For the sequential polymerization, known reaction conditions can be applied.

Specific examples of structural units represented by Formula (C) will be shown below, but the present invention is not limited thereto.

[Chem. 64]

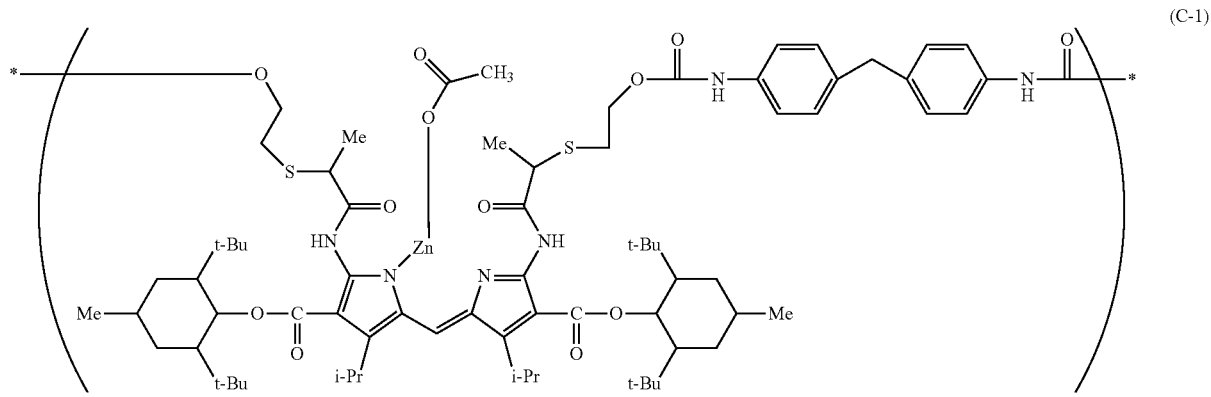

(C-1)

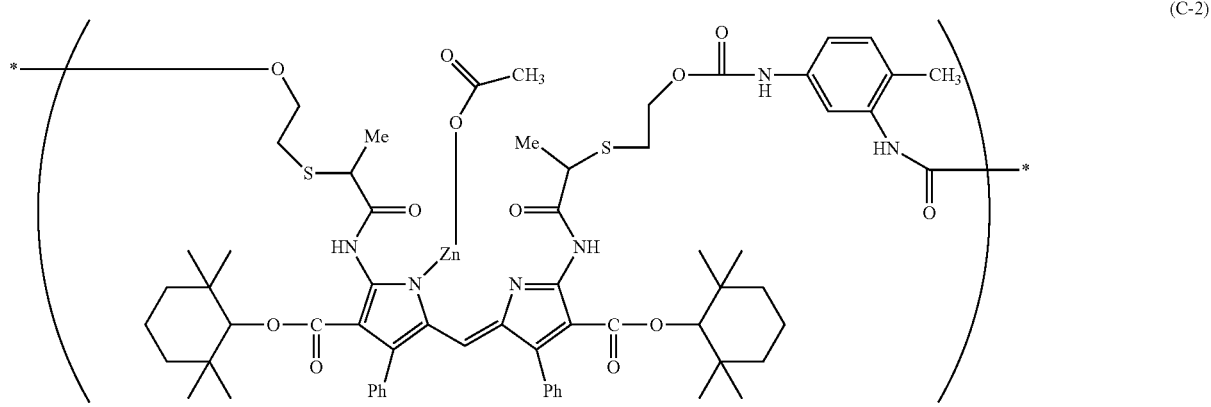

(C-2)

(C-3)
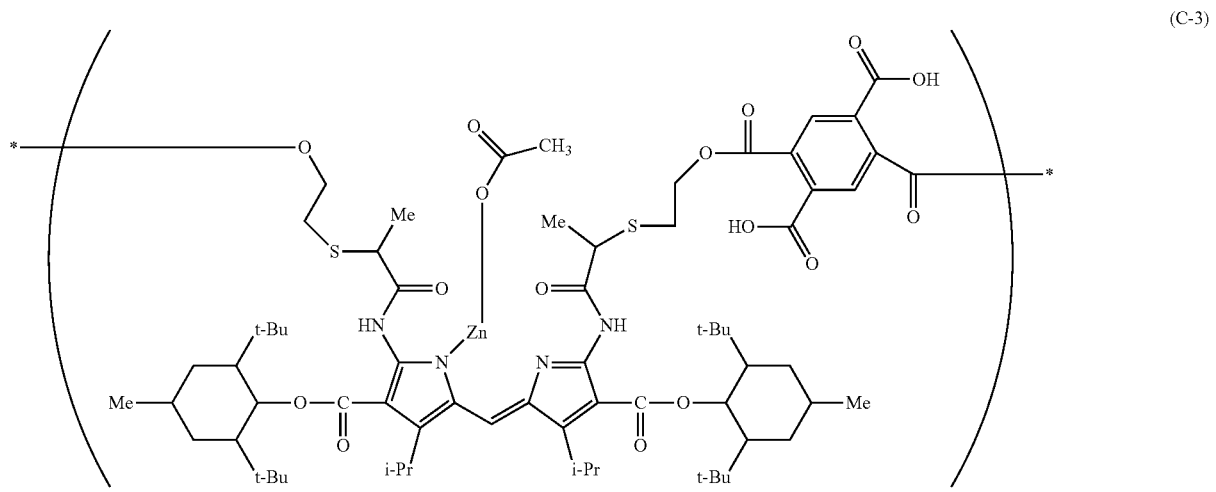
[Chem. 65]
(C-az-1)
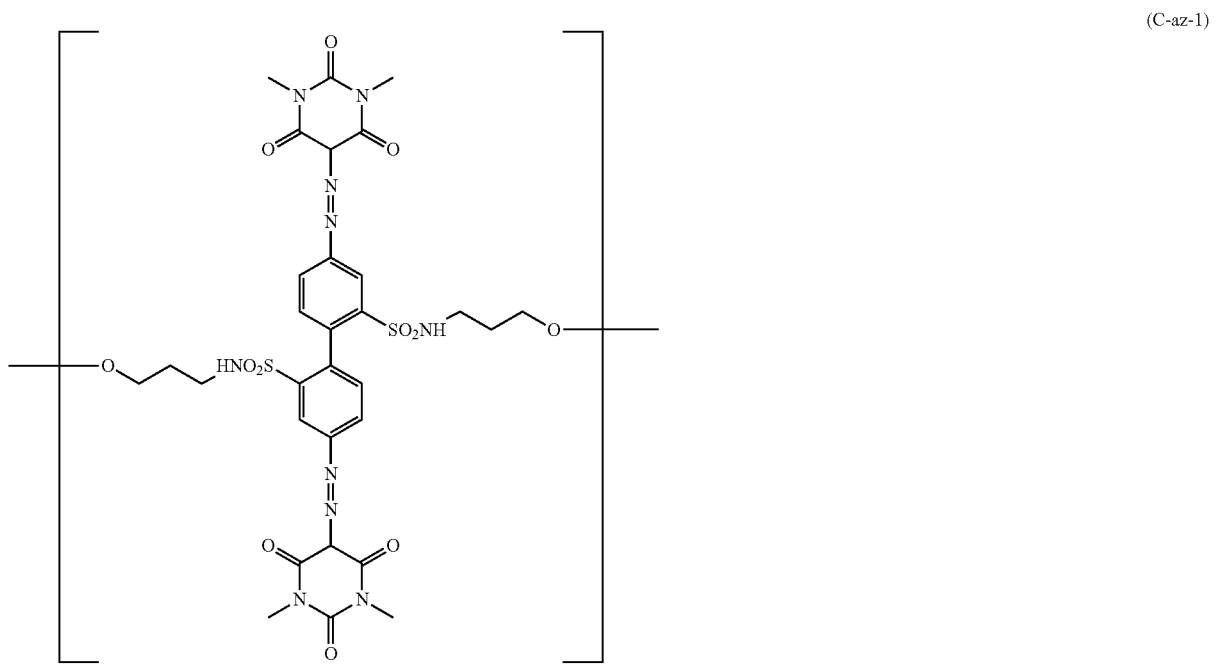
(C-pm-1)
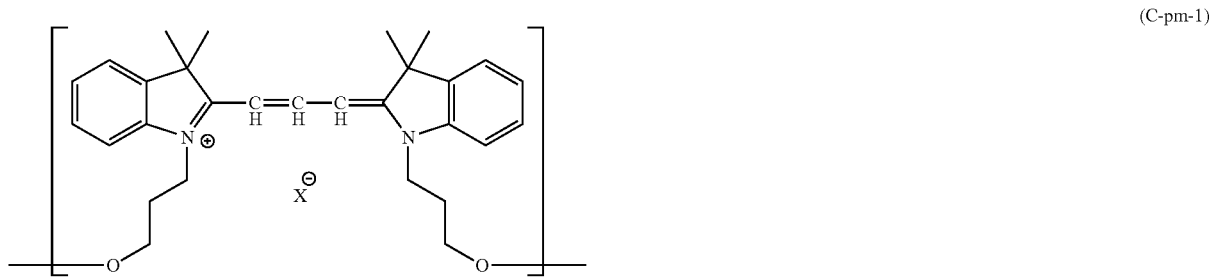

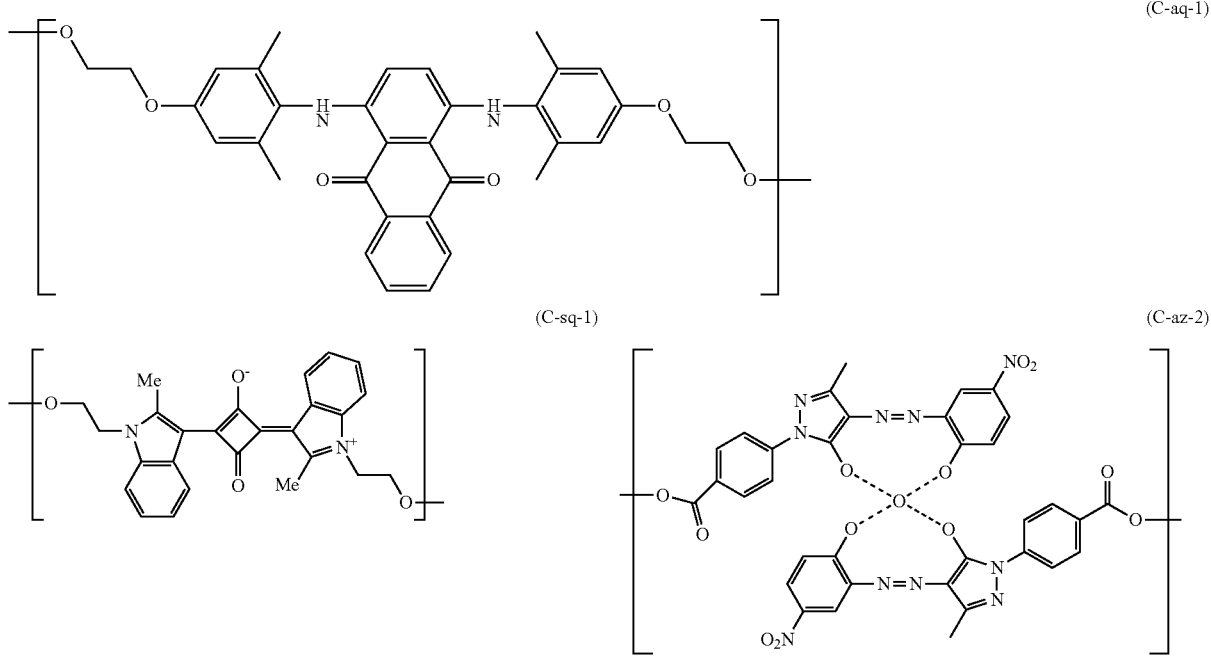

<Dye Multimer Represented by Formula (D)>

Next, a dye multimer represented by Formula (D) will be described in detail.

[Chem. 66]

$$(L_4)\!\!-\!\!(DyeIV)_n \quad \text{Formula (D)}$$

In Formula (D), $L_4$ represents a linking group having a valency of n. n represents an integer from 2 to 20. When n is 2 or greater, structures of DyeIV may be the same as or different from each other. DyeIV represents a dye structure.

In Formula (D), n is preferably 3 to 15, and particularly preferably 3 to 6.

In Formula (D), when n is 2, preferable examples of divalent linking groups represented by $L_4$ include a substituted or unsubstituted alkylene group having 1 to 30 carbon atoms (for example, a methylene group, an ethylene group, a trimethylene group, a propylene group, a butylenes group, or the like), a substituted or unsubstituted arylene group having 6 to 30 carbon atoms (for example, a phenylene group, a naphthylene group, or the like), a substituted or unsubstituted heterocyclic linking group, —CH=CH—, —O—, —S—, —NR— (each R independently represents a hydrogen atom, an alkyl group, an aryl group, or a heterocyclic group), —C(=O)—, —SO—, —SO$_2$—, and a linking group that is formed of two or more of these groups linked to each other.

When n is 3 or greater, examples of the linking group having a valency of n include linking groups which have, as a central core, substituted or unsubstituted arylene group (a 1,3,5-phenylene group, a 1,2,4-phenylene group, a 1,4,5,8-naphthalene group, or the like), a heterocyclic linking group (for example, a 1,3,5-triazine group or the like), an alkylene linking group, or the like, and are formed when the aforementioned divalent linking group is substituted.

Specific examples of $L_4$ in Formula (D) will be shown below, but the present invention is not limited thereto.

[Chem. 67]

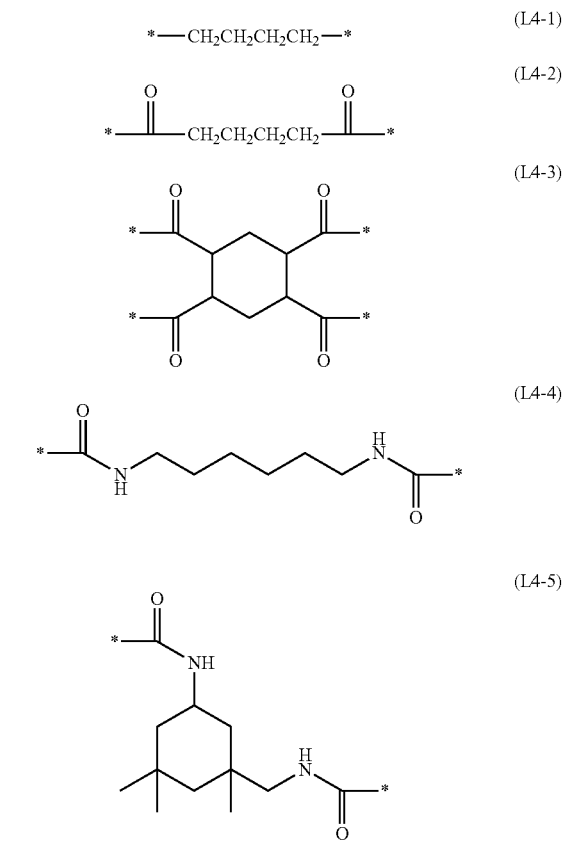

(L4-6) 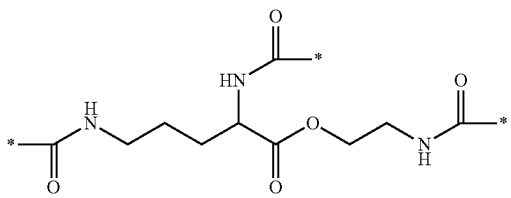
(L4-7) 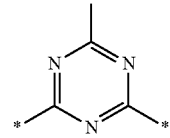
(L4-8) 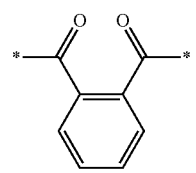
(L4-9) 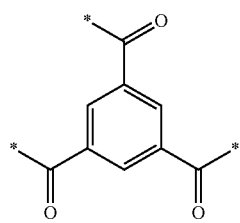
(L4-10) 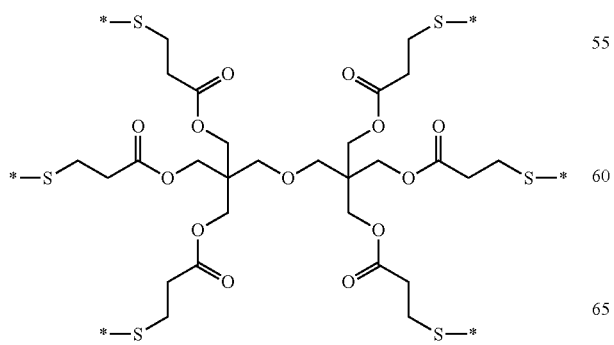
(L4-11) 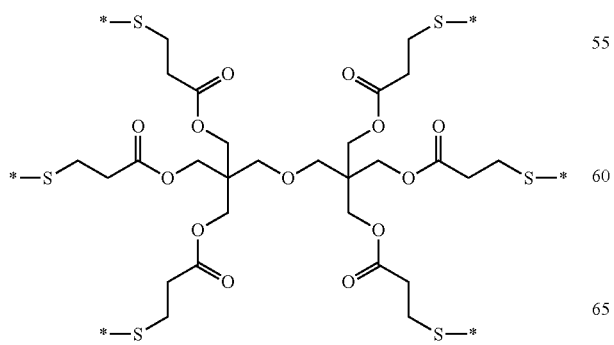
(L4-12) 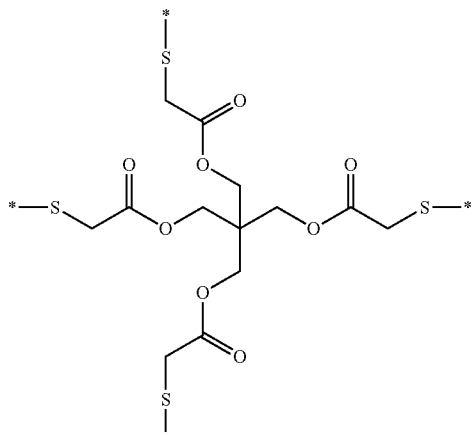
(L4-13) 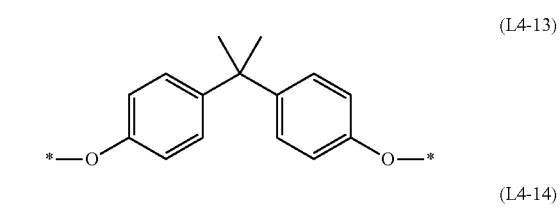
(L4-14) 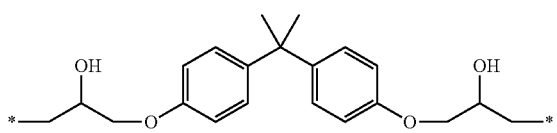
Specific examples of DyeIV in Formula (D) will be shown below, but the present invention is not limited thereto.
[Chem. 68]
(D-sq-1) 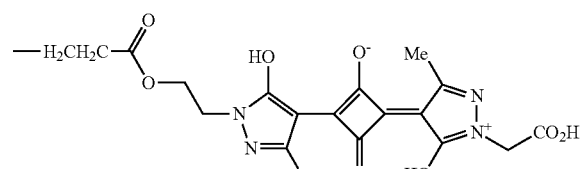
(D-az-1) 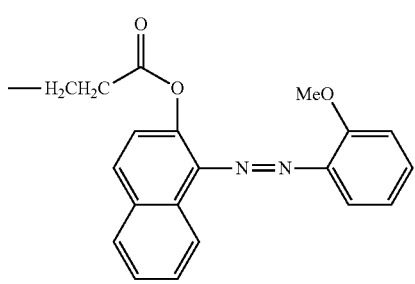
(D-az-2) 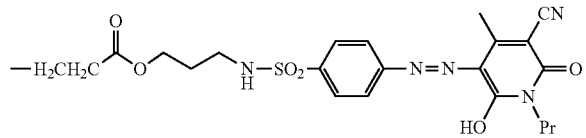

-continued (D-tp-1)

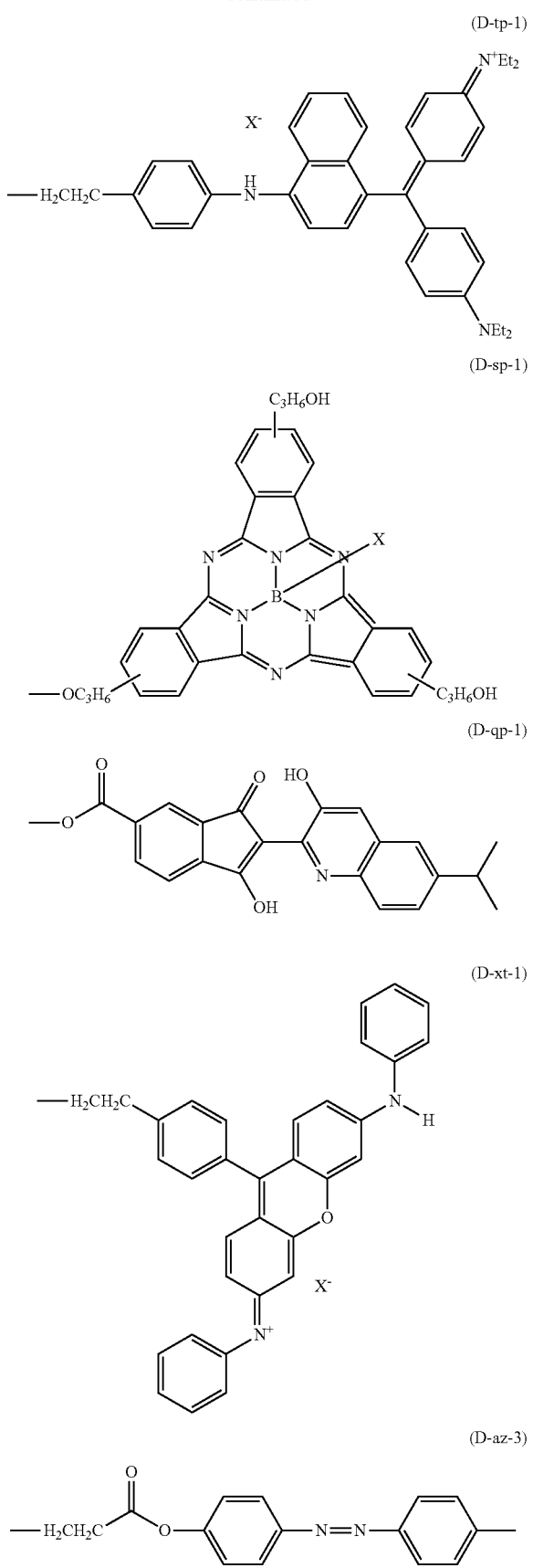

(D-sp-1)

(D-qp-1)

(D-xt-1)

(D-az-3)

-continued (D-aq-1)

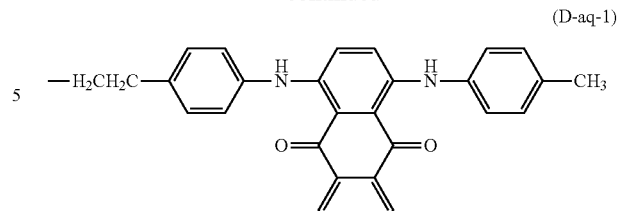

Among the dye multimer having the structural unit represented by Formula (A), Formula (B), and/or Formula (C) and the dye multimer represented by Formula (D), in the dye multimer having the structural unit represented by Formula (A) and Formula (C) and the dye multimer represented by Formula (D), the partial structures derived from a dye are linked to each other through a covalent bond in the molecular structure. Accordingly, the colored radiation-sensitive composition containing such a dye multimer has excellent heat resistance. Therefore, if the colored radiation-sensitive composition is used for a pattern forming process including a high-temperature process, it is preferable since an effect of inhibiting color migration to another colored pattern adjacent thereto is obtained. Moreover, the compound represented by Formula (A) is particularly preferable since the compound makes it easy to control the molecular weight of the dye multimer.

(Polymerizable Group that the Dye Multimer (A) Has)

It is preferable for the dye multimer (A) of the present invention to have a polymerizable group. If the dye multimer (A) has a polymerizable group, hardness of the film of an exposed portion is improved, the pattern shape is further improved, and surface roughness of pattern is more effectively reduced.

As the polymerizable group, known polymerizable groups that can be crosslinked by a radical, an acid, or heat can be used, and examples thereof include groups having an ethylenically unsaturated bond, cyclic ether groups (an epoxy group and a oxetane group), methylol groups, and the like. Particularly, groups having an ethylenically unsaturated bond are preferable, (meth)acryloyl groups are more preferable, and (meth)acryloyl groups derived from glycidyl (meth)acrylate and 3,4-epoxy-cyclohexyl methyl (meth)acrylate are most preferable.

As the method of introducing the polymerizable group, there are (1) a method of introducing the polymerizable group by modifying the dye multimer with a polymerizable group-containing compound, (2) a method of introducing the polymerizable group by copolymerizing the dye multimer with a polymerizable group-containing compound, and the like. Hereinafter, the methods will be described in detail.

—(1) Method of Introducing Polymerizable Group by Modifying Dye Mulitmer with Polymerizable Group-Containing Compound—

As the method of introducing the polymerizable group by modifying the dye multimer with a polymerizable group-containing compound, known methods can be used without particular limitation. For example, from the viewpoint of production, (a) a method of causing a reaction between a carboxylic acid contained in the dye multimer and an unsaturated bond-containing epoxy compound, (b) a method of causing a reaction between a hydroxyl group or an amino group contained in the dye multimer and an unsaturated bond-containing isocyanate compound, and (c) a method of causing a reaction between an epoxy compound contained in the dye multimer and an unsaturated bond-containing carboxylic acid compound are preferable.

Examples of the unsaturated bond-containing epoxy compound in (a) a method of causing a reaction between a carboxylic acid contained in the dye multimer and an unsaturated bond-containing epoxy compound include glycidyl methacrylate, glycidyl acrylate, allylglycidyl ether, 3,4-epoxy-cyclohexylmethyl acrylate, 3,4-epoxy-cyclohexylmethyl methacrylate, and the like. Particularly, glycidyl methacrylate, and 3,4-epoxy-cyclohexylmethyl methacrylate are preferable since these compounds have crosslinking properties and storage stability. Known conditions can be used as the reaction conditions.

Examples of the unsaturated bond-containing isocyanate compound in (b) a method of causing a reaction between a hydroxyl group or an amino group contained in the dye multimer and an unsaturated bond-containing isocyanate compound include 2-isocyanatoethyl methacrylate, 2-isocyanatoethyl acrylate, 1,1-bis(acryloyloxymethyl)ethyl isocyanate, and the like. Among these, 2-isocyanatoethyl methacrylate is preferable since this compound has excellent crosslinking properties and storage stability. Known conditions can be used as the reaction conditions.

As the unsaturated bond-containing carboxylic acid compound in (c) a method of causing a reaction between an epoxy compound contained in the dye multimer and an unsaturated bond-containing carboxylic acid compound, any carboxylic acid compounds can be used without particular limitation as long as the compound has a known (meth)acryloyloxy group. Among these, methacrylic acid and acrylic acid are preferable, and methacrylic acid is particularly preferable since this acid has excellent crosslinking properties and storage stability. Known conditions can be used as the reaction conditions.

<(2) Method of Introducing Polymerizable Group by Copolymerizing Dye Monomer and Polymerizable Group-Containing Compound>

—(2) Method of Introducing Polymerizable Group by Copolymerizing Dye Monomer and Polymerizable Group-Containing Compound—

As (2) a method of introducing a polymerizable group by copolymerizing a dye monomer and a polymerizable group-containing compound, any known methods can be used without particular limitation. Among these, (d) a method of copolymerizing a radically polymerizable dye monomer with a polymerizable group-containing compound that can be radically polymerized, and (e) a method of copolymerizing a dye monomer that can be subjected to polyaddition with a polymerizable group-containing compound that can be subjected to polyaddition are preferable.

Examples of the polymerizable group-containing compound that can be radically polymerized in (d) a method of copolymerizing a radically polymerizable dye monomer with a polymerizable group-containing compound that can be radically polymerized particularly include an allyl group-containing compound (for example, allyl (meth)acrylate or the like), an epoxy group-containing compound (for example, glycidyl (meth)acrylate, 3,4-epoxy-cyclohexyl methyl (meth)acrylate), an oxetane group-containing compound (for example, 3-methyl-3-oxetanyl methyl (meth)acrylate or the like), and a methylol group-containing compound (for example, N-(hydroxymethyl)acrylamide or the like). Among these, an epoxy group-containing compound and an oxetane group-containing compound are particularly preferable. Known conditions can be used as the reaction conditions.

Examples of the polymerizable group-containing compound that can be subjected to polyaddition in (e) a method of copolymerizing a dye monomer that can be subjected to poly-addition with a polymerizable group-containing compound that can be subjected to polyaddition include an unsaturated bond-containing diol compound (for example, 2,3-dihydroxypropyl (meth)acrylate), and the like. Known conditions can be used as the reaction conditions.

As the method of introducing a polymerizable group, a method of causing a reaction between a carboxylic acid contained in the dye multimer and an unsaturated bond-containing epoxy compound is most preferable.

The amount of the polymerizable group contained in the dye multimer (A) is preferably 0.1 mmol to 2.0 mmol, more preferably 0.2 mmol to 1.5 mmol, and most preferably 0.3 mmol to 1.0 mmol, with respect to 1 g of the dye multimer (A).

As the method of introducing a polymerizable group, a method of causing a reaction between a carboxylic acid contained in the dye multimer and an unsaturated bond-containing epoxy compound is most preferable.

The amount of the polymerizable group contained in the dye multimer (A) is preferably 0.1 mmol to 2.0 mmol, more preferably 0.2 mmol to 1.5 mmol, and most preferably 0.3 mmol to 1.0 mmol, with respect to 1 g of the dye multimer (A).

Specific examples of structural units that the polymerizable group has will be shown below, but the present invention is not limited thereto.

[Chem. 69]

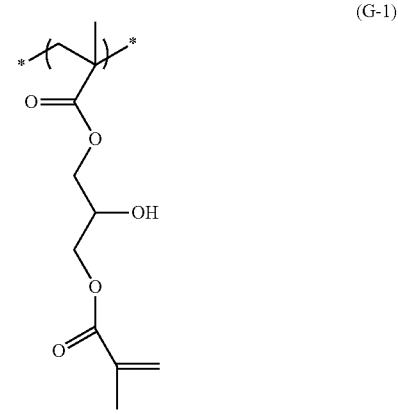

(G-1)

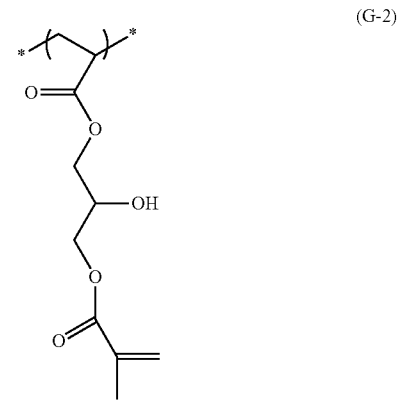

(G-2)

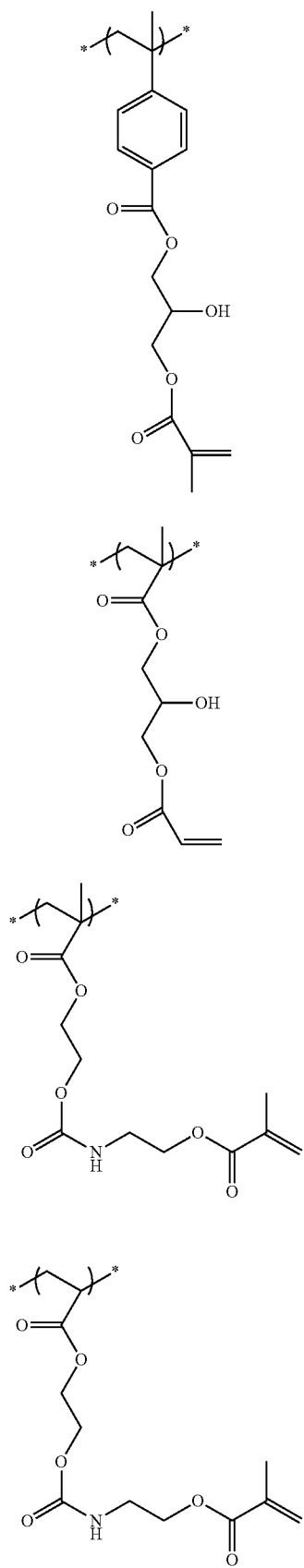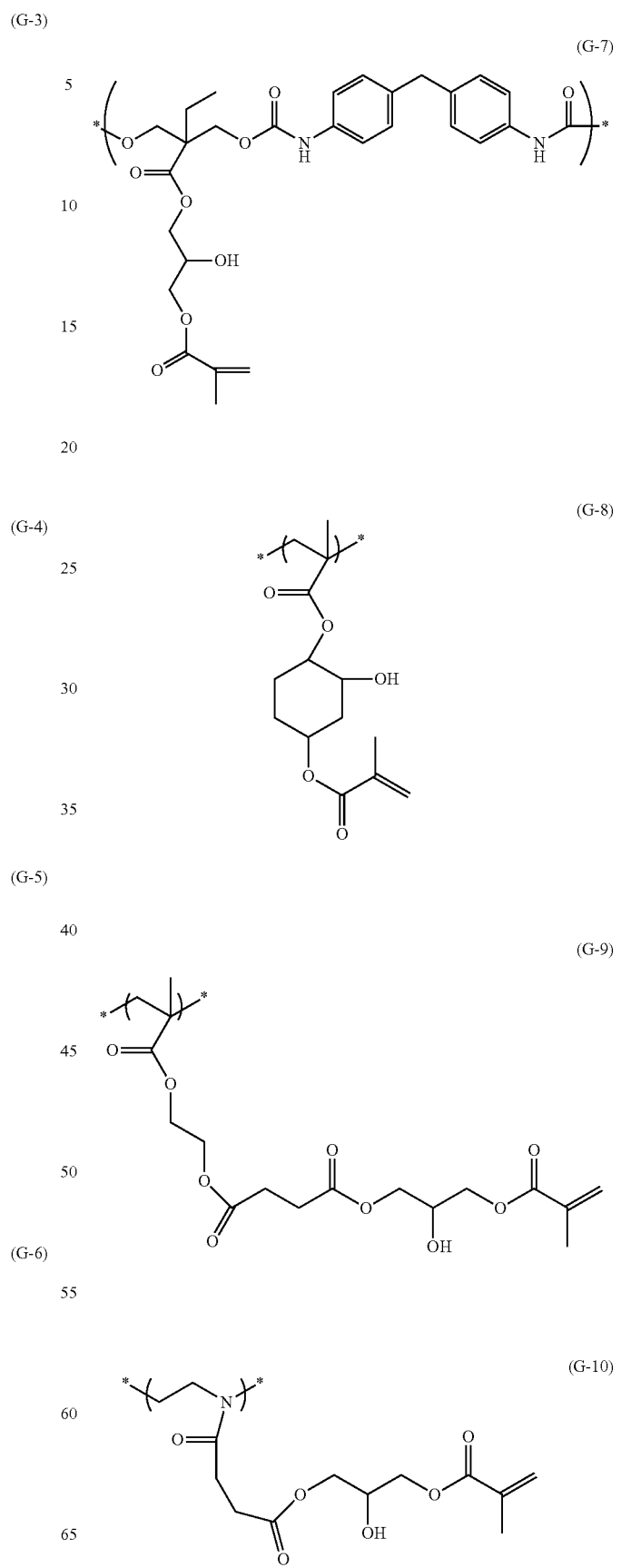

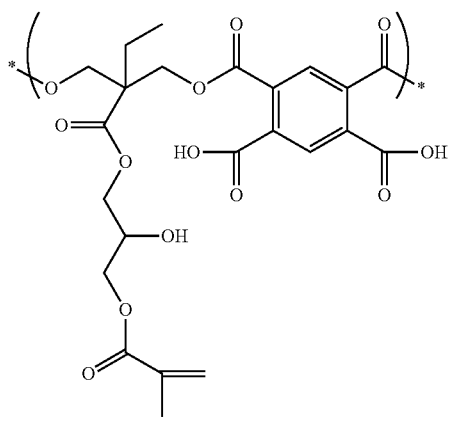

[Chem. 70]

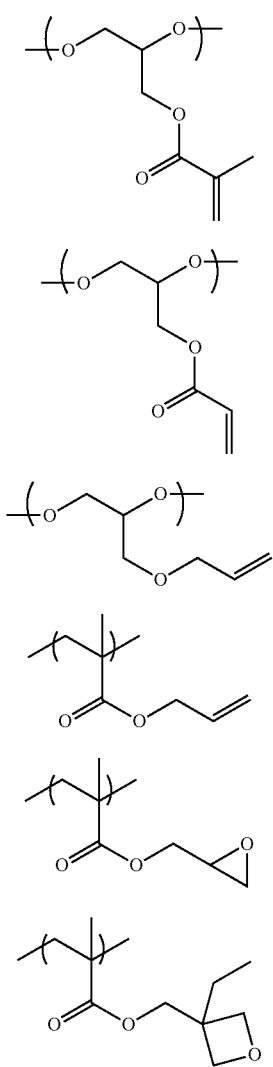

Among the above specific examples, from the viewpoint of substrate adhesiveness and surface roughness, dye monomers having an ethylenically unsaturated bond are preferable. Among these, a methacryloyl group, an acryloyl group, a styryl group, or a vinyloxy group is preferable, and a methacryloyl group is most preferable.

(Other Functional Groups that Dye Multimer (A) Has)

The dye multimer (A) in the present invention may have other functional groups. The dye multimer (A) preferably has alkali-soluble groups such as a carboxylic acid, a sulfonic acid, a phosphoric acid, and a phenolic hydroxyl group as other functional groups. As the alkali-soluble group, a carboxylic acid is most preferable.

Examples of the method of introducing the alkali-soluble group to the dye multimer include a method of introducing in advance the alkali-soluble group to a dye monomer and a method of copolymerizing monomers (a caprolactone-modified derivative of a (meth)acrylic acid or an acrylic acid, a succinic anhydride-modified derivative of 2-hydroxyethyl (meth)acrylate, a phthalic anhydride-modified derivative of 2-hydroxyethyl (meth)acrylate, a 1,2-cyclohexanedicarboxylic anhydride-modified derivative of 2-hydroxyethyl (meth)acrylate, a carboxylic acid-containing monomer such as a styrene carboxylic acid, itaconic acid, maleic acid, or norbornene carboxylic acid, a phosphoric acid-containing monomer such as acid phosphoxy ethyl methacrylate or vinyl phosphonate and a sulfonic acid-containing monomer such as vinyl sulfonate 2-acrylamide-2-methyl phosphonate) other than the dye monomer having the alkali-soluble group. It is most preferable to use both the methods.

The amount (acid value) of the alkali-soluble group contained in the dye multimer (A) is preferably 0.3 mmol to 2.0 mmol, more preferably 0.4 mmol to 1.5 mmol, and most preferably 0.5 mmol to 1.0 mmol, with respect to 1 g of the dye multimer (A).

In the present invention, the acid value of the dye multimer can be calculated from, for example, the average content of the acid group contained in the dye multimer. Moreover, by varying the content of the monomer unit that contains the acid group constituting the dye multimer, a resin having an intended acid value can be obtained.

Examples of other functional groups that the dye multimer (A) has include a development accelerator such as lactone, acid anhydride, amide, —COCH$_2$CO—, or a cyano group, or a hydrophobicity or hydrophilicity-regulating group such as a long chain-alkyl group, a cyclic alkyl group, an aralkyl group, an aryl group, a polyalkylene oxide group, a hydroxyl group, a maleimide group, or an amino group, and the like. These can be appropriately introduced into the dye multimer.

Examples of the method of introducing the functional group include a method of introducing the functional group in advance to the dye monomer, a method of copolymerizing a monomer having the above functional group, and the like.

Specific examples of repeating units having other functional groups that the dye multimer (A) has will be shown below, but the present invention is not limited thereto.

[Chem. 71]

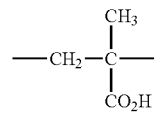 (H-1)

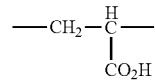 (H-2)

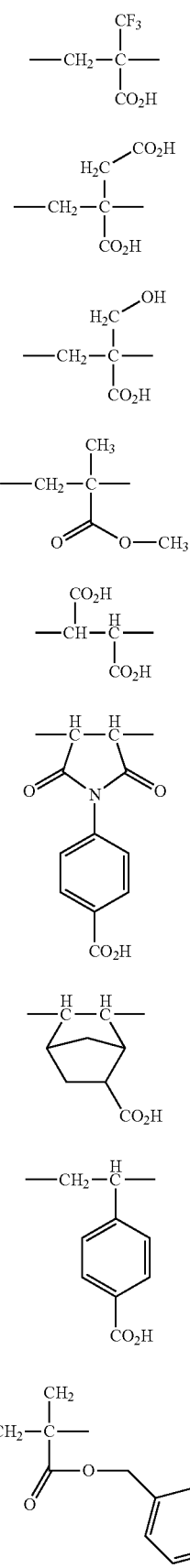
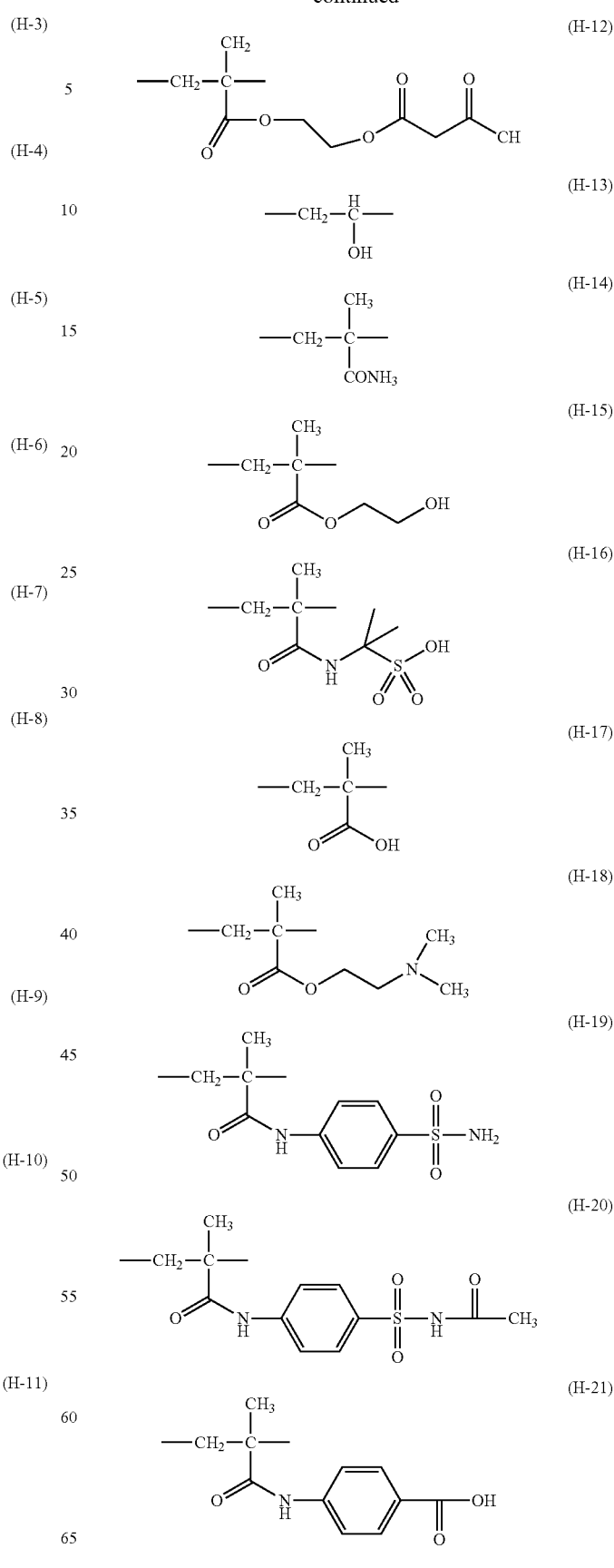

[Chem. 72]

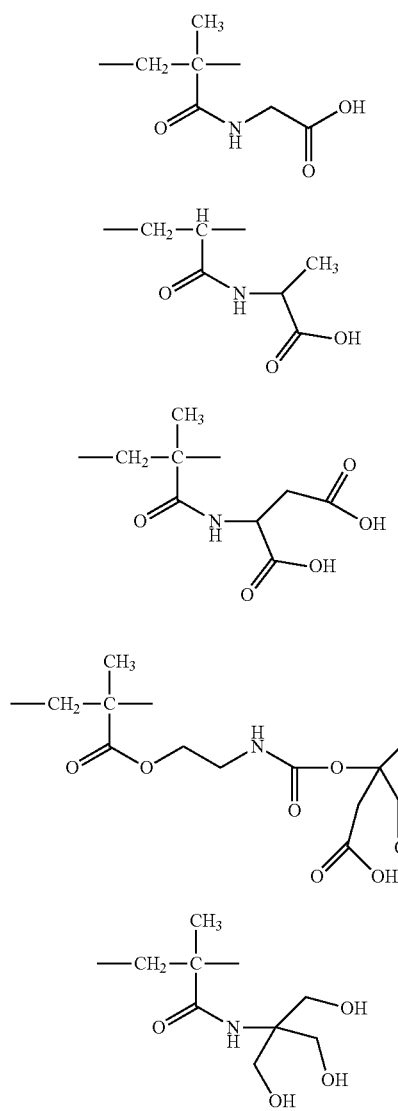

(H-22)
(H-23)
(H-24)
(H-25)
(H-26)

[Chem. 73]

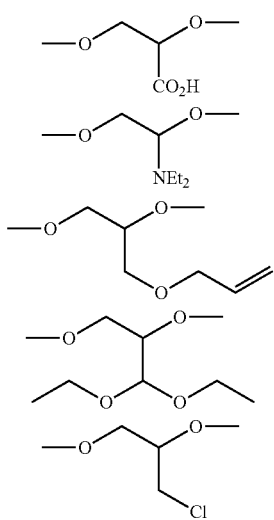

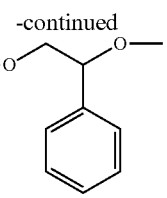

[Chem. 74]

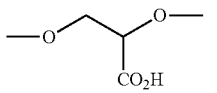 (H-27)

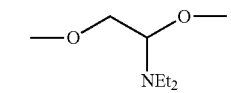 (H-28)

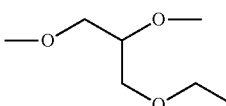 (H-29)

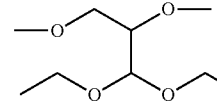 (H-30)

(H-31)

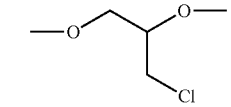 (H-32)

The weight average molecular weight of the dye multimer (A) is preferably 2,000 to 20,000, more preferably 3,000 to 15,000, and most preferably 4,000 to 10,000.

In the present invention, the weight average molecular weight and number average molecular weight are values measured by GPC and expressed in terms of styrene. For measuring the values, for example, it is possible to use HLC-8120 (manufactured by TOSOH CORPORATION), TSK gel Multipore HXL-M (manufactured by TOSOH CORPORATION, 7.8 mm ID×30.0 cm) as a column, and tetrahydrofuran (THF) as an eluent.

Moreover, a ratio [(Mw)/(Mn)] between the weight average molecular weight (Mw) and number average molecular weight (Mn) of the dye multimer (A) is preferably 1.0 to 3.0, more preferably 1.6 to 2.5, and most preferably 1.6 to 2.0.

Tg of the dye multimer (A) according to the present invention is preferably 50° C. or higher and more preferably 100° C. or higher. Furthermore, a 5% weight reduction temperature measured by thermogravimetric analysis (TGA measurement) is preferably 120° C. or higher, more preferably 150° C. or higher, and even more preferably 200° C. or higher. If the temperature is in this range, when the colored radiation-sensitive composition of the present invention is used for preparing a color filter or the like, change in concentration caused by a heating process can be reduced.

In addition, the absorption coefficient (hereinafter, described as ε'. ε'=ε/average molecular weight, unit: L/g·cm)

per unit weight of the dye multimer according to the present invention is preferably 30 or greater, more preferably 60 or greater, and even more preferably 100 or greater. If the extinction coefficient is in this range, when a color filter is prepared using the colored radiation-sensitive composition of the present invention, a color filter having excellent color reproducibility can be prepared.

From the viewpoint of a coloring ability, it is preferable for the molar absorption coefficient of the dye multimer (A) used for the colored radiation-sensitive composition of the present invention to be as high as possible.

It is preferable for the dye multimer (A) according to the present invention to be a compound soluble in the following organic solvents.

Examples of the organic solvents include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones (methyl ethyl ketone, cyclohexanone, 2-heptanone, 3-heptanone, and the like), and aromatic hydrocarbons (for example, toluene and xylene). The dye multimer (A) dissolves preferably from 1% by mass to 50% by mass, more preferably from 5% by mass to 40% by mass, and even more preferably from 10% by mass to 30% by mass in these solvents. If the resin (A) dissolves in the organic solvent in this range, when the colored radiation-sensitive composition of the present invention is used for preparing a color filter or the like, preferable coating surface properties can be obtained or reduction in concentration caused by elution after coating of other colors can be decreased.

In the colored radiation-sensitive composition of the present invention, one kind of the dye multimer (A) may be used singly, or two or more kinds thereof may be used concurrently.

The content of the dye multimer (A) in the colored radiation-sensitive composition of the present invention is determined in consideration of a content ratio between the dye multimer (A) and the (B) pigment which will be described later.

A ratio of mass of the dye multimer to the pigment (dye multimer (A)/pigment) is preferably 0.1/1 to 5/1, more preferably 0.2/1 to 2/1, and even more preferably 0.3/1 to 1/1.

[(B) Pigment]

The colored radiation-sensitive composition of the present invention contains a pigment.

As the pigment used in the present invention, various inorganic or organic pigments known in the related art can be used, and it is preferable for the pigment to have a high degree of transmissivity.

Examples of the inorganic pigment include metal compounds represented by a metal oxide, a metal complex salt, and the like, and specific examples thereof include metal oxides of iron, cobalt, aluminum, cadmium, lead, copper, titanium, magnesium, chromium, zinc, antimony, and the like, and complex oxides of the above metals.

Examples of the organic pigment include C. I. Pigment Yellow 11, 24, 31, 53, 83, 93, 99, 108, 109, 110, 138, 139, 147, 150, 151, 154, 155, 167, 180, 185, 199; C. I. Pigment Orange 36, 38, 43, 71; C. I. Pigment Red 81, 105, 122, 149, 150, 155, 171, 175, 176, 177, 209, 220, 224, 242, 254, 255, 264, 270; C. I. Pigment Violet 19, 23, 32, 39; C. I. Pigment Blue 1, 2, 15, 15:1, 15:3, 15:6, 16, 22, 60, 66; C. I. Pigment Green 7, 36, 37, 58; C. I. Pigment Brown 25, 28; C. I. Pigment Black 1,7; and the like.

Examples of pigments that can be preferably used in the present invention include the following, but the present invention is not limited thereto.

C. I. Pigment Yellow 11, 24, 108, 109, 110, 138, 139, 150, 151, 154, 167, 180, 185; C. I. Pigment Orange 36, 71; C. I. Pigment Red 122, 150, 171, 175, 177, 209, 224, 242, 254, 255, 264; C. I. Pigment Violet 19, 23, 32; C. I. Pigment Blue 15:1, 15:3, 15:6, 16, 22, 60, 66; C. I. Pigment Green 7, 36, 37, 58; C. I. Pigment Black 1, 7

One kind of these organic pigments can be used singly, or alternatively, for spectral adjustment or improvement of color purity, various organic pigments described above can be used in combination. Specific examples of the combination will be shown below. For example, as a red pigment, an anthraquinone-based pigment, a perylene-based pigment, or a diketopyrrolopyrrole-based pigment can be used singly, or alternatively, a mixture of at least one kind of these with a disazo-based yellow pigment, an isoindoline-based yellow pigment, a quinophthalone-based yellow pigment, or a perylene-based red pigment can be used. Examples of the anthraquinone-based pigment include C. I. Pigment Red 177, examples of the perylene-based pigment include C. I. Pigment Red 155 and C. I. Pigment Red 224, and examples of the diketopyrrolopyrrole-based pigment include C. I. Pigment Red 254. In view of color separation properties, a mixture of the above pigment with C. I. Pigment Yellow 139 is preferable. The mass ratio between the red pigment and the yellow pigment is preferably 100:5 to 100:50. If the mass ratio is 100:4 or less, it is difficult to reduce a light transmissivity at 400 nm to 500 nm, and if it is 100:51 or higher, a dominant wavelength moves closer to a short wavelength, so a color separating ability cannot be improved in some cases. Particularly, the mass ratio is optimally in a range of 100:10 to 100:30. Moreover, in a case of a combination of red pigments, the mass ratio can be adjusted according to the required spectrum.

As a green pigment, a halogenated phthalocyanine-based pigment can be used singly, or alternatively, a mixture of this pigment with a disazo-based yellow pigment, a quinophthalone-based yellow pigment, an azomethine-based yellow pigment, or an isoindoline-based yellow pigment can be used. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used singly, or a mixture of this pigment with a dioxazine-based violet pigment can be used. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

Moreover, as a pigment for a black matrix, carbon, titanium black, iron oxide, or titanium oxide may be used singly or used as a mixture, and a combination of carbon with titanium black is preferable. The mass ratio between carbon and titanium black is preferably in a rage of 100:0 to 100:60.

When the colored radiation-sensitive composition is used for a color filter, the average primary particle size of the pigment is preferably 100 nm or less from the viewpoint of color unevenness or contrast. From the viewpoint of dispersion stability, the average primary particle size is preferably 5 nm or greater. The average primary particle size of the pigment is more preferably 5 nm to 75 nm, even more preferably 5 nm to 55 nm, and particularly preferably 5 nm to 35 nm. The specific dispersion resin of the present invention can exert excellent effects particularly when it is combined with a pigment of which the average primary particle size is within a range of 5 nm to 35 nm.

The average primary particle size of the pigment can be measured by a known method such as an electron microscope. For example, it can be measured by a dynamic light scattering method by using an analyzer such as Microtrac Nanotrac UPA-EX150 (manufactured by NIKKISO CO., LTD).

It is preferable for the pigment to be a pigment selected from an anthraquinone pigment, a diketopyrrolopyrrole pigment, a phthalocyanine pigment, a quinophthalone pigment, an isoindoline pigment, an azomethine pigment, and a dioxazine pigment. Particularly, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are most preferable.

The content of the pigment is preferably 10% by mass to 70% by mass, more preferably 20% by mass to 60% by mass, and even more preferably 30% by mass to 60% by mass, with respect to the total amount of components contained in the colored radiation-sensitive composition excluding a solvent.

[(C) Polymerizable Compound]

The colored radiation-sensitive composition of the present invention contains a polymerizable compound.

Known polymerizable compounds that can be crosslinked by a radical, an acid, or heat can be used, and examples thereof include polymerizable compounds having an ethylenically unsaturated bond, a cyclic ether (epoxy or oxetane), methylol, and the like. In view of sensitivity, the polymerizable compound is suitably selected from compounds having one and preferably two or more terminal ethylenically unsaturated bonds. Among these, polyfunctional polymerizable compounds having 4 or more functional groups are preferable, and polyfunctional polymerizable compounds having 5 or more functional groups are more preferable.

Such compound groups are widely known in the industrial field of the related art and can be used in the present invention without particular limitation. These may be in any type of chemical forms such as a monomer, a prepolymer, that is, dimer, a trimer, an oligomer, a mixture of these, and a multimer of these. One kind of the polymerizable compound in the present invention may be used singly, or two or more kinds thereof may be used concurrently.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of unsaturated carboxylic acid and an aliphatic polyol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, or a mercapto group and monofunctional or polyfunctional isocyanates or epoxies, products of a dehydration condensation reaction between the unsaturated carboxylic acid esters or amides and a monofunctional or polyfunctional carboxylic acid, and the like are also suitably used. In addition, products of an addition reaction between unsaturated carboxylic acid esters or amides having an electrophilic substituent such as an isocyanate group or an epoxy group and monofunctional or polyfunctional alcohols, amines, or thiols, and products of a substitution reaction between unsaturated carboxylic acid esters or amides having an elimination substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in JP2009-288705A, paragraphs 0095 to 0108 can also be preferably used in the present invention.

As the polymerizable compound, compounds that have at least one addition-polymerizable ethylene group and have an ethylenically unsaturated group having a boiling point of 100° C. or higher under normal pressure are also preferable. Examples of the compounds include monofunctional acrylate or methacrylate such as polyethylene glycol mono(meth)acrylate, polypropylene glycol mono(meth)acrylate, and phenoxyethyl (meth)acrylate; compounds that are obtained by adding ethylene oxide or propylene oxide to a polyfunctional alcohol and then (meth)acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerin, and trimethylolethane; urethane (meth)acrylates described in JP1973-41708B (JP-S48-41708B), JP1975-6034B (JP-S50-6034B), and JP1976-37193A (JP-S51-37193A); polyester acrylates described in JP1973-64183A (JP-S48-64183A), JP1974-43191B (JP-S49-43191B), and JP1977-30490B (JP-S52-30490B); polyfunctional acrylate or methacrylate such as epoxy acrylates as products of a reaction between an epoxy resin and (meth)acrylic acid; and mixtures of these.

The above examples also include polyfunctional (meth)acrylate and the like that is obtained by reacting polyfunctional carboxylic acid with a compound having a cyclic ether group such as glycidyl (meth)acrylate and an ethylenically unsaturated group.

Furthermore, as other preferable polymerizable compounds, compounds having a fluorene ring and an ethylenically unsaturated group having 2 or more functional groups described in JP2010-160418A, JP2010-129825A, and JP4364216B, and a cardo resin can also be used.

Moreover, as the compound that has a boiling point of 100° C. or higher under normal pressure and has at least one addition-polymerizable ethylenically unsaturated group, compounds described in JP2008-292970A, paragraphs 0254 to 0257 are also preferable.

In addition to the above, radically polymerizable monomers represented by the following Formulae (MO-1) to (MO-5) can also be used. In the formulae, when T is an oxyalkylene group, the terminal at a carbon atom side binds to R.

[Chem. 75]

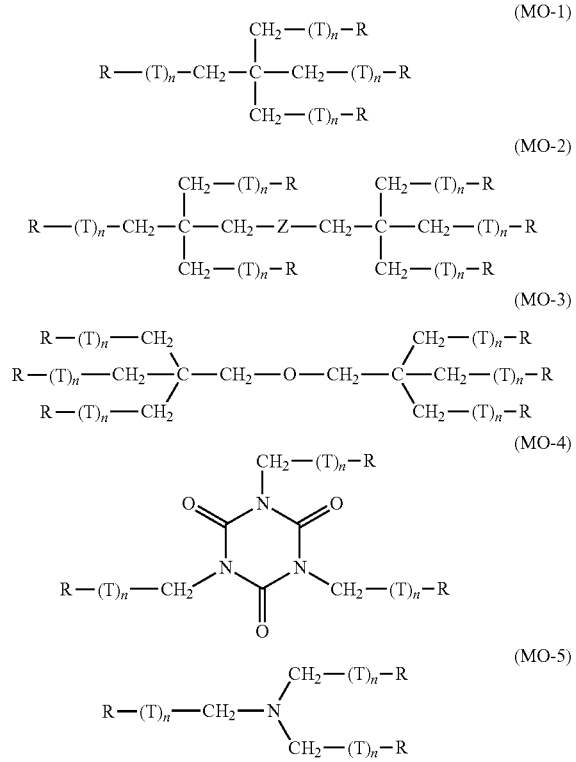

[Chem. 76]

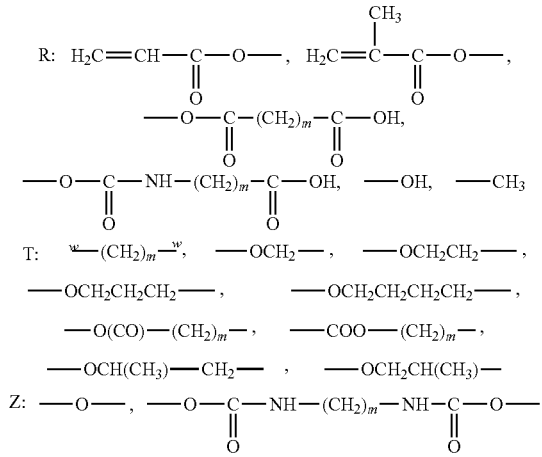

In the formula, n is 0 to 14, and m is 1 to 8. Each of plural Rs and Ts present in the same molecule may be the same as or different from each other.

In each of the polymerizable compounds represented by the Formulae (MO-1) to (MO-5), at least one of the plural Rs represents a group represented by —OC(=O)CH=CH$_2$ or —OC(=O)C(CH$_3$)=CH$_2$.

Specific examples of the polymerizable compounds represented by the Formulae (MO-1) to (MO-5) include the compounds described in JP2007-269779A, paragraphs 0248 to 0251.

In addition, a compound that is obtained by adding ethylene oxide or propylene oxide to the polyfunctional alcohol, which is described as Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol acrylate (KAYARAD D-330 as a commercially available product; manufactured by NIPPON KAYAKU Co., Ltd.), dipentaerythritol tetraacrylate (KAYARAD D-320 as a commercially available product; manufactured by NIPPON KAYAKU Co., Ltd.), dipentaerythritol penta(meth)acrylate (KAYARAD D-310 as a commercially available product; manufactured by NIPPON KAYAKU Co., Ltd.), dipentaerythritol hexa(meth)acrylate (KAYARAD DPHA as a commercially available product; manufactured by NIPPON KAYAKU Co., Ltd.), and a structure in which ethylene glycol or a propylene glycol residue is interposed between these (meth)acryloyl groups are preferable. Oligomer type of these can also be used. Preferable embodiments of the polymerizable compound will be shown below.

The polymerizable compound is a polyfunctional monomer and may have an acid group such as a carboxyl group, a sulfonic acid group, or a phosphoric acid group. If an ethylenic compound has an unreacted carboxyl group as in a case where the ethylene compound is a mixture described above, this compound can be used as is. However, if necessary, a hydroxyl group of the above ethylenic compound may be reacted with an aromatic carboxylic anhydride so as to introduce an acid group. In this case, specific examples of the aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, a polyfunctional monomer is preferable which is an ester obtained between an aliphatic polyhydroxy compound and an unsaturated carboxylic acid and obtains an acid group by reacting an unreacted hydroxyl group of the aliphatic polyhydroxy compound with a non-aromatic carboxylic anhydride.

Particularly, a monomer in which the aliphatic polyhydroxy compound in the ester is pentaerythritol and/or dipentaerythritol is preferable. Examples of commercially available products thereof include M-510, M-520, or the like which is a polybasic modified acryl oligomer manufactured by TOAGOSEI, CO., LTD.

One kind of these monomers may be used singly. However, it is difficult to use a single compound in production, and accordingly, two or more kinds thereof may be used as a mixture. Moreover, if necessary, a polyfunctional monomers not having an acid group and a polyfunctional monomer having an acid group may be used concurrently as the monomer.

The acid value of the polyfunctional monomer having an acid group is preferably 0.1 mg KOH/g to 40 mg KOH/g and particularly preferably 5 mg KOH/g to 30 mg KOH/g. If the acid value of the polyfunctional monomer is too low, characteristics of development solubility of the composition deteriorate. If the acid value is too high, difficulty is caused in production and handleability of the composition, hence a photopolymerization performance deteriorates, which leads to deterioration of curability such as surface smoothness of pixels. Therefore, when two or more kinds of polyfunctional monomers having different acid groups are used concurrently, or when a polyfunctional monomer not having an acid group is used concurrently, it is preferable to adjust the acid value such that the acid value of the whole polyfunctional monomers falls within the above range.

Moreover, an embodiment is also preferable in which the composition contains, as a polymerizable monomer, a polyfunctional monomer having a caprolactone structure.

The polyfunctional monomer having a caprolactone structure is not particularly limited as long as this monomer has a caprolactone structure in a molecule thereof, and examples thereof include ε-caprolactone-modified polyfunctional (meth)acrylates that are obtained by esterifying polyols such as trimethylolethane, ditrimethylolethane, trimethylolpropane, ditrimethylolpropane, pentaerythritol, dipentaerythritol, tripentaerythritol, glycerin, diglycerol, and trimethylolamine with (meth)acrylic acid and ε-caprolactone. Among these, a polyfunctional monomer having a caprolactone structure represented by the following Formula (Z-1) is preferable.

[Chem. 77]

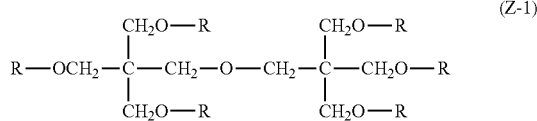

In Formula (Z-1), all of six Rs are a group represented by the following Formula (Z-2). Alternatively, one to five among six Rs are a group represented the following Formula (Z-2), and the remainder is a group represented by the following General Formula (Z-3).

[Chem. 78]

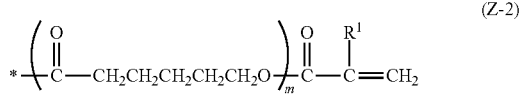

In Formula (Z-2), $R^1$ represents a hydrogen atom or a methyl group, m represents a number 1 or 2, and "*" represents a bond.

[Chem. 79]

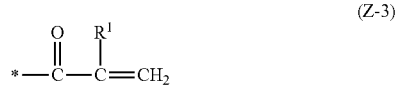

In Formula (Z-3), $R^1$ represents a hydrogen atom or a methyl group, and "*" represents a bond.

The polyfunctional monomer having such a caprolactone structure is commercially available from NIPPON KAYAKU Co., Ltd., as a KAYARAD DPCA series, and examples thereof include DPCA-20 (a compound in which m=1 in Formulae (1) to (3), the number of the group represented by Formula (2)=2, and all of $R^1$s are hydrogen atoms), DPCA-30 (a compound in which m=1 in Formulae (1) to (3), the number of the group represented by Formula (2)=3, and all of $R^1$s are hydrogen atoms), DPCA-60 (a compound in which m=1 in Formulae (1) to (3), the number of the group represented by Formula (2)=6, and all of $R^1$s are hydrogen atoms), DPCA-120 (a compound in which m=2 in Formulae (1) to (3), the number of the group represented by Formula (2)=6, and all of $R^1$s are hydrogen atoms), and the like.

In the present invention, one kind the polyfunctional monomer having a caprolactone structure can be used sigly, or two or more kinds thereof can be used by being mixed with each other.

Moreover, the specific monomer in the present invention is preferably at least one kind selected from a group of compounds represented by the following Formula (Z-4) or (Z-5).

[Chem. 80]

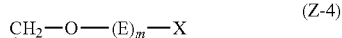

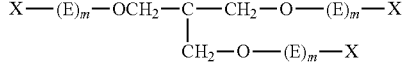

In the Formulae (Z-4) and (Z-5), each E independently represents —(($CH_2$)$yCH_2O$)— or —(($CH_2$)$yCH(CH_3)O$)—, each y independently represents an integer from 0 to 10, and each X independently represents an acryloyl group, a methacryloyl group, a hydrogen atom, or a carboxyl group.

In the Formula (Z-4), the sum of the acryloyl group and the methacryloyl group is 3 or 4, each m independently represents an integer from 0 to 10, and the sum of each m is an integer from 0 to 40. Here, when the sum of each m is 0, one of Xs is a carboxyl group.

In the Formula (ii), the sum of the acryloyl group and the methacryloyl group is 5 or 6, each n independently represents an integer from 0 to 10, and the sum of each n is an integer from 0 to 60. Here, when the sum of each n is 0, one of Xs is a carboxyl group.

In the Formula (Z-4), m is preferably an integer from 0 to 6, and more preferably an integer from 0 to 4.

Moreover, the sum of each m is preferably an integer from 2 to 40, more preferably an integer from 2 to 16, and particularly preferably an integer from 4 to 8.

In the Formula (Z-5), n is preferably an integer from 0 to 6, and more preferably an integer from 0 to 4.

Furthermore, the sum of each n is preferably an integer from 3 to 60, more preferably an integer from 3 to 24, and particularly preferably an integer from 6 to 12.

In addition, —(($CH_2$)$yCH_2O$)— or —(($CH_2$)$yCH(CH_3)O$)— in Formula (Z-4) or (Z-5) is preferably in the form in which the terminal at an oxygen atom side binds to X.

One kind of the compound represented by the Formula (Z-4) or (Z-5) may be used singly, or two or more kinds thereof may be used concurrently. Particularly, a form in which all of six Xs in Formula (ii) are an acryloyl group is preferable.

Moreover, the total content of the compound represented by the Formula (Z-4) or (Z-5) in the polymerizable compound is preferably 20% by mass or more, and more preferably 50% by mass or more.

The compound represented by the Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, so those skilled in the related art can easily synthesize the compound represented by General Formula (i) or (ii).

Among the compounds represented by the Formula (Z-4) or (Z-5), a pentaerythritol derivative and/or a dipentaerythritol derivative are/is more preferable.

Specific examples of the compounds include compounds represented by the following Formulae (a) to (f) (hereinafter, also referred to as "Examples Compounds (a) to (f)"). Among these, Examples Compounds (a), (b), (e), and (f) are preferable.

[Chem. 81]

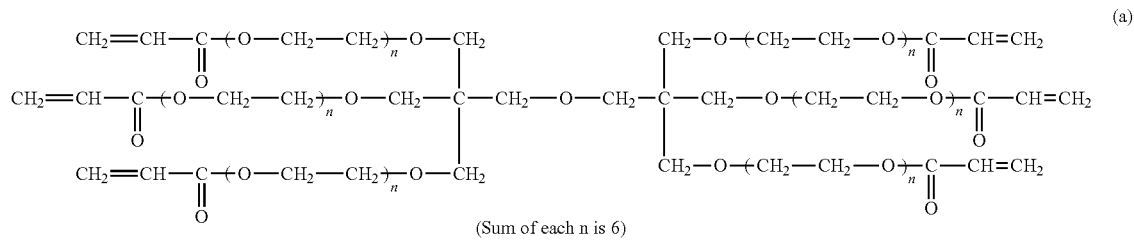

(a)

(Sum of each n is 6)

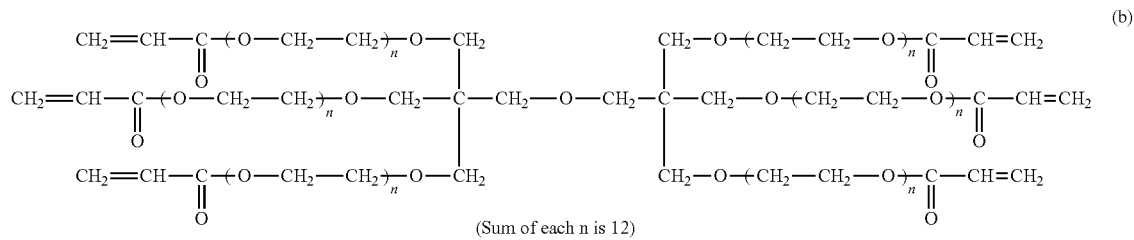

(b)

(Sum of each n is 12)

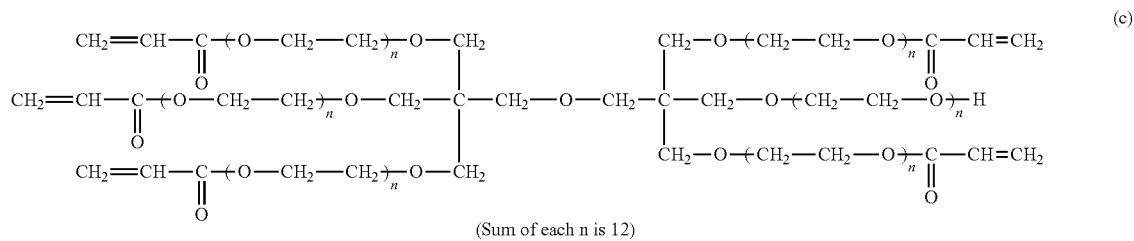

(c)

(Sum of each n is 12)

[Chem. 82]

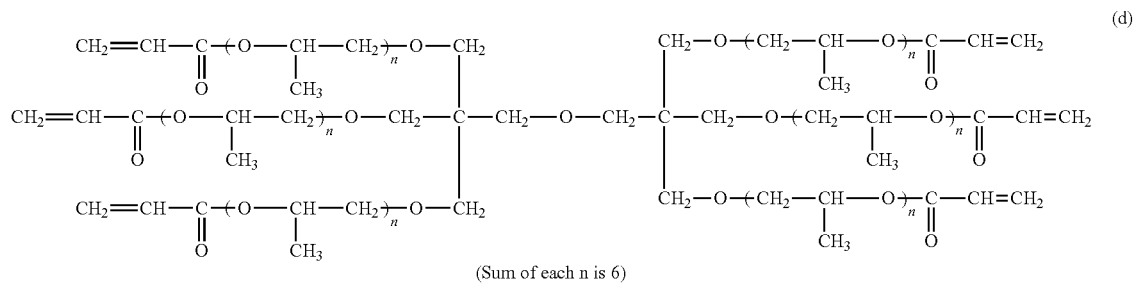

(d)

(Sum of each n is 6)

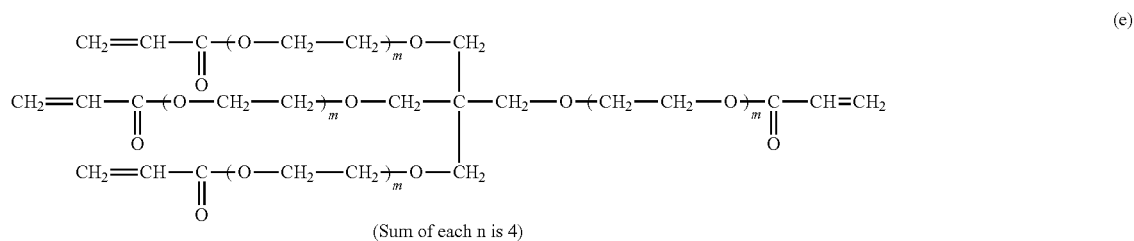

(e)

(Sum of each n is 4)

-continued

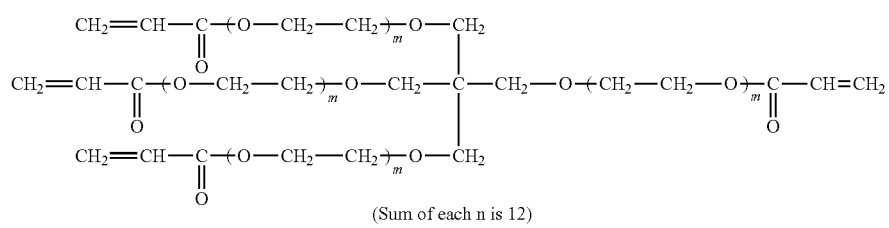

(Sum of each n is 12)

Examples of commercially available products of the polymerizable compounds represented by Formulae (Z-4) and (Z-5) include SR-494 whichi is manufactured by Sartomer and is tetrafunctional acrylate having four ethyleneoxy chains, DPCA-60 as hexafunctional acrylate having six pentyleneoxy chains and TPA-330 as trifunctional acrylate having three isobutyleneoxy chains, which are manufactured by NIPPON KAYAKU Co., Ltd., and the like.

Moreover, as the polymerizable compounds, urethane acrylates described in JP1973-41708B (JP-S48-41708B), JP1976-37193A (JP-S51-37193A), JP1990-32293B (JP-H2-32293B), and JP1990-16765B (JP-H2-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H1-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), "UA-7200" (manufactured by Shin-Nakamura Chemical Co., Ltd.), DPHA-40H (NIPPON KAYAKU Co., Ltd.), UA-306H, UA-306T, UA-306I, AH-600, T-600, and AI-600 (manufactured by KYOEISHA CHEMICAL Co., LTD.), M-460 (manufactured by TOAGOSEI CO., LTD.), and the like.

Details of how to use these polymerizable compounds, such as the structure, whether the polymerizable compounds are used singly or used concurrently, and the amount of the polymerizable compounds added, can be arbitrarily set according to the designed final performance of the colored radiation-sensitive composition. For example, from the viewpoint of sensitivity, a structure in which the content of an unsaturated group per molecule is large is preferable, and in many cases, it is preferable for the polymerizable compound to have 2 or more functional groups. Moreover, from the viewpoint of enhancing the strength of cured colored film formed of the colored radiation-sensitive composition, it is preferable for the polymerizable compound to have 3 or more functional groups. In addition, a method of adjusting both the sensitivity and strength by concurrently using compounds that differ in the number of functional groups and have different polymerizable groups (for example, an acrylic acid ester, a methacrylic acid ester, a styrene-based compound, and a vinylether based compound) is also effective. Furthermore, it is preferable to polymerizable compounds having 3 or more functaional groups and differing in the length of an ethylene oxide chain, since the developability of the colored radiation-sensitive composition can be adjusted, and excellent pattern formability is obtained.

In addition, in view of the compatibility between the polymerizable compound and other components (for example, a photopolymerization initiator, a substance to be dispersed, and alkali-soluble resin) contained in the colored radiation-sensitive composition and dispersibility, how to select and use the polymerizable compound is an important factor. For example, if a low-purity compound is used, or two or more kinds thereof are used concurrently, the compatibility can be improved. Moreover, in view of improving adhesiveness of the composition to a hard surface of a support and the like, specific structures may be selected.

The content of the polymerizable compound in the colored radiation-sensitive composition of the present invention is preferably 0.1% by mass to 90% by mass, more preferably 1.0% by mass to 50% by mass, and particularly preferably 2.0% by mass to 30% by mass, with respect to the total solid contents of the colored radiation-sensitive composition.

[(D) Photopolymerization Initiator]

From the viewpoint of further improving sensitivity, the colored radiation-sensitive composition of the present invention must contain a photopolymeriation initiator.

The photopolymerization initiator can be appropriately selected from known photopolymerization initiators without particular limitation, as long as the photopolymerization initiator has a function of initiating polymerization of the polymerizable compound. For example, photopolymerization initiators sensitive to light rays in a range from ultraviolet region to visible light are preferable. Moreover, the photopolymerization initiator may be either an activator that interacts with a photo-excited sensitizer in any way and generates active radicals or an initiator that initiates cationic polymerization according to the type of monomer.

It is preferable for the photopolymerization initiator to contain at least one kind of compound having at least a molecular absorption coefficient of about 50 in a range from about 300 nm to about 800 nm (more preferably 330 nm to 500 nm).

Examples of the photopolymerization initiator include halogenated hydrocarbon derivatives (for example, a derivative having a triazine skeleton, a derivative having an oxadiazole skeleton, and the like), acyl phosphine compounds such as acyl phosphine oxide, oxime compounds such as hexaaryl biimidazole, and oxime derivatives, organic peroxide, thio compounds, ketone compounds, aromatic onium salts, ketoxime ether, aminoacetophenone compounds, hydroxyacetophenone, and the like.

Furthermore, from the viewpoint of exposure sensitivity, a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, 3-aryl-substituted coumarin compound is preferable.

More preferably, at least one kind of compound that is a trihalomethyl triazine compound, an α-aminoketone compound, an acyl phosphine compound, a phosphine oxide compound, an oxime compound, a triallyl imidazole dimer, an onium compound, a benzophenone compound, or an acetophenone compound and selected from a group consisting of a trihalomethyl triazine compound, an α-aminoketone compound, an oxime compound, a triallyl imidazole dimer, and a benzophenone compound is most preferable.

Particularly, when the colored radiation-sensitive composition of the present invention is used for preparing a color filter of a solid-state image sensor, a fine pattern needs to be formed in a sharp shape. Accordingly, it is important for the composition to have curability and to be developed without residues in an unexposed portion. From this viewpoint, it is particularly preferable to use an oxime compound as a polymerization initiator. Particularly, when a fine pattern is formed in the solid-state image sensor, stepper exposure is used for exposure for curing. However, the exposure machine used at this time is damaged by halogen in many cases, so the amount of a polymerization initiator added needs to be reduced. Considering this point, for forming a fine pattern like a solid-state image sensor, it is most preferable to use an oxime compound as the (D) photopolymerization initiator.

Examples of the halogenated hydrocarbon compound having a triazine skeleton include the compound described in Wakabayashi et al., Bull. Chem. Soc. Japan, 42, 2924 (1969), the compound described in UK1388492B, the compound described in JP1978-133428A (JP-553-133428A), the compound described in GE3337024B, the compound described in F. C. Schaefer et al., J. Org. Chem.; 29, 1527 (1964), the compound described in JP1987-58241A (JP-562-58241A), the compound described in JP1993-281728A (JP-H5-281728A), the compound described in JP1993-34920A (JP-H5-34920A), the compound described in U.S. Pat. No. 4,212,976A, and the like.

Examples of the compound disclosed in the U.S. Pat. No. 4,212,976A include compounds having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadizaole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, and 2-tribromomethyl-5-styryl-1,3,4-oxadiazole) and the like.

Examples of photopolymerization initiators other than the above include acridine derivatives (for example, 9-phenylacridine and 1,7-bis(9,9'-acridinyl)heptane), N-phenylglycine, polyhalogen compounds (for example, carbon tetrabromide, phenyl tribromomethyl sulfone, and phenyl trichloromethyl ketone), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonyl bis(5,7-di-n-propoxycoumarin), 3,3'-carbonyl bis(7-diethylaminocoumarin), 3-benzoyl-7-methoxycoumarin, 3-(2-furoyl)-7-diethylaminocoumarin, 3-(4-diethylamino-cinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, and coumarin compounds described in JP1993-19475A (JP-H5-19475A), JP1995-271028A (JP-H7-271028A), JP2002-363206A, JP2002-363207A, JP2002-363208A, JP2002-363209A, and the like), acyl phosphine oxides (for example, bis(2,4,6-trimethylbenzoyl)-phenyl phosphine oxide, bis(2,6-dimethoxybenzoyl)-2,4,4-trimethyl-pentylphenyl phosphine oxide, and Lucirin TPO), metallocenes (for example, bis(η5-2,4-cyclopentadien-1-yl)-bis(2,6-difluoro-3-(1H-pyrrol-1-yl)-phenyl)titanium, and η5-cyclopentadienyl-η6-cumenyl-iron(1+)-hexafluorophosphate(1−)), the compounds described in JP1978-133428A (JP-S53-133428A), JP1982-1819B (JP-S57-1819B), JP1982-6096B (JP-S57-6296B), and U.S. Pat. No. 3,615,455A, and the like.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, 4,4'-bis(hydroxyethylamino)benzophenone, 4-methoxy-4'-dimethylaminobenzophenone, 4,4'-dimethoxybenzophenone, 4-dimethylaminobenzophenone, and 4-dimethylaminoacetophenone), benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, a 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butylacridone, N-butyl-chloroacridone, and the like.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used. Moreover, as the acyl phosphine-based initiator, IRGACURE-819 or DAROCUR-TPO (trade name, all manufactured by BASF) which are commercially available products can be used.

Examples of the photopolymerization initiator more preferably include oxime compounds. Specific examples of the oxime compounds include the compound described in JP2001-233842A, the compound described in JP2000-80068A, and the compound described in JP2006-342166A can be used.

Examples of the oxime compound such as an oxime derivative that is preferably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime compound include the compounds described in J. C. S. Perkin II (1979), pp 1653-1660, J. C. S. Perkin II (1979), pp 156-162, Journal of Photopolymer Science and Technology (1995), pp 202-232, and JP2000-66385A, the compounds described respectively in JP2000-80068A, JP2004-534797A, and JP2006-342166A, and the like.

As commercially available products, IRGACURE-OXE01 (manufactured by BASF) and IRGACURE-OXE02 (manufactured by BASF) are also preferably used.

As oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a dye moiety, the ketoxime compound described in WO2009/131189A, the compound described in U.S. Pat. No. 7,556,910B that contains a triazine skeleton and an oxime skeleton in the same molecule, the compound described in JP2009-221114A that exhibits maximum absorption at 405 nm and exhibits excellent sensitivity to a light source of a g-line, and the like may be used.

Moreover, the cyclic oxime compounds described in JP2007-231000A and JP2007-322744A can also be preferably used. Among the cyclic oxime compounds, the cyclic oxime compounds condensed to a carbazole dye, which are described in JP2010-32985A and JP2010-185072A, are preferable, since these compounds have a high degree of light absorptivity and make it possible to improve sensitivity.

Furthermore, the compound described in JP2009-242469A that is an oxime compound having an unsaturated bond in a specific moiety can also be preferably used since this compound makes it possible to improve sensitivity by reproducing active radicals from polymerization-inactive radicals.

The most preferable examples of the oxime compounds include the oxime compound having a specific substituent described in JP2007-269779A and the oxime compound having a thioaryl group described in JP2009-191061A.

Specifically, the oxime compound as a photopolymerization initiator is preferably a compound represented by the following Formula (OX-1). Moreover, the compound may be an oxime compound in which an N—O bonde of oxime forms an (E) isomer, an oxime compound in which the N—O bond forms a (Z) isomer, or a mixture in which the N—O bond forms a mixture of an (E) isomer and a (Z) isomer.

[Chem. 83]

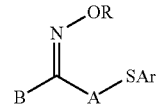

(OX-1)

In Formula (OX-1), each of R and B independently represents a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, an arylthiocarbonyl group, and the like. These groups may have one or more substituents. Moreover, the above substituents may be further substituted with other substituents.

Examples of the substituents include a halogen atom, an aryloxy group, an alkoxycarbonyl group, an aryloxycarbonyl group, an acyloxy group, an acyl group, an alkyl group, an aryl group, and the like.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, an octaphenyl group, an o-tolyl group, an m-tolyl group, a p-tolyl group, a xylyl group, an o-cumenyl group, an m-cumemyl group, a p-cumenyl group, a mesityl group, a pentalenyl group, a binaphthalenyl group, a ternaphthalenyl group, an octanaphthalenyl group, a heptalenyl group, biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, an octaanthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group, aromatic or aliphatic heterocycles having a nitrogen atom, an oxygen atom, a sulfur atom, or a phosphorus atom are preferable.

Specific examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathienyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantholyl group.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In Formula (OX-1), the monovalent substituent represented by B represents an aryl group, a heterocyclic group, an arylcarbonyl group, or a heterocyclic carbonyl group. These groups may have one or more substituents, and examples of the substituents include the substituents described above. Moreover, the substituents described above may be further substituted with other substituents.

Among these, the following structures are particularly preferable.

In the following structures, each of Y, X, and n have the same definition as Y, X, and n in Formula (OX-2) which will be described later, and the preferable examples thereof are also the same.

[Chem. 84]

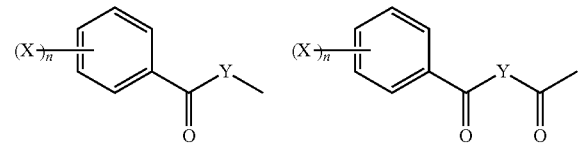

In Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. Furthermore, the substituents described above may further substituted with other substituents.

Among these, as A in Formula (OX-1), in view of improving sensitivity and inhibiting coloring caused by elapse of time during heating, an unsubstituted alkylene group, an alkylene group substituted with an alkyl group (for example, a methyl group, an ethyl group, a tert-butyl group, or a dodecyl group), an alkylene group substituted with an ankenyl group (for example, a vinyl group or an allyl group), and an alkylene group substituted with an aryl group (for example, a phenyl group, a p-tolyl group, a xylyl group, a cumenyl group, a naphthyl group, an anthryl group, a phenanthryl group, or a styryl group) are preferable.

In Formula (OX-1), the aryl group represented by Ar is preferably an aryl group having 6 to 30 carbon atoms, and may have a substituent. Examples of the substituent include the same ones as the substituents exemplified above as specific examples of the aryl group that may have a substituent and introduced into the substituted aryl group.

Among these, in view of improving sensitivity and inhibiting coloring caused by elapse of time during heating, a substituted or unsubstituted phenyl group is preferable.

In Formula (OX-1), in view of sensitivity, a structure "SAr" that is formed of Ar and S adjacent thereto in Formula (OX-1) is preferably the following structure. Moreover, Me represents a methyl group, and Et represents an ethyl group.

[Chem. 85]

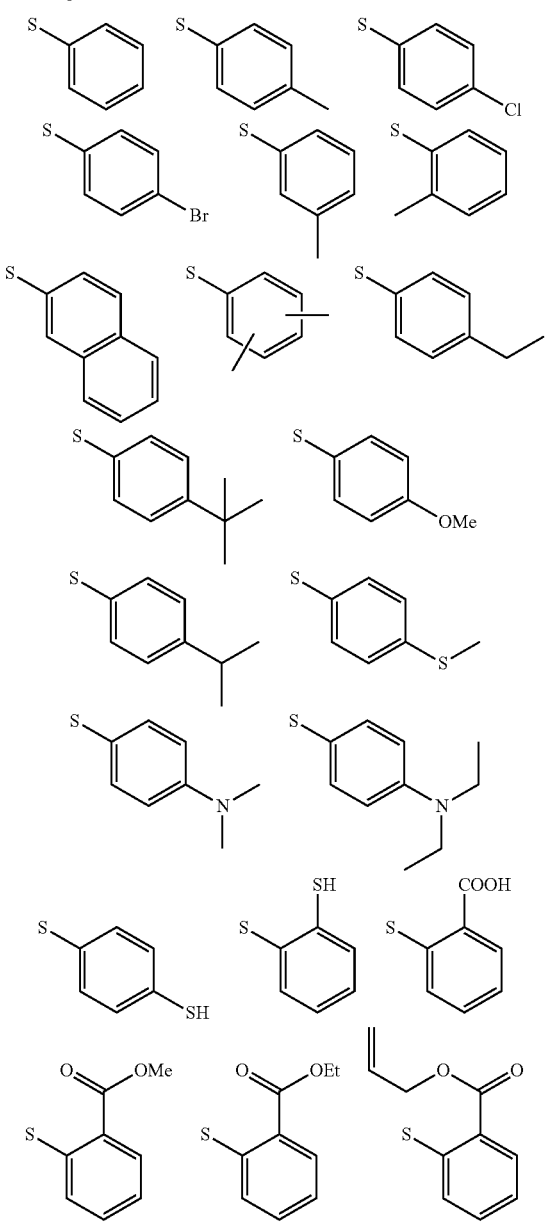

The oxime compound is preferably a compound represented by the following Formula (OX-2).

[Chem. 86]

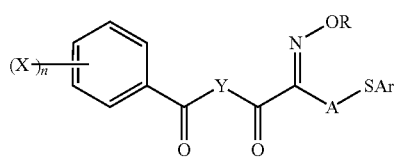

In Formula (OX-2), each of R and X independently represents a monovalent substituent, each of A and Y independently represents a divalent organic group, Ar represents an aryl group, and n represents an integer from 0 to 5. R, A, and Ar in Formula (OX-2) have the same definition as R, A, and Ar in Formula (OX-1), and the preferable examples thereof are also the same.

Examples of the monovalent substituent represented by X in Formula (OX-2) include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents, and examples of the substituents include the substituents described above. Moreover, the substituents described above may be further substituted with other substituents.

Among these, in view of improving solvent solubility and absorption efficiency in a long-wavelength region, X in Formula (OX-2) is preferably an alkyl group.

Furthermore, n in Formula (2) represents an integer from 0 to 5 and preferably represents an integer of 0 to 2.

Examples of the divalent organic group represented by Y in Formula (OX-2) include the following structures. In the following groups, "*" represents a position where Y binds to an carbon atom adjacent thereto in Formula (OX-2).

[Chem. 87]

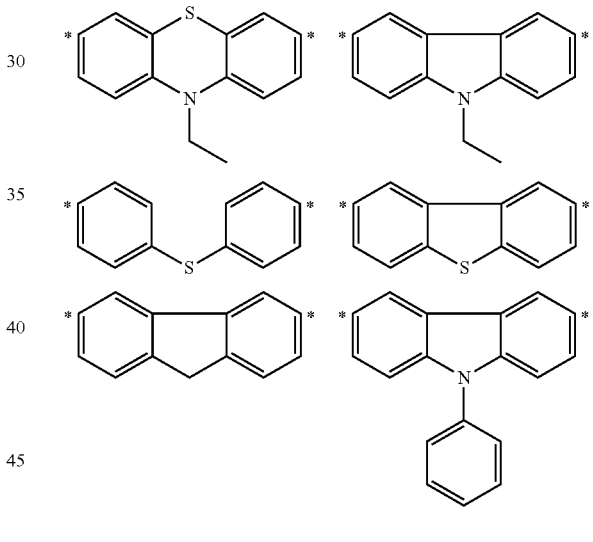

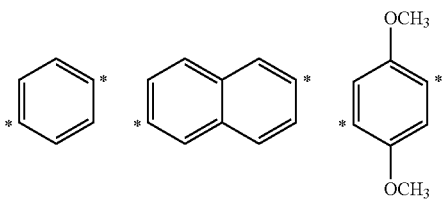

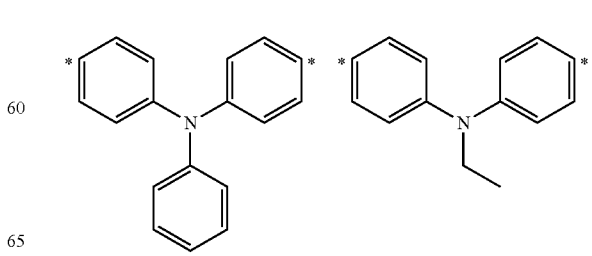

Among these, in view of improving sensitivity, the following structures are preferable.

[Chem. 88]

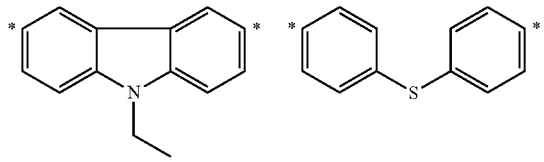

Moreover, the oxime compound is preferably a compound represented by the following Formula (OX-3) or (OX-4).

[Chem. 89]

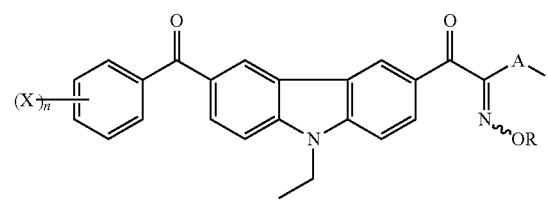

(OX-3)

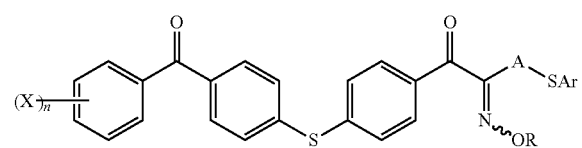

(OX-4)

In Formula (OX-3) or (OX-4), each of R and X independently represents a monovalent substituent, A represents a divalent organic group, Ar represents an aryl group, and n represents an integer from 0 to 5.

Each of R, X, A, Ar, and n in Formula (OX-3) or (OX-4) has the same definition as R, X, A, Ar, and n in the Formula (OX-2), and the preferable examples thereof are also the same.

Specific examples (C-4) to (C-13) of the oxime compound that are preferably used will be shown below, but the present invention is not limited thereto.

[Chem. 90]

(C-4)

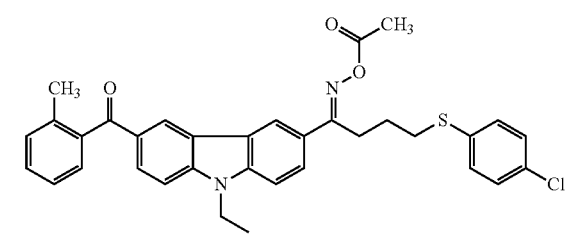

(C-5)

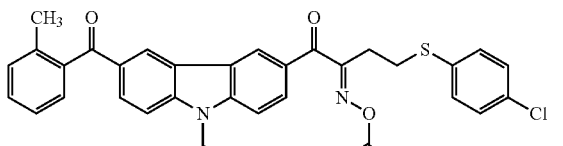

(C-6)

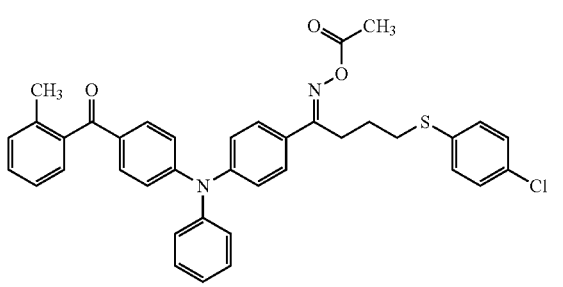

(C-7)

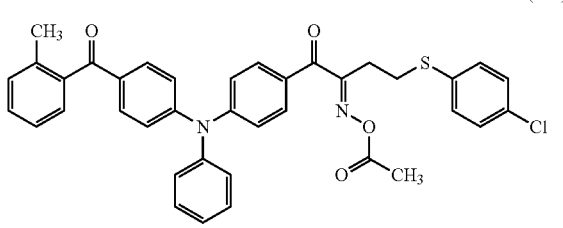

(C-8)

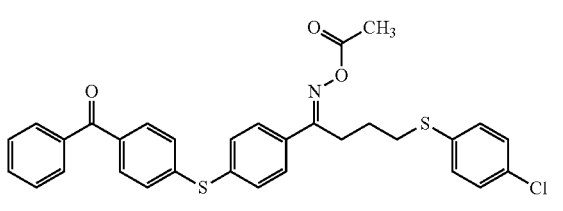

(C-9)

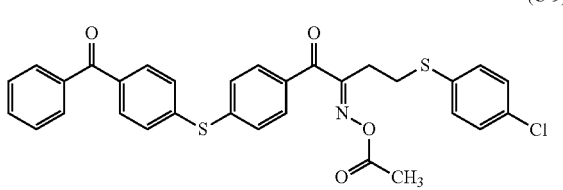

(C-10)

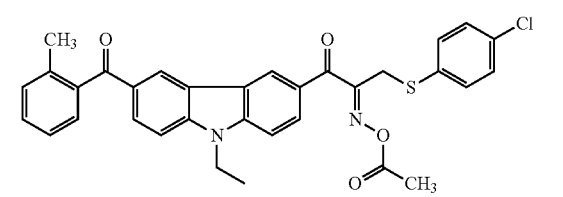

(C-11)

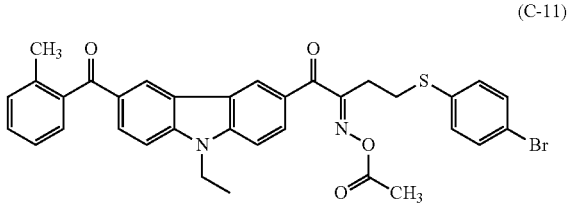

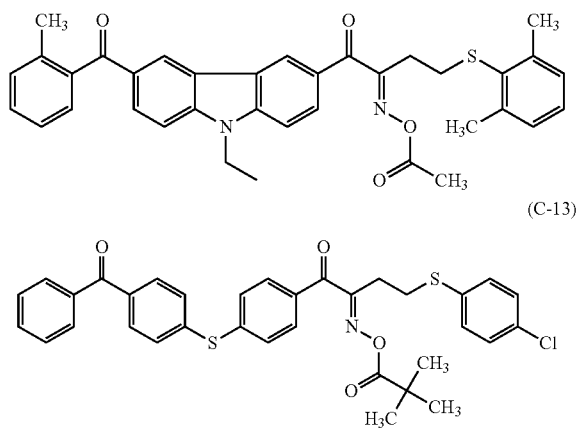

The oxime compound has a maximum absorption wavelength in a wavelength region of 350 nm to 500 nm and preferably in a wavelength region of 360 nm to 480 nm, and an oxime compound showing a high absorbance at 365 nm and 455 nm is particularly preferable.

In view of sensitivity, the molar absorption coefficient at 365 nm or 405 nm of the oxime compound is preferably 1,000 to 300,000, and more preferably 2,000 to 300,000, and particularly preferably 5,000 to 200,000.

The molar absorption coefficient of the compound can be measured using a known method. Specifically, it is preferable to measure the molar absorption coefficient by means of, for example, an ultraviolet and visible light spectrophotometer (Carry-5 spectrophotometer manufactured by Varian) by using an ethyl acetate solvent at a concentration of 0.01 g/L.

If necessary, the photopolymerization initiator used in the present invention may be used in combination of two or more kinds thereof.

The content of the (D) photopolymerization initiator contained in the colored radiation-sensitive composition of the present invention is preferably from 0.1% by mass to 50% by mass, more preferably from 0.5% by mass to 30% by mass, and even more preferably from 1% by mass to 20% by mass, with respect to the total solid contents of the colored radiation-sensitive composition. If the content of the photopolymerization initiator is within this range, better sensitivity and pattern formability are obtained.

[(E) Dispersion Resin Obtained by Reacting Polymer, Which Has a Hydroxyl Group on One Terminal, with Acid Anhydride]

The colored radiation-sensitive composition of the present invention contains a dispersion resin (specific dispersion resin) obtained by reacting a polymer, which has a hydroxyl group on one terminal, with an acid anhdyride.

(Polymer Which Has a Hydroxyl Group on One Terminal)

Examples of the polymer which has a hydroxyl group on one terminal include polymers having known repeating units and a hydroxyl group on one terminal, such as polyester-based polymers, (meth)acrylic polymers, and styrene polymers. As the polymer which has a hydroxyl group on one terminal, polyeseter obtained by reacting an alcohol with lactone and poly(meth)acrylic acid ester polymerized using hydroxyl group-containing thiol as a chain transfer agent are preferable.

<Polyester Obtained by Reacing Alcohol with Lactone>

As the alcohol, known alcohols can be used. From the viewpoint of reactivity, alcohols having a boiling point of 100° C. or higher are preferable, aliphatic alcohols having 4 to 25 carbon atoms are preferable.

As the lactone, known lactones can be used. From the viewpoint of reactivity and dispersibility, ε-caprolactone is preferable.

Two or more kinds of alcohols and lactones may be mixed with each other for reaction.

At the time of performing a polyesterification reaction, a catalyst may be added.

As the catalyst, a tin catalyst (for example, stannous chloride, stannic chloride, tin octylate, dibutyltin oxide, monobutyltin oxide, or the like) and a titanium catalyst (for example, tetrabutyl titanate, tetrapropyl titanate, or the like) are preferable, and among these, monobutyltin dioxide is most preferable.

The reaction temperature of the polyesterification reaction can be appropriately set, but the temperature is generally 80° C. to 200° C. The reaction time is preferably set to 2 to 24 hours.

Regarding the method of synthesizing polyester obtained by reacting an alcohol with lactone, the method described in, for example, JP4020150B can be referred to.

<Poly(meth)acrylic Acid Ester Polymerized Using Hydroxyl Group-Containing Thiol as Chain Transfer Agent>

Raw material monomers of the poly(meth)acrylic acid ester can be selected from known (meth)acrylic acid esters. Among these, particularly, (meth)acrylic acid esters having an alkoxy moiety having 1 to 10 carbon atoms, such as methyl (meth)acrylate, ethyl (meth)acrylate, propyl (meth)acrylate, isopropyl (meth)acrylate, butyl (meth)acrylate, sec-butyl (meth)acrylate, isobutyl (meth)acrylate, tert-butyl (meth)acrylate, pentyl (meth)acrylate, hexyl (meth)acrylate, heptyl (meth)acrylate, octyl (meth)acrylate, and 2-ethylhexyl (meth)acrylate, are preferable. From the viewpoint of dispersibility, methyl (meth)acrylate and ethyl (meth)acrylate are most preferable.

The hydroxyl group-containing thiol used as a chain transfer agent can be appropriately selected from known thiols. From the viewpoint of polymerization properties, 2-mercaptoethanol or 3-mercapto-1,2-propanediol is preferable.

Regarding the method of synthesizing poly(meth)acrylic acid ester polymerized using hydroxyl group-containing thiol as a chain transfer agent, the method described in, for example, JP2009-165924A can be referred to.

(Acid Anhydride)

As the acid anhydride, known acid anhydrides can be used, and among these, tetracarboxylic acid dianhydrides are preferably used.

Examples of the tetracarboxylic acid dianhydrides include the following.

Examples of aliphatic tetracarboxylic acid dianhydrides include 1,2,3,4-butanetetracarboxylic acid dianhydride, 1,2,3,4-cyclobutanetetracarboxylic acid dianhydride, 1,3-dimethyl-1,2,3,4-cyclobutanetetracarboxylic acid dianhydride, 1,2,3,4-cyclopentanetetracarboxylic acid dianhydride, 2,3,5-tricarboxycyclopentyl acetic dianhydride, 2,3,5,6-tetracarboxycyclohexane dianhydride, 2,3,5,6-tetracarboxynorbornane dianhydride, 3,5,6-tricarboxynorbornane-2-acetic dianhydride, 2,3,4,5-tetrahydrofulan tetracarboxylic acid dianhydride, 5-(2,5-dioxotetrahydrofural)-3-methyl-3-cyclohexene-1,2-dicarboxylic acid dianhydride, bicyclo[2,2,2]-oct-7-ene-2,3,5,6-tetracarboxylic acid dianhydride, and the like.

Examples of aromatic tetracarboxylic acid dianhydrides include pyromellitic dianhydride, ethylene glycol trimellitic dianhydride ester, propylene glycol trimellitic dianhydride ester, butylene glycol trimellitic dianhydride ester, 3,3',4,4'- benzophenone tetracarboxylic acid dianhydride, 2,2',3,3'-benzophenone tetracarboxylic acid dianhydride, 3,3',4,4'-biphenylsulfone tetracarboxylic acid dianhydride, 2,2',3,3'-biphenylsulfone tetracarboxylic acid dianhydride, 1,4,5,8-naphthalene tetracarboxylic acid dianhydride, 2,3,6,7-naphthalene tetracarboxylic acid dianhydride, 3,3',4,4'-biphenylether tetracarboxylic acid dianhydride, 3,3',4,4'-dimethyldiphenylsilane tetracarboxylic acid dianhydride, 3,3',4,4'-tetraphenylsilane tetracarboxylic acid dianhydride, 1,2,3,4-furan tetracarboxylic acid dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy)diphenylpropane dianhydride, 3,3',4,4'-perfluoroisopropylidene diphthalic acid dianhydride, 3,3',4,4'-biphenyltetracarboxylic acid dianhydride, bis(phthalic acid)phenylphosphine oxide dianhydride, p-phenylene-bis(triphenylphthalic acid) dianhydride, M-phenylene-bis(triphenylphthalic acid) dianhydride, bis(triphenylphthalic acid)-4,4'-diphenylether dianhydride, bis(triphenylphthalic acid)-4,4'-diphenylmethane dianhydride, 9,9-bis(3,4-dicarboxyphenyl)fluorene dianhydride, 9,9-bis[4-(3,4-dicarboxyphenoxy)phenyl]fluorene dianhydride, and the like.

Examples of polycyclic tetracarboxylic acid anhydrides include 3,4-dicarboxy-1,2,3,4-tetrahydro-1-naphthalene succinic dianhydride, 3,4-dicarboxy-1,2,3,4-tetrahydro-6-methyl-1-naphthalene succinic dianhydride, and the like.

Examples of compounds as tetracarboxylic acid dianhydride are described as above. However, tetracarboxylic acid dianhydrides that can be used for obtaining the specific dispersion resin are not limited to the compounds exemplified as above, and the tetracarboxylic acid dianhydrides have any type of structure as long as they have two carboxylic acid anhydride groups. Moreover, one kind of these tetracarboxylic acid dianhydrides may be used singly, or plural kinds thereof may be used concurrently.

In the present invention, from the viewpoint of decreasing viscosity of the specific dispersion resin, aromatic tetracarboxylic acid dianhydride is preferably used as the tetracarboxylic acid dianhydride. More specifically, as the aromatic tetracarboxylic acid dianhydride, pyromellitic dianhydride, 3,3',4,4'-benzophenone tetracarboxylic acid dianhydride, ethylene glycol trimellitic dianhydride ester, 3,3',4,4'-benzophenone tetracarboxylic acid dianhydride, 9,9-bis(3,4-dicarboxyphenyl)fluorene dianhydride, 3,3',4,4'-biphenylsulfone tetracarboxylic acid dianhydride, 2,3,6,7-naphthalene tetracarboxylic acid dianhydride, and 3,3',4,4'-biphenyl tetracarboxylic acid dianhydride are preferable.

(Method for Producing Specific Dispersion Resin)

Specifically, the specific dispersion resin is obtained by reacting the polymer, which has a hydroxyl group on one terminal, with the acid anhydride.

The specific dispersion resin can be synthesize based on the method described in, for example, JP4020150B, JP2009-1659254A, and the like.

A weight average molecular weight of the specific dispersion resin is preferably 2,000 to 50,000, more preferably 3,000 to 40,000, and even more preferably 4,000 to 30,000.

An acid value of the specific dispersion resin is preferably 10 mg KOH/g to 200 mg KOH/g, more preferably 20 mg KOH/g to 150 mg KOH/g, and even more preferably 30 mg KOH/g to 100 mg KOH/g.

As specific examples of the specific dispersion resin, example compounds (a-1) to (a-11) will be shown below. However, the specific dispersion resin of the present invention is not limited thereto.

[Chem. 91]

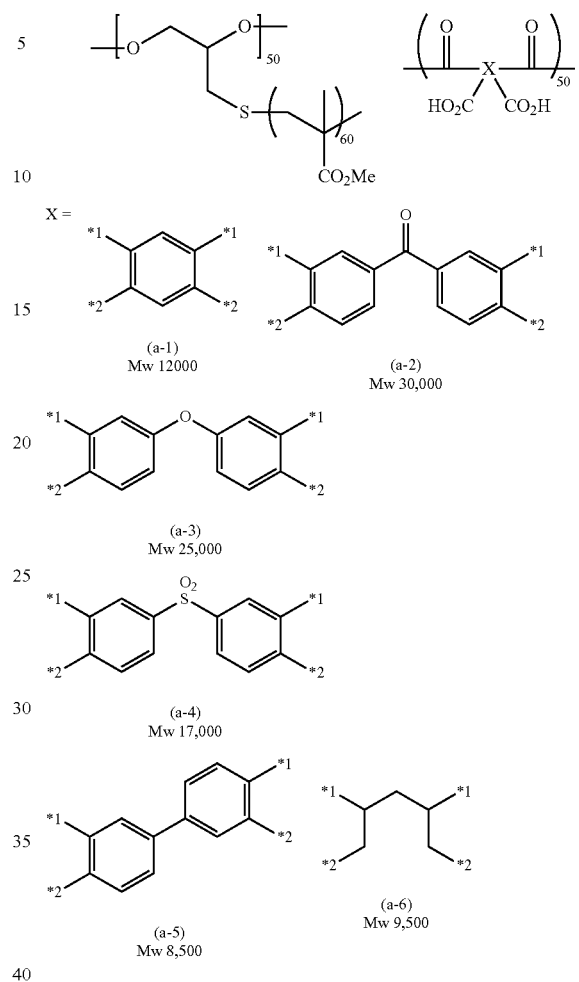

In the example compounds (a-1) to (a-6), one of the *1 and *2 in a linking group X indicates a position where the compound is linked to two carboxyl groups, and the other indicates a polytion where the compound is linked to a polymer main chain.

[Chem. 92]

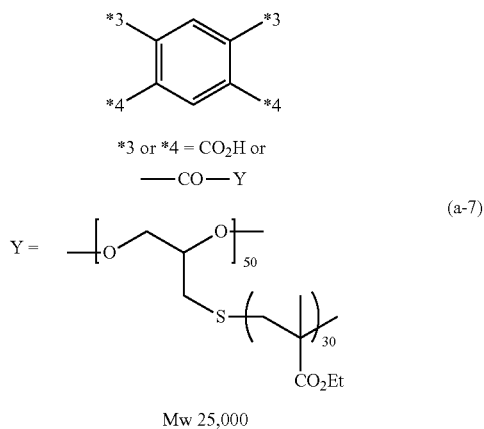

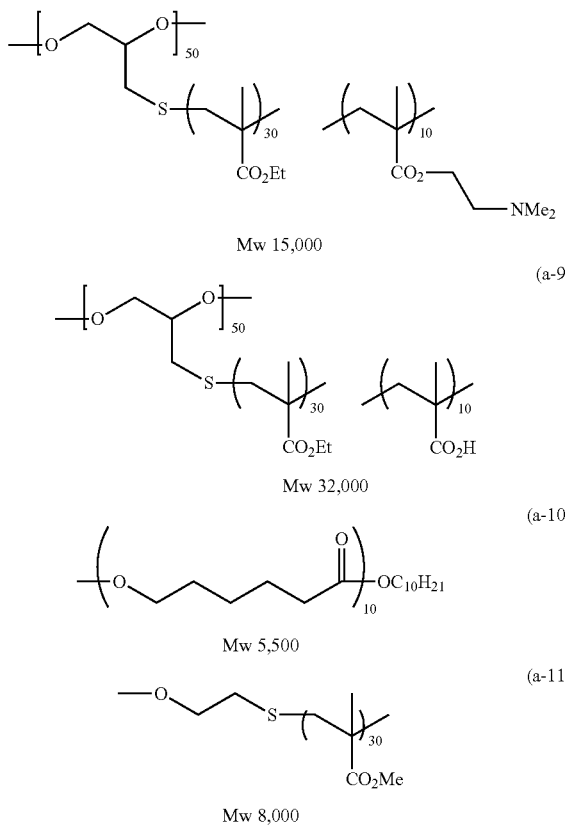

The content of the specific dispersion resin in the colored radiation-sensitive composition of the present invention is preferably 10% by mass to 60% by mass, more preferably 15% by mass to 50% by mass, and even more preferably 20% by mass to 40% by mass with respect to the pigment.

—Other Pigment Dispersants—

For the colored radiation-sensitive composition of the present invention, pigment dispersants other than the specific dispersion resin can be concurrently used as desired.

Examples of other pigment dispersants usable in the present invention include polymer dispersants [for example, polyamide amine and a salt thereof, polycarboxylic acid and a salt thereof, a high-molecular weight unsaturated acid ester, modified polyurethane, modified polyester, modified poly(meth)acrylate, a (meth)acrylic copolymer, and a naphthalene sulfonate formalin condensate], surfactants such as a polyoxyethylene alkyl phosphoric acid ester, polyoxyethylene alkylamine, and alkanolamine; pigment derivatives; and the like.

The polymer dispersants can be classified into straight-chain polymers, terminal-modified polymers, graft polymers, and block polymers, according to the structure.

Examples of the terminal-modified polymers that has a moiety anchored to the pigment surface include a polymer having a phosphoric acid group in the terminal as described in JP1991-112992A (JP-H3-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H9-77994), and the like. Moreover, a polymer obtained by introducing two or more moieties (acid groups, basic groups, partial skeletons of an organic dye, or heterocycles) anchored to the pigment surface into a polymer terminal as described in JP2007-277514A is also preferable since this polymer is excellent in dispersion stability.

Examples of the graft polymers having a moiety anchored to the pigment surface include polyester-based dispersant and the like, and specific examples thereof include a product of a reaction between poly(lower alkyleneimine) and polyester that is described in JP1979-37082A (JP-S54-37082A), JP1996-507960A (JP-H8-507960A), JP2009-258668A, and the like, a product of a reaction between polyallylamine and polyester that is described in JP1997-169821A (JP-H9-169821A) and the like, a copolymer of a macromonomer and a nitrogen atom monomer that is described in JP1998-339949A (JP-H10-339949A), JP2004-37986A, WO2010/110491, and the like, a graft polymer having a partial skeleton or a heterocycle of an organic dye that is described in JP2003-238837A, JP2008-9426A, JP2008-81732A, and the like, a copolymer of a macromonomer and an acid group-containing monomer that is described in JP2010-106268A, and the like. Particularly, from the viewpoint of dispersibility of a pigment dispersion, dispersion stability, and developability that the colored radiation-sensitive composition using the pigment exhibits, an amphoteric dispersion resin having basic and acid groups that is described in JP2009-203462A is preferable.

As the macromonomer used in producing a graft polymer having a moiety anchored to the pigment surface by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; Placcel FM 5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by DAICEL CORPORATION; a polyester-based macromonomer described in JP1990-272009A (JP-H2-272009A), and the like. Among these, from the viewpoint of dispersibility of the pigment, dispersion stability, and the developability that the colored radiation-sensitive composition using the pigment dispersion exhibits, the polyester-based macromonomer excellent in flexibility and solvent compatibility is particularly preferable. Furthermore, a polyester-based macromonomer represented by the polyester-based macromonomer described in JP1990-272009A (JP-H2-272009A) is most preferable.

As the block polymer having a moiety anchored to the pigment surface, block polymers described in JP2003-49110A, JP2009-52010A, and the like are preferable.

The pigment dispersant usable in the present invention can be obtained in the form of commercially available products, and specific examples thereof include "DA-7301" manufactured by Kusumoto Chemicals, Ltd., "Disperbyk-101 (polyamidamine phosphoric acid salt), 107 (carboxylic acid ester), 110 (copolymer including an acid group), 130 (polyamide), 161, 162, 163, 164, 165, 166, 170 (polymeric copolymer)" and "BYK-P104, P105 (high-molecular weight unsaturated polycarboxylic acid) manufactured by BYK-Chemie, "EFKA 4047, 4010 to 4050, 4050 to 4165 (polyurethane-based dispersant), FEKA 4330 to 4340 (block copolymer), 4400 to 4402 (modified polyacrylate), 5010 (polyesteramide), 5765 (high-molecular weight polycarboxylic acid salt), 6220 (aliphatic polyester), 6745 (phthalocyanine derivative), 6750 (azo pigment derivative)" manufactured by EFKA, "Ajisper PB821, PB822, PB880, PB881" manufactured by Ajinomoto Fine-Techno Co., Inc., "Flowlen TG-710 (urethane oligomer)" and "Polyflow No. 50E, No. 300 (acrylic copolymer) manufactured by KYOEISHA CHEMICAL Co., LTD., "Disparlon KS-860, 873SN, 874, #2150 (aliphatic polyvalent carboxylic acid), #7004 (polyether ester), DA-703-50, DA-705, and DA-725" manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid), "Emulgen 920, 930, 935, 985 (polyoxyethylene nonyl phenyl ether)", and "Acetamine 86 (stearylamine acetate)" manufactured by Kao Corporation, "Solsperse 5000 (phthalocyanine derivative), 22000 (azo pigment derivative), 13240 (polyesteramine), 3000, 17000, 27000 (polymer having a functional portion in the terminal portion), 24000, 28000, 32000, 38500 (graft polymer)" manufactured by The Lubrizol Corporation, Japan, "Nikkol T106 (polyoxyethylene sorbitan monooleate) and MYS-IEX (polyoxyethylene monostearate)" manufactured by NIKKO CHEMICAL CO., LTD., Hinoact T-8000E and the like manufactured by Kawaken Fine Chemicals Co., Ltd., "organosiloxane polymer KP341" manufactured by Shin-Etsu Chemical Co., Ltd., a cationic surfactant such as "WO01" manufactured by Yusho Co., Ltd. and nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "WO04, WO05, and WO17", "EFKA-46, EFKA-47, EFKA-47EA, EFKA polymer 100, EFKA polymer 400, EFKA polymer 401, and EFKA polymer 450" manufactured by MORISHITA SANGYO CORPORATION, polymer dispersants such as "Disperse aid 6, Disperse aid 8, Disperse aid 15, and Disperse aid 9100" manufactured by SAN NOPCO LIMITED, "Adeka Pluronic L31, F38, L42, L44, L61, L64, F68, L72, P95, F77, P84, F87, P94, L101, P103, F108, L121, and P-123" manufactured by ADEKA CORPORATION, "Ionet (product name) S-20" manufactured by Sanyo Chemical Industries, Ltd., and the like.

These pigment dispersants may be used singly or used in combination of two or more kinds thereof. In the present invention, it is particularly preferable to use a combination of a pigment derivative and a polymer dispersant. Moreover, for the pigment dispersant, a terminal-modified polymer having a moiety anchored to the pigment surface, a graft polymer, and a block polymer may be used concurrently with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, and an acidic cellulose derivative having a carboxylic acid in a side chain, and particularly, a (meth)acrylic acid copolymer is preferable. In addition, an N position-substituted maleimide monomer copolymer described in JP1998-300922A (JP-H10-300922A), an ether dimer copolymer described in JP2004-300204A, and an alkali-soluble resin containing a polymerizable group described in JP1995-319161A (JP-H7-319161A) are also preferable.

In the colored radiation-sensitive composition, a total content of the specific dispersion resin and other pigment dispersants is preferably 1 part by mass to 80 parts by mass, more preferably 5 parts by mass to 70 parts by mass, and even more preferably 10 parts by mass to 60 parts by mass, with respect to 100 parts by mass of the pigment. The amount of the specific dispersion resin is preferably 50% by mass or more, more preferably 60% by mass or more, and even more preferably 70% by mass or more of the dispersant components contained in the colored radiation-sensitive composition.

Specifically, when a polymer dispersant is used, the amount of the dispersant used is preferably in a range from 5 parts by mass to 100 parts by mass, and more preferably in a range from 10 parts by mass to 80 parts by mass expressed in terms of mass, with respect to 100 parts by mass of the pigment.

Moreover, when a pigment derivative is concurrently used, the amount of the pigment derivative used is preferably in a range from 1 part by mass to 30 parts by mass, more preferably in a range from 3 parts by mass to 20 parts by mass, and particularly preferably in a range from 5 parts by mass to 15 parts by mass expressed in terms of mass, with respect to 100 parts by mass of the pigment.

In the colored radiation-sensitive composition, from the viewpoint of curing sensitivity and color density, the total content of the colorant and the dispersant components (including the specific dispersion resin and other pigment dispersants) is preferably from 50% by mass to 90% by mass, more preferably from 55% by mass to 85% by mass, and even more preferably from 60% by mass to 80% by mass, with respect to the total solid contents constituting the colored radiation-sensitive composition.

[(F) Alkali-Soluble Resin]

It is preferable for the colored radiation-sensitive composition of the present invention to further contain an alkali-soluble resin. Moreover, the alkali-soluble resin mentioned herein does not include the component such as a dispersant component like the specific dispersion resin that is contained in the colored radiation-sensitive composition of the present invention.

The alkali-soluble resin can be appropriately selected from alkali-soluble resins which are linear organic high molecular-weight polymers and have at least one group enhancing alkali solubility in a molecule (preferably, a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable. Furthermore, from the viewpoint of controlling developability, an acrylic resin, an acrylamide-based resin, an acryl/acrylamide copolymer resin are preferable.

Examples of the group enhancing alkali solubility (hereinafter, also referred to as an "acid group") include a carboxyl group, a phosphoric acid group, a sulfonic acid group, a phenolic hydroxyl group, and the like. The group enhancing alkali solubility is preferably a group that is soluble in an organic solvent and can be developed by an aqueous weak alkaline solution, and preferable examples thereof include (meth)acrylic acid. One kind of the acid groups may be used singly, or two or more kinds thereof may be used.

Examples of the monomer that can give the acid group after polymerization include monomers having a hydroxyl group, such as 2-hydroxyethyl(meth)acrylate, monomers having an epoxy group, such as glycidyl (meth)acrylate, monomers having an isocyanate group, such as 2-isocyanate ethyl(meth) acrylate, and the like. One kind of the monomers for introducing these acid groups may be used singly, or two or more kinds thereof may be used. In order to introduce the acid group into the alkali-soluble resin, for example, the monomer having the acid group and/or the monomer that can give the acid group after polymerization (hereinafter, referred to as a "monomer for introducing an acid group" in some cases) may be polymerized as a monomer component.

When the monomer that can give the acid group after polymerization is used as a monomer component to introduce the acid group, for example, a treatment for giving the acid group, which will be described later, needs to be performed after polymerization.

In order to produce the alkali-soluble resin, for example, a method implemented by known radical polymerization can be used. Various polymerization conditions for producing the alkali-soluble resin by radical polymerization, such as temperature, pressure, the type and amount of radical initiators, and the type of solvents, can be easily set by those skilled in the art, and the conditions can also be set experimentally.

As the linear organic high-molecular weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac resin, acidic cellulose derivatives having a carboxylic acid in a side chain, and a polymer obtained by adding acid anhydride to a polymer having a hydroxyl group. Particularly, a copolymer of a (meth)acrylic acid and another monomer copolymerizable with the (meth)acrylic acid is suitable as the alkali-soluble resin. Examples of the monomer copolymerizable with a (meth)acrylic acid include alkyl (meth)acrylate, aryl (meth)acrylate, vinyl compounds, and the like. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, and the like. Examples of the vinyl compounds include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and the like. Examples of the N-position substituted maleimide monomer disclosed in JP1998-300922A (JP-H10-300922A) include N-phenylmaleimide, N-dicyclohexylmaleimide, and the like. Other monomers that can be copolymerized with a (meth)acrylic acid may be used singly, or two or more kinds thereof may be used.

It is also preferable for the colored radiation-sensitive composition to contain, as the alkali-soluble resin, a polymer (a) obtained by polymerizing monomer components including a compound represented by the following Formula (ED) (hereinafter, the compound will be referred to as an "ether dimer" in some cases) as an essential component.

[Chem. 93]

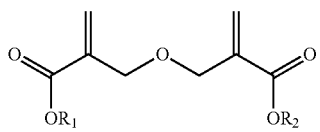

Formula (ED)

In Formula (ED), each of $R_1$ and $R_2$ independently represents a hydrogen atom or a hydrocarbon group having 1 to 25 carbon atoms that may have a substituent.

If the colored radiation-sensitive composition of the present invention contains the polymer (a), the composition can form a cured coating film having extremely excellent heat resistance and transparency. In the Formula (1) that represents the ether dimer, the hydrocarbon group, which is represented by $R_1$ and $R_2$, has 1 to 25 carbon atoms, and may have a substituent, is not particularly limited, and examples thereof include linear or branched alkyl groups such as methyl, ethyl, n-propyl, isopropyl, n-butyl, isobutyl, t-butyl, t-amyl, stearyl, lauryl, and 2-ethylhexyl; aryl groups such as phenyl; alicyclic groups such as cyclohexyl, t-butylcyclohexyl, cyclopentadienyl, tricyclodecanyl, isobornyl, adamantyl, and 2-methyl-2-adamantyl; alkyl groups substituted with alkoxy such as 1-methoxyethyl and 1-ethoxyethyl; alkyl groups substituted with an aryl group such as benzyl; and the like. Among these, in view of heat resistance, substituents of primary or secondary carbon that are not easily eliminated by an acid or heat, such as methyl, ethyl, cyclohexyl, and benzyl, are preferable.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenote, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(cyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate, and the like. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. One kind of these ether dimers may be used singly, or two or more kinds thereof may be used. The structure derived from the compound represented by the Formula (ED) may be copolymerized with other monomers.

In order to improve crosslinking efficiency of the colored radiation-sensitive composition of the present invention, the alkali-soluble resins having a polymerizable group may be used. As the alkali-soluble resins having a polymerizable group, alkali-soluble resins and the like containing an allyl group, a (meth)acryl group, an allyloxyalkyl group, and the like on a side chain thereof are useful. Examples of polymers containing the above polymerizable group include Dianal NR series (manufactured by Mitsubishi Rayon Co., Ltd.), Photomer 6173 (a polyurethane acrylic oligomer containing COOH, manufactured by Diamond Shamrock Co., Ltd.), Biscoat R-264 and KS Resist 106 (all manufactured by OSAKA ORGANIC CHEMICAL INDUSTRY LTD.), Cyclomer P series and Placcel CF200 series (all manufactured by DAICEL CORPORATION), Ebecryl 3800 (manufactured by DAICEL-UCB Co., Ltd.), and the like. As these alkali-soluble resins containing a polymerizable group, a polymerizable double bond-containing acrylic resin modified with urethane, which is a resin obtained by reacting an isocyanate group and an OH group in advance to leave an unreacted isocyanate group and causing a reaction between a compound having a (meth)acryloyl group and an acrylic resin having a carboxyl group, an unsaturated bond-containing acrylic resin which is obtained by a reaction between an acrylic resin having a carboxyl group and a compound having both an epoxy group and a polymerizable double bond in a molecule, a polymerizable double bond-containing acrylic resin which is obtained by a reaction between an acid pendant type epoxy acrylate resin, an acrylic resin having an OH group, and a dibasic acid anhydride having a polymerizable double bond, a resin obtained by a reaction between an acrylic resin having an OH group and a compound having isocyanate and a polymerizable group, a resin that is obtained by treating a resin, which has an ester group having an elimination group such as a halogen atom or a sulfonate group in an α-position or a β-position described in JP2002-229207A and JP2003-335814A on a side chain, with a base, and the like are preferable.

As the alkali-soluble resin, particularly, a benzyl (meth)acrylate/(meth)acrylic acid copolymer or a multicomponent copolymer including benzyl (meth)acrylate/(meth)acrylic acid/other monomers is suitable. Examples thereof also include a resin obtained by copolymerizing 2-hydroxyethyl methacrylate, a 2-hydroxypropyl (meth)acrylate/a polystyrene macromonomer/benzyl methacrylate/methacrylic acid copolymer disclosed in JP1995-140654A (JP-H7-140654A), a 2-hydroxy-3-phenoxypropyl acrylate/a polymethyl methacrylate macromonomer/benzyl methacrylate/methacrylic acid copolymer, a 2-hydroxyethyl methacrylate/a polystyrene macromonomer/methyl methacrylate/methacrylic acid copolymer, a 2-hydroxyethyl methacrylate/a polystyrene macromonomer/benzyl methacrylate/methacrylic acid copolymer, and the like, and particularly, a copolymer of benzyl methacrylate/methacrylic acid is preferable.

The acid value of the alkali-soluble resin is preferably 30 mgKOH/g to 200 mgKOH/g, more preferably 50 mgKOH/g to 150 mgKOH/g, and most preferably 70 mgKOH/g to 120 mgKOH/g.

The weight average molecular weight (Mw) of the alkali-soluble resin is preferably 2,000 to 50,000, more preferably 5,000 to 30,000, and most preferably 7,000 to 20,000.

The content of the alkali-soluble resin in the colored radiation-sensitive composition is preferably 1% by mass to 15% by mass, more preferably 2% by mass to 12% by mass, and particularly preferably 3% by mass to 10% by mass, with respect to the total solid contents of the colored radiation-sensitive composition.

[Other Components]

The colored radiation-sensitive composition of the present invention may further contain other components such as an organic solvent and a crosllinking agent in addition to the respective components described above, within a range that does not diminish the effects of the present invention.

(Organic Solvent)

The colored radiation-sensitive composition of the present invention may contain an organic solvent.

Basically, the organic solvent is not particularly limited as long as the solvent satisfies the solubility of the respective components or the coating properties of the colored radiation-sensitive composition. Particularly, it is preferable to select the organic solvent in consideration of the solubility, coating properties, and safety of an ultraviolet absorber, the alkali-soluble resin, the dispersant, and the like. Moreover, when the colored radiation-sensitive composition of the present invention is prepared, the composition preferably contains at least two kinds of organic solvents.

Preferable examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), alkyl 3-oxypropionate esters (specifically, methyl 3-oxypropionate or ethyl 3-oxypropionate (for example, methyl 3-methoxypropionate, ethyl 3-methoxypropionate, methyl 3-ethoxypropionate, or ethyl 3-ethoxypropionate)), alkyl 2-oxypropionate esters (specifically, methyl 2-oxypropionate, ethyl 2-oxypropionate, or propyl 2-oxypropionate (specifically, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (specifically, methyl 2-methoxy-2-methyl propionate or ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, and 3-butanone; aromatic hydrocarbons such as toluene and xylene; and the like.

From the viewpoint of solubility of an ultraviolet absorber and the alkali-soluble resin, and improvement of the shape of the coated surface, it is also preferable to mix two or more kinds of these organis solvents with each other. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

From the viewpoint of coating properties, the content of the organic solvent in the colored radiation-sensitive composition is set such that the concentration of the total solid contents of the composition becomes preferably 5% by mass to 80% by mass, more preferably 5% by mass to 60% by mass, and particularly preferably 10% by mass to 50% by mass.

(Crosslinking Agent)

If a crosslinking agent is complementarily used for the colored radiation-sensitive composition of the present invention, hardness of the colored cured film obtained by curing the colored radiation-sensitive composition can be improved.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound substituted with at least one substituent selected from a methylol group, an alkoxymethyl group, and an acyloxymethyl group. Among these, a polyfunctional epoxy resin is preferable.

Regarding details of specific examples of the crosslinking agent, the disclosure of JP2004-295116A, paragraphs 0134 to 0147 can be referred to.

(Polymerization Inhibitor)

It is desirable to add a small amount of a polymerization inhibitor to the colored radiation-sensitive composition of the present invention so as to hinder the occurrence of unnecessary thermal polymerization of the polymerizable compound during production or storage of the colored radiation-sensitive composition.

Examples of the polymerization inhibitor usable in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, and the like.

The amount of the polymerization inhibitor added is preferably about 0.01% by mass to about 5% by mass, with respect to the total mass of the composition.

(Surfactant)

From the viewpoint of further impriving coating properties, various surfactants may be added to the colored radiation-sensitive composition of the present invention. As the surfactants, it is possible to use various surfactants such as a fluorosurfactant, a nonionic surfactant, a cationic surfactant, an anionic surfactant, and silicone-based surfactant.

Particularly, if the colored radiation-sensitive composition of the present invention contains a fluorosurfactant, liquid characteristics (particularly, fluidity) are further improved when the composition is prepared as a coating liquid, and accordingly, evenness of coating thickness or liquid saving properties can be further improved.

That is, when a coating liquid, which is obtained using the colored radiation-sensitive composition containing a fluorosurfactant, is used to form a film, surface tension between a surface to be coated and the coating liquid is reduced. Consequently, wettability with respect to the surface to be coated is improved, and coating properties with respect to the surface to be coated is enhanced. Therefore, even when a thin film of about several pm is formed of a small amount of liquid, a film with a uniform thickness that exhibits a small extent of thickness unevenness is more preferably formed, and accordingly, the colored radiation-sensitive composition containing a fluorosurfactant is effective.

The fluorine content in the fluorosurfactant is preferably 3% by mass to 40% by mass, more preferably 5% by mass to 30% by mass, and particularly preferably 7% by mass to 25% by mass. The fluorosurfactant in which the fluorine content is in this range is effective in view of the thickness of the coating film or liquid saving properties, and solubility of the surfactant in the colored radiation-sensitive composition is also excellent.

Examples of the fluorosurfactant include Megaface F171, F172, F173, F176, F177, F141, F142, F143, F144, R30, F437, F475, F479, F482, F554, F780, and F781 (all manufactured by DIC CORPORATION), Fluorad FC430, FC431, and FC171 (all manufactured by Sumitomo 3M), Surflon S-382, SC-101, SC-103, SC-104, SC-105, SC1068, SC-381, SC-383, SC-393, and KH-40 (all manufactured by ASAHI GLASS CO., LTD.), PF636, PF656, PF6320, PF6520, and PF7002 (all manufactured by OMNOVA Solutions, Inc.), and the like.

Specific examples of the nonionic surfactant include glycerol, trimethylolpropane, trimethylolethane, and ethoxylate and propoxylate of these (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L10, L31, L61, L62, 10R5, 17R2, and 25R2, Tetronic 304, 701, 704, 901, 904, and 150R1 manufactured by BASF), Solseperse 20000 manufactured by The Lubrizol Corporation, Japan, and the like.

Specific examples of the cationic surfactant include phthalocyanine derivatives (trade name: EFKA-745 manufactured by MORISHITA SANGYO CORPORATION), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL Co., LTD.), WO01 (manufactured by Yusho Co., Ltd.), and the like.

Specific examples of the anionic surfactant include WO04, WO05, and WO17 (manufactured by Yusho Co., Ltd.), and the like.

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" manufactured by Dow Corning Toray, "TSF-4440", "TSF-4300", "TSF-4445", "TSF-4460", and "TSF-4452" manufactured by Momentive Performance Materials Inc., "KP341", "KF6001", and "KF6002" manufactured by Shin-Etsu Silicones, "BYK307", "BYK323", and "BYK330" manufactured by BYK-Chemie, and the like.

One kind of the surfactant may be used singly, or two or more kinds thereof may be used in combination.

The amount of the surfactant added is preferably 0.001% by mass to 2.0% by mass and more preferably 0.005% by mass to 1.0% by mass, with respect to the total mass of the colored radiation-sensitive composition.

(Other Additives)

If necessary, various additives such as a filler, an adhesion promoting agent, an antioxidant, an ultraviolet absorber, and an anti-aggregation agent may be mixed in the colored radiation-sensitive composition. Examples of these additives include those described in JP2004-295116A, paragraphs 0155 and 0156.

The colored radiation-sensitive composition of the present invention can contain the sensitizer or a light stabilizer described in JP2004-295116A, paragraph 0078, and the thermal polymerization inhibitor described in JP2004-295116A, paragraph 0081.

(Organic Carboxylic Acid and Organic Carboxylic Anhydride)

The colored radiation-sensitive composition of the present invention may contain an organic carboxylic acid having a molecular weight of 1000 or less and/or an organic carboxylic anhydride.

Specific examples of the organic carboxylic acid compound include aliphatic carboxylic acid and aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid, and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly having a molecular weight of 50 to 500, specifically, maleic acid, malonic acid, succinic acid, and itaconic acid are particularly preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, naphthalic anhydride, and the like. Among these, those having a molecular weight of 600 or less, particularly having a molecular weight of 50 to 500, specifically, for example, maleic anhydride, succinic anhydride, citraconic anhydride, and itaconic anhydride are preferable.

The amount of these organic carboxylic acids and/or the organic carboxylic anhydrides added is generally in a range from 0.01% by mass to 10% by mass, preferably in a range from 0.03% by mass to 5% by mass, and more preferably in a range from 0.05% by mass to 3% by mass in the total solid contents.

If these organic carboxylic acids and/or the organic carboxylic anhydrides having a molecular weight of 1000 or less are added, it is possible to greatly reduce the amount of the residual undissolved substance of the colored radiation-sensitive composition while maintaining a high degree of pattern adhesiveness.

[Method for Preparing Colored Radiation-Sensitive Composition]

The colored radiation-sensitive composition of the present invention is prepared by mixing the aforementioned components together.

When the colored radiation-sensitive composition is prepared, the respective components constituting the colored radiation-sensitive composition may be mixed together at the same time or mixed together sequentially after being dissolved and dispersed in a solvent. Moreover, during the mixing, the order of adding the components and operation conditions are not particularly restricted. For example, all components may be dissolved and dispersed in a solvent at the same time to prepare the composition. Alternatively, if necessary, the respective components may be appropriately prepared as two or more solutions and dispersions and mixed at the time of use (at the time of coating) to prepare the composition.

The colored radiation-sensitive composition prepared as above can be used after being filtered using a filter and the like of which a pore size is preferably about 0.01 μm to 3.0 μm and more preferably about 0.05 μm to 0.5 μm.

The colored radiation-sensitive composition of the present invention can form a colored cured film having excellent heat resistance and color characteristics. Accordingly, the colored radiation-sensitive composition is preferably used for forming a colored pattern (colored layer) of a color filter. Furthermore, the colored radiation-sensitive composition of the present invention can be preferably used for forming a colored pattern of a color filter and the like used in solid-state image sensors (for example, CCD, CMOS, and the like) or image display devices such as a liquid crystal display (LCD). Moreover, the composition can also be preferably used for preparing a print ink, an ink jet ink, a coating material, and the like. Particularly, the composition can be preferably used for preparing a color filter for solid-state image sensors such as CCD and CMOS.

<Colored Cured Film, Pattern Forming Mehtod, Color Filter, and Color Filter Production Method>

Next, the colored cured film, pattern forming method, and color filter of the present invention will be described in detail by an explanation of these color filter production methods.

The pattern forming method of the present invention includes a colored radiation-sensitive composition layer forming step of forming a colored radiation-sensitive composition layer by applying the colored radiation-sensitive composition of the present invention onto a support, a light exposure step of exposing the colored radiation-sensitive composition layer to light in the form of pattern, and a pattern forming step of forming a colored pattern by developing and removing an unexposed portion.

The pattern forming method of the present invention can be preferably used for forming a colored pattern (pixel) that a color filter has.

The support for forming a pattern by the pattern forming method of the present invention includes plate-like substances such as a substrate and is not particularly limited as long as the support can be used for forming a pattern.

Hereinafter, each step of the pattern forming method of the present invention will be described in detail by describing a method for producing a color filter for solid-state image sensor, but the present invention is not limited to the method.

The color filter production method of the present invention uses the pattern forming method of the present invention, and includes a step of forming a colored pattern on a support by using the pattern forming method of the present invention.

That is, the color filter production method of the present invention uses the pattern forming method of the present invention, and includes a colored radiation-sensitive composition layer forming step of forming a colored radiation-sensitive composition layer by applying the colored radiation-sensitive composition of the present invention onto a support, a light exposure step of exposing the colored radiation-sensitive composition layer to light in the form of pattern, and a pattern forming step of forming a colored pattern by developing and removing an unexposed portion. If necessary, the method may include a step of baking the colored radiation-sensitive composition layer (pre-baking step) and a step of baking the developed colored pattern (post-baking step). Hereinafter, these steps may be collectively referred to as a "pattern forming step" in some cases.

The color filter of the present invention can be preferably obtained by the above production method.

Hereinafter, the color filter for solid-state image sensor may be simply referred to as a "color filter" in some cases.

Each step in the pattern forming method of the present invention will be described in detail below by describing the color filter production method of the present invention.

The color filter production method of the present invention uses the pattern forming method of the present invention, and includes a step of forming a colored pattern onto a support by using the pattern forming method of the present invention.

[Colored Radiation-Sensitive Composition Layer Forming Step]

In the colored radiation-sensitive composition layer forming step, a colored radiation-sensitive composition layer is formed by applying the colored radiation-sensitive composition of the present invention onto a support.

As the support usable in this step, for example, it is possible to use a substrate for a solid-state image sensor that is formed by providing an image sensor (light-receiving element) such as Charge Coupled Device (CCD) or Complementary Metal-Oxide Semiconductor (CMOS) onto a substrate (for example, a silicon substrate).

The colored pattern of the present invention may be formed on the image sensor-formed surface (front surface) of the substrate for a solid-state image sensor or on the surface (rear surface) where the imaging sensor is not formed.

A light shielding film may be disposed between colored patterns in the solid-state image sensor or onto the rear surface of the substrate for a soli-state image sensor.

Moreover, if necessary, an undercoat layer may be disposed onto the support so as to improve adhesiveness between the support and the upper layer, prevent diffusion of substances, or planarize the surface of the substrate.

As the method of applying the colored radiation-sensitive composition of the present invention onto the support, various coating methods such as slit coating, inkjet coating, spin coating, cast coating, roll coating, and screen printing can be used.

Drying (pre-baking) of the colored radiation-sensitive composition layer coated onto the supporter can be performed using a hot plate, an oven, or the like at 50° C. to 140° C. for 10 seconds to 300 seconds.

[Light Exposure Step]

In the light exposure step, the colored radiation-sensitive composition layer formed in the colored radiation-sensitive composition layer forming step is exposed to light in patternwise through a mask having a predetermined mask pattern by using, for example, an exposure device such as a stepper. In this manner, a colored cured film is obtained.

As radiation (light) usable in light exposure, particularly, ultraviolet rays such as a g-line and an i-line are preferably used (particularly, an i-line is preferably used). The irradiation dose (exposure dose) is preferably 30 mJ/cm$^2$ to 1500 mJ/cm$^2$, more preferably 50 mJ/cm$^2$ to 1000 mJ/cm$^2$, and most preferably 80 mJ/cm$^2$ to 500 mJ/cm$^2$.

The film thickness of the colored cured film is preferably 1.0 μm or less, more preferably 0.1 μm to 0.9 μm, and even more preferably 0.2 μm to 0.8 μm.

It is preferable to set the film thickness to be 1.0 μm or less since a high degree of resolution and adhesiveness are obtained.

Moreover, in this step, a colored cured film having a small film thickness of 0.7 μm or less can be preferably formed. Furthermore, if the obtained colored cured film is subjected to a development process in a pattern forming step which will be described later, it is possible to obtain a thin film having a colored pattern which exhibits excellent developability and reduced surface roughness and has excellent pattern shape.

[Pattern Forming Step]

Thereafter, by performing alkali development treatment, the colored radiation-sensitive composition layer in a portion not irradiated with light in the light exposure step is eluted into an aqueous alkaline solution, and as a result, only a photocured portion remains.

As a developer, an organic alkaline developer not damaging the image sensor, a circuit, or the like in the underlayer is desirable. The development temperature is generally 20° C. to 30° C., and the development time is conventionally 20 seconds to 90 seconds. In order to further remove residues, development may be performed for 120 seconds to 180 seconds. Moreover, in order to improve residue removal properties, a step of shaking off the developer every 60 seconds and newly supplying a developer is repeated plural times in some cases.

Examples of alkaline agents used for the developer include organic alkaline compounds such as aqueous ammonia, ethylamine, diethylamine, dimethyl ethanolamine, tetramethyl ammonium hydroxide, tetraethyl ammonium hydroxide, choline, pyrrole, piperidine, and 1,8-diazabicyclo-[5,4,0]-7-undecene. As the developer, aqueous alkaline solutions obtained by diluting these alkaline agents with pure water so as to yield a concentration of the agent of 0.001% by mass to 10% by mass, more preferably 0.01% by mass to 1% by mass are preferably used.

In addition, inorganic alkalis may be used for the developer, and as the inorganic alkali, for example, sodium hydroxide, potassium hydroxide, sodium carbonate, sodium hydrogen carbonate, sodium silicate, sodium metasilicate, and the like are preferable.

When a developer formed of such an aqueous alkaline solution is used, generally, the pattern is washed (rinsed) with pure water after development.

Thereafter, it is preferable to perform a heating treatment (post-baking) after drying. If a multicolored pattern is formed, the above steps can be sequentially repeated for each color to produce a cured coat. In this manner, a color filter is obtained.

The post-baking is a heating treatment performed after development so as to complete curing, and in the post-baking, a thermal curing treatment is performed generally at 100° C. to 240° C. and preferably at 200° C. to 240° C.

The post-baking treatment can be performed on the coating film obtained after development consecutively or in a batch manner, by using heating means such as a hot plate, a convection oven (a hot-air circulation type drier), and a high-frequency heater under the conditions described above.

If necessary, the production method of the present invention may include, as a step other than the above steps, a step known as a production method of a color filter for a solid-state image sensor. For example, if necessary, in the production method, a curing step of curing the formed colored pattern by heating and/or light exposure may be performed after the colored radiation-sensitive composition layer forming step, the light exposure step, and the pattern forming step are conducted.

When the colored radiation-sensitive composition of the present invention is used, for example, a nozzle of an ejection portion or a piping portion of a coating device is clogged, or the colored radiation-sensitive composition or a pigment adhere to or are precipitated or dried inside the coating machine, and as a result, contamination and the like are caused in some cases. Therefore, in order to efficiently wash off the contamination caused by the colored radiation-sensitive composition of the present invention, it is preferable to use the aforementioned solvent relating to the present composition as a rinsing solution. In addition, rinsing solutions described in JP1995-128867A (JP-H7-128867A), JP1995-146562A (JP-H7-146562A), JP1996-278637A (JP-H8-278637A), JP2000-273370A, JP2006-85140A, JP2006-291191A, JP2007-2101A, JP2007-2102A, JP2007-281523A, and the like can also be preferably used to rinse and remove the colored radiation-sensitive composition according to the present invention.

Among the above, alkylene glycol monoalkyl ether carboxylate and alkylene glycol monoalkyl ether are preferable.

One kind of these solvents may be used singly, or two or more kinds thereof may be used as by being mixed with each other. When two or more kinds thereof are mixed with each other, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and even more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Moreover, in order to improve the permeability of the rinsing solution with respect to the contaminant, it is preferable to add the aforementioned surfactants relating to the composition to the rinsing solution.

The color filter of the present invention uses the colored radiation-sensitive composition of the present invention. Accordingly, light exposure forming excellent exposure margin can be performed, and the formed colored pattern (colored pixel) has an excellent pattern shape. Furthermore, since the surface roughness of the pattern and the amount of residues in an exposed portion are reduced, the color filter exhibits excellent color characteristics.

The color filter of the present invention can be preferably used for solid-state image sensors such as CCD and CMOS, and is particularly preferable for CCD, CMOS, and the like with a high resolution that have more than 1,000,000 pixels. The color filter for a solid-state image sensor of the present invention can be used as, for example, a color filter disposed between a light-receiving portion of each pixel constituting CCD or CMOS and a microlens for condensing light.

The film thickness of the colored pattern (colored pixel) in the color filter of the present invention is preferably 2.0 μm or less, more preferably 1.0 μm or less, and even more preferably 0.7 μm or less.

Moreover, the size (pattern width) of the colored pattern (colored pixel) is preferably 2.5 μm or less, more preferably 2.0 μm or less, and particularly preferably 1.7 μm or less.

<Solid-State Image Sensor>

The solid-state image sensor of the present invention includes the aforementioned color filter of the present invention. The constitution of the solid-state image sensor of the present invention is not particularly limited, as long as the solid-state image sensor includes the color filter of the present invention and functions as a solid-state imase sensor. However, for example, the solid-state image sensor can be constituted as below.

That is, the solid-state image sensor has a constitution in which transfer electrodes consisting of plural photodiodes and transfer electrodes formed of polysilicon or the like constituting a light-receiving area of a solid-state image sensor (a CCD image sensor, a CMOS image sensor, or the like) are arranged onto a supporter; a light shielding film that is opened only to the light-receiving portion of the photodiode and is formed of tungsten or the like is disposed onto the photodiodes and the transfer electrodes; a device protecting film that is formed for covering the entire surface of the light shielding film and the light receiving portion of the photodiodes and is formed of silicon nitride or the like is disposed onto the light shielding film; and the color filter for a solid-state image sensorof the present invention is disposed onto the device protecting film.

In addition, the solid-state image sensor may have a constitution in which light-condensing means (for example, a microlens or the like, the sam shall be applied hereinafter) is disposed to a portion which is positioned on the device protecting portion and under the color filter (side close to the support), a constitution in which light-condensing means is disposed on the color filter, and the like.

<Image Display Device>

The color filter of the present invention can be used not only for the solid-state image sensor, but also for an image display device such as a liquid crystal display device or organic EL display device. Particularly, the color filter is preferable for a liquid crystal display device. The liquid crystal display device having the color filter of the present invention can display high-quality images showing excellent color hue and having excellent display characteristics.

The definition of display devices or details of the respective display devices are described in, for example, "Electronic display device (Akio Sasaki, Kogyo Chosakai Publishing Co., Ltd., 1990)", "Display device (Toshiyuki Ibuki, Sangyo-Tosho Publishing Co., Ltd., 1989), and the like. In addition, regarding a liquid crystal display device, for example, "Liquid crystal display technology for next generation (edited by Tatsuo Uchida, Kogyo Chosakai Publishing Co., Ltd., 1994)" includes a disclosure. The liquid crystal display device to which the present invention can be applied is not particularly limited. For example, the present invention can be applied to liquid crystal display devices employing various systems described in the "Liquid crystal display technology for next generation".

The color filter of the present invention may be used for a liquid crystal display device using a color TFT system. Regarding the liquid crystal display device using a color TFT system, for example, "Color TFT liquid crystal display (KYORITSU SHUPPAN CO., LTD., 1996)" includes a disclosure. Moreover, the present invention can be applied to liquid crystal display devices that use an in-plane switching driving system such as IPS, a pixel division system such as MVA, and the like and have an enlarged viewing angle, STN, TN, VA, OCS, FFS, R-OCB, and the like.

In addition, the color filter of the present invention can be provided to a Color-filter On Array (COA) system that is a bright and high-definition system. In the liquid crystal display device of the COA system, the characteristics required for a color filter layer need to include characteristics required for an interlayer insulating film, that is, a low dielectric constant and remover resistance in some cases, in addition to the above characteristics that are generally required. In the color filter of the present invention, a dye having an excellent color hue is used. Accordingly, the color purity, light transmissivity, and the like are excellent, and the color shade of the colored pattern (pixel) is excellent. Consequently, a liquid crystal display device of a COA system that has a high resolution and is excellent in long-term durability can be provided. Moreover, in order to satisfy the requirement for the characteristic of a low dielectric constant, a resin coat may be disposed onto the color filter layer.

Regarding these image display systems, for example, "EL, PDP, and LCD display technologies and recent trend in market (TORAY RESEARCH CENTER, research department, 2001)" includes a disclosure on p. 43 and the like.

The liquid crystal display device having the color filter of the present invention is constituted with various members such as an electrode substrate, a polarizing film, a phase difference film, a backlight, a spacer, and a viewing anglecompensation film, in addition to the color filter of the present invention. The color filter of the present invention can be applied to a liquid crystal display device constituted with these known members. Regarding these members, for example, "'94 Market of peripheral materials and chemicals of liquid crystal display (Kentaro Shima, CMC Co., Ltd., 1994)" and "2003 Current situation of market relating to liquid crystal and prospects (Vol. 2) (Yoshikichi Hyo, Fuji Chimera Research Institute, Inc., 2003)" include disclosures.

Regarding the backlight, SID meeting Digest 1380 (2005) (A. Konno et al.), December issue of monthly "Display", 2005, pp 18-24 (Yasuhiro Shima) and pp 25-30 (Takaaki Hagi), and the like include disclosures.

If the color filter of the present invention is used in a liquid crystal display device, high contrast can be realized when the color filter is combined with a three-wavelength tube of a cold cathode tube known in the related art. Moreover, if a light source of LED of red, green and blue (RGB-LED) is used as a backlight, a liquid crystal display device having a high luminance, high color purity, and an excellently high degree of color reproducibility can be provided.

EXAMPLES

Hereinafter, the present invention will be described in more detail based on examples, but the present invention is not limited to the examples as long as the object of the invention is not impaired. Moreover, "%" and "part(s)" are based on mass unless otherwise specified.

Synthesis Example 1

Synthesis of Dye Multimer (J-1)

[Chem. 94]

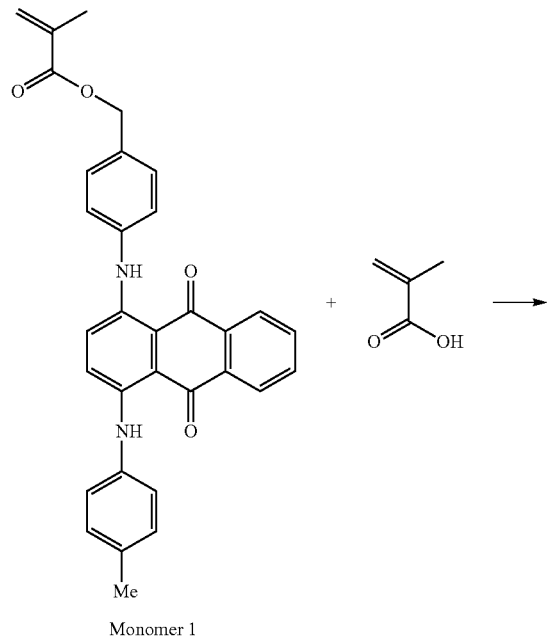

Monomer 1

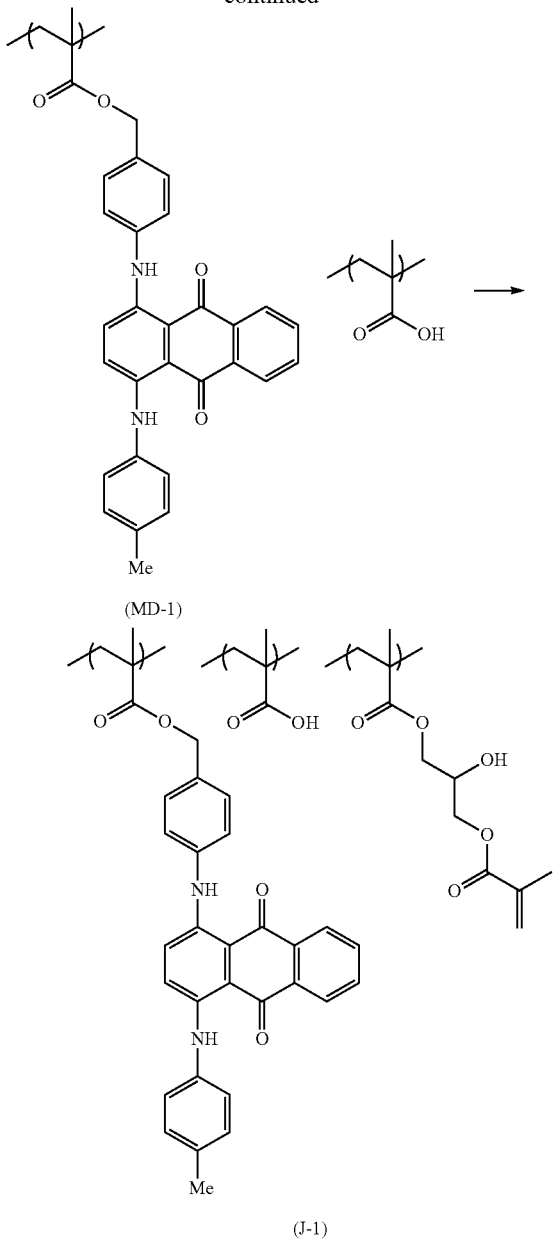

A monomer 1 (8.2 g), methacrylic acid (MMA, 1.075 g), dodecyl mercaptan (0.255 g), and propylene glycol 1-monomethyl ether 2-acetate (hereinafter, also referred to as "PGMEA") (23.3 g) were put into a 100 mL three-neck flask, and the solution was heated at 80° C. in a nitrogen atmosphere. To this solution, a mixed solution consisting of the monomer (8.2 g), methacrylic acid (1.075 g), dodecyl mercaptan (0.255 g), dimethyl 2,2'-azobis(isobutyrate) [trade name: V601, manufactured by Wako Pure Chemical Industries, Ltd.] (0.58 g), and PGMEA (23.3 g) was added dropwise over 2 hours. Thereafter, the obtained reaction solution was stirred for 3 hours and heated to 90° C. Subsequently, the solution was heated and stirred for 2 hours and then left to cool, thereby obtaining a PGMEA solution of an intermediate (MD-1). Next, to the PGMEA solution of (MD-1), glycidyl methacrylate (GMA, 1.42 g), tetrabutyl ammonium bromide (80 mg), and p-methoxyphenol (20 mg) were added, the solution was heated for 15 hours at 100° C. in the air atmosphere, and removal of the glycidyl methacrylate was confirmed. After being cooled, the obtained reaction solution was added dropwise to a mixed solvent of methanol/deionized water=100 mL/10 mL for reprecipitation, thereby obtaining 17.6 g of a dye multimer (J-1).

The weight average molecular weight (Mw) of the dye multimer (J-1) measured by GPC was 6,000, and a ratio of weight average molecular weight/number average molecular weight (Mw/Mn) thereof was 1.9.

Moreover, the acid value thereof measured by titration using a 0.1 N aqueous sodium hydroxide solution was 0.75 mmol/g. As a result of NMR measurement, the amount of a polymerizable group contained in the dye multimer was confirmed to be 0.40 mmol with respect to 1 g of the dye multimer (J-1).

Synthesis Examples 2 to 15

Synthesis of dye multimers (J-2) to (J-15)

Dye multimers (J-2) to (J-15) were obtained by performing the same operation as in Synthesis Example 1, except that the amount of the components used in Synthesis Example 1 was changed as shown in Table 1.

The weight average molecular weight (Mw), ratio of weight average molecular weight/number average molecular weight (Mw/Mn), acid value (mmol/g), and amount of a polymerizable group (mmol/g) of the obtained dye multimers (J-2) to (J-15) were measured in the same manner as used for the dye multimer (J-1). The results are shown in Table 2.

TABLE 1

| Synthesis example No. | Dye multimer | Monomer 1 (g) | MMA (g) | GMA (g) | $C_{12}H_{25}SH$ (g) | V601 (g) |
|---|---|---|---|---|---|---|
| 1 | (J-1) | 16.4 | 2.15 | 1.42 | 0.51 | 0.58 |
| 2 | (J-2) | 16.4 | 2.15 | 1.42 | 0.76 | 0.86 |
| 3 | (J-3) | 16.4 | 2.15 | 1.42 | 0.38 | 0.43 |
| 4 | (J-4) | 16.4 | 2.15 | 1.42 | 0.30 | 0.35 |
| 5 | (J-5) | 16.4 | 2.15 | 1.42 | 0.20 | 0.23 |
| 6 | (J-6) | 16.4 | 2.15 | 1.42 | 1.01 | 1.15 |
| 7 | (J-7) | 16.3 | 1.94 | 1.78 | 0.51 | 0.58 |
| 8 | (J-8) | 16.1 | 2.58 | 1.42 | 0.51 | 0.58 |
| 9 | (J-9) | 17.2 | 1.55 | 1.42 | 0.51 | 0.58 |
| 10 | (J-10) | 15.7 | 2.93 | 1.42 | 0.51 | 0.58 |
| 11 | (J-11) | 17.2 | 1.94 | 1.07 | 0.51 | 0.58 |
| 12 | (J-12) | 14.2 | 2.93 | 2.84 | 0.51 | 0.58 |
| 13 | (J-13) | 13.0 | 3.44 | 3.55 | 0.51 | 0.58 |
| 14 | (J-14) | 17.7 | 1.64 | 0.71 | 0.51 | 0.58 |
| 15 | (J-15) | 12.5 | 3.57 | 2.84 | 0.51 | 0.58 |

(Synthesis Example 16) Synthesis of Dye Multimer (J-16)

[Chem. 95]

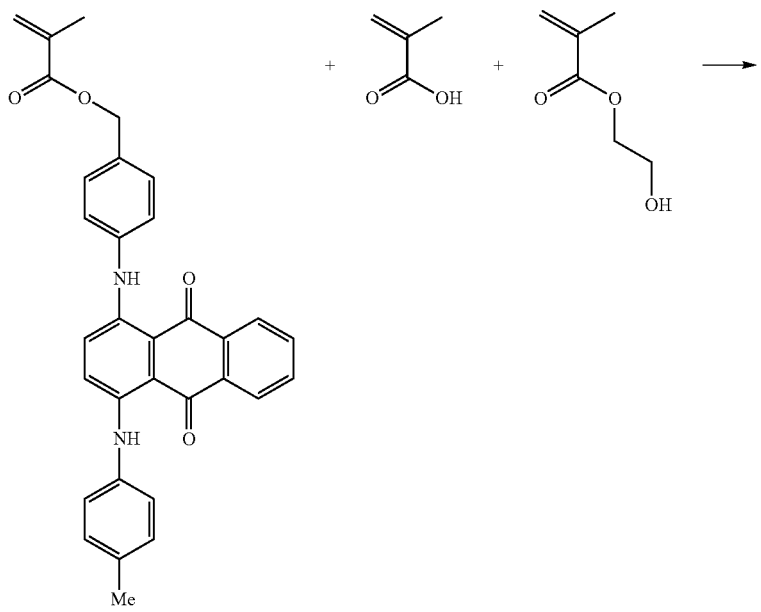

Monomer 1

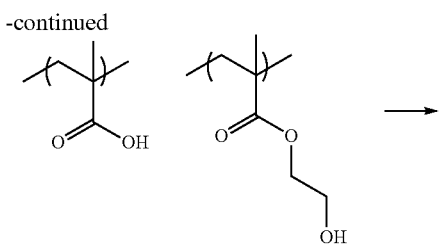

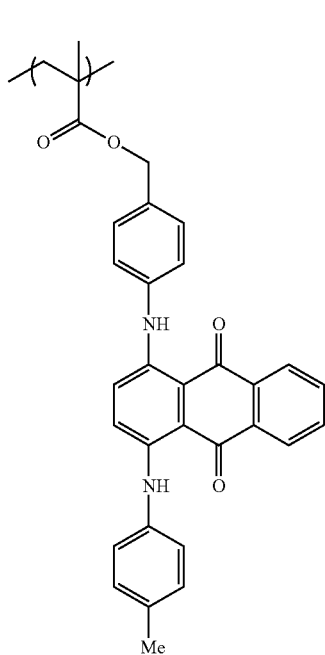

(MD-2)

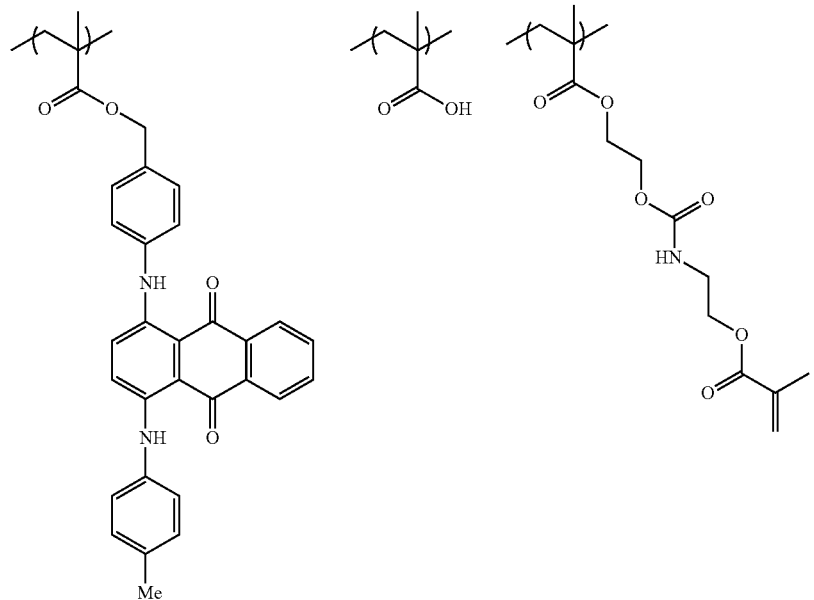

(J-16)

A monomer 1 (7.93 g), methacrylic acid (0.65 g), 2-hydroxyethyl methacrylate (0.65 g), dodecyl mercaptan (0.25 g), and PGMEA (23.3 g) were put into a 100 mL three-neck flask, and the solution was heated at 80° C. in a nitrogen atmosphere. To this solution, a mixed solution consisting of the monomer 1 (7.93 g), methacrylic acid (0.65 g), 2-hydroxyethyl methacrylate (0.65 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 3 hours and heated to 90° C. Subsequently, the solution was heated and stirred for 2 hours and then left to cool, thereby obtaining a PGMEA solution of (MD-2). Next, to the PGMEA solution of (MD-2), 2-isocyanatoethyl methacrylate (1.55 g), Neostann U-600 (manufactured by NITTO KASEI CO., LTD.) (20 mg), and p-methoxyphenol (20 mg) were added, the solution was heated for 5 hours at 80° C. in the air atmosphere, and removal of the 2-isocyanatoethyl methacrylate was confirmed. After being cooled, the obtained reaction solution was added dropwise to a mixed solvent of methanol/deionized water=100 mL/10 mL for reprecipitation, thereby obtaining 18.8 g of a dye multimer (J-16).

The weight average molecular weight (Mw) of the dye multimer (J-16) measured by GPC was 6,500, and a ratio of weight average molecular weight/number average molecular weight (Mw/Mn) thereof was 1.9.

Moreover, the acid value thereof measured by titration using a 0.1 N aqueous sodium hydroxide solution was 0.75 mmol/g. As a result of NMR measurement, the amount of a polymerizable group contained in the dye multimer was confirmed to be 0.50 mmol with respect to 1 g of the dye multimer (J-16).

Synthesis Example 17

Synthesis of Dye Multimer (J-17)

[Chem. 96]

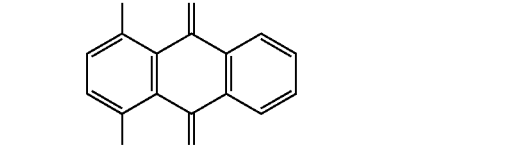
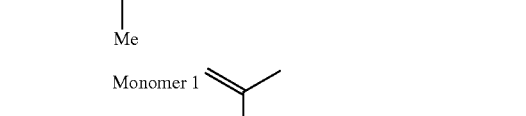
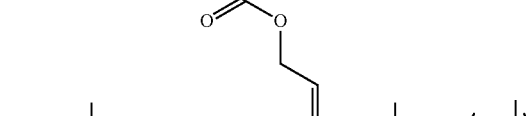
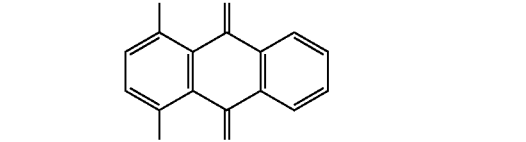

The monomer 1 (8.72 g), methacrylic acid (0.65 g), allyl methacrylate (0.63 g), dodecyl mercaptan (0.25 g), and PGMEA (23.3 g) were put into a 100 mL three-neck flask, and the solution was heated at 80° C. in a nitrogen atmosphere. To this solution, a mixed solution consisting of the monomer 1 (8.72 g), methacrylic acid (0.65 g), allyl methacrylate (0.63 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 3 hours and then left to cool. The reaction solution was added dropwise to a mixed solvent of methanol/deionized water=100 mL/10 mL for reprecipitation, thereby obtaining 18.2 g of a dye multimer (J-17).

The weight average molecular weight (Mw) of the dye multimer (J-17) measured by GPC was 7,500, and a ratio of weight average molecular weight/number average molecular weight (Mw/Mn) thereof was 2.4.

Moreover, the acid value thereof measured by titration using a 0.1 N aqueous sodium hydroxide solution was 0.76 mmol/g. As a result of NMR measurement, the amount of a polymerizable group contained in the dye multimer was confirmed to be 0.40 mmol with respect to 1 g of the dye multimer (J-17).

Synthesis Example 18

Synthesis of Dye Multimer (J-18)

[Chem. 97]

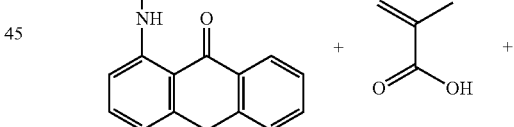
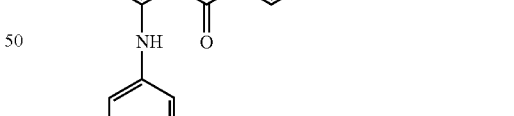
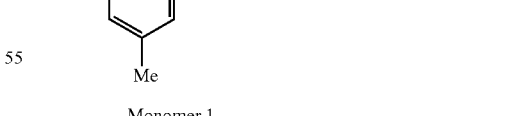
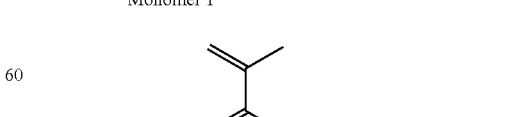
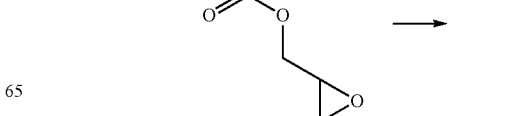
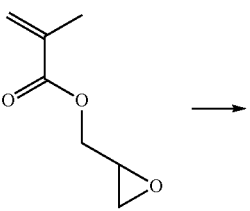

Synthesis Example 19

Synthesis of Dye Multimer (J-19)

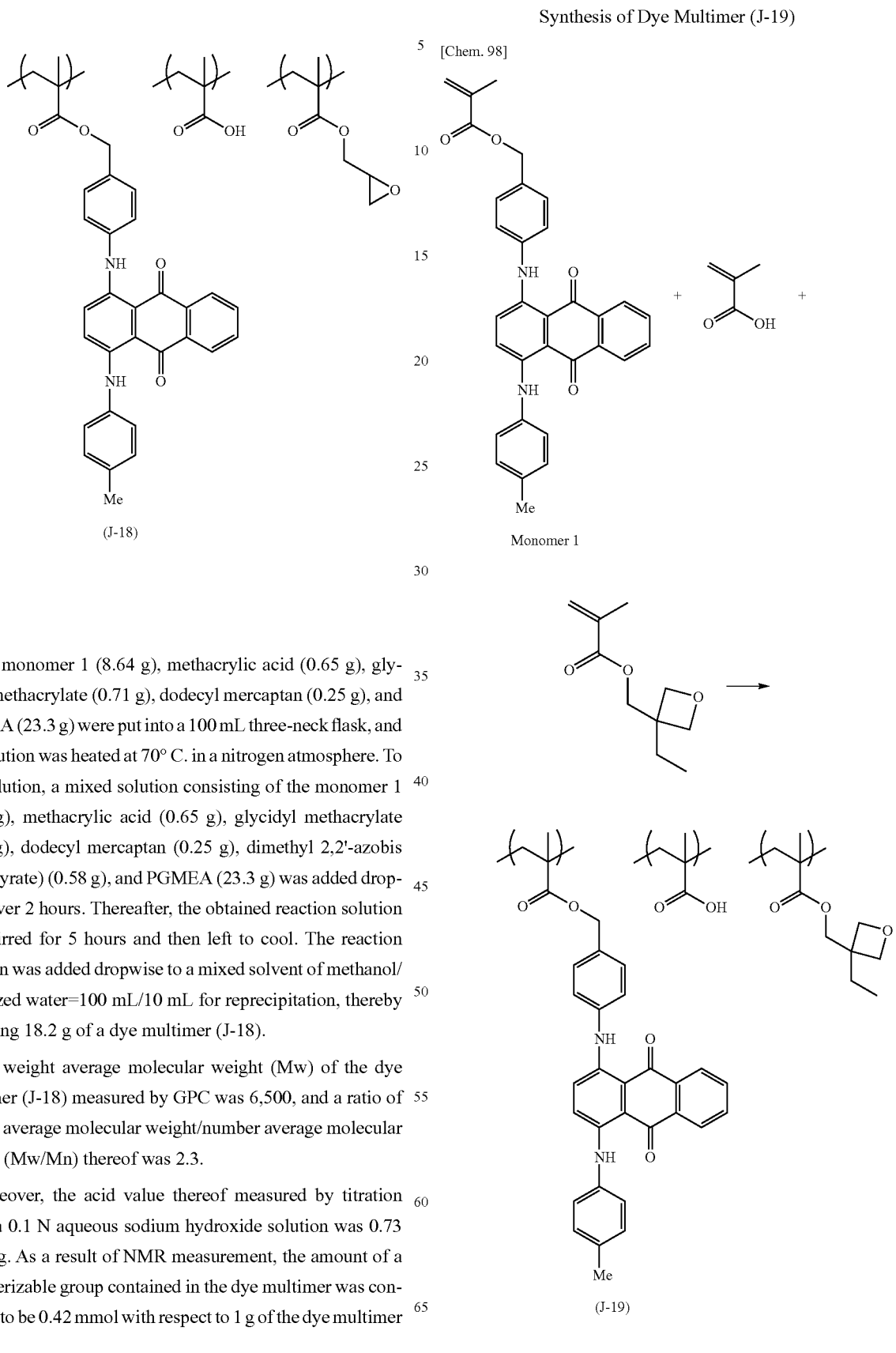

The monomer 1 (8.64 g), methacrylic acid (0.65 g), glycidyl methacrylate (0.71 g), dodecyl mercaptan (0.25 g), and PGMEA (23.3 g) were put into a 100 mL three-neck flask, and the solution was heated at 70° C. in a nitrogen atmosphere. To this solution, a mixed solution consisting of the monomer 1 (8.64 g), methacrylic acid (0.65 g), glycidyl methacrylate (0.71 g), dodecyl mercaptan (0.25 g), dimethyl 2,2'-azobis (isobutyrate) (0.58 g), and PGMEA (23.3 g) was added dropwise over 2 hours. Thereafter, the obtained reaction solution was stirred for 5 hours and then left to cool. The reaction solution was added dropwise to a mixed solvent of methanol/deionized water=100 mL/10 mL for reprecipitation, thereby obtaining 18.2 g of a dye multimer (J-18).

The weight average molecular weight (Mw) of the dye multimer (J-18) measured by GPC was 6,500, and a ratio of weight average molecular weight/number average molecular weight (Mw/Mn) thereof was 2.3.

Moreover, the acid value thereof measured by titration using a 0.1 N aqueous sodium hydroxide solution was 0.73 mmol/g. As a result of NMR measurement, the amount of a polymerizable group contained in the dye multimer was confirmed to be 0.42 mmol with respect to 1 g of the dye multimer (J-18).

The monomer 1 (8.43 g), methacrylic acid (0.65 g), 3-methyl-3-oxetanyl methyl methacrylate (0.92 g), dodecyl mercaptan (0.25 g), and PGMEA (23.3 g) were put into a 100 mL three-neck flask, and the solution was heated at 70° C. in a nitrogen atmosphere. To this solution, a mixed solution consisting of the monomer 1 (8.43 g), methacrylic acid (0.65 g), 3-methyl-3-oxetanyl methyl methacrylate (0.92 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 5 hours and then left to cool. The reaction solution was added dropwise to a mixed solvent of methanol/deionized water=100 mL/10 mL for reprecipitation, thereby obtaining 19.1 g of a dye multimer (J-19).

The weight average molecular weight (Mw) of the dye multimer (J-19) measured by GPC was 6,300, and a ratio of weight average molecular weight/number average molecular weight (Mw/Mn) thereof was 2.3.

Moreover, the acid value thereof measured by titration using a 0.1 N aqueous sodium hydroxide solution was 0.74 mmol/g. As a result of NMR measurement, the amount of a polymerizable group contained in the dye multimer was confirmed to be 0.45 mmol with respect to 1 g of the dye multimer (J-19).

Synthesis Example 20

Synthesis of Dye Multimer (J-20)

[Chem. 99]

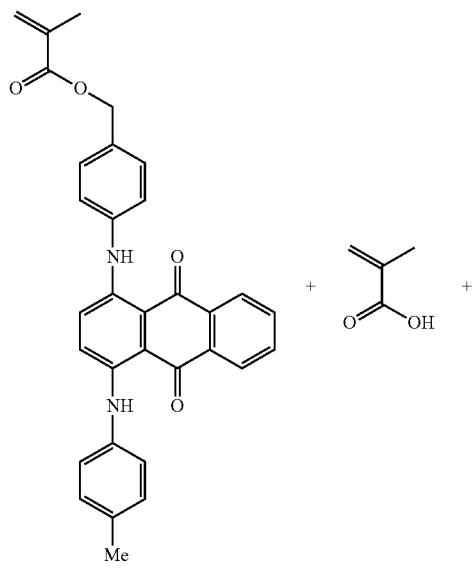

Monomer 1

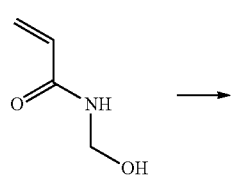

-continued

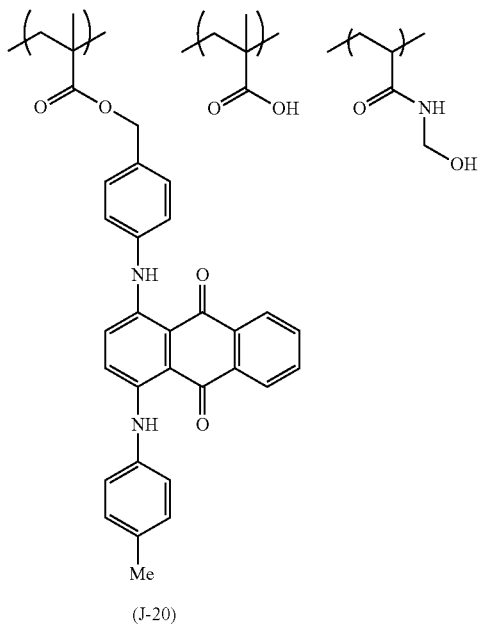

(J-20)

The monomer 1 (8.85 g), methacrylic acid (0.65 g), N-(hydroxymethyl)acrylamide (0.51 g), dodecyl mercaptan (0.25 g), and PGMEA (23.3 g) were put into a 100 mL three-neck flask, and the solution was heated at 70° C. in a nitrogen atmosphere. To this solution, a mixed solution consisting of the monomer 1 (8.85 g), methacrylic acid (0.65 g), N-(hydroxymethyl)acrylamide (0.51 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 5 hours and then left to cool. The reaction solution was added dropwise to a mixed solvent of methanol/deionized water=100 mL/10 mL for reprecipitation, thereby obtaining 18.3 g of a dye multimer (J-20).

The weight average molecular weight (Mw) of the dye multimer (J-20) measured by GPC was 6,800, and a ratio of weight average molecular weight/number average molecular weight (Mw/Mn) thereof was 2.4.

Moreover, the acid value thereof measured by titration using a 0.1 N aqueous sodium hydroxide solution was 0.70 mmol/g. As a result of NMR measurement, the amount of a polymerizable group contained in the dye multimer was confirmed to be 0.50 mmol with respect to 1 g of the dye multimer (J-20).

Synthesis Examples 21 to 34

Synthesis of Dye Multimers (J-21) to (J-34)

Dye multimers (J-21) to (J-34) shown below were synthesized in the same manner as in Synthesis Example 1, except that the dye monomer used in Synthesis Example 1 was changed.

[Chem. 100]
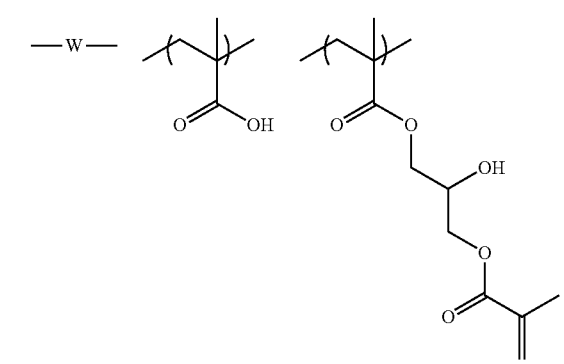
(J-21)
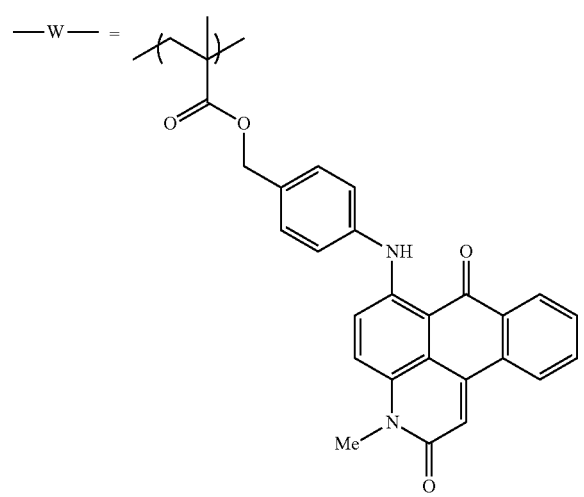
(J-22)
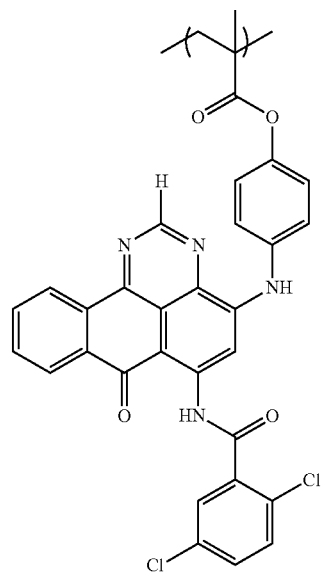
-continued
(J-23)
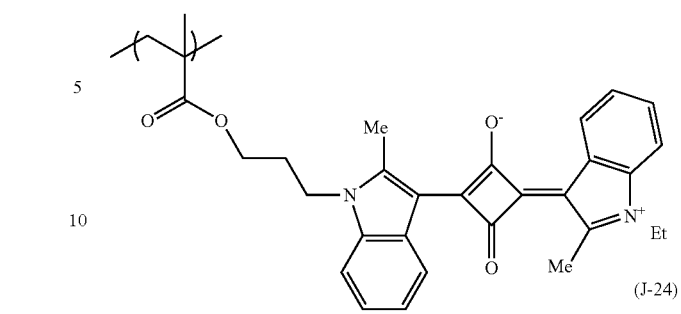
(J-24)
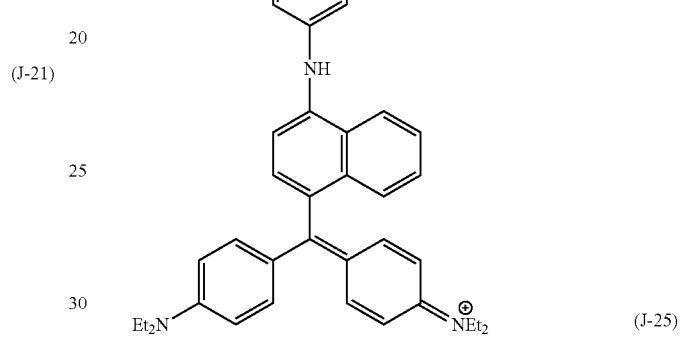
(J-25)
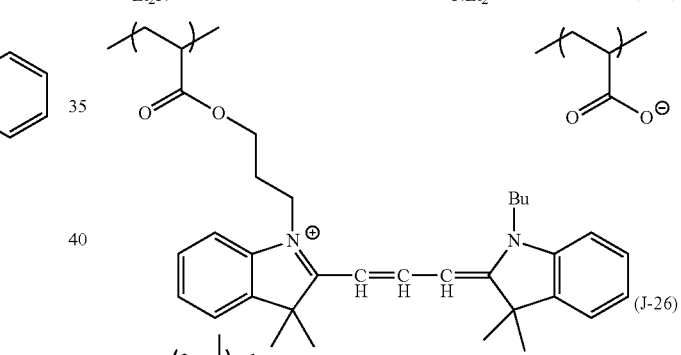
(J-26)
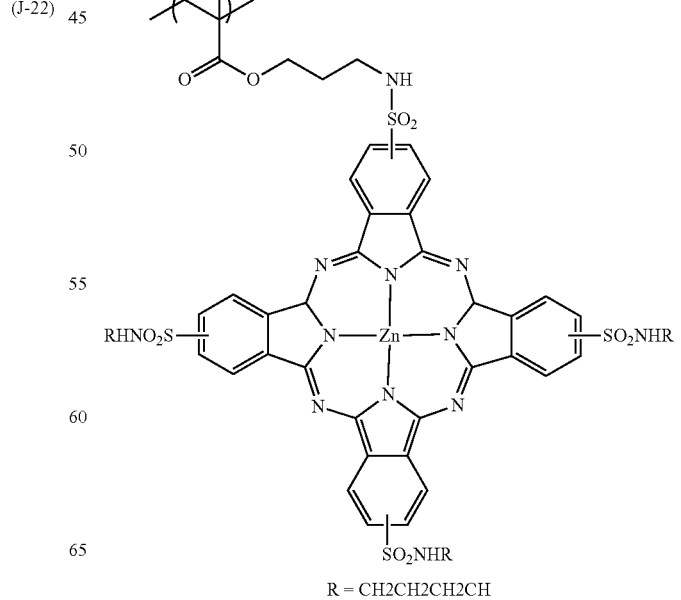
R = CH2CH2CH2CH (J-27)
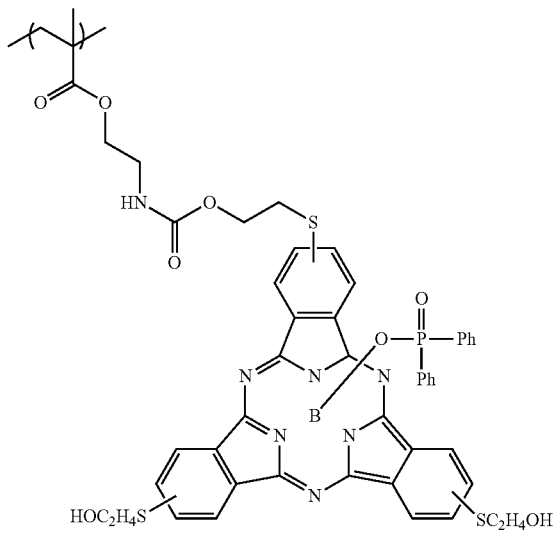
(J-28)
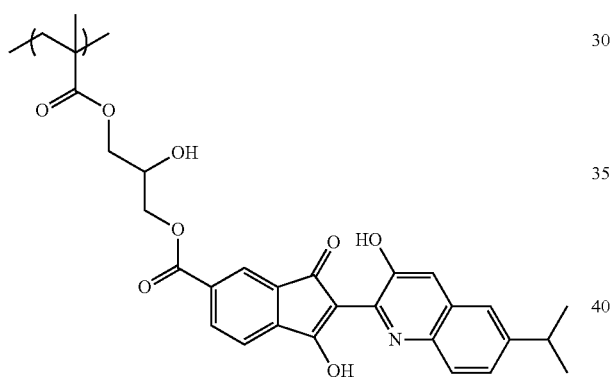
(J-29)
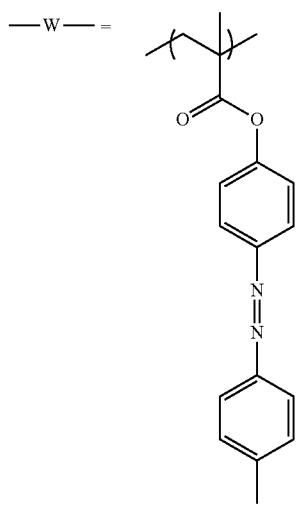
[Chem. 101]
—W— =
(J-30)
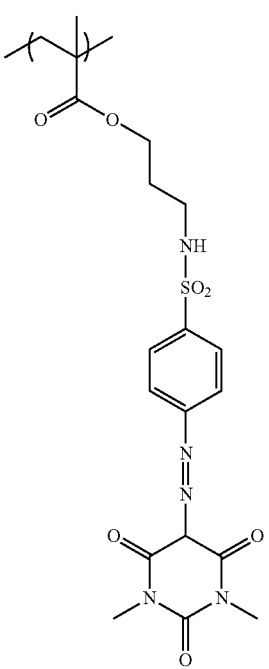
(J-31)

-continued (J-32)
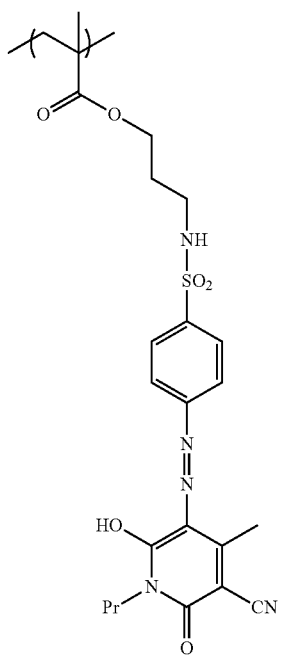

(J-33)
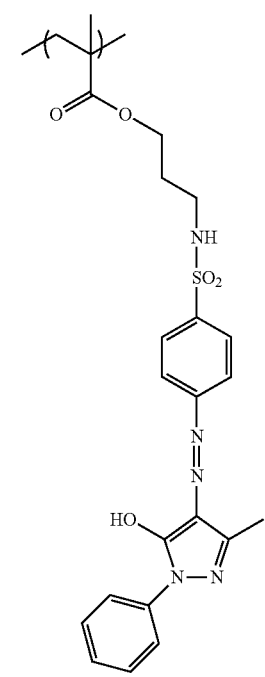

(J-34)
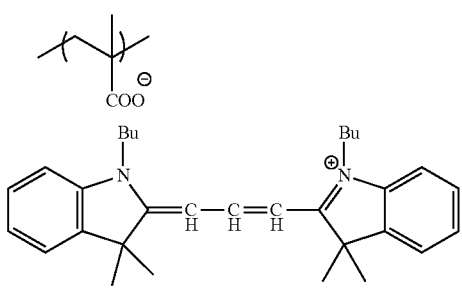

Synthesis Example 35

Synthesis of Dye Multimer (J-35)

[Chem. 102]

HO-Dye-OH + Monomer 2 + ...

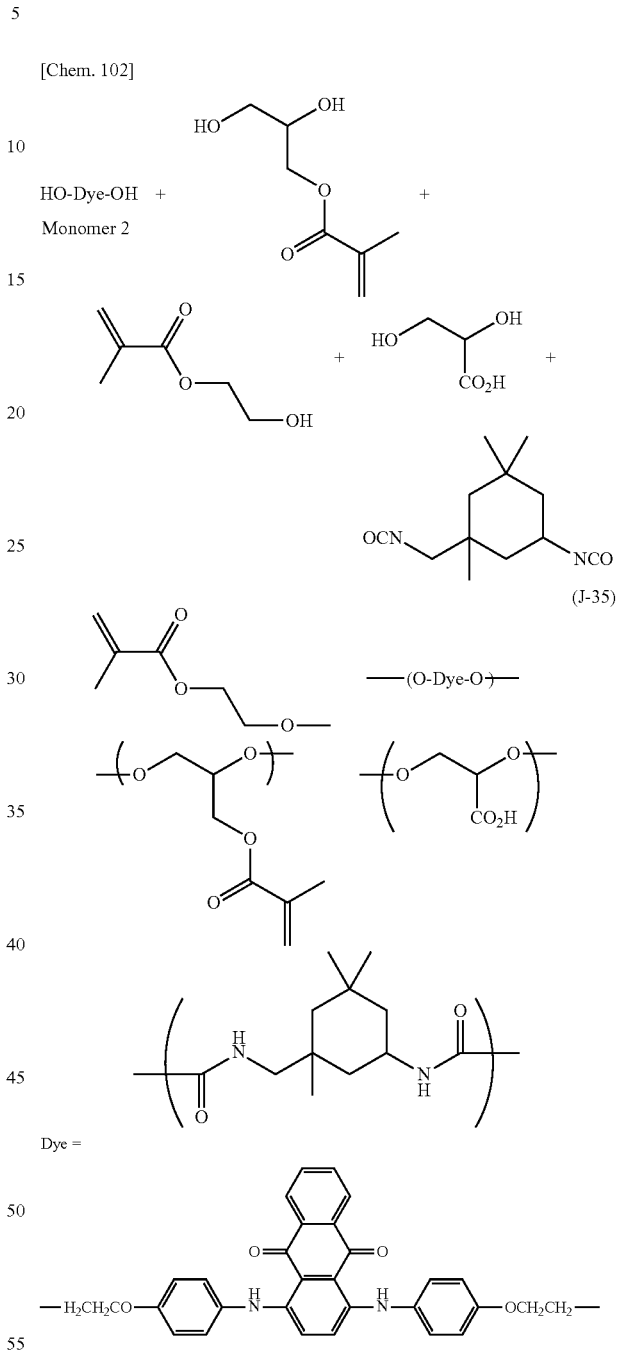

(J-35)

2-Hydroxyethyl methacrylate (1.29 g), a monomer 2 (9.40 g), 2,3-dihydroxyethyl methacrylate (0.53 g), 1,2-dihydroxypropionic acid (1.41 g), and isophorone diisocyanate (7.37 g) were added to PGMEA (46.7 g), and the solution was heated at 80° C. in a nitrogen atmosphere. Thereafter, Neostann U-600 (manufactured by NITTO KASEI CO., LTD.) (20 mg) was added to the obtained reaction solution, and the resultant was heated for 10 hours and then left cool, thereby obtaining a 30% PGMEA solution of a dye multimer (J-35).

The weight average molecular weight (Mw) of the dye multimer (J-35) measured by GPC was 7,900, and a ratio of weight average molecular weight/number average molecular weight (Mw/Mn) thereof was 2.8.

Moreover, the acid value thereof measured by titration using a 0.1 N aqueous sodium hydroxide solution was 0.66 mmol/g. As a result of NMR measurement, the amount of a polymerizable group contained in the dye multimer was confirmed to be 0.65 mmol with respect to 1 g of the dye multimer (J-35).

Synthesis Example 36 to 38

Synthesis of Dye Multimers (J-36) to (J-38)

Dye multimers (J-36) to (J-38) were obtained by performing the same operation as in Synthesis Example 35, except that the monomer used in Synthesis Example 35 was replaced with monomers having the following dye structure.

Synthesis Example 39

Synthesis of Dye Multimer (J-39)

[Chem. 104]

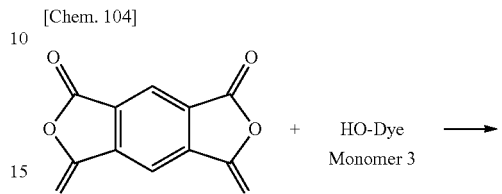

[Chem. 103]

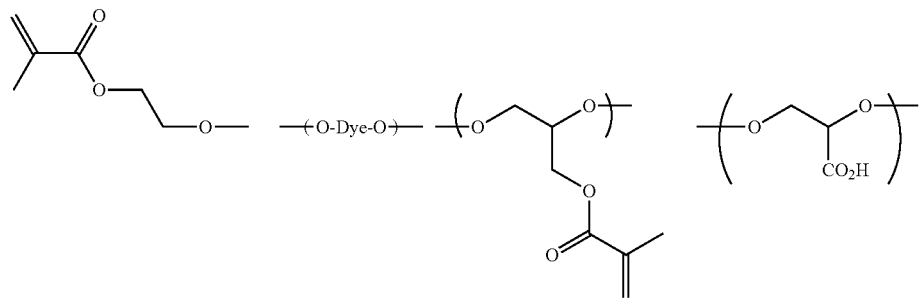

Dye =

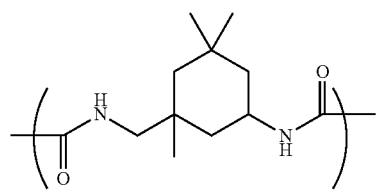

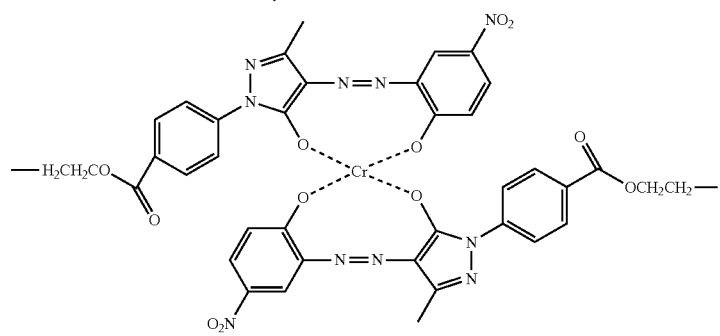

(J-36)

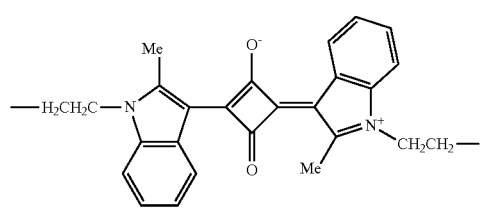

(J-37)

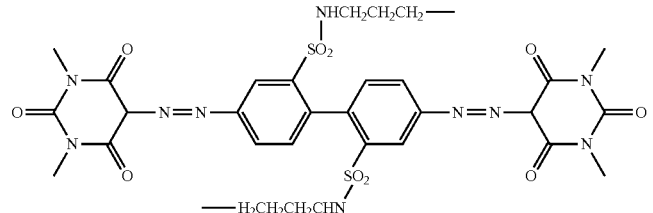

(J-38)

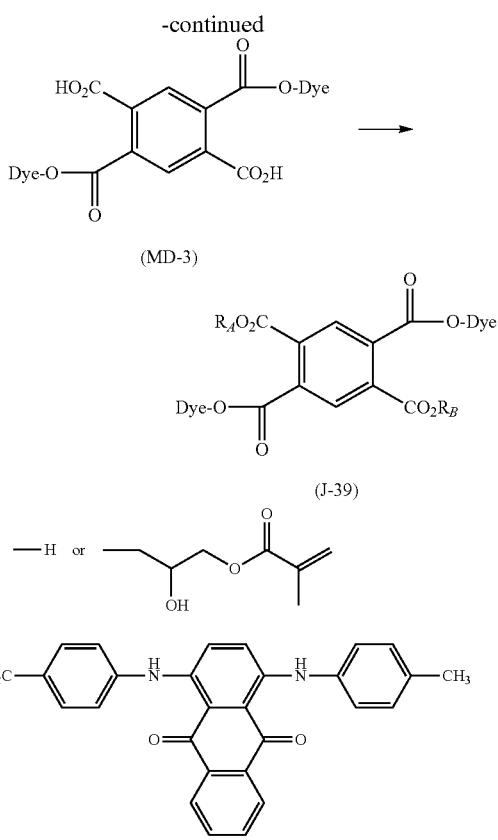

(MD-3)

(J-39)

Pyromellitic anhydride (3.55 g) and a monomer 3 (14.1 g) were added to PGMEA (46.7 g), and the solution was heated at 80° C. in a nitrogen atmosphere. Thereafter, Neostann U-600 (manufactured by NITTO KASEI CO., LTD.) (20 mg) was added to the obtained reaction solution, and the resultant was heated for 10 hours and cooled, thereby obtaining an intermediate (MD-3). Subsequently, glycidyl methacrylate (2.31 g) and tetrabutyl ammonium bromide (20 mg) were added to the intermediate (MD-3), and the resultant was heated for 10 hours at 100° C., threby obtaining a 30% PGMEA solution of a dye multimer (J-39).

The weight average molecular weight (Mw) of the dye multimer (J-39) measured by GPC was 2,500, and a ratio of weight average molecular weight/number average molecular weight (Mw/Mn) thereof was 1.6.

Moreover, the acid value thereof measured by titration using a 0.1 N aqueous sodium hydroxide solution was 0.82 mmol/g. As a result of NMR measurement, the amount of a polymerizable group contained in the dye multimer was confirmed to be 0.71 mmol with respect to 1 g of the dye multimer (J-39).

Synthesis Example 40

Synthesis of Dye Multimer (J-40)

[Chem. 105]

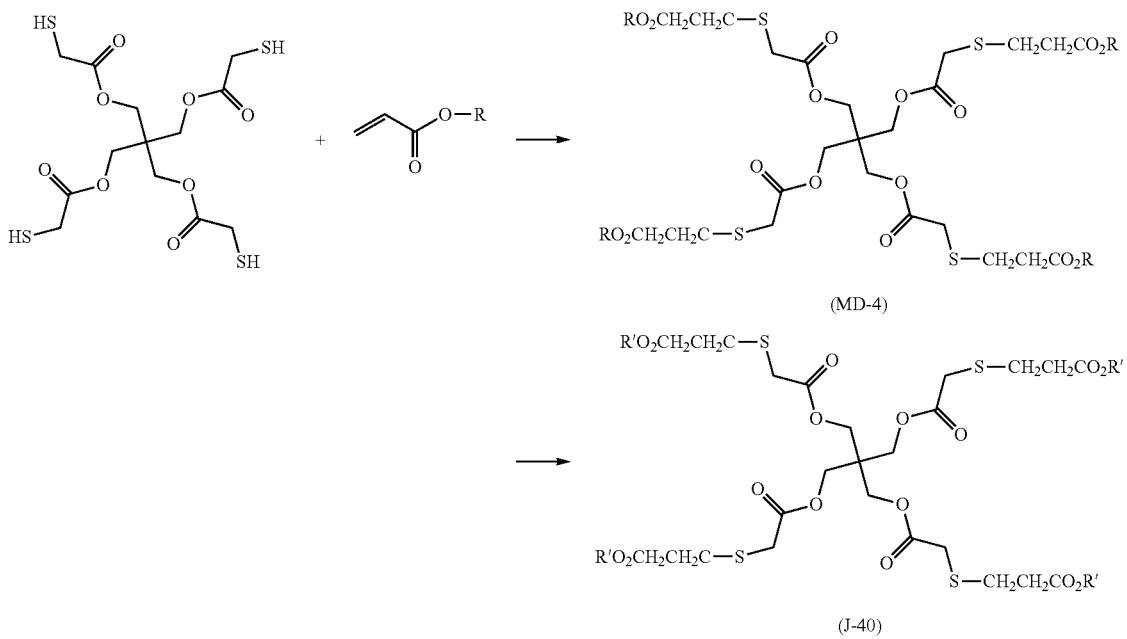

(MD-4)

(J-40)

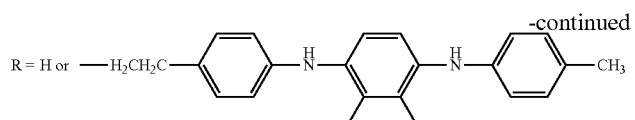

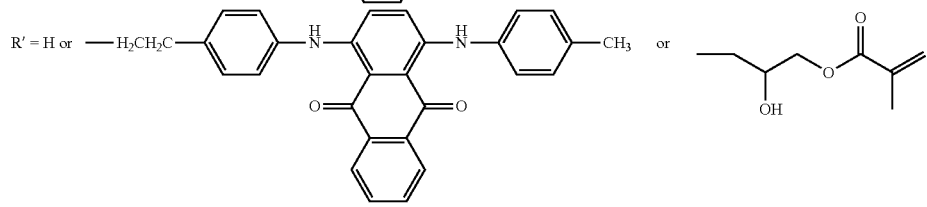

Pentaerythritol tetrakis(2-mercaptoacetate) (5.10 g), a monomer 4 (11.9 g), acrylic acid (1.70 g), and tributylamine (0.10 g) were added to PGMEA (46.7 g), and the solution was heated for 10 hours at 80° C. in a nitrogen atmosphere and then cooled, thereby obtaining an intermediate (MD-4). Thereafter, glycidyl methacrylate (1.34 g) and tetrabutyl ammonium bromide (20 mg) were added to the intermediate (MD-4), and the resultant was heated for 10 hours at 100° C., thereby obtaining a 30% PGMEA solution of a dye multimer (J-40).

The weight average molecular weight (Mw) of the dye multimer (J-40) measured by GPC was 4,500, and a ratio of weight average molecular weight/number average molecular weight (Mw/Mn) thereof was 1.8.

Moreover, the acid value thereof measured by titration using a 0.1 N aqueous sodium hydroxide solution was 0.72 mmol/g. As a result of NMR measurement, the amount of a polymerizable group contained in the dye multimer was confirmed to be 0.35 mmol with respect to 1 g of the dye multimer (J-40).

Synthesis Example 41

Synthesis of Dye Multimer (J-41)

[Chem. 106]

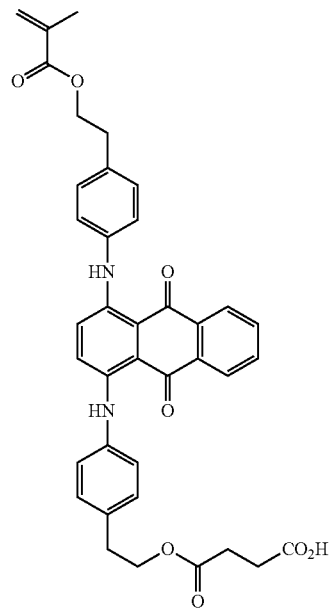

Monomer 5

+

-continued

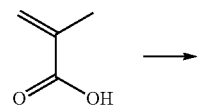

→

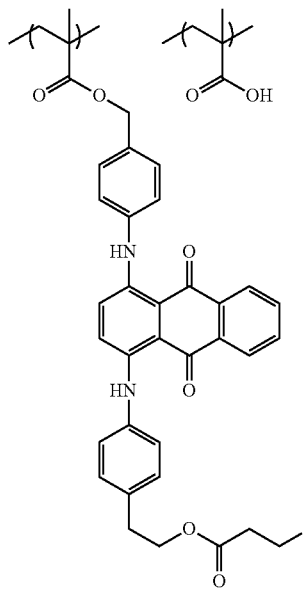

(MD-5)

→

-continued

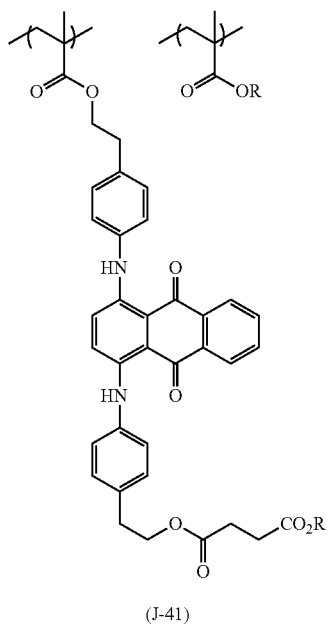

(J-41)

A monomer 5 (8.51 g), methacrylic acid (0.35 g), dodecyl mercaptan (0.25 g), and PGMEA (23.3 g) were put into a 100 mL three-neck flask, and the solution was heated at 80° C. in a nitrogen atmosphere. To this solution, a mixed solution consisting of the monomer 5 (8.51 g), methacrylic acid (0.35 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 3 hours and then heated to 90° C. Subsequently, the solution was heated and stirred for 2 hours and then left to cool, thereby obtaining a PGMEA solution of (MD-5). Next, glycidyl methacrylate (2.29 g), tetrabutyl ammonium bromide (80 mg), and p-methoxyphenol (20 mg) were added to the PGMEA solution of (MD-5), the resultant was heated for 15 hours at 100° C. in the atmosphere, and removal of the glycidyl methacrylate was confirmed. After being cooled, the reaction solution was added dropwise to a mixed solvent of methanol/deionized water=100 mL/10 mL for reprecipitation, thereby obtaining 18.6 g of dye multimer (J-41).

The weight average molecular weight (Mw) of the dye multimer (J-41) measured by GPC was 6,500, and a ratio of weight average molecular weight/number average molecular weight (Mw/Mn) thereof was 2.0.

Moreover, the acid value thereof measured by titration using a 0.1 N aqueous sodium hydroxide solution was 0.81 mmol/g. As a result of NMR measurement, the amount of a polymerizable group contained in the dye multimer was confirmed to be 0.70 mmol with respect to 1 g of the dye multimer (J-41).

Synthesis Example 42

Synthesis of Dye Multimer (J-42)

[Chem. 107]

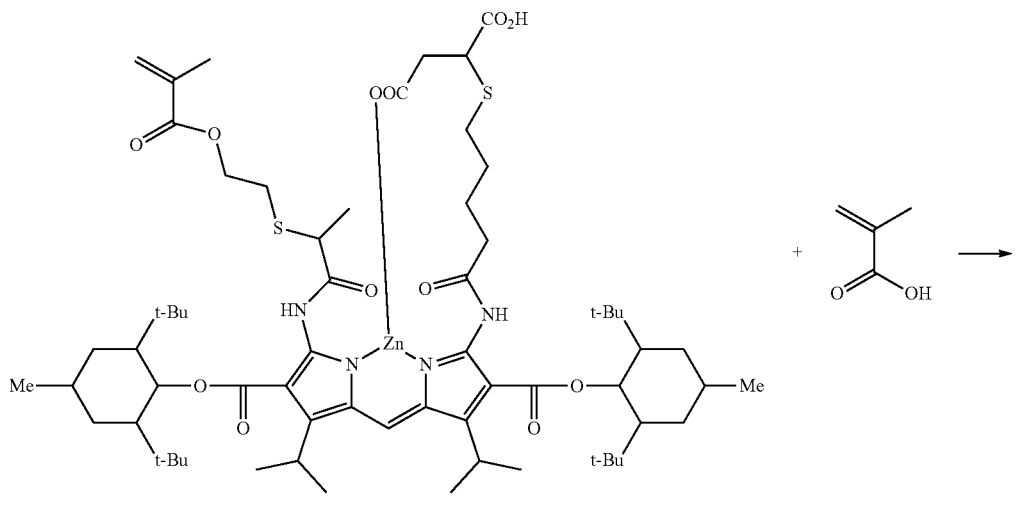

Monomer 6

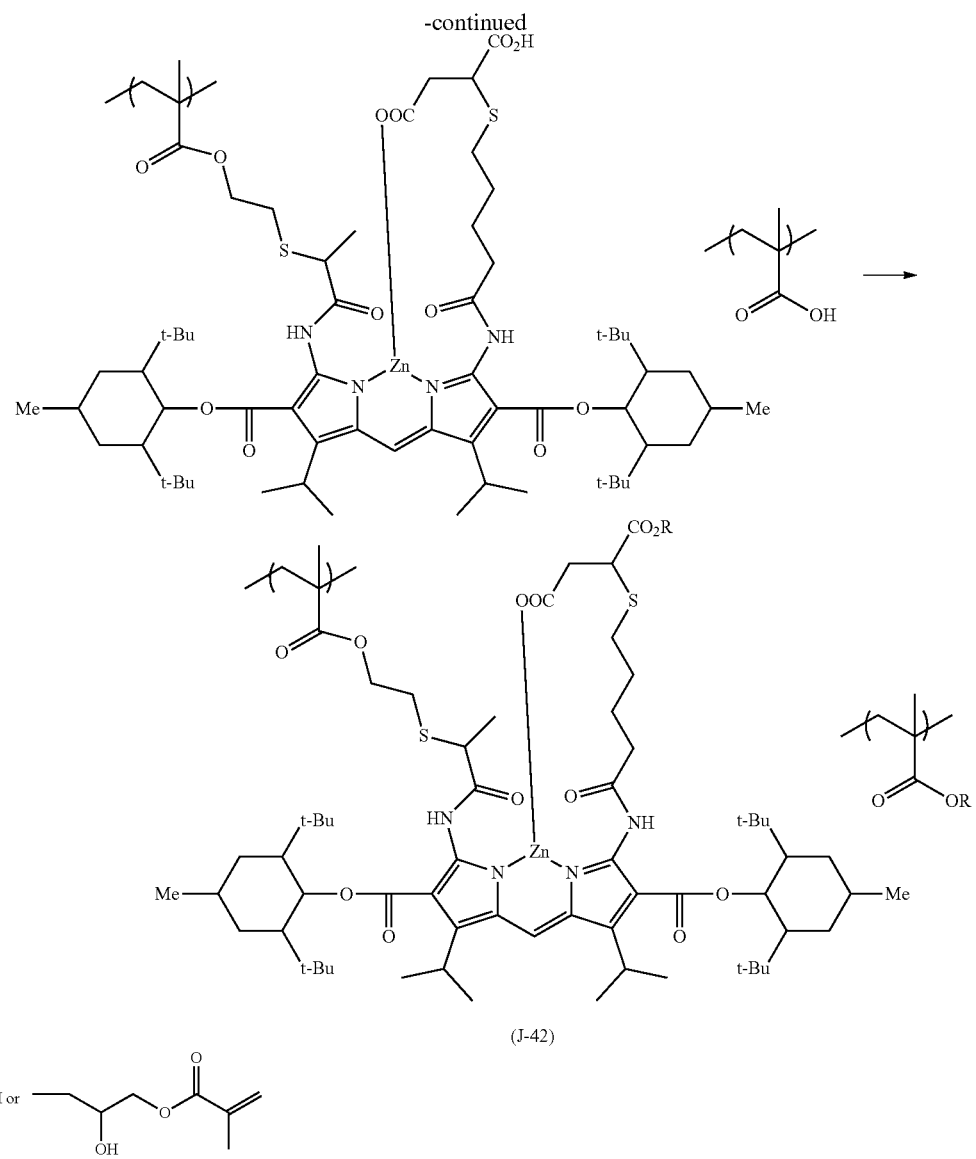

(J-42)

R = H or ![structure with OH and methacrylate]

A monomer 6 (8.51 g), methacrylic acid (0.35 g), dodecyl mercaptan (0.25 g), and PGMEA (23.3 g) were put into a 100 mL three-neck flask, and the solution was heated at 80° C. in a nitrogen atmosphere. To this solution, a mixed solution consisting of the monomer 6 (8.51 g), methacrylic acid (0.35 g), dodecyl mercaptan (0.25 g), dimethyl 2,2'-azobis(isobutyrate) (0.58 g), and PGMEA (23.3 g) was added dropwise over 2 hours. Thereafter, the obtained reaction solution was stirred for 3 hours and then heated to 90° C. Next, the solution was heated and stirred for 2 hours and then left to cool. Thereafter, glycidyl methacrylate (2.29 g), tetrabutyl ammonium bromide (80 mg), and p-methoxyphenol (20 mg) were added to the reaction solution left to cool, the resultant was heated for 15 hours at 100° C. in the nitrogen atmosphere, and removal of the glycidyl methacrylate was confirmed. After being cooled, the reaction solution was added dropwise to a mixed solvent of methanol/deionized water=100 mL/10 mL for reprecipitation, thereby obtaining 18.6 g of a dye multimer (J-42).

The weight average molecular weight (Mw) of the dye multimer (J-42) measured by GPC was 6,300, and a ratio of weight average molecular weight/number average molecular weight (Mw/Mn) thereof was 2.2.

Moreover, the acid value thereof measured by titration using a 0.1 N aqueous sodium hydroxide solution was 0.83 mmol/g. As a result of NMR measurement, the amount of a polymerizable group contained in the dye multimer was confirmed to be 0.72 mmol with respect to 1 g of the dye multimer (J-42).

Synthesis Example 43

Synthesis of Dye Multimer (H-1)

The monomer 1 (9.33 g), methacrylic acid (0.67 g), dodecyl mercaptan (0.25 g), and PGMEA (23.3 g) were put into a 100 mL three-neck flask, and the solution was heated at 80° C. in a nitrogen atmosphere. To this solution, a mixed solution consisting of the monomer 1 (9.33 g), methacrylic acid (0.67 g), dodecyl mercaptan (0.25 g), dimethyl 2,2'-azobis(isobutyrate) [trade name: V601, manufactured by Wako Pure Chemical Industries, Ltd.] (0.58 g), and PGMEA (23.3 g)

were added dropwise over 2 hours. Thereafter, the obtained reaction solution was stirred for 3 hours. After being cooled, the obtained reaction solution was added dropwise to a mixed solvent of methanol/deionized water=100 mL/10 mL for reprecipitation, thereby obtaining 17.2 g of a dye multimer (H-1).

The weight average molecular weight (Mw) of the dye multimer (H-1) measured by GPC was 7,500, and a ratio of weight average molecular weight/number average molecular weight (Mw/Mn) thereof was 1.9.

Moreover, the acid value of the dye multimer (H-1) measured by titration using a 0.1 N aqueous sodium hydroxide solution was 0.78 mmol/g.

Synthesis Example 44

Synthesis of Dye Multimer (H-2)

Pentaerythritol tetrakis(2-mercaptoacetate) (4.33 g), the monomer 4 (14.9 g), acrylic acid (0.76 g), and tributylamine (0.10 g) were added to PGMEA (46.7 g), and the solution was heatd for 10 hours at 80° C. in a nitrogen atmosphere and then cooled, thereby obtaining a dye multimer (H-2).

The weight average molecular weight (Mw) of the dye multimer (H-2) measured by GPC was 6,200, and a ratio of weight average molecular weight/number average molecular weight (Mw/Mn) thereof was 2.2.

Moreover, the acid value of the dye multimer (H-2) measured by titration using a 0.1 N aqueous sodium hydroxide solution was 0.52 mmol/g.

[Chem. 108]

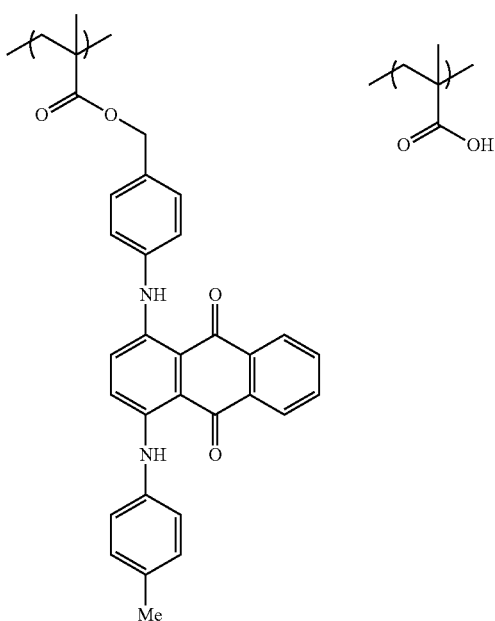

The weight average molecular weight (Mw), ratio of weight average molecular weight/number average molecular weight (Mw/Mn), acid value (mmol/g), and amount of polymerizable group (mmol/g) of the dye multimers (J-1) to (J-42), (H-1), and (H-2) are summarized in Table 2.

TABLE 2

| Synthesis example No. | Dye multimer | Mw | Mw/Mn | Acid value (mmol/g) | Amount of polymerizable group (mmol/g) |
|---|---|---|---|---|---|
| 1 | (J-1) | 6000 | 1.9 | 0.75 | 0.40 |
| 2 | (J-2) | 4000 | 1.8 | 0.74 | 0.41 |
| 3 | (J-3) | 8000 | 2.3 | 0.75 | 0.39 |
| 4 | (J-4) | 10000 | 1.7 | 0.77 | 0.42 |
| 5 | (J-5) | 15000 | 2.3 | 0.73 | 0.41 |
| 6 | (J-6) | 3000 | 1.9 | 0.74 | 0.40 |
| 7 | (J-7) | 6500 | 2.0 | 0.51 | 0.52 |
| 8 | (J-8) | 5800 | 2.1 | 0.98 | 0.41 |
| 9 | (J-9) | 6300 | 1.9 | 0.42 | 0.45 |
| 10 | (J-10) | 6500 | 1.8 | 1.21 | 0.47 |
| 11 | (J-11) | 6200 | 1.9 | 0.75 | 0.29 |
| 12 | (J-12) | 6800 | 2.3 | 0.72 | 0.81 |
| 13 | (J-13) | 7100 | 2.4 | 0.70 | 1.02 |
| 14 | (J-14) | 6100 | 2.2 | 0.69 | 0.21 |
| 15 | (J-15) | 7500 | 2.1 | 0.71 | 1.15 |
| 16 | (J-16) | 6500 | 1.9 | 0.75 | 0.50 |
| 17 | (J-17) | 7500 | 2.4 | 0.76 | 0.40 |
| 18 | (J-18) | 6500 | 2.3 | 0.73 | 0.42 |
| 19 | (J-19) | 6300 | 2.3 | 0.74 | 0.45 |
| 20 | (J-20) | 6800 | 2.4 | 0.70 | 0.50 |
| 21 | (J-21) | 6400 | 1.9 | 0.62 | 0.35 |
| 22 | (J-22) | 6200 | 2.3 | 0.85 | 0.45 |
| 23 | (J-23) | 7500 | 2.1 | 0.58 | 0.62 |
| 24 | (J-24) | 5200 | 1.7 | 0.62 | 0.32 |
| 25 | (J-25) | 6800 | 1.6 | 0.68 | 0.75 |
| 26 | (J-26) | 7700 | 2.3 | 0.74 | 0.79 |
| 27 | (J-27) | 4300 | 2.2 | 0.95 | 0.65 |
| 28 | (J-28) | 5500 | 2.1 | 0.91 | 0.62 |
| 29 | (J-29) | 5800 | 2.1 | 0.62 | 0.64 |
| 30 | (J-30) | 7000 | 2.3 | 0.74 | 0.52 |
| 31 | (J-31) | 6100 | 2.4 | 0.65 | 0.32 |
| 32 | (J-32) | 6000 | 2.1 | 0.81 | 0.40 |
| 33 | (J-33) | 4900 | 1.9 | 0.90 | 0.51 |
| 34 | (J-34) | 5800 | 1.9 | 0.55 | 0.65 |
| 35 | (J-35) | 7900 | 2.8 | 0.66 | 0.65 |
| 36 | (J-36) | 7500 | 2.9 | 0.58 | 0.35 |
| 37 | (J-37) | 6500 | 2.8 | 0.91 | 0.79 |
| 38 | (J-38) | 7100 | 2.7 | 0.85 | 0.65 |
| 39 | (J-39) | 2500 | 1.6 | 0.82 | 0.71 |
| 40 | (J-40) | 4500 | 1.8 | 0.72 | 0.35 |

TABLE 2-continued

| Synthesis example No. | Dye multimer | Mw | Mw/Mn | Acid value (mmol/g) | Amount of polymerizable group (mmol/g) |
|---|---|---|---|---|---|
| 41 | (J-41) | 6500 | 2.0 | 0.81 | 0.70 |
| 42 | (J-42) | 6300 | 2.2 | 0.83 | 0.72 |
| 43 | (H-1) | 7500 | 1.9 | 0.78 | 0 |
| 44 | (H-2) | 6200 | 2.2 | 0.52 | 0 |

Examples 1 to 53 and Comparative Examples 1 and 2

1. Preparation of Resist Solution

A resist solution was prepared by mixing and dissolving components having the following composition.

<Composition of Resist Solution>

| | |
|---|---|
| Solvent: propylene glycol monomethyl ether acetate | 19.20 parts |
| Solvent: ethyl lactate | 36.67 parts |
| Alkali-soluble resin: 40% PGMEA solution of benzyl methacrylate/methacrylic acid/2-hydroxyethyl methacrylate copolymer (molar ratio = 60/22/18, weight average molecular weight of 15,000, number average molecular weight of 9,000) | 30.51 parts |
| Ethylenically unsaturated double bond-containing compound:dipentaerythritol hexaacrylate (KAYARAD DPHA, manufactured by Nippon Kayaku Co., Ltd.) | 12.20 parts |
| Polymerization inhibitor: p-methoxyphenol | 0.0061 parts |
| Fluorosurfactant: F-475, manufactured by DIC CORPORATION | 0.83 parts |
| Photopolymerization initiator: trihalomethyl triazine-based photopolymerization initiator (TAZ-107 manufactured by Midori Kagaku Co., Ltd.) | 0.586 parts |

2. Preparation of Undercoat Layer-Attached Silicon Wafer Substrate

A 6-inch silicon wafer was heated in an oven at 200° C. for 30 minutes. Thereafter, the resist solution was coated onto this silicon wafer such that a dry film thickness became 1.5 μm. Moreover, the resultant was further heated and dried in an oven at 220° C. for an hour to form an undercoat layer, thereby obtaining an undercoat layer-attached silicon wafer substrate.

3. Preparation of Colored Radiation-Sensitive Composition 3-1. Preparation of Blue Pigment Dispersion A blue pigment dispersion 1 was prepared in the following manner.

A mixed solution consisting of 13.0 parts of C. I. Pigment Blue 15:6 (blue pigment, average primary particle size of 55 nm), 5.0 parts of a dispersion resin A (following structure, specific dispersion resin) as a pigment dispersant, and 82.0 parts of PGMEA was mixed with each other for 3 hours by a beads mill (zirconia beads having a diameter of 0.3 mm) so as to disperse the blue pigment, thereby preparing a pigment dispersion. Thereafter, by using a high-pressure dispersing machine NANO-3000-10 equipped with a depressurizing mechanism (manufactured by Nihon B.E.E Co., Ltd.), a dispersion process was performed on the pigment dispersion under a pressure of 2000 kg/cm$^3$ and at a flow rate of 500 g/min. The dispersion process was repeated 10 times, thereby obtaining a blue pigment dispersion 1 (dispersion of C. I. Pigment Blue 15:6, pigment concentration of 13%) used for the colored radiation-sensitive compositions of examples or comparative examples.

For the obtained blue pigment dispersion 1, an average primary particle size of the pigment was measured using a dynamic light scattering method (Microtrac Nanotrac UPA-EX150 manufactured by Nikkiso Co., Ltd.), and as a result, the particle size was measured to be 24 nm.

A blue pigment dispersion 2 used for colored radiation-sensitive compositions for examples was obtained by performing the same operation as used for the blue pigment dispersion 1, except that the dispersion resin A used in Preparation of Blue Pigment Dispersion 1 was replaced with a dispersion resin B (following structure, specific dispersion resin).

A blue pigment dispersion 3 used for colored radiation-sensitive compositions of comparative examples was obtained by performing the same operation as used for the blue pigment dispersion 1, except that the dispersion resin A used in Preparation of Blue Pigment Dispersion 1 was replaced with a dispersion resin C (following structure, dispersion resin for comparison).

[Chem. 109]

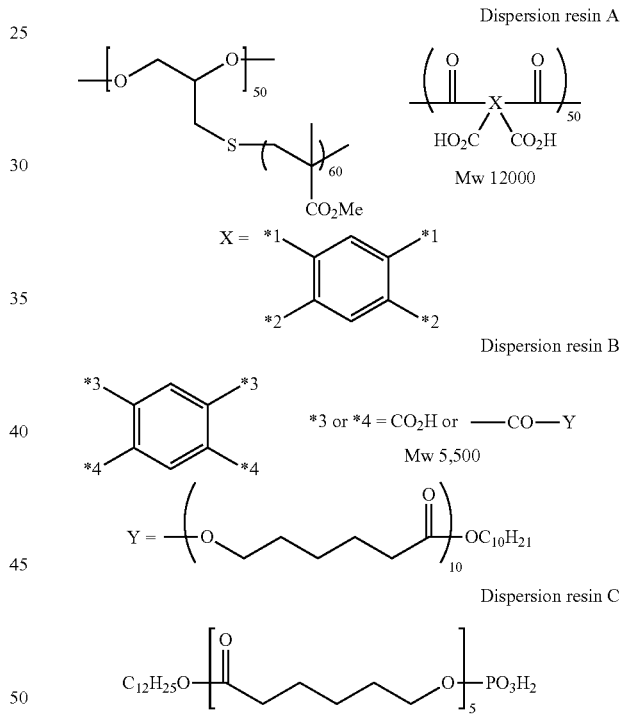

The dispersion resin A is a compound described above as the example compound (a-1), and the dispersion resin B is a compound described above as the example compound (a-10).

A red pigment dispersion, a green pigment dispersion, and a yellow pigment dispersion were prepared in the same manner as in Preparation of Blue Pigment Disperion 1, except that in Preparation of Blue Pigment Disperion 1, a combination of the pigment and the dispersion resin shown in Table 3 was used instead of the combination of C. I. Pigment Blue 15:6 and the dispersion resin A used as a blue pigment.

Details of the pigments (PR254, PR177, PG36, PG58, PY139, and PY150) shown in Table 3 are as follows. Moreover, in Table 3, PB 15:6 indicates C. I. Pigment Blue 15:6 used as a blue pigment in Preparation of Blue Pigment Dispersion 1.

~Red Pigment~
C. I. Pigment Red 254 (PR254) (average primary particle size of 26 nm)
C. I. Pigment Red 177 (PR177) (average primary particle size of 28 nm)
~Green Pigment~
C. I. Pigment Green 36 (PG36) (average primary particle size of 25 nm)
C. I. Pigment Green 58 (PG58) (average primary particle size of 30 nm)
~Yellow Pigment~
C. I. Pigment Yellow 139 (PG139) (average primary particle size of 27 nm)
C. I. Pigment Yellow 150 (PG150) (average primary particle size of 26 nm)

3-2. Preparation of Colored Radiation-Sensitive Composition (1) Colored Radiation-Sensitive Compositions of Examples 1 to 53 and Comparative Examples 1 and 2

The following components were mixed with each other respectively and dissolved, thereby obtaining the respective colored radiation-sensitive compositions of Examples 1 to 53 and Comparative Examples 1 and 2.

| | |
|---|---|
| Cyclohexanone | 1.133 parts |
| Alkali-soluble resin (J1 or J2 shown below: compound shown in Table 3) | 0.030 parts |
| Solsperse 20000 (1% cyclohexane solution, manufactured by The Lubrizol Corporation, Japan) | 0.125 parts |
| Photopolymerization initiator (compound having the following structure: compound shown in Table 3) | 0.012 parts |
| Colorant (dye multimer: dye multimers (J-1) to (J-42), (H-1), and (H-2) or dye 1 (compound described above as the monomer 1): compounds shown in Table 3) | 0.040 parts as solid content |
| Pigment dispersion shown in Table 3 (pigment concentration 13.0%) | 0.615 parts |
| Dipentaerythritol hexaacrylate (KAYARAD DPHA, manufactured by NIPPON KAYAKU Co., Ltd.) | 0.070 parts |
| Glycerol propoxylate (1% cyclohexane solution) | 0.048 parts |

[Chem. 110]

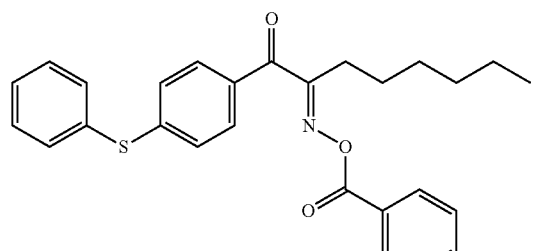

IRUGACURE OXE01 (Manufactured by BASF) (I-1)

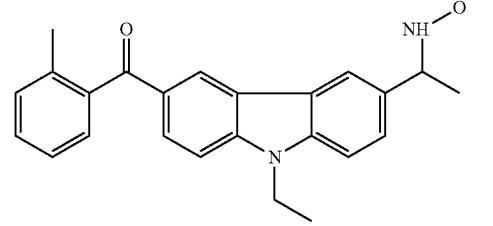

IRUGACURE OXE02 (Manufactured by BASF) (I-2)

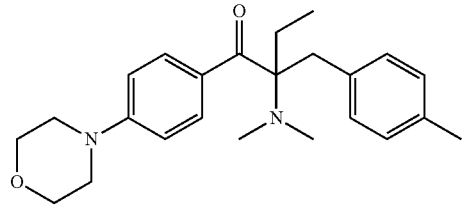

IRUGACURE OXE379 (Manufactured by BASF) (I-3)

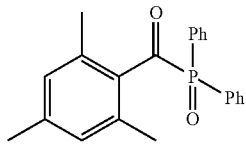

DAROCUR TPO (Manufactured by BASF) (I-4)

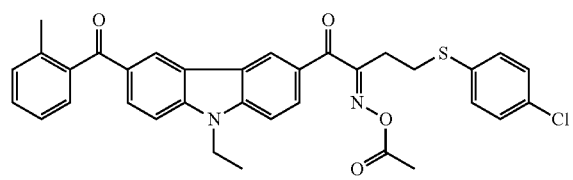

(I-5)

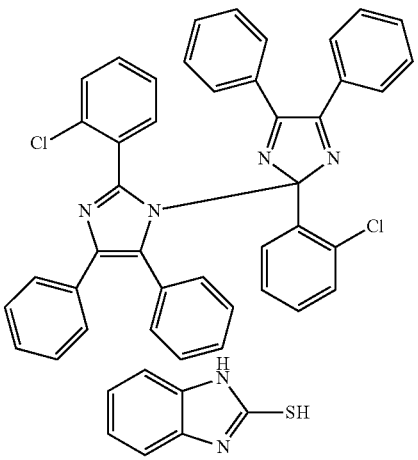

(I-6a)

(I-6b)

(I-6): (I-6a)/(I-6b) = 20/10 (Mass ratio)

-continued

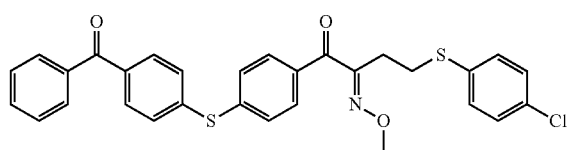

(I-7)

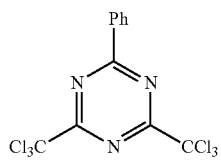

(I-8)

[Chem. 111]

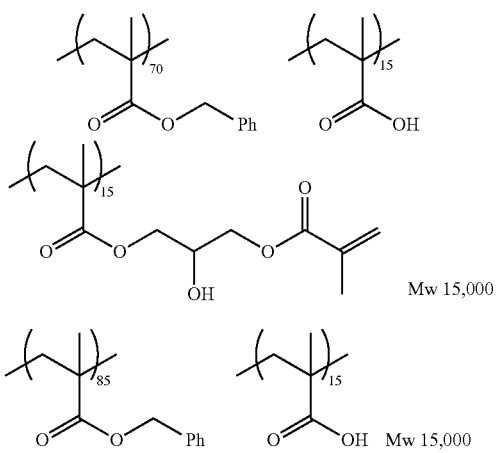

4. Preparation of Color Filter Formed of Colored Radiation-Sensitive Composition <Formation of Pattern>

Each of the colored radiation-sensitive compositions of examples and comparative examples prepared as above was coated onto the undercoat layer of the undercoat layer-attached silicon wafer substrate obtained in the above section 2., thereby forming a colored radiation-sensitive composition layer (coating film). Thereafter, the wafer was subjected to heating treatment (pre-baking) for 120 seconds by using a hot plate of 100° C. such that a dry film thickness of the coating film became 0.7 μm.

Next, by using an i-line stepper exposure device FPA-3000i5+ (manufactured by CANON INC.), the wafer was exposed to light at a wave length of 365 nm through an island pattern mask having a 1.0 μm×1.0 μm pattern, by varying the exposure dose in a range from 50 mJ/cm² to 1,200 mJ/cm².

Subsequently, the silicon wafer substrate, which had been irradiated with light and had a coating film formed thereon, was loaded onto a horizontal spin table of a spin shower developing machine (DW-30, manufactured by Chemitronics Co., Ltd.), and subjected to paddle development for 60 seconds at 23° C. by using CD-2000 (manufactured by FUJIFILM Electronic Materials Co., Ltd.), thereby forming a colored pattern on the silicon wafer substrate.

The silicon wafer on which the colored pattern had been formed was fixed onto the horizontal spin table by a vacuum chuck method, and the silicon wafer substrate was rotated at a rotation frequency of 50 rpm by using a rotation device. In this state, from the position above the rotation center, pure water was supplied onto the wafer from a spray nozzle in the form of shower so as to perform rinsing treatment, and then the wafer was spray-dried.

In the manner described above, monochromatic color filters having the colored pattern formed of the colored radiation-sensitive composition of examples or comparative examples were prepared.

Thereafter, by using a length measuring SEM "S-9260A" (manufactured by Hitachi High-Technologies Corporation), size of the colored pattern was measured. An exposure dose at which the pattern size became 1.0 μm was determined as an optimal exposure dose.

5. Performance Evaluation 5-1. Developability 100 developed portions of the colored pattern were observed, and the number of developed portions that had residues and was unsufficiently developed was counted. The larger the number is, the worse the developability is. The results are shown in Table 3.

5-2. Surface Roughness

The pattern surface was observed with an atomic force microscope (AFM) to measure Ra (nm). The smaller the Ra is, the lower the degree of surface roughness is, and the better the pattern is.

5-3. Pattern Shape 20 cross-sections of the pattern were observed with SEM to evaluate the pattern shape based on the following evaluation criteria. The resuls are shown in Table 3.

A: The pattern has a rectangular shape and does not have defects

B: 1 to 5 defects are observed on top of the pattern shape.

C: 6 or more defects are observed on top of the pattern shape.

TABLE 3

| | Dye multimer or dye for comparison | Pigment dispersion | | Polymerization initiator | Alkali-soluble resin | Evaluation | | |
|---|---|---|---|---|---|---|---|---|
| | | Pigment | Dispersion resin | | | Developability | Surfaces roughness (×10⁻¹ nm) | Pattern shape |
| Example 1 | (J-1) | PY139 | A | (I-1) | J1 | 0 | 4 | A |
| Example 2 | (J-2) | PY139 | A | (I-1) | J1 | 0 | 5 | A |
| Example 3 | (J-3) | PY139 | A | (I-1) | J1 | 0 | 4 | A |
| Example 4 | (J-4) | PY139 | A | (I-1) | J1 | 2 | 6 | A |
| Example 5 | (J-5) | PY139 | A | (I-1) | J1 | 6 | 12 | A |
| Example 6 | (J-6) | PY139 | A | (I-1) | J1 | 5 | 13 | A |
| Example 7 | (J-7) | PY139 | A | (I-1) | J1 | 0 | 6 | A |
| Example 8 | (J-8) | PY139 | A | (I-1) | J1 | 0 | 5 | A |
| Example 9 | (J-9) | PY139 | A | (I-1) | J1 | 5 | 11 | A |
| Example 10 | (J-10) | PY139 | A | (I-1) | J1 | 6 | 13 | A |

TABLE 3-continued

| | Dye multimer or dye for comparison | Pigment dispersion | | Polymerization initiator | Alkali-soluble resin | Evaluation | | |
|---|---|---|---|---|---|---|---|---|
| | | Pigment | Dispersion resin | | | Developability | Surfaces roughness ($\times 10^{-1}$ nm) | Pattern shape |
| Example 11 | (J-11) | PY139 | A | (I-1) | J1 | 0 | 1 | A |
| Example 12 | (J-12) | PY139 | A | (I-1) | J1 | 0 | 6 | A |
| Example 13 | (J-13) | PY139 | A | (I-1) | J1 | 3 | 9 | A |
| Example 14 | (J-14) | PY139 | A | (I-1) | J1 | 6 | 12 | A |
| Example 15 | (J-15) | PY139 | A | (I-1) | J1 | 7 | 13 | A |
| Example 16 | (J-16) | PY139 | A | (I-1) | J1 | 3 | 9 | A |
| Example 17 | (J-17) | PY139 | A | (I-1) | J1 | 6 | 13 | A |
| Example 18 | (J-18) | PY139 | A | (I-1) | J1 | 7 | 12 | A |
| Example 19 | (J-19) | PY139 | A | (I-1) | J1 | 6 | 11 | A |
| Example 20 | (J-20) | PY139 | A | (I-1) | J1 | 7 | 12 | A |
| Example 21 | (J-21) | PY139 | A | (I-1) | J1 | 0 | 4 | A |
| Example 22 | (J-22) | PY139 | A | (I-1) | J1 | 0 | 6 | A |
| Example 23 | (J-23) | PB15.6 | A | (I-1) | J1 | 0 | 4 | A |
| Example 24 | (J-24) | PB15.6 | A | (I-1) | J1 | 0 | 5 | A |
| Example 25 | (J-25) | PB15.6 | A | (I-1) | J1 | 0 | 5 | A |
| Example 26 | (J-26) | PB15.6 | A | (I-1) | J1 | 0 | 6 | A |
| Example 27 | (J-27) | PB15.6 | A | (I-1) | J1 | 0 | 4 | A |
| Example 28 | (J-28) | PG36 | A | (I-1) | J1 | 0 | 5 | A |
| Example 29 | (J-29) | PB15.6 | A | (I-1) | J1 | 0 | 4 | A |
| Example 30 | (J-30) | PR254 | A | (I-1) | J1 | 0 | 6 | A |
| Example 31 | (J-31) | PR177 | A | (I-1) | J1 | 0 | 5 | A |
| Example 32 | (J-32) | PG58 | A | (I-1) | J1 | 0 | 4 | A |
| Example 33 | (J-33) | PG36 | A | (I-1) | J1 | 0 | 4 | A |
| Example 34 | (J-34) | PG36 | A | (I-1) | J1 | 0 | 6 | A |
| Example 35 | (J-35) | PY150 | A | (I-1) | J1 | 0 | 6 | A |
| Example 36 | (J-36) | PG58 | A | (I-1) | J1 | 0 | 5 | A |
| Example 37 | (J-37) | PB15.6 | A | (I-1) | J1 | 0 | 6 | A |
| Example 38 | (J-38) | PR254 | A | (I-1) | J1 | 0 | 5 | A |
| Example 39 | (J-39) | PY139 | A | (I-1) | J1 | 0 | 4 | A |
| Example 40 | (J-40) | PY139 | A | (I-1) | J1 | 0 | 6 | A |
| Example 41 | (J-41) | PY150 | A | (I-1) | J1 | 0 | 2 | A |
| Example 42 | (J-42) | PB15.6 | A | (I-1) | J1 | 0 | 2 | A |
| Example 43 | (J-1) | PY139 | A | (I-2) | J1 | 0 | 6 | A |
| Example 44 | (J-1) | PY139 | A | (I-3) | J1 | 6 | 12 | A |
| Example 45 | (J-1) | PY139 | A | (I-4) | J1 | 6 | 13 | A |
| Example 46 | (J-1) | PY139 | A | (I-5) | J1 | 0 | 2 | A |
| Example 47 | (J-1) | PY139 | A | (I-6) | J1 | 3 | 9 | A |
| Example 48 | (J-1) | PY139 | A | (I-7) | J1 | 0 | 2 | A |
| Example 49 | (J-1) | PY139 | A | (I-8) | J1 | 3 | 8 | A |
| Example 50 | (J-1) | PY139 | A | (I-1) | J2 | 6 | 12 | A |
| Example 51 | (H-1) | PY139 | A | (I-1) | J1 | 7 | 14 | A |
| Example 52 | (H-1) | PY139 | A | (I-1) | J1 | 7 | 12 | A |
| Example 53 | (J-24) | PB15.6 | B | (I-1) | J1 | 3 | 8 | A |
| Comparative Example 1 | Dye 1 | PB15.6 | A | (I-1) | J1 | 4 | 22 | C |
| Comparative Example 2 | (J-24) | PB15.6 | C | (I-1) | J1 | 12 | 24 | C |

Examples 54 and 55 and Comparative Examples 3 and 4

By using the same colored radiation-sensitive composition as the colored radiation-sensitive composition prepared in Examples 23 and 24 and Comparative Examples 1 and 2, monochromatic color filters were prepared in the same manner as in the "4. Preparation of Color Filter Formed of Colored Radiation-Sensitive Composition", except that the dry film thickness was changed to 1.0 μm, and the pattern size was changed to 1.5 μm. These color filters were evaluated in terms of the respective items described in the "5. Performance Evaluation".

TABLE 4

| | Dye multimer or dye for comparison | Pigment dispersion | | Polymerization initiator | Alkali-soluble resin | evaluation | | |
|---|---|---|---|---|---|---|---|---|
| | | Pigment | Dispersion resin | | | Developability | Surfaces roughness ($\times 10^{-1}$ nm) | Pattern shape |
| Example 54 | (J-24) | PB15.6 | A | (I-1) | J1 | 0 | 2 | A |
| Example 55 | (J-24) | PB15.6 | B | (I-1) | J1 | 2 | 2 | A |
| Comparative Example 3 | Dye 1 | PB15.6 | A | (I-1) | J1 | 2 | 5 | B |

TABLE 4-continued

| | Dye multimer or dye for comparison | Pigment dispersion | | | Alkali-soluble resin | evaluation | | |
|---|---|---|---|---|---|---|---|---|
| | | Pigment | Dispersion resin | Polymerization initiator | | Developability | Surfaces roughness ($\times 10^{-1}$ nm) | Pattern shape |
| Comparative Example 4 | (J-24) | PB15.6 | C | (I-1) | J1 | 5 | 6 | B |

From the results shown in Table 3, it is understood that the color filters obtained using the respective colored radiation-sensitive compositions of examples are superior to Comparative Example 1, which does not contain a dye multimer and uses the dye 1, and Comparative Example 2, which uses a dispersion resin other than the specific dispersion resin, in terms of all of the developability, surface roughenss, and pattern shape.

Moreover, from the results shown in Tables 3 and 4, it is understood that the colored radiation-sensitive compositions of examples exhibit particularly excellent effects when the composition is used for forming a fine and thin colored pattern having a small film thickness.

Example 56

—Preparation of Color Filter of Full Color for Solid-State Image Sensor—

By using the colored radiation-sensitive composition for green prepared in Example 28, green pixels were formed using an island bayer pattern of 1.0 µm×1.0 µm. Thereafter, by using the colored radiation-sensitive composition for red prepared in Example 30, red pixels were formed using an island pattern of 1.0 µm×1.0 µm. Moreover, in the remaining grids, blue pixels in the form of an island pattern of 1.0 µm×1.0 µm were formed using the colored radiation-sensitive composition for blue prepared in Example 29. In this manner, a color filter for a solid-state image sensor for a light shielding portion was prepared.

EVALUATION

The obtained color filter of full color for a solid-state image sensor was installed in a solid-state image sensor, and as a result, it was confirmed that the solid-state image sensor has high resolution and exhibits excellent color separation properties.

What is claimed is:

1. A colored radiation-sensitive composition comprising:
   (A) a dye multimer which is a trimer or higher;
   (B) a pigment;
   (C) a polymerizable compound;
   (D) a photopolymerization initiator; and
   (E) a dispersion resin obtained by reacting a polyester, which has a hydroxyl group on one terminal, with an acid anhydride,
   wherein the (A) dye multimer has a partial structure derived from a dye selected from an azo dye, an anthraquinone dye, a triphenylmethane dye, a xanthene dye, a cyanine dye, a squarylium dye, a quinophthalone dye, a phthalocyanine dye, and a subphthalocyanine dye.

2. The colored radiation-sensitive composition according to claim 1,
   wherein the (A) dye multimer has a partial structure derived from a dye selected from a triphenylmethane dye and a xanthene dye.

3. The colored radiation-sensitive composition according to claim 1,
   wherein the (A) dye multimer further contains an alkali-soluble group.

4. The colored radiation-sensitive composition according to claim 1,
   wherein the acid value of the (A) dye multimer is 0.3 mmol/g to 2.0 mmol/g.

5. The colored radiation-sensitive composition according to claim 1,
   wherein the weight average molecular weight of the (A) dye multimer is 2,000 to 20,000.

6. The colored radiation-sensitive composition according to claim 1,
   wherein the (A) dye multimer is a radical polymer containing a dye monomer having an ethylenically unsaturated bond.

7. The colored radiation-sensitive composition according to claim 1,
   wherein the (A) dye multimer has a polymerizable group.

8. The colored radiation-sensitive composition according to claim 7,
   wherein the content of the polymerizable group with respect to 1 g of the (A) dye multimer is 0.1 mmol to 2.0 mmol.

9. The colored radiation-sensitive composition according to claim 1,
   wherein the (B) pigment is at least one kind of pigment selected from the group consisting of an anthraquinone pigment, a diketopyrrolopyrrole pigment, a phthalocyanine pigment, a quinophthalone pigment, an isoindoline pigment, an azomethine pigment, and a dioxazine pigment.

10. The colored radiation-sensitive composition according to claim 1,
    wherein the (D) photopolymerization initiator is an oxime compound.

11. The colored radiation-sensitive composition according to claim 1, that is used for forming a colored layer of a color filter.

12. A colored cured film obtained by curing the colored radiation-sensitive composition according to claim 1.

13. A color filter comprising the colored cured film according to claim 12.

14. The color filter according to claim 13,
    wherein the film thickness of the colored cured film is 0.7 µm or less.

15. A solid-state image sensor comprising:
    the color filter according to claim 13.

16. An image display device comprising:
    the color filter according to claim 13.

17. A pattern forming method comprising:
    forming a colored radiation-sensitive composition layer by applying the colored radiation-sensitive composition according to claim 1 onto a support;
    exposing the colored radiation-sensitive composition layer in the form of a pattern; and
    forming a colored pattern by developing and removing an unexposed portion.

18. A color filter production method comprising:
forming a colored radiation-sensitive composition layer by applying the colored radiation-sensitive composition according to claim 1 onto a support;
exposing the colored radiation-sensitive composition layer in the form of a pattern; and
forming a colored pattern by developing and removing an unexposed portion.

19. The colored radiation-sensitive composition according to claim 1,
wherein the (A) dye multimer has a partial structure derived from a dye selected from a triphenylmethane dye, a xanthene dye, a cyanine dye, a squarylium dye, a quinophthalone dye, a phthalocyanine dye, and a subphthalocyanine dye.

20. The colored radiation-sensitive composition according to claim 1,
wherein the polyester, which has a hydroxyl group on one terminal, is obtained by reacting an alcohol with lactone.

21. The colored radiation-sensitive composition according to claim 20, wherein the lactone is ε-caprolactone.

22. The colored radiation-sensitive composition according to claim 21, wherein the alcohol has a boiling point of 100° C. or higher, or the alcohol is an aliphatic alcohol having 4 to 25 carbon atoms.

23. The colored radiation-sensitive composition according to claim 1,
wherein the acid anhydride is a tetracarboxylic acid dianhydride.

24. The colored radiation-sensitive composition according to claim 1,
wherein the (A) dye multimer contains at least one of the structural units represented by Formula (A) and Formula (C), or the (A) dye multimer is represented by Formula (D),

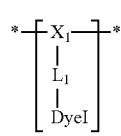

Formula (A)

wherein in Formula (A),
$X_1$ represents a linking group formed by polymerization,
$L_1$ represents a single bond or a divalent linking group, and
DyeI represents a dye structure,

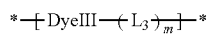

Formula (C)

wherein in Formula (C),
$L_3$ represents a single bond or a divalent linking group,
DyeIII represents a partial structure of a dye, and
m represents 0 or 1, $(L_4\!\!-\!\!(DyeIV))_n$ Formula (D)
wherein in Formula (D),
$L_4$ represents a linking group having a valency of n,
n represents an integer from 2 to 20, when n is 2 or greater, structures of DyeIV may be the same as or different from each other, and
DyeIV represents a dye structure.

25. The colored radiation-sensitive composition according to claim 24,
wherein the (A) dye multimer contains the structural units represented by the Formula (A).

26. The colored radiation-sensitive composition according to claim 1, wherein the polyester has one hydroxyl group on one terminal.

27. The colored radiation-sensitive composition according to claim 1, wherein the (E) dispersion resin is selected from the group consisting of compounds (a-7) to (a-11):

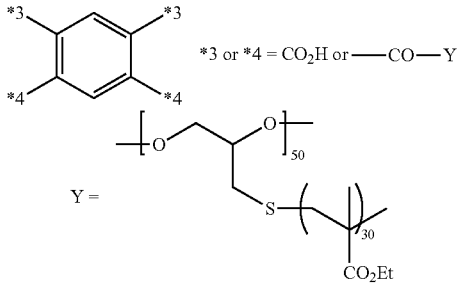

(a-7)
Mw 25,000

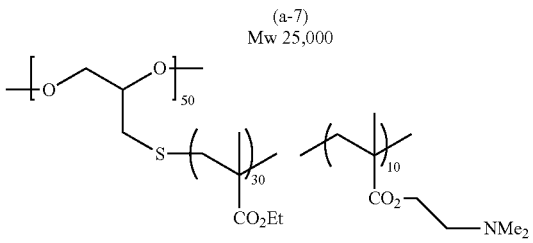

(a-8)
Mw 15,000

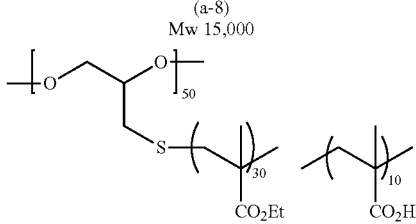

(a-9)
Mw 32,000

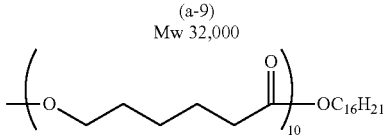

(a-10)
Mw 5,500

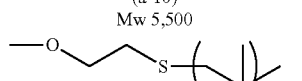

(a-11)
Mw 8,000

* * * * *